United States Patent
Wakul et al.

(10) Patent No.: US 7,589,939 B2
(45) Date of Patent: Sep. 15, 2009

(54) MAGNETIC SENSOR USING GIANT MAGNETORESISTIVE ELEMENTS AND METHOD FOR MANUFACTURING THE SAME

(75) Inventors: Yukio Wakul, Iwata (JP); Masayoshi Omura, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 179 days.

(21) Appl. No.: 11/236,645

(22) Filed: Sep. 28, 2005

(65) Prior Publication Data
US 2006/0072249 A1 Apr. 6, 2006

(30) Foreign Application Priority Data

Sep. 28, 2004 (JP) .............................. 2004-281451
Aug. 29, 2005 (JP) .............................. 2005-248324
Aug. 29, 2005 (JP) .............................. 2005-248416

(51) Int. Cl.
*G01B 7/30* (2006.01)
*G11B 5/39* (2006.01)

(52) U.S. Cl. .............................. 360/324.1; 324/207.21; 324/252; 338/32 R

(58) Field of Classification Search ............ 324/207.21, 324/252, 38 R; 360/324.11, 324.1, 324.12; 338/32 R
See application file for complete search history.

(56) References Cited

FOREIGN PATENT DOCUMENTS

| EP | 710850 A2 | * | 5/1996 |
| EP | 1574870 A2 | * | 9/2005 |
| JP | 2004-163419 | | 6/2004 |
| WO | WO 9958994 A1 | * | 11/1999 |

* cited by examiner

*Primary Examiner*—William J Klimowicz
(74) *Attorney, Agent, or Firm*—DicksteinShapiroLLP

(57) ABSTRACT

A magnetic sensor includes a single substrate, a conventional GMR element formed of a spin-valve film including a single-layer-pinned fixed magnetization layer, and a SAF element formed of a synthetic spin-valve film including a plural-layer-pinned fixed magnetization layer. When the spin-valve film intended to act as the conventional GMR element and the synthetic spin-valve film intended to act as the SAF element are subjected to the application of a magnetic field oriented in a single direction at a high temperature, they become giant magnetoresistive elements whose magnetic-field-detecting directions are antiparallel to each other. Since films intended to act as the conventional GMR element and the SAF element can be disposed close to each other, the magnetic sensor which has giant magnetoresistive elements whose magnetic-field-detecting directions are antiparallel to each other can be small.

9 Claims, 81 Drawing Sheets

⇨ ;INITIAL MAGNETIZATION DIRECTION OF FREE LAYER
➜ ;FIXED MAGNETIZATION DIRECTION OF PINNED LAYER
 (ANTIPARALLEL TO MAGNETIC-FIELD-DETECTING DIRECTION)

⇨ ;INITIAL MAGNETIZATION DIRECTION OF FREE LAYER

➔ ;FIXED MAGNETIZATION DIRECTION OF PINNED LAYER
(ANTIPARALLEL TO MAGNETIC-FIELD-DETECTING DIRECTION)

CONVENTIONAL GMR ELEMENT
(CONVENTIONAL SPIN-VALVE FILM)

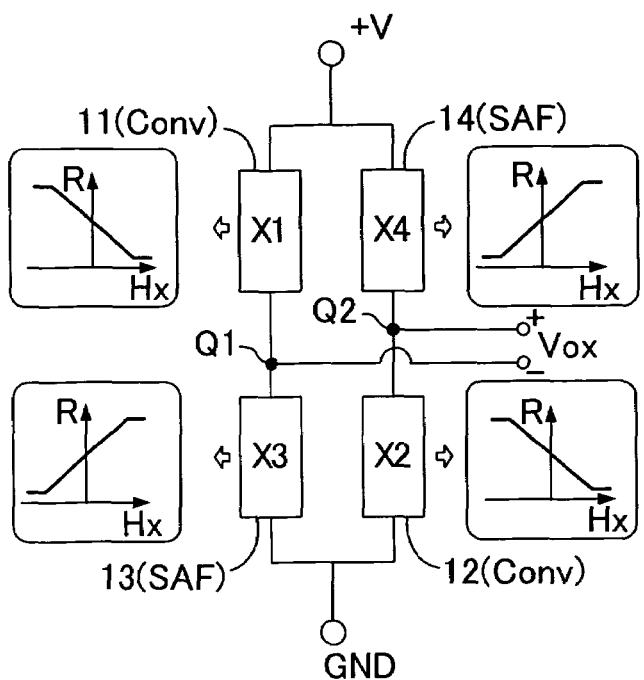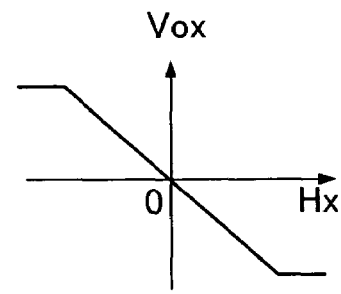
FIG.6A  FIG.6B
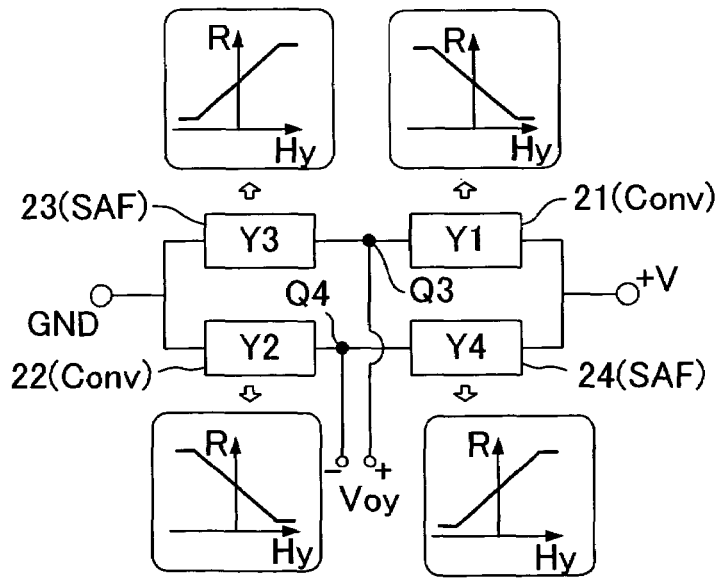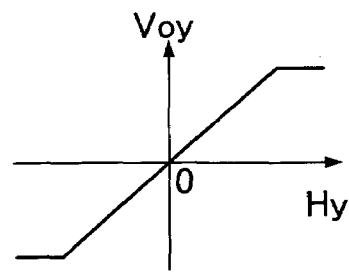
FIG.7A  FIG.7B

⇨ ; INITIAL MAGNETIZATION DIRECTION OF FREE LAYER
➡ ; FIXED MAGNETIZATION DIRECTION OF PINNED LAYER
(ANTIPARALLEL TO MAGNETIC-FIELD-DETECTING DIRECTION)

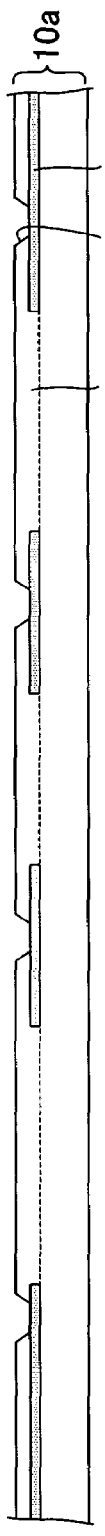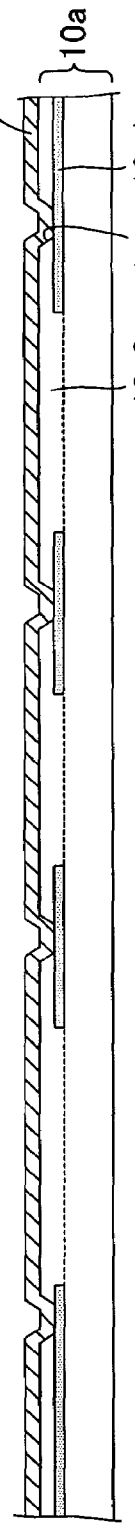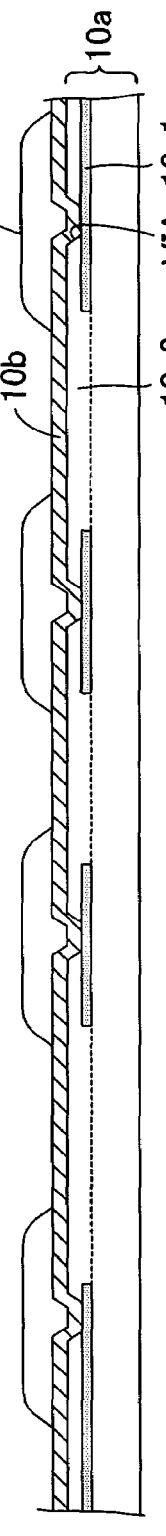
STEP 1: PREPARING SUBSTRATE   FIG.16A
STEP 2: FORMING BIAS MAGNET FILMS   FIG.16B
STEP 3: DEPOSITING RESIST LAYER FOR REMOVING UNNECESSARY BIAS MAGNET FILMS   FIG.16C

STEP 4: ION MILLING, REMOVING UNNECESSARY BIAS MAGNET FILMS

STEP 5: REMOVING RESIST LAYER

STEP 6: DEPOSITING CONVENTIONAL GMR ELEMENT COMPOSITE LAYER

STEP 7: DEPOSITING RESIST LAYER FOR REMOVING UNNECESSARY CONVENTIONAL GMR ELEMENT COMPOSITE LAYER

STEP 8: ION MILLING, REMOVING UNNECESSARY CONVENTIONAL GMR ELEMENT COMPOSITE LAYER

STEP 9: REMOVING RESIST LAYER

STEP 10: DEPOSITING INSULATING INTERLAYER

STEP 11: DEPOSITING RESIST LAYER

STEP 12: ION MILLING, REMOVING UNNECESSARY INSULATING INTERLAYER

STEP 13: REMOVING RESIST LAYER

STEP 14: DEPOSITING SAF ELEMENT COMPOSITE LAYER

STEP 15: DEPOSITING RESIST LAYER FOR REMOVING UNNECESSARY SAF ELEMENT COMPOSITE LAYER

STEP 16: ION MILLING, REMOVING UNNECESSARY SAF ELEMENT COMPOSITE LAYER

STEP 17: REMOVING RESIST LAYER

STEP 1: PREPARING SUBSTRATE

STEP 2: FORMING BIAS MAGNET FILMS

STEP 3: DEPOSITING RESIST LAYER FOR REMOVING UNNECESSARY BIAS MAGNET FILMS

STEP 4: ION MILLING, REMOVING UNNECESSARY BIAS MAGNET FILMS

STEP 5: REMOVING RESIST LAYER

STEP 6: DEPOSITING PtMn/CoFe/Ru

STEP 7: DEPOSITING RESIST LAYER FOR REMOVING REGIONS EXCEPT FIRST SAF COMPOSITE LAYER AND ITS VICINITY

STEP 8: ION MILLING, REMOVING UNNECESSARY Ru LAYER AND PART OF CoFe LAYER

STEP 9: REMOVING RESIST LAYER

STEP 10: DEPOSITING CoFe, Co, AND FREE LAYER

STEP 11: DEPOSITING RESIST LAYER

STEP 12: ION MILLING, REMOVING UNNECESSARY REGIONS

STEP 13: REMOVING RESIST LAYER

FIG. 29
STEP 1: DEPOSITING FREE LAYER, SPACER LAYER S, Cu, CoFe, AND Ru
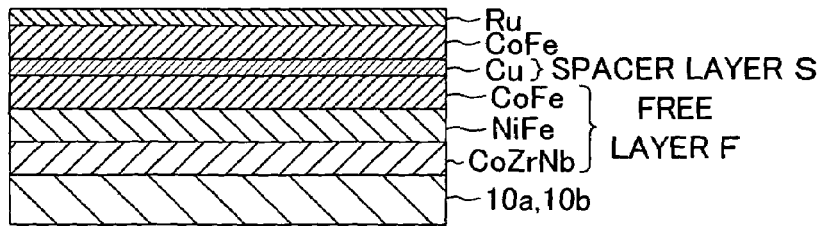
STEP 2, REMOVING UNNECESSARY Ru LAYER BY MILLING
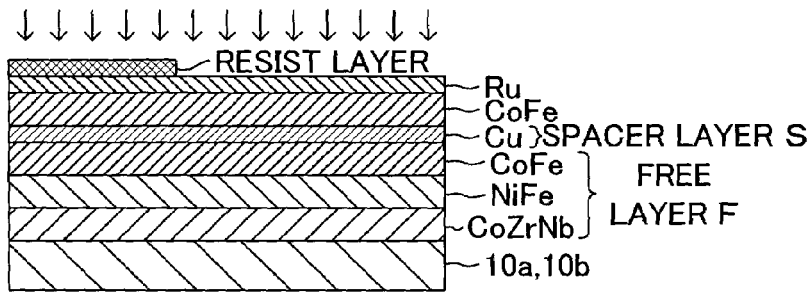
STEP 3, REMOVING RESIST LAYER
STEP 4, DEPOSITING CoFe AND PtMn TO FORM FIXED LAYERS P AND P', AND DEPOSITING Ta
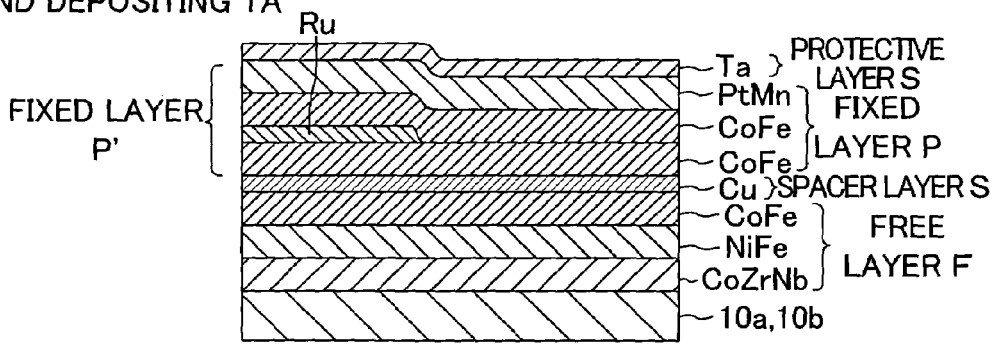
STEP 5, MAGNETIC FIELD HEAT TREATMENT
STEP 6, PATTERNING

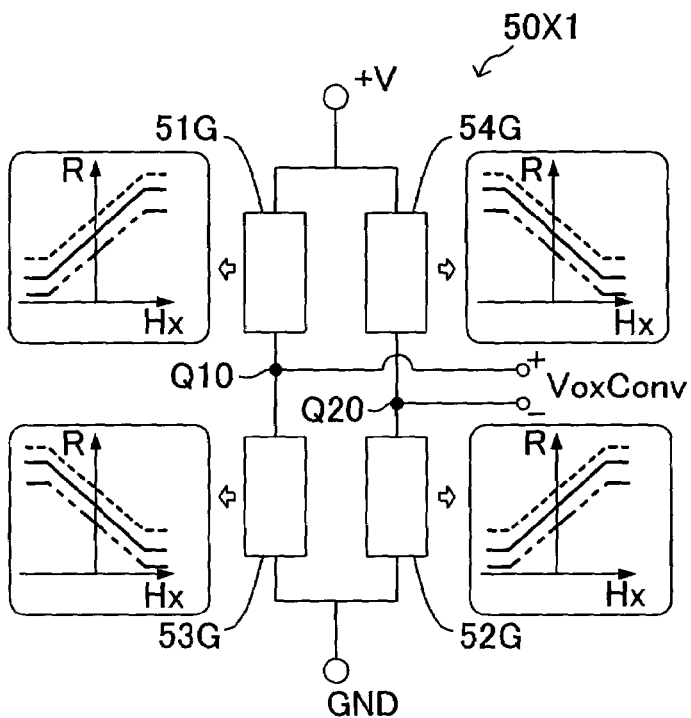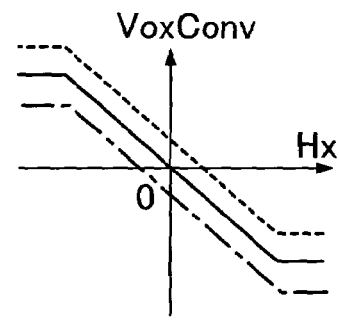
FIG.32A  FIG.32B
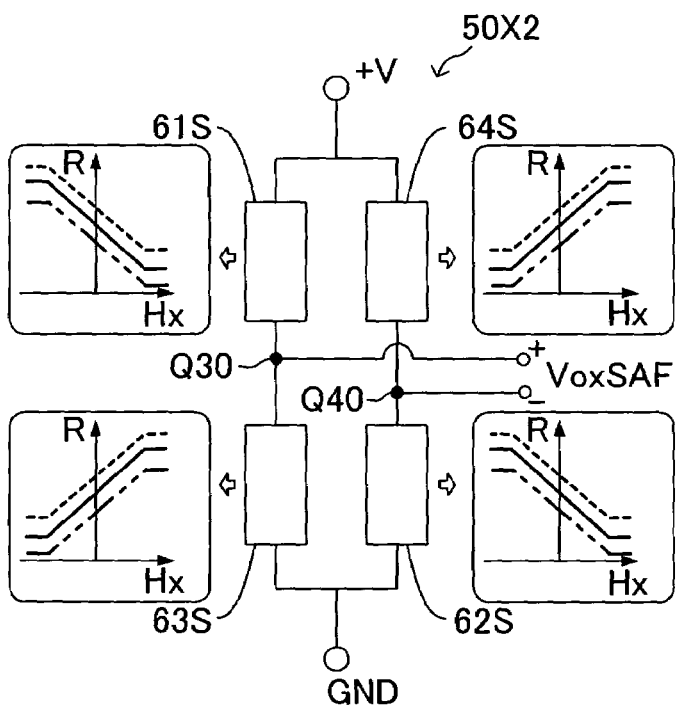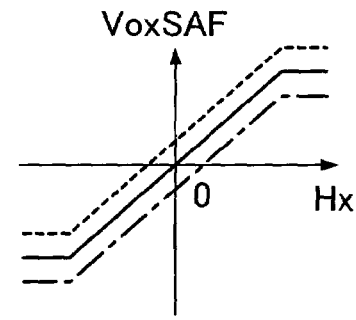
FIG.33A  FIG.33B

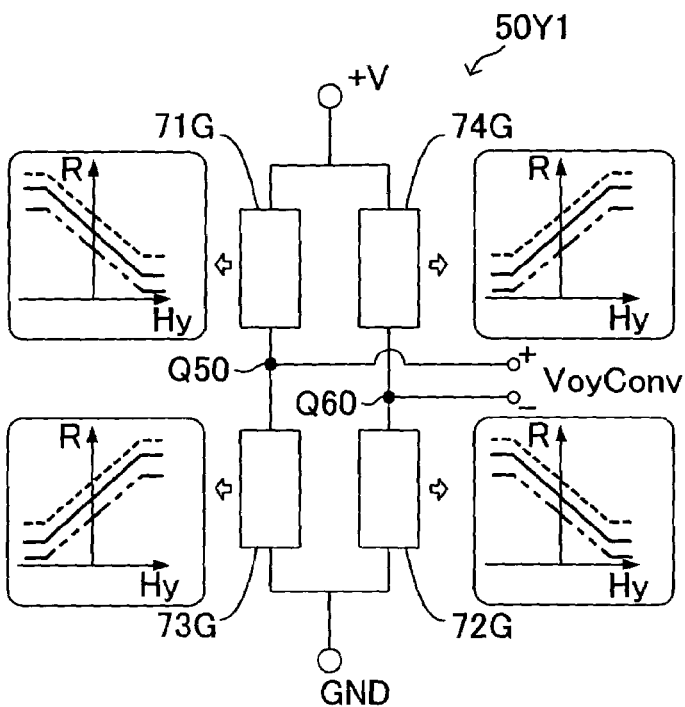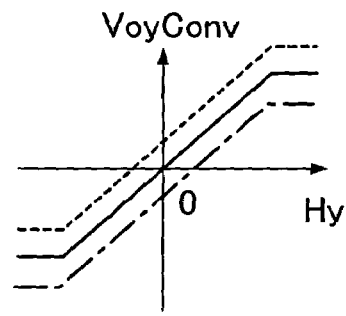
FIG.36A  FIG.36B
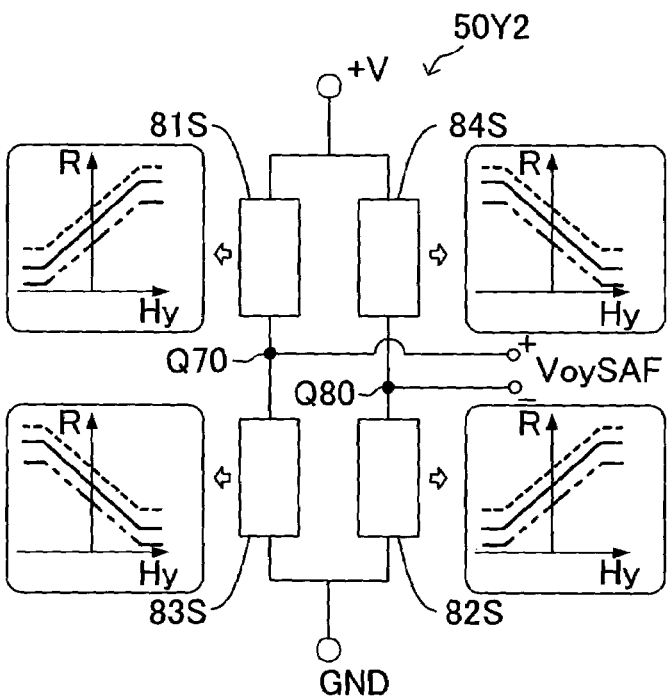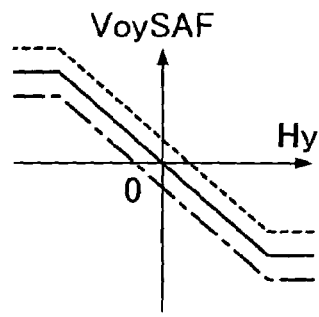
FIG.37A  FIG.37B

⇨ ;INITIAL MAGNETIZATION DIRECTION OF FREE LAYER

➔ ;FIXED MAGNETIZATION DIRECTION OF PINNED LAYER
(ANTIPARALLEL TO MAGNETIC-FIELD-DETECTING DIRECTION)

⇨ ;INITIAL MAGNETIZATION DIRECTION OF FREE LAYER

➡ ;FIXED MAGNETIZATION DIRECTION OF PINNED LAYER
(ANTIPARALLEL TO MAGNETIC-FIELD-DETECTING DIRECTION)

⇨ ;INITIAL MAGNETIZATION DIRECTION OF FREE LAYER

➔ ;FIXED MAGNETIZATION DIRECTION OF PINNED LAYER
(ANTIPARALLEL TO MAGNETIC-FIELD-DETECTING DIRECTION)

⇒ ;INITIAL MAGNETIZATION DIRECTION OF FREE LAYER
→ ;FIXED MAGNETIZATION DIRECTION OF PINNED LAYER
(ANTIPARALLEL TO MAGNETIC-FIELD-DETECTING DIRECTION)

⇨ ; INITIAL MAGNETIZATION DIRECTION OF FREE LAYER
➡ ; FIXED MAGNETIZATION DIRECTION OF PINNED LAYER
(ANTIPARALLEL TO MAGNETIC-FIELD-DETECTING DIRECTION)

⇨ ;INITIAL MAGNETIZATION DIRECTION OF FREE LAYER
➡ ;FIXED MAGNETIZATION DIRECTION OF PINNED LAYER
(ANTIPARALLEL TO MAGNETIC-FIELD-DETECTING DIRECTION)

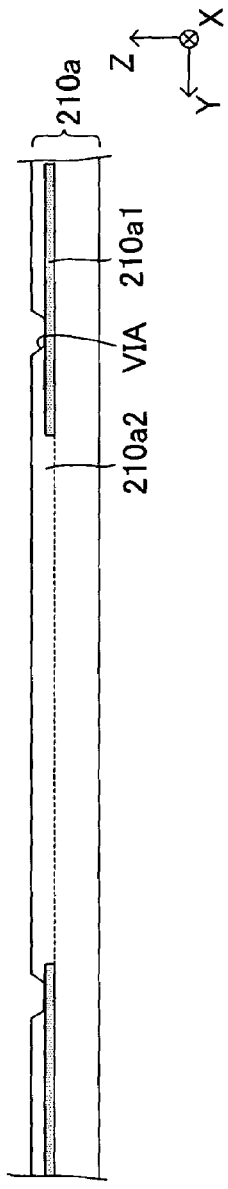
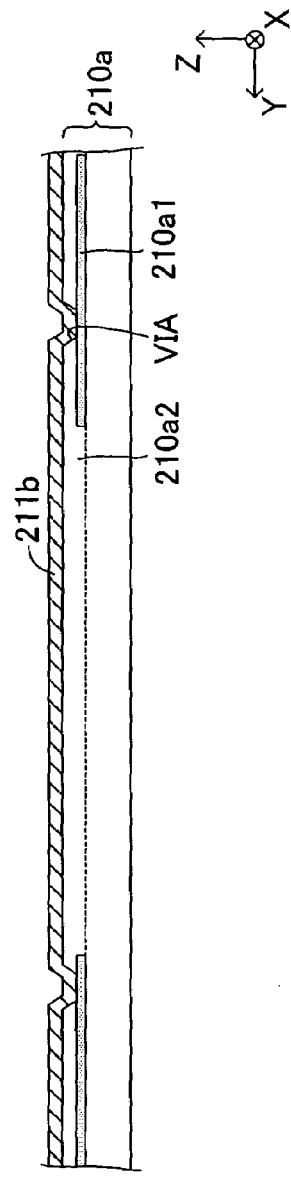
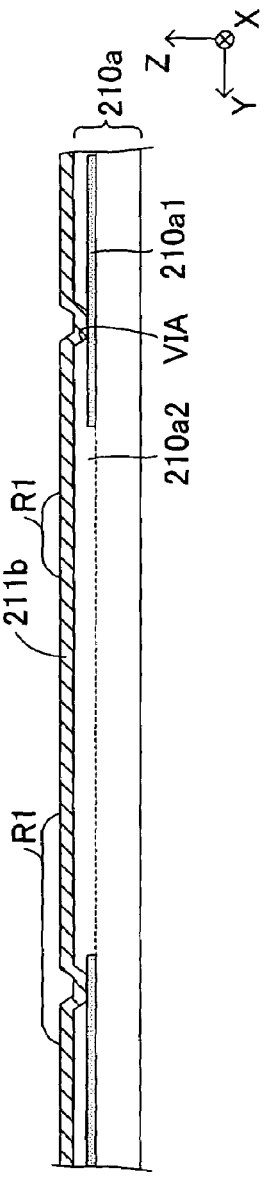
FIG.61A  STEP 31: PREPARING SUBSTRATE
FIG.61B  STEP 32: FORMING BIAS MAGNET FILMS (HARD MAGNET FILMS)
FIG.61C  STEP 33: FORMING RESIST MASK FOR REMOVING UNNECESSARY BIAS MAGNET FILMS

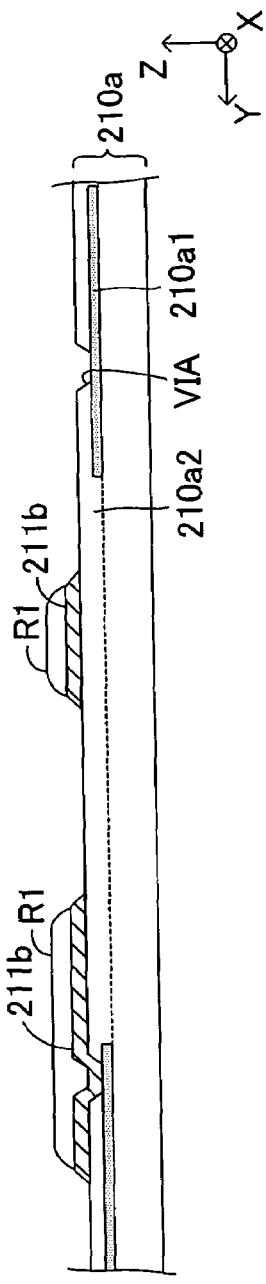
FIG.62A STEP 34: REMOVING UNNECESSARY BIAS MAGNET FILMS BY ION MILLING
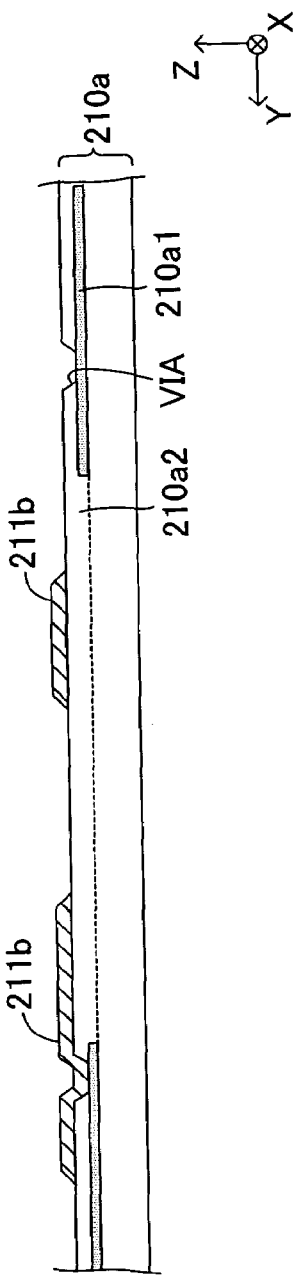
FIG.62B STEP 35: REMOVING RESIST MASK
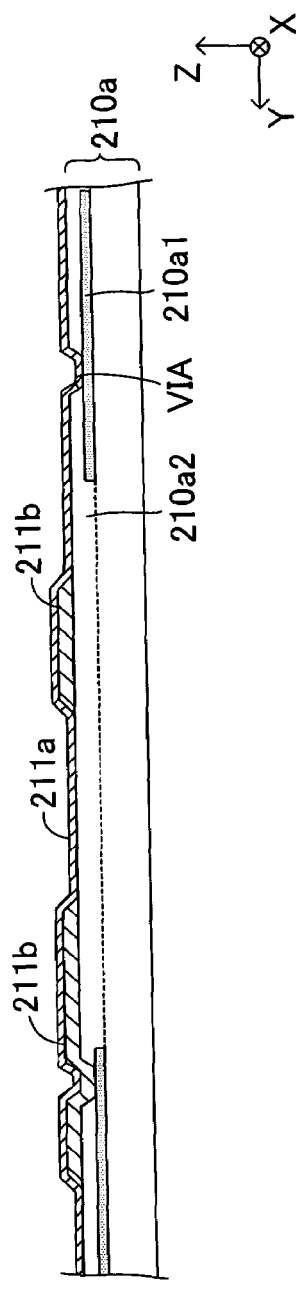
FIG.62C STEP 36: DEPOSITING CONVENTIONAL GMR ELEMENT COMPOSITE LAYER

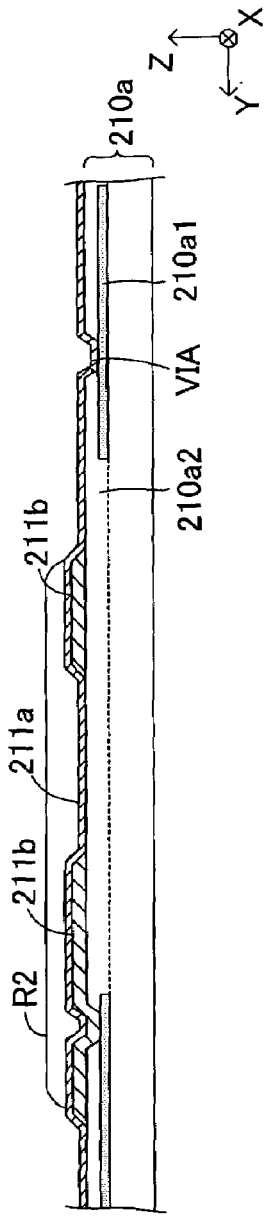
FIG.63A   STEP 37: FORMING RESIST MASK FOR REMOVING UNNECESSARY CONVENTIONAL GMR ELEMENT COMPOSITE LAYER
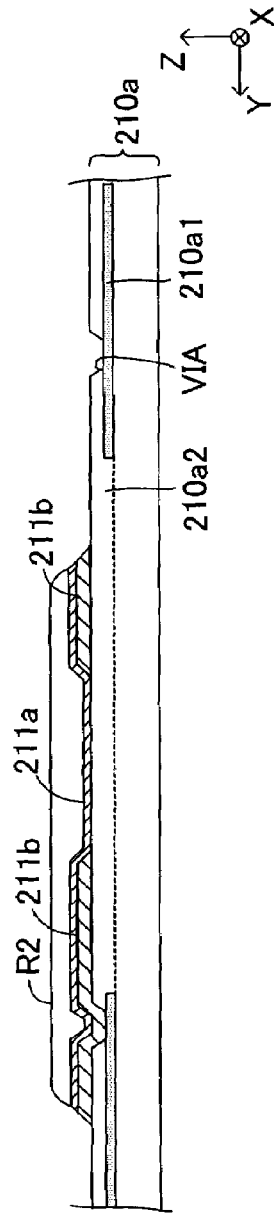
FIG.63B   STEP 38: REMOVING UNNECESSARY CONVENTIONAL GMR ELEMENT COMPOSITE LAYER BY ION MILLING
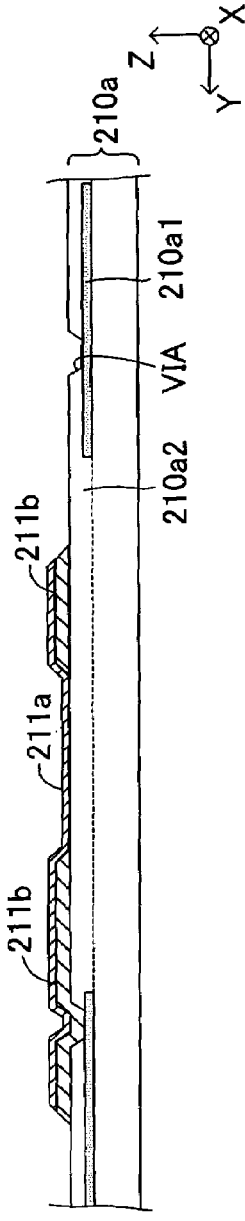
FIG.63C   STEP 39: REMOVING RESIST MASK

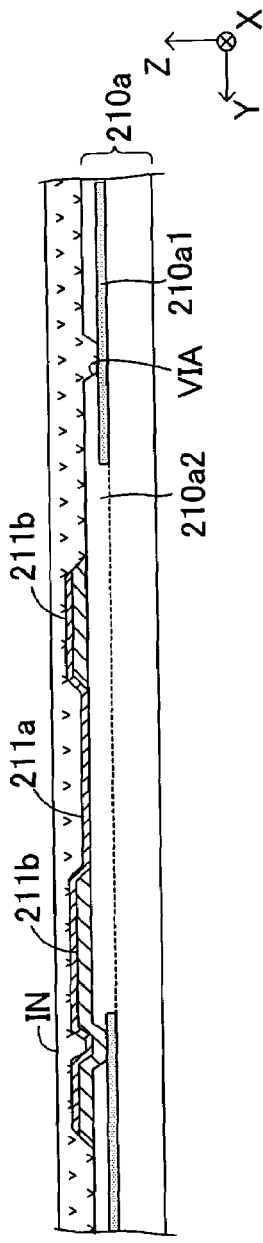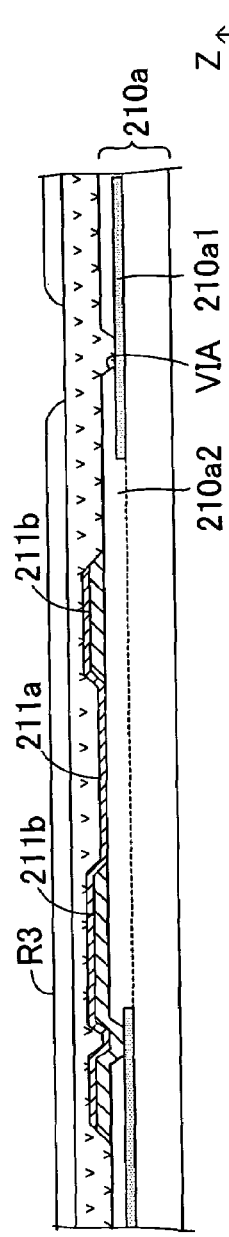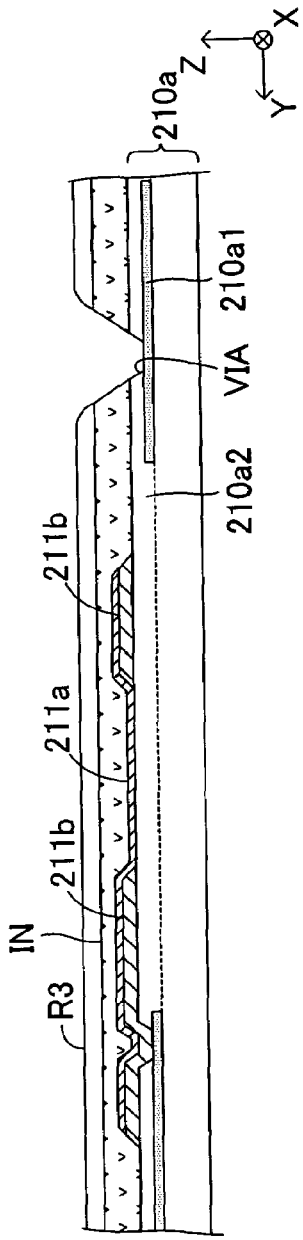

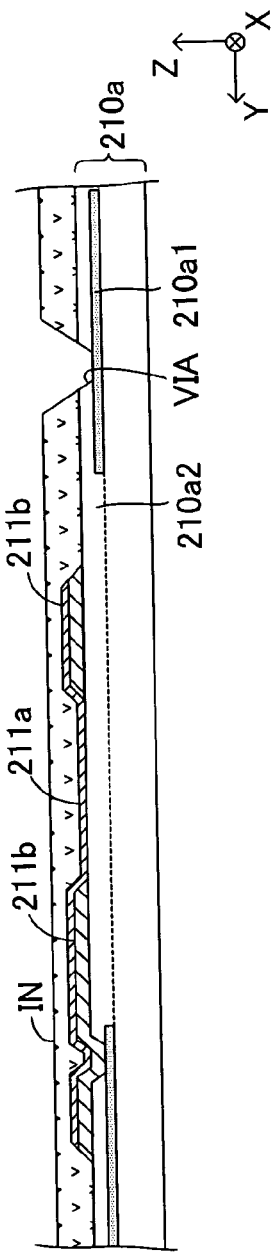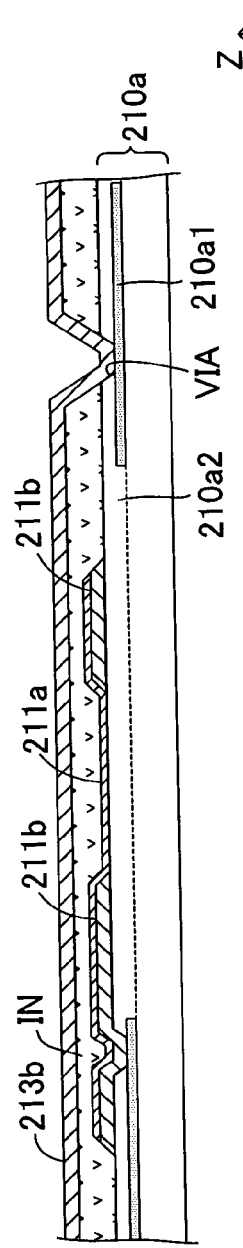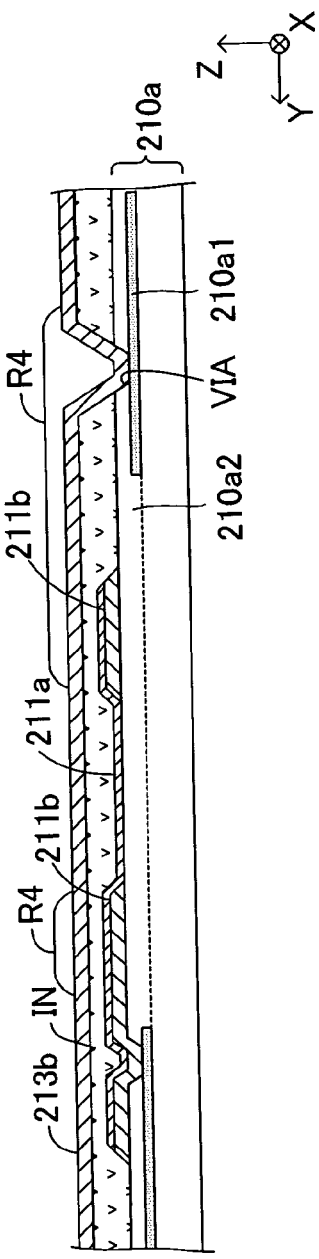

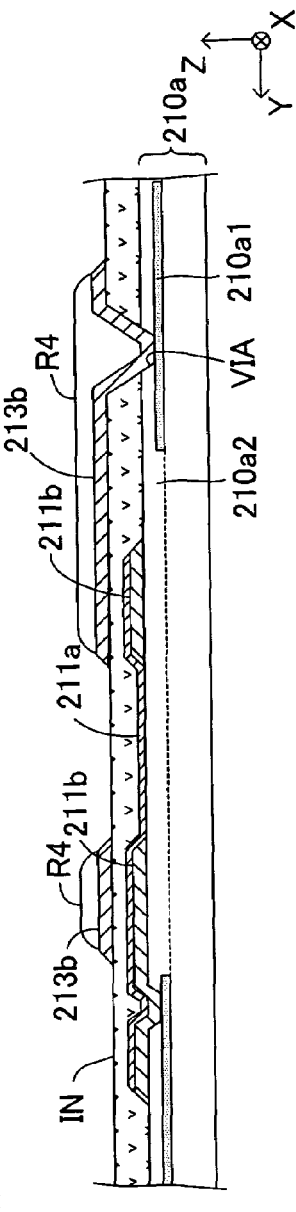
FIG.66A STEP 46: REMOVING UNNECESSARY BIAS MAGNET FILMS BY ION MILLING
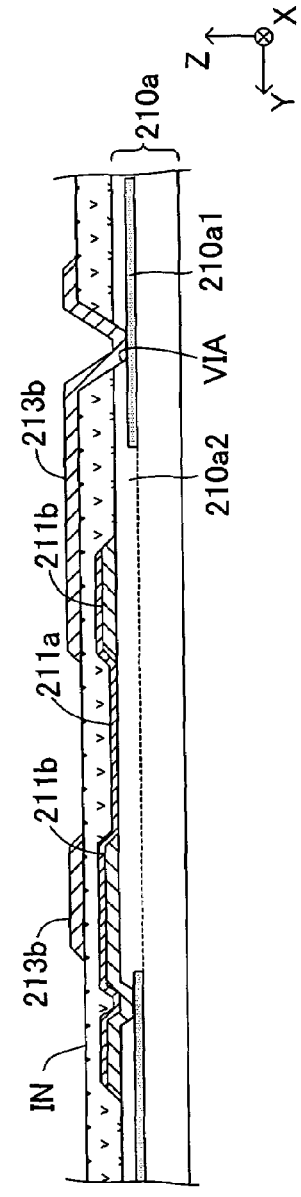
FIG.66B STEP 47: REMOVING RESIST MASK
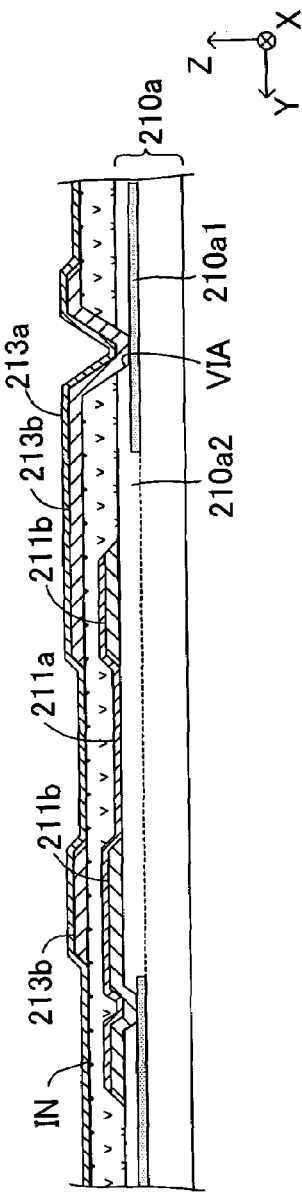
FIG.66C STEP 48: DEPOSITING SAF ELEMENT COMPOSITE LAYER STEP 49: FORMING RESIST MASK FOR REMOVING UNNECESSARY SAF ELEMENT COMPOSITE LAYER

STEP 50: REMOVING UNNECESSARY SAF ELEMENT COMPOSITE LAYER BY ION MILLING

STEP 51: REMOVING RESIST MASK

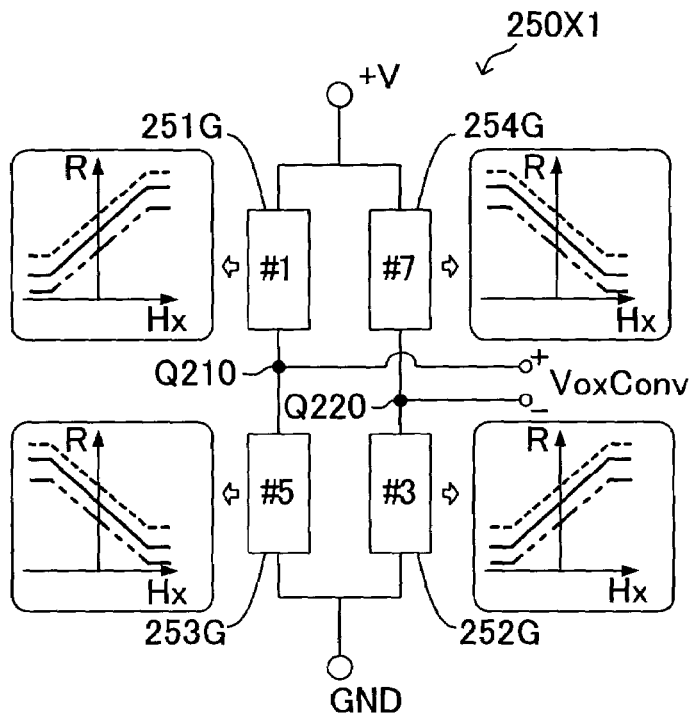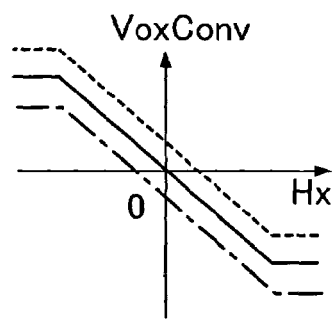
FIG.71A
FIG.71B
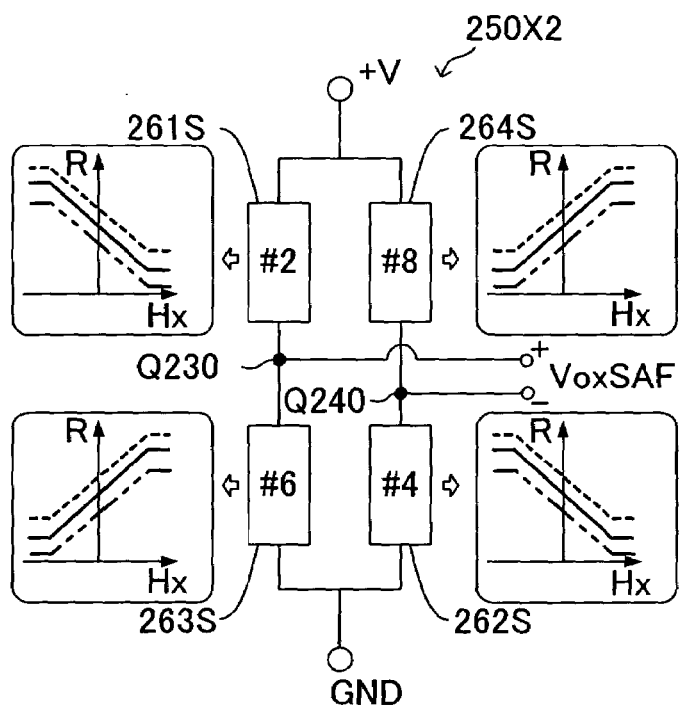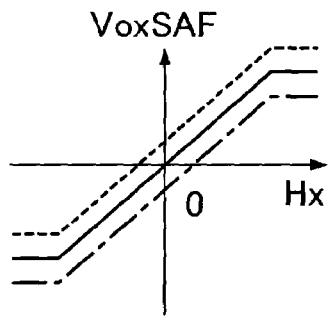
FIG.72A
FIG.72B

⇨ ;INITIAL MAGNETIZATION DIRECTION OF FREE LAYER
➔ ;FIXED MAGNETIZATION DIRECTION OF PINNED LAYER
(ANTIPARALLEL TO MAGNETIC-FIELD-DETECTING DIRECTION)

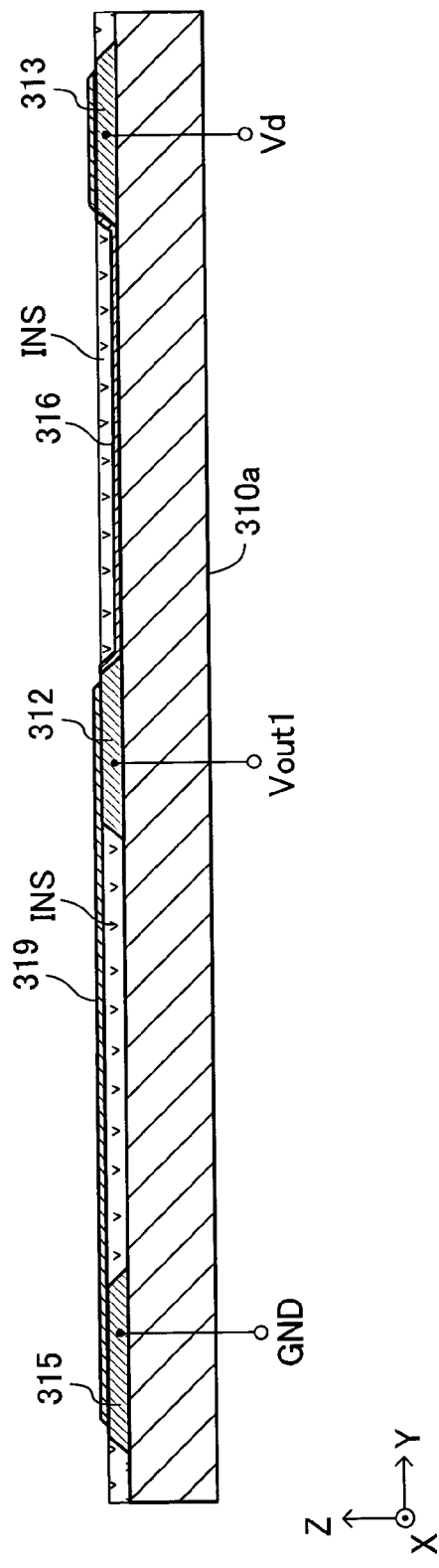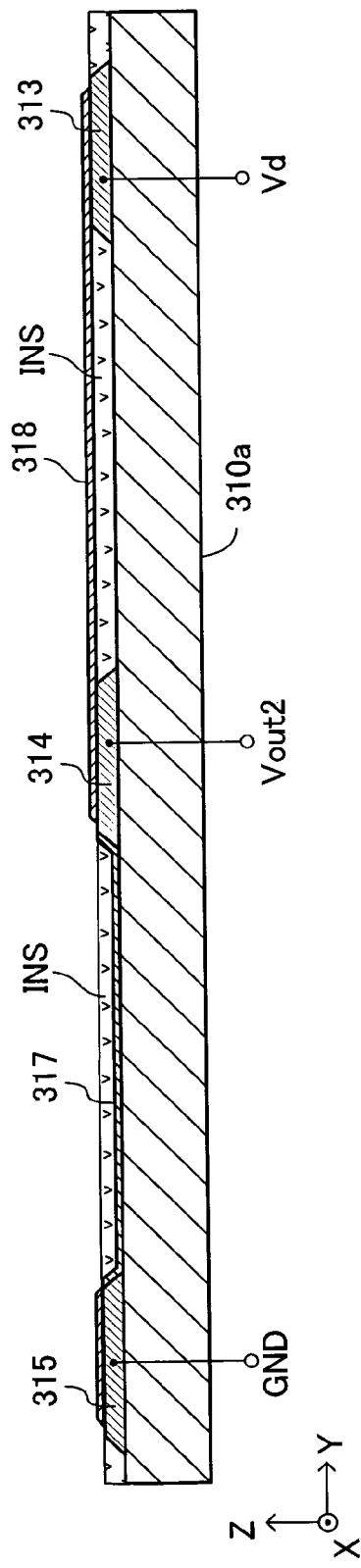

MAGNETIC SENSOR USING GIANT MAGNETORESISTIVE ELEMENTS AND METHOD FOR MANUFACTURING THE SAME

BACKGROUND OF THE INVENTION

1. Field of the Invention

The present invention relates to a magnetic sensor including giant magnetoresistive elements and a method for manufacturing the same.

2. Description of the Related Art

A generally known giant magnetoresistive element comprises a spin-valve film including a fixed magnetization layer, a free layer whose magnetization direction is changed in response to an external magnetic field, and a nonmagnetic conductive spacer layer. The fixed magnetization layer includes a pinned layer and a pinning layer for fixing the magnetization direction of the pinned layer, and the spacer layer is disposed between the pinned layer and the free layer. Since the pinned layer of the fixed magnetization layer comprises a single ferromagnetic layer (for example, a CoFe layer), the fixed magnetization layer is hereinafter referred to as the "single-layer-pinned fixed magnetization layer" and the spin-valve films including the single-layer-pinned fixed magnetization layer is hereinafter referred to as the "single-layer-pinned spin-valve film", for the sake of convenience. A giant magnetoresistive element including the single-layer-pinned fixed magnetization layer is hereinafter referred to as a "conventional GMR element".

The resistance of the conventional GMR element varies depending on the angle formed by the magnetization directions of the pinned layer and the free layer. Specifically, the resistance of the element varies in response to the component of an external magnetic field along the magnetization direction of the pinned layer. Therefore, the element detects magnetic fields in the direction along the fixed magnetization direction of the pinned layer (more properly, the direction antiparallel to the magnetization direction of the pinned layer). In order to fix the magnetization direction of the pinned layer, magnetic field heat treatment is performed in which, for example, a composite film including a ferromagnetic layer intended to act as the pinned layer and an antiferromagnetic layer intended to act as the pinning layer is heat-treated at a high temperature while a magnetic field oriented in a predetermined direction is applied to the composite film.

As shown in FIG. 45A, a magnetic sensor using the conventional GMR element generally includes two conventional GMR elements 101 and 102 detecting a magnetic field in a predetermined direction and another two conventional GMR elements 103 and 104 detecting a magnetic field in the direction antiparallel to the predetermine direction. These GMR elements are connected in a full-bridge configuration so as to output the potential difference V between the points shown in the figure. FIG. 45B shows the output V of the magnetic sensor shown in FIG. 45A in response to an external magnetic field H in its magnetic-field-detecting direction.

This bridge configuration allows the known magnetic sensor to produce high output even for a small magnetic field. In the known magnetic sensor, the temperatures of the GMR elements vary evenly, and the resistances of the GMR elements vary evenly, accordingly. For example, if the temperature of a GMR element increases, the temperatures of the other GMR elements increase evenly and thus the resistances of all the GMR elements varies evenly. Thus, the output V is not easily affected by the changes in temperature of the GMR elements, and the magnetic sensor can accurately detect external magnetic fields even if the temperatures of the GMR elements are varied (as disclosed in, for example, Japanese Unexamined Patent Application Publication No. 2004-163419).

The magnetization direction of the pinned layer, which determines the magnetic-field-detecting direction, is the same as the direction of a magnetic field applied to the layers which will become the fixed magnetization layer during the magnetic field heat treatment. In order to form a plurality of conventional GMR elements detecting magnetic fields in antiparallel directions for use in the bridge configuration, antiparallel magnetic fields must be applied to a substrate having a plurality of films which will become the conventional GMR elements. Furthermore, for a magnetic sensor capable of detecting the components of a magnetic field along two perpendicular directions (for example, X-axis and Y-axis directions), conventional GMR elements detecting components of a magnetic field in the positive X-axis direction, positive Y-axis direction, negative X-axis direction, and negative Y-axis direction are provided on a very small substrate. Thus, magnetic fields oriented in these four directions must be applied to the substrate having films which will become the conventional GMR elements during the magnetic field heat treatment. However, it is difficult to generate such magnetic fields oriented in different directions from one another in a small area.

The above-cited Japanese Unexamined Patent Application Publication No. 2004-163419 has disclosed a method for manufacturing a magnetic sensor, using the following sensor structure and magnet array. Specifically, films which will become four pairs (eight in total) of conventional GMR elements 101 to 108 are formed in the vicinities of the four edges of a substantially square substrate 100a, as shown in the plan view in FIG. 46.

The magnet array includes rectangular solid permanent magnets arrayed in a tetragonal lattice manner. The permanent magnets are arrayed in such a manner that their end surfaces on one side are present in substantially the same plane and the end surfaces of any two adjacent permanent magnets have magnetic polarities opposite to each other. FIG. 47 is a perspective view of some of permanent magnets 110 in the magnet array. FIG. 47 shows that the upper side of the magnet array and magnetic fields generated by the magnets in four directions from an N pole to S poles.

For performing the magnetic field heat treatment, the substrate 100a having the films which will become the conventional GMR elements is disposed over the upper side of the magnet array. The magnetic fields in the four directions generated from the upper side of the magnet array are applied, for heat treatment, to the films which will become the conventional GMR elements, as shown in FIG. 48. A magnetic sensor 100 shown in FIG. 46 is thus produced.

The conventional GMR elements 101 to 104 of the magnetic sensor 100 detect the component of a magnetic field along the X-axis direction. The magnetization directions of the pinned layers of the conventional GMR elements 101 and 102 are fixed in the negative X-axis direction. The magnetization directions of the pinned layers of the conventional GMR elements 103 and 104 are fixed in the positive X-axis direction. In general, the conventional GMR elements 101 to 104 are connected in a full-bridge configuration, as shown in FIG. 45, to form an X-axis magnetic sensor for detecting magnetic fields in the X-axis directions.

The conventional GMR elements 105 to 108 detect the component of a magnetic field along the Y-axis direction. The magnetization directions of the pinned layers of the conventional GMR elements 105 and 106 are fixed in the positive Y-axis direction. The magnetization directions of the pinned layers of the conventional GMR elements 107 and 108 are fixed in the negative Y-axis direction. The conventional GMR elements 105 to 108 are connected in the same full-bridge configuration as the conventional GMR elements 101 to 104, and thus form a Y-axis magnetic sensor for detecting magnetic fields in the Y-axis directions.

In such perpendicular bidirectional (detecting) magnetic sensor, the conventional GMR elements are disposed in the vicinities of the four edges of the substrate 100a, and accordingly it is difficult to miniaturize the magnetic sensor (chip) sufficiently.

In a magnetic sensor in which the conventional GMR elements are arranged with long distances, the conventional GMR elements are unevenly deformed by stresses unevenly put thereon if the substrate 100a or a resin coating or the like covering the substrate 100a is deformed by heat, external stresses, and so forth. Consequently, the resistances of the conventional GMR elements connected in a bridge configuration are individually varied, and thus the bridge circuit of the magnetic sensor becomes imbalance. As a result, the magnetic sensor 100 cannot accurately detect magnetic fields.

Furthermore, since the distance between the conventional GMR elements in the magnetic sensor is long, the lengths of wires forming the full-bridge configuration are increased, and accordingly losses due to the resistance of the wires are increased.

SUMMARY OF THE INVENTION

The present invention provides a magnetic sensor having a first giant magnetoresistive element including a single-layer-pinned fixed magnetization layer and a second giant magnetoresistive element including a plural-layer-pinned fixed magnetization layer on a single substrate.

The first giant magnetoresistive element is defined by a single-layer-pinned spin-valve film including a single-layer-pinned fixed magnetization layer, a free layer whose magnetization direction changes in response to an external magnetic field, and a spacer layer made of a nonmagnetic conductive material. The single-layer-pinned fixed magnetization layer includes a single ferromagnetic layer and a pinning layer, and the space layer is disposed between the ferromagnetic layer and the free layer. The magnetization of the ferromagnetic layer is fixed in a first direction (for example, positive X-axis direction) by the pinning layer, so that the ferromagnetic layer serves as a pinned layer.

The second giant magnetoresistive element is defined by a plural-layer-pinned spin-valve film including a plural-layer-pinned fixed magnetization layer, a free layer whose magnetization direction changes in response to an external magnetic field, and a spacer layer made of a nonmagnetic conductive material. The plural-layer-pinned fixed magnetization layer includes a first ferromagnetic layer, an exchange coupling layer adjoining the first ferromagnetic layer, a second ferromagnetic layer adjoining the exchange coupling layer, and a pinning layer adjoining the second ferromagnetic layer. The space layer is disposed between the first ferromagnetic layer and the free layer. The magnetization direction of the second ferromagnetic layer is fixed by the pinning layer, and the magnetization direction of the first ferromagnetic layer is fixed in a second direction antiparallel to the first direction (for example, negative X-axis direction) by exchange coupling of the first ferromagnetic layer and the second ferromagnetic layer with the exchange coupling layer therebetween. Thus, the first ferromagnetic layer serves as a pinned layer.

The fixed magnetization direction of the pinned layer of the first giant magnetoresistive element (first direction) is 180° different from (antiparallel to) the fixed magnetization direction of the pinned layer of the second giant magnetoresistive element (second direction).

The substrate having the single-layer-pinned spin-valve film intended to act as the first giant magnetoresistive element and the plural-layer-pinned spin-valve film intended to act as the second giant magnetoresistive element is subjected to magnetic field heat treatment. Specifically, a magnetic field oriented in a single direction is applied to these two films at a high temperature. Consequently, the magnetization of the ferromagnetic layer, intended to act as the pinned layer, of the single-layer-pinned spin-valve film and the magnetization of the second ferromagnetic layer of the plural-layer-pinned spin-valve film are fixed in the same direction. At the same time, the first ferromagnetic layer, intended to act as the pinned layer, of the plural-layer-pinned spin-valve film is exchange-coupled with the second ferromagnetic layer with the exchange coupling layer therebetween, so that the magnetization of the first ferromagnetic layer is fixed in the direction antiparallel to the magnetization direction of the second ferromagnetic layer. Thus, the magnetization of the pinned layer (ferromagnetic layer) of the first giant magnetoresistive element and the magnetization of the pinned layer (first ferromagnetic layer) of the second giant magnetoresistive element are fixed in antiparallel directions to each other.

The first giant magnetoresistive element and the second giant magnetoresistive element each detect magnetic fields in a direction antiparallel to the fixed magnetization direction of their respective pinned layers; hence, these two elements detect magnetic fields in antiparallel directions (see FIG. 14).

Accordingly, the magnetic sensor of the present invention does not require that two giant magnetoresistive elements be disposed with a long interval in order to apply both a first magnetic field and a second magnetic field whose direction is different from a direction of the first magnetic field by 180° to the giant magnetoresistive elements, unlike the known magnetic sensor. That is, the magnetic sensor of the present invention can be manufactured by applying a magnetic field oriented in a single direction to two types of films formed on the substrate: one being intended to act as the first giant magnetoresistive element and the other being intended to act as the second giant magnetoresistive element. Therefore, in the magnetic sensor of the present invention, the two types of giant magnetoresistive element (the first giant magnetoresistive element and the second giant magnetoresistive element), having 180° different magnetic-field-detecting directions can be disposed close to each other. Consequently, the magnetic sensor can be very small.

Preferably, the first giant magnetoresistive element(s) and the second giant magnetoresistive element(s) are connected in a bridge configuration to form a circuit producing an output according to a potential at a predetermined point of the circuit that monotonically increases or decreases as the intensity of the component in the first direction of a magnetic field applied to the magnetic sensor increases.

The circuit may be a half-bridge circuit or a full-bridge circuit. The circuit may include a fixed resistor, in addition to the first giant magnetoresistive element and the second giant magnetoresistive element.

The magnetic sensor may include two first giant magnetoresistive elements and two second giant magnetoresistive elements, and these elements are connected to form a full-bridge circuit.

Specifically, in the full-bridge circuit, an end of one of the two first giant magnetoresistive elements is connected to an end of one of the two second giant magnetoresistive elements to form a first sub-circuit. A first potential is applied to the other end of the first giant magnetoresistive element of the first sub-circuit, and a second potential different from the first potential is applied to the other end of the second giant magnetoresistive element of the first sub-circuit.

In addition, an end of the other first giant magnetoresistive element is connected to an end of the other second giant magnetoresistive element to form a second sub-circuit. The first potential is applied to the other end of the second giant magnetoresistive element in the second sub-circuit, and the second potential is applied to the other end of the first giant magnetoresistive element in the second sub-circuit.

In this configuration, the magnetic sensor outputs a difference in potential between the junction of the first giant magnetoresistive element with the second giant magnetoresistive element in the first sub-circuit and the junction of the first giant magnetoresistive element with the second giant magnetoresistive element in the second sub-circuit.

The full-bridge configuration needs two pairs of giant magnetoresistive elements, the magnetoresistive elements in each of the pairs having antiparallel magnetic-field-detecting directions. As explained, since the first giant magnetoresistive element and the second giant magnetoresistive element, which detect magnetic fields in antiparallel directions, can be readily disposed in a small area on a single substrate, two pairs of the first giant magnetoresistive element and the second giant magnetoresistive element can be readily disposed in a small area on the substrate. Accordingly, the present invention can achieve a down-sized magnetic sensor having a full-bridge circuit and exhibiting superior temperature characteristics.

Since these two types of giant magnetoresistive elements can be disposed in a small area on a single substrate, stress (for example, tensile stress or compressive stress) is almost uniformly and evenly placed (put) on these giant magnetoresistive elements, even if the substrate or resin coating or the like covering the substrate and other layers is deformed by heat or external stress. Thus, the resistances of the giant magnetoresistive elements evenly increase or decrease, and the possibility of losing the balance of the full-bridge circuit can be reduced. Accordingly, the magnetic sensor can accurately detect magnetic fields.

The magnetic sensor may further include a third giant magnetoresistive element is defined by the single-layer-pinned spin-valve film formed on the substrate, and a fourth giant magnetoresistive element is defined by the plural-layer-pinned spin-valve film formed on the substrate. The magnetization of the ferromagnetic layer in the third giant magnetoresistive element is fixed in a third direction perpendicular to the first direction, and the magnetization of the first ferromagnetic layer in the fourth giant magnetoresistive element is fixed in a fourth direction antiparallel to the third direction.

This structure allows the magnetic sensor to detect the components (magnetism) of a magnetic field along two perpendicular directions. This type of magnetic sensor may be referred to as a "perpendicular bidirectional magnetic sensor". Since the third giant magnetoresistive element and the fourth giant magnetoresistive element can be disposed in a small area on the substrate, as in the case of the first giant magnetoresistive element and the second giant magnetoresistive element, the perpendicular bidirectional magnetic sensor can be small.

In the perpendicular bidirectional magnetic sensor, the first giant magnetoresistive element and the second giant magnetoresistive element are connected in a bridge configuration to form a circuit producing a first output according to a potential at a predetermined point of the circuit that monotonically increases or decreases as the intensity of a component in the first direction of a magnetic field applied to the magnetic sensor increases. Also, the third giant magnetoresistive element and the fourth giant magnetoresistive element are connected in a bridge configuration to form a circuit producing a second output according to a potential at a predetermined point of the circuit that monotonically increases or decreases as the intensity of a component in the third direction of the magnetic field applied to the magnetic sensor increases.

These bridge configurations may leads to half-bridge circuits or full-bridge circuits. These circuits may each include a fixed resistor, in addition to the first and second giant magnetoresistive elements, or the third and fourth giant magnetoresistive elements.

The perpendicular bidirectional magnetic sensor may include two first giant magnetoresistive elements, two second giant magnetoresistive element, two third giant magnetoresistive elements, and two fourth giant magnetoresistive elements. The two first giant magnetoresistive elements and the two second giant magnetoresistive element are connected in a full-bridge configuration including a first sub-circuit and a second sub-circuit. The two third giant magnetoresistive elements and the two fourth giant magnetoresistive elements are connected in another full-bridge configuration including a third sub-circuit and a fourth sub-circuit.

This structure can achieve a perpendicular bidirectional magnetic sensor including two full-bridge circuits and exhibiting superior temperature characteristics. In addition, the two third giant magnetoresistive elements and the two fourth giant magnetoresistive elements, as well as the two first giant magnetoresistive elements and the two second giant magnetoresistive element, can be disposed in a small area on the substrate. Accordingly, the perpendicular bidirectional magnetic sensor can be small.

Since the giant magnetoresistive elements forming a bridge circuit can be disposed in a small area on a single substrate, stress (for example, tensile stress or compressive stress) is almost uniformly placed on these giant magnetoresistive elements, even if the substrate or a resin coating or the like covering the substrate and other layers is deformed. The resistances of these giant magnetoresistive elements therefore evenly increase or decrease, and the possibility of losing the balance of the full-bridge circuit can be reduced. Thus, the perpendicular bidirectional magnetic sensor can accurately detect each of the components of a magnetic field along two perpendicular directions. In this magnetic sensor, a first potential and a second potential different from the first potential may be respectively applied to the ends of one of the full-bridge circuits, and a third potential and a fourth potential different from the third potential may be respectively applied to the ends of the other full-bridge circuit. In this instance, the first potential and the third potential may be the same, and the second potential and the fourth potential may be the same.

The magnetic sensor of the present invention may include four giant magnetoresistive elements formed on the substrate, each including (defined by) the single-layer-pinned spin-valve film, and four giant magnetoresistive elements formed on the substrate, each including (defined by) the plural-layer-pinned spin-valve film. The four giant magnetoresistive elements of the single-layer-pinned spin-valve film are connected in a full-bridge configuration to form a circuit used for detecting magnetic fields in a predetermined direction. The four giant magnetoresistive elements of the plural-layer-pinned spin-valve film are connected in a full-bridge configuration to form another circuit used for detecting magnetic fields in the predetermined direction. By use of outputs from these two circuits, the magnetic sensor can produce outputs affected as little as possible by stress placed on the elements.

To facilitate understanding, this form will be described in detail below with reference to FIGS. 30 to 34. Specifically, in the magnetic sensor in this form, the number of the first giant magnetoresistive element is two (51G, 52G), and the number of the second giant magnetoresistive element is two (61S, 62S). The two first giant magnetoresistive elements and the two second giant magnetoresistive elements are disposed close to each other in a first region.

The magnetic sensor further includes two fifth giant magnetoresistive elements (53G, 54G) each including (defined by) the single-layer-pinned spin-valve film on the substrate, and two sixth giant magnetoresistive elements (63S, 64S) each including (defined by) the plural-layer-pinned spin-valve film on the substrate. The magnetization of the ferromagnetic layer in each fifth giant magnetoresistive element is fixed in the second direction. The magnetization of the first ferromagnetic layer in each sixth giant magnetoresistive element is fixed in the first direction. The two fifth giant magnetoresistive elements and the two sixth giant magnetoresistive elements are disposed close to each other in a second region apart from the first region.

As shown in FIG. 32A, in the magnetic sensor, an end of one element (51G) of the two first giant magnetoresistive elements is connected to an end of one element (53G) of the two fifth giant magnetoresistive elements to form a fifth sub-circuit, and an end of the other first giant magnetoresistive element (52G) is connected to an end of the other fifth giant magnetoresistive element (54G) in series to form a sixth sub-circuit. A first potential (+V) is applied to the other end of the first giant magnetoresistive element (51G) of the fifth sub-circuit and the other end of the fifth giant magnetoresistive element (54G) of the sixth sub-circuit, and a second potential (GND) different from the first potential is applied to the other end of the fifth giant magnetoresistive element (53G) of the fifth sub-circuit and the other end of the first giant magnetoresistive element (52G) of the sixth sub-circuit. The thus formed circuit outputs the potential difference VoxConv between the junction (Q10) of the first giant magnetoresistive element (51G) with fifth giant magnetoresistive element (53G) in the fifth sub-circuit and the junction (Q20) of the first giant magnetoresistive element (52G) with the fifth giant magnetoresistive element (54G) in the sixth sub-circuit. This potential difference VoxConv is defined as a conventional GMR element output.

Also, as shown in FIG. 33A, an end of one element (61S) of the two second giant magnetoresistive elements is connected to an end of one element (63S) of the two sixth giant magnetoresistive elements to form a seventh sub-circuit, and an end of the other second giant magnetoresistive element (62S) is connected to an end of the other sixth giant magnetoresistive element (64S) in series to form an eighth sub-circuit. A third potential (which may be the same as the first potential +V) is applied to the other end of the second giant magnetoresistive element (61S) of the seventh sub-circuit and the other end of the sixth giant magnetoresistive element (64S) of the eighth sub-circuit, and a fourth potential (which may be the same as the second potential, GND) different from the third potential is applied to the other end of the sixth giant magnetoresistive element (63S) of the seventh sub-circuit and the other end of the second giant magnetoresistive element (62S) of the eighth sub-circuit. The thus formed circuit outputs the potential difference VoxSAF between the junction (Q30) of the second giant magnetoresistive element (61S) with the sixth giant magnetoresistive element (63S) in the seventh sub-circuit and the junction (Q40) of the second giant magnetoresistive element (62S) with the sixth giant magnetoresistive element (64S) in the eighth sub-circuit. This potential difference VoxSAF is defined as a SAF element output.

As shown in FIG. 31, the magnetic sensor produces an output according to the conventional GMR element output VoxConv and the SAF element output VoxSAF. The output according to the conventional GMR element output and the SAF element output may be the potential difference between the conventional GMR element output and the SAF element output, the ratio of these two outputs, or other values.

For the sake of convenience of the description, it is assumed that the positive direction of the directions in which a magnetic field is to be detected is antiparallel to the first direction, that the conventional GMR element output VoxConv is a difference obtained by subtracting the potential at the junction Q20 from the potential at the junction Q10, and that the SAF element output VoxSAF is a difference obtained by subtracting the potential at the junction Q40 from the potential at the junction Q30. In addition, it is assumed that the magnetic sensor outputs a difference obtained by subtracting the conventional GMR element output VoxConv from the SAF element output VoxSAF, as shown in FIG. 31.

In this instance, as the intensity of a magnetic field to be detected increases, the conventional GMR element output VoxConv decreases as shown in FIG. 32B and the SAF element output VoxSAF increases as shown in FIG. 33B. Consequently, the output Vox of the magnetic sensor increases as the intensity of the magnetic field increases, as shown in FIG. 34.

In the magnetic sensor, a stress (for example, tensile stress or compressive stress) is uniformly placed on the first giant magnetoresistive elements (51G, 52G) and second giant magnetoresistive element (61S, 62S) in the first region. Also, a stress (for example, tensile stress or compressive stress) is uniformly placed on the fifth giant magnetoresistive elements (53G, 54G) and sixth giant magnetoresistive element (63S, 64S) in the second region.

If a compressive stress is placed on the elements in the first region and a tensile stress is placed on the elements in the second region while the magnetic field to be detected is not changed, the resistances of the elements (51G, 52G, 61S, 62S) in the first region reduce evenly and the resistances of the elements (53G, 54G, 63S, 64S) in the second region increase evenly. Thus, the potentials at the junctions Q10 and Q30 increase and the potentials at the junctions Q20 and Q40 decrease.

Consequently, the SAF element output VoxSAF and the conventional GMR element output VoxConv increase together, and thus the output of the magnetic sensor hardly varies.

If a tensile stress is placed on the elements in the first region and a compressive stress is placed on the elements in the second region, the resistances of the elements (51G, 52G, 61S, 62S) in the first region increase evenly and the resistances of the elements (53G, 54G, 63S, 64S) in the second region reduce evenly. Thus, the potentials at the junctions Q10 and Q30 decrease and the potentials at the junctions Q20 and Q40 increase.

Consequently, the SAF element output VoxSAF and the conventional GMR element output VoxConv decrease together, and thus the output of the magnetic sensor hardly varies.

Furthermore, if a tensile stress is placed on all the elements, the resistances of the elements in the first region and the second region all increase evenly. Thus, the potentials at the junctions from Q10 to Q40 hardly vary. Consequently, the SAF element output VoxSAF and the conventional GMR element output VoxConv hardly vary, and thus the output of the magnetic sensor, that is, the difference of those two outputs, hardly varies. If a compressive stress is placed on all the elements, the potentials at the junctions from Q10 to Q40 hardly vary, and thus output of the magnetic sensor hardly varies.

As described above with the exemplification, the magnetic sensor can produce a substantially constant output even if the stress placed on each of the elements is different each other, as long as the external magnetic field remains unchanged. Thus, the magnetic sensor can accurately detect magnetic fields.

The magnetic sensor of the present invention may include a plurality of first giant magnetoresistive elements (each having the single-layer-pinned fixed magnetization layer) and the same number of the second giant magnetoresistive elements (each having the plural-layer-pinned fixed magnetization layer) as the number of the first giant magnetoresistive elements. The first giant magnetoresistive elements and the second giant magnetoresistive elements are alternately arranged in parallel with each other in a predetermined direction of the substrate. The first giant magnetoresistive elements are connected in series to form a giant magnetoresistive element, and the second giant magnetoresistive elements are connected in series to form another giant magnetoresistive element.

As described above, since the magnetic sensor of the present invention can be small, the difference among stresses placed on the giant magnetoresistive elements on the substrate can be small. But, it is inferred that the stress produced by deformation of the substrate or a resin coating and placed on the elements on the substrate gradually varies along the surface of the substrate. Thus, as the arrangement described above, by alternately arranging the first giant magnetoresistive elements and the second giant magnetoresistive elements along a predetermined direction on the substrate, and connecting the first giant magnetoresistive elements in serried to form a giant magnetoresistive element (first element), and connecting the second giant magnetoresistive elements in series to form another giant magnetoresistive element (second element), stresses of similar magnitudes (having similar averages) can be placed on the first element and the second element. Accordingly, the variations in resistance resulting from the stresses on the first element and the second element become close to each other. Therefore, by connecting the first and the second element in a bridge configuration to form a circuit, the output of the magnetic sensor is less affected by stress.

The magnetic sensor of the present invention may include four of said first giant magnetoresistive elements and four of said second giant magnetoresistive elements. Two of the four first giant magnetoresistive elements lie adjacent to each other and form a first group, and the other two of the four first giant magnetoresistive elements lie adjacent to each other and form a second group. Two of the four second giant magnetoresistive elements lie adjacent to each other and form a third group, and the other two of the four second giant magnetoresistive elements lie adjacent to each other and form a fourth group. The first to fourth groups are arranged in parallel in a predetermined direction on the substrate in an order of the first group, the third group, the second group, and the fourth group, or in an order of the third group, the first group, the fourth group, and the second group.

Two of the first giant magnetoresistive elements which are unadjacent each other are connected to form an element (third element) composed of the first giant magnetoresistive elements and the rest two of the first giant magnetoresistive elements which are unadjacent each other are connected to form an element (fourth element) composed of the first giant magnetoresistive elements. In other words, two pairs of unadjacent first giant magnetoresistive elements are respectively connected to define two elements (third element, fourth element) composed of the first giant magnetoresistive elements.

Further, Two of the second giant magnetoresistive elements which are unadjacent each other are connected to form an element (third element) composed of the second giant magnetoresistive elements and the rest two of the second giant magnetoresistive elements which are unadjacent each other are connected to form an element (fourth element) composed of the second giant magnetoresistive elements. In other words, two pairs of unadjacent second giant magnetoresistive elements are respectively connected to define two elements (fifth element, sixth element) composed of the second giant magnetoresistive elements.

This structure can allow the third to sixth elements to receive stresses having still closer magnitudes. Thus, the variations in resistance of the third to sixth elements due to stress can be close. Accordingly, by connecting these third to sixth elements in a full-bridge configuration to form a magnetic sensor, the magnetic sensor can produce outputs still less affected by stress on the elements.

According to another aspect of the present invention, a method for manufacturing the magnetic sensor is provided. The method includes the film forming step of forming a film intended to act as the first giant magnetoresistive element and a film intended to act as the second giant magnetoresistive element on the substrate, and the magnetic field heat treatment step of applying a magnetic field oriented in a single direction to the films at a high-temperature (under a high-temperature atmosphere) to fix the magnetization direction of each pinned layer.

According to the magnetic field heat treatment, the magnetization direction of the pinned layer in the first giant magnetoresistive element and the magnetization direction of the pinned layer in the second giant magnetoresistive element are easily fixed so that these magnetization directions are antiparallel to each other. Thus, two giant magnetoresistive elements whose magnetic-field-detecting directions are antiparallel to each other can easily be manufactured on a single substrate.

Preferably, the magnetic field heat treatment step uses a magnetic field generated from a magnet array including a plurality of substantially rectangular solid permanent magnets, each having a substantially square end surface perpendicular to a central axis of each of the permanent magnet. The permanent magnets are arrayed at small intervals in such a manner that the barycenters of the end surfaces correspond to lattice points of a tetragonal lattice, and that a polarity of any one of the permanent magnets is opposite to a polarity of the other adjacent permanent magnets spaced by the shortest route (distance).

Preferably, the film forming step includes the sub steps of forming on the substrate a first composite layer which will become one of the first giant magnetoresistive element and the second giant magnetoresistive element (first film forming step), removing an unnecessary region of the first composite layer (first unnecessary region removing step), coating the first composite layer with an insulating layer after removing the unnecessary region (forming an insulating layer step), forming a second composite layer which will become the other film of the first giant magnetoresistive element and the second giant magnetoresistive element on the substrate and on the insulating layer (second film forming step); and removing an unnecessary region of the second composite layer (second unnecessary region removing step).

With the method above, a magnetic sensor having the first giant magnetoresistive element and the second giant magnetoresistive element on the single substrate is easily manufactured.

Alternatively, the film forming step may include the sub steps of forming (depositing) layers intended to act as the pinning layer, the second ferromagnetic layer, and the exchange coupling layer of the second giant magnetoresistive element in this order on the substrate to form a first pre-composite layer (first pre-composite layer forming step), removing completely the layer intended to act as the exchange coupling layer of the first pre-composite layer from a region in which the first giant magnetoresistive element is to be formed without removing the first pre-composite layer in a region that is to have the second giant magnetoresistive element (first exchange coupling layer removing step), and forming (depositing) a ferromagnetic layer having the same composition as the second ferromagnetic layer and layers intended to act as the spacer layer and the free layer of the first giant magnetoresistive element and the second giant magnetoresistive element, in this order, over the entire upper surface of the layers after the step of removing the layer intended to act as the exchange coupling layer (first additional layers forming step).

By the method above, a composite layer intended to act as the second giant magnetoresistive element including the first ferromagnetic layer and the second ferromagnetic layer with the exchange coupling layer therebetween is provided on one side, and another composite layer intended to act as the first giant magnetoresistive element including the ferromagnetic layer formed by two cycles of deposition in the fixed magnetization layer (or the pinned layer) is provided on the other side. Thus, a magnetic sensor having the first giant magnetoresistive element and the second giant magnetoresistive element on the single substrate is easily manufactured.

Alternatively, the film forming step may include the sub steps of forming (depositing) a layer intended to act as the free layer of the first and second giant magnetoresistive elements, a layer intended to act as the spacer layer of the first and second giant magnetoresistive elements, a layer intended to act as the first ferromagnetic layer of the second giant magnetoresistive element, a layer intended to act as the exchange coupling layer of the second giant magnetoresistive element, in this order, on the substrate to form a second pre-composite layer (second pre-composite layer forming step), removing the layer completely intended to act as the exchange coupling layer of the second pre-composite layer from a region on which the first giant magnetoresistive element is formed without removing the second pre-composite layer in a region that is to have the second giant magnetoresistive element (second exchange coupling layer removing step), and forming (depositing) a ferromagnetic layer having the same composition as the first ferromagnetic layer and a layer intended to act as the pinning layer of the first and the second giant magnetoresistive elements, in this order, over the entire upper surface of the layers after the step of removing the layer intended to act as the exchange coupling layer (second additional layers forming step).

By the method above, a composite layer intended to act as the second giant magnetoresistive element including the first ferromagnetic layer and the second ferromagnetic layer with the exchange coupling layer therebetween is provided on one side, and another composite layer intended to act as the first giant magnetoresistive element including the ferromagnetic layer formed by two cycles of deposition in the fixed magnetization layer (or the pinned layer) is provided on the other side. Thus, a magnetic sensor having the first giant magnetoresistive element and the second giant magnetoresistive element on the single substrate is easily manufactured.

According to another aspect of the present invention, a magnetic sensor is provided in which the first giant magnetoresistive element including the single-layer-pinned fixed magnetization layer and the second giant magnetoresistive element including the plural-layer-pinned fixed magnetization layer overlap each other (lie one over the other) on a single substrate.

Specifically, the first giant magnetoresistive element and the second giant magnetoresistive element are formed so as to overlap each other (lie one over the other) at a same position of the main surface of the substrate. Also, the fixed magnetization of the pinned layer of the first giant magnetoresistive element is oriented in the direction (i.e., the first direction) which is antiparallel to the direction (i.e., the second direction) of the fixed magnetization of the pinned layer of the second giant magnetoresistive element.

Accordingly, the magnetic sensor also does not require that two giant magnetoresistive elements be disposed with a long interval in order to apply both a first magnetic field and a second magnetic field whose direction is different from a direction of the first magnetic field by 180° to the giant magnetoresistive elements, unlike the known magnetic sensor. That is, the magnetic sensor can be manufactured by applying a magnetic field oriented in a single direction to two types of films formed on the substrate in such a manner that those two types of films overlap each other: one being intended to act as the first giant magnetoresistive element and the other being intended to act as the second giant magnetoresistive element. Therefore, in the magnetic sensor of the present invention, the two types of giant magnetoresistive element (i.e., the first giant magnetoresistive element and the second giant magnetoresistive element), having 180° different magnetic-field-detecting directions can be disposed close. Consequently, the magnetic sensor can be very small.

By disposing the first giant magnetoresistive element and the second giant magnetoresistive element so as to lie one over the other, stress (tensile stress or compressive stress) is substantially uniformly placed on these giant magnetoresistive elements, even if the substrate or resin coating covering the substrate is deformed by heat or external stress and the like. As a result, even when such stresses are placed on both elements, the resistances of the elements vary evenly (the resistances of the elements change by almost the same amount). Thus, by adopting a configuration (for example, a bridge circuit), in which the difference in resistances of the both elements is extracted, for the magnetic sensor, the resulting magnetic sensor may not be affected by such stresses.

The magnetic sensor may further includes a third giant magnetoresistive element defined by the single-layer-pinned spin-valve film disposed on the substrate, and a fourth giant magnetoresistive element defined by the plural-layer-pinned spin-valve film which is disposed on the substrate so as to lap over or under the third giant magnetoresistive element. The magnetization of the ferromagnetic layer in the third giant magnetoresistive element is fixed in a third direction perpendicular to the first direction, and the magnetization of the first ferromagnetic layer in the fourth giant magnetoresistive element is fixed in a fourth direction antiparallel to the third direction.

This structure allows the magnetic sensor to detect the components (magnetism) of a magnetic field along two perpendicular directions; hence, a perpendicular bidirectional magnetic sensor is achieved. Since the third giant magnetoresistive element and the fourth giant magnetoresistive element can be disposed in a small area on the substrate, as in the case of the first giant magnetoresistive element and the second giant magnetoresistive element, the perpendicular bidirectional magnetic sensor can be small.

According to another aspect of the present invention, a method for manufacturing the magnetic sensor described above is also provided. Specifically, the method includes the film forming step of forming a film intended to act as the first giant magnetoresistive element and a film intended to act as the second giant magnetoresistive element on the substrate such that one of the films overlap the other film, and the magnetic field heat treatment step of applying a magnetic field oriented in a single direction to the films at a high-temperature to fix the magnetization direction of each pinned layer.

According to the magnetic field heat treatment, the magnetization direction of the pinned layer in the first giant magnetoresistive element and the magnetization direction of the pinned layer in the second giant magnetoresistive element are easily fixed so that these magnetization directions are antiparallel to each other. Thus, two giant magnetoresistive elements whose magnetic-field-detecting directions are antiparallel to each other can easily be manufactured on a single substrate.

Preferably, the magnetic field heat treatment step uses a magnetic field generated from a magnet array including a plurality of substantially rectangular solid permanent magnets, each having substantially square end surfaces perpendicular to a central axis of the permanent magnet. The permanent magnets are arrayed at small intervals in such a manner that the barycenters of the end surfaces correspond to lattice points of a tetragonal lattice, and that a polarity of any one of the permanent magnets is opposite to a polarity of the other adjacent permanent magnets spaced by the shortest route (distance).

Preferably, the film forming step includes the sub steps of forming on the substrate a first composite layer which will become one of a film intended to act as the first giant magnetoresistive element and a film intended to act as the second giant magnetoresistive element (first film forming step), removing an unnecessary region (i.e., an unnecessary portion) of the first composite layer (first unnecessary region removing step), coating the first composite layer with an insulating layer after removing the unnecessary region (insulating layer forming step), forming a second composite layer which will become a file intended to act as the other film of the first giant magnetoresistive element and the second giant magnetoresistive element on the insulating layer (second film forming step), and removing an unnecessary region (i.e., an unnecessary portion) of the second composite layer.

With the method above, the magnetic sensor having the first giant magnetoresistive element and the second giant magnetoresistive element on a single substrate is easily manufactured.

According to another aspect of the present invention, a magnetic sensor of the present invention may include four giant magnetoresistive elements formed on the substrate each of which includes the single-layer-pinned spin-valve film, and four giant magnetoresistive elements formed on the substrate each of which includes the plural-layer-pinned spin-valve film, wherein the plural-layer-pinned spin-valve films respectively lap (lie) over or under the single-layer-pinned spin-valve films. The four giant magnetoresistive elements having the single-layer-pinned spin-valve films are connected in a full-bridge configuration to form a circuit using for detecting a magnetic field in a predetermined direction. The four giant magnetoresistive elements having the plural-layer-pinned spin-valve films are connected in a full-bridge configuration to form another circuit used for detecting the magnetic field in the predetermined direction. The magnetic sensor utilizes outputs from these two circuits to detect the magnetic field in the predetermined direction. The magnetic sensor thus configured can produce outputs affected as little as possible by stress placed on the elements.

To facilitate understanding, this form will be described in detail below with reference to FIGS. 69 to 75A and 75B. Specifically, in the magnetic sensor in this form, the first giant magnetoresistive element (251G) and the second giant magnetoresistive element (261S) overlap over or under the first giant magnetoresistive element (251G) define an eleventh element group, and the eleventh element group is disposed in an eleventh region on the substrate. Note that, in FIG. 69, two elements in each solid line circle (for example, the first giant magnetoresistive element 251G and the second giant magnetoresistive element 261S) overlap each other (i.e., lie one over the other) in the direction perpendicular to the main surface of the substrate 210a (i.e., Z-axis direction).

The magnetic sensor further includes a third giant magnetoresistive element (252G) defined by the single-layer-pinned spin-valve film, and a fourth giant magnetoresistive element (262S) defined by the plural-layer-pinned spin-valve film. The fourth giant magnetoresistive element (262S) laps over or under the third giant magnetoresistive element (252G) on the substrate. The magnetization of the ferromagnetic layer of the third giant magnetoresistive element is fixed in the first direction, and the magnetization of the first ferromagnetic layer of the fourth giant magnetoresistive element is fixed in the second direction. The third giant magnetoresistive element and the fourth giant magnetoresistive element define a twelfth element group, and the twelfth element group is disposed close to the eleventh element group in the eleventh region.

The magnetic sensor still further includes a fifth giant magnetoresistive element (253G) defined by the single-layer-pinned spin-valve film and in which the magnetization of the ferromagnetic layer is fixed in the second direction, a sixth giant magnetoresistive element (263S) defined by the plural-layer-pinned spin-valve film which laps over or under the fifth giant magnetoresistive element on the substrate and in which the magnetization of the first ferromagnetic layer is fixed in the first direction, a seventh giant magnetoresistive element (254G) defined by the single-layer-pinned spin-valve film and in which the magnetization of the ferromagnetic layer is fixed in the second direction, and an eighth giant magnetoresistive element (246S) defined by the plural-layer-pinned spin-valve film which laps over or under the seventh giant magnetoresistive element on the substrate and in which the magnetization of the first ferromagnetic layer is fixed in the first direction. The fifth giant magnetoresistive element (253G) and the sixth giant magnetoresistive element (263S) define a thirteenth element group and the thirteenth element group is disposed in a twelfth region on the substrate, apart from the eleventh region. The seven giant magnetoresistive element (254G) and the eighth giant magnetoresistive element (264S) define a fourteenth element group and the fourteenth element group is disposed close to the thirteenth element group in the twelfth region.

As shown in FIG. 71A, in the magnet sensor, an end of the first giant magnetoresistive element (251G) is connected to an end of the fifth giant magnetoresistive element (253G) to form a first sub-circuit, and an end of the third giant magnetoresistive element (252G) is connected to an end of the seventh giant magnetoresistive element (254G) to form a second sub-circuit. A first potential (+V) is applied to the other end of the first giant magnetoresistive element (251G) and the other end of the seventh giant magnetoresistive element (254G), and a second potential (GND) different from the first potential is applied to the other end of the third giant magnetoresistive element (252G) and the other end of the fifth giant magnetoresistive element (253G). The magnet sensor is configured so as to output the potential difference VoxConv between the junction (Q210) of the first giant magnetoresistive element (251G) with the fifth giant magnetoresistive element (253G) and the junction (Q220) of the third giant magnetoresistive element (252G) with the seventh giant magnetoresistive element (254G). This potential difference VoxConv is defined as a conventional GMR element output.

Also, as shown in FIG. 72A, an end of the second giant magnetoresistive element (261S) is connected to an end of the sixth giant magnetoresistive element (263S) to form a third sub-circuit, and an end of the fourth giant magnetoresistive element (262S) is connected to an end of the eighth giant magnetoresistive element (264S) to form a fourth sub-circuit. A third potential (may be the same as the first potential +V) is applied to the other end of the second giant magnetoresistive element (261S) and the other end of the eighth giant magnetoresistive element (264S), and a fourth potential (may be the same as the second potential GND) different from the third potential is applied to the other end of the fourth giant magnetoresistive element (262S) and the other end of the sixth giant magnetoresistive element (263S). The magnet sensor is configured so as to output the potential difference VoxSAF between the junction (Q230) of the second giant magnetoresistive element (261S) with the sixth giant magnetoresistive element (263S) and the junction (Q240) of the fourth giant magnetoresistive element (262S) with the eighth giant magnetoresistive element (264S). This potential difference VoxSAF is defined as a SAF element output.

Further, as shown in FIG. 70, the magnetic sensor produces an output Vox according to the conventional GMR element output VoxConv and the SAF element output VoxSAF. The output according to the conventional GMR element output and the SAF element output may be the potential difference between the conventional GMR element output and the SAF element output, the ratio of these two outputs, or other values using these two outputs.

This magnetic sensor functions in the same manner as the foregoing magnetic sensor described with reference to FIGS. 30 to 34. For the sake of convenience of the description, it is assumed that the positive direction of the directions in which a magnetic field is to be detected is antiparallel to the first direction, that the conventional GMR element output VoxConv is a difference obtained by subtracting the potential at the junction Q220 from the potential at the junction Q210, and that the SAF element output VoxSAF is a difference obtained by subtracting the potential at the junction Q240 from the potential at the junction Q230. In addition, it is assumed that the magnetic sensor outputs a difference obtained by subtracting the conventional GMR element output VoxConv from the SAF element output VoxSAF.

In this instance, as the intensity of a magnetic field to be detected increases, the conventional GMR element output VoxConv decreases as shown in FIG. 71B and the SAF element output VoxSAF increases as shown in FIG. 72B. Consequently, the output Vox of the magnetic sensor increases as the intensity of the magnetic field increases, as shown in FIG. 73.

In the magnetic sensor, a stress (for example, tensile stress or compressive stress) is uniformly placed on the giant magnetoresistive elements (251G, 252G, 261S, 262S) in the eleventh region. Also, a stress is uniformly placed on the giant magnetoresistive elements (253G, 254G, 263S, 264S) in the twelfth region.

If a compressive stress is placed on the elements in the eleventh region and a tensile stress is placed on the elements in the twelfth region while the magnetic field to be detected is not changed, the resistances of the elements (251G, 252G, 261S, 262S) in the eleventh region reduce evenly and the resistances of the elements (253G, 254G, 263S, 264S) in the twelfth region increase evenly. Thus, the potentials at the junctions Q210 and Q230 increase and the potentials at the junctions Q220 and Q240 decrease.

Consequently, the SAF element output VoxSAF and the conventional GMR element output VoxConv increase together, and thus the output of the magnetic sensor hardly varies.

If a tensile stress is placed on the elements in the eleventh region and a compressive stress is placed on the elements in the twelfth region, the resistances of the elements (251G, 252G, 261S, 262S) in the eleventh region increase evenly and the resistances of the elements (253G, 254G, 263S, 264S) in the twelfth region reduce evenly. Thus, the potentials at the junctions Q210 and Q230 decrease and the potentials at the junctions Q220 and Q240 increase.

Consequently, the SAF element output VoxSAF and the conventional GMR element output VoxConv decrease together, and thus the output of the magnetic sensor hardly varies.

Furthermore, if a tensile stress is placed on all the elements, the resistances of the elements in the eleventh region and the twelfth region all increase evenly. Thus, the potentials at the junctions from Q210 to Q240 hardly vary. Consequently, the SAF element output VoxSAF and the conventional GMR element output VoxConv hardly vary, and thus the output of the magnetic sensor, that is, the difference of those two outputs, hardly varies. If a compressive stress is placed on all the elements, the potentials at the junctions from Q210 to Q240 also hardly vary, and thus output of the magnetic sensor hardly varies.

As described above with the exemplification, the magnetic sensor can produce a substantially constant output even if the stress placed on each of the elements is different each other, as long as the external magnetic field remains unchanged. Thus, the magnetic sensor can accurately detect magnetic fields.

According to another aspect of the present invention, a magnetic sensor may include a first giant magnetoresistive element (first giant magnetoresistive element film) including the single-layer-pinned fixed magnetization layer, a second giant magnetoresistive element (second giant magnetoresistive element film) including the plural-layer-pinned fixed magnetization layer, and a plurality of bias magnet films for applying bias magnetic fields to the giant magnetoresistive elements, on a single substrate.

In the sensor, the first giant magnetoresistive element and the second giant magnetoresistive element are disposed close to each other on the substrate. The fixed magnetization direction (i.e., the first direction) of the pinned layer of the first giant magnetoresistive element is antiparallel to the fixed magnetization direction (i.e., the second direction) of the pinned layer of the second giant magnetoresistive element.

That is, the first direction is different from the second direction by 180°.

The magnetic sensor also does not require that two giant magnetoresistive elements be disposed with a long interval in order to apply both a first magnetic field and a second magnetic field whose direction is different from a direction of the first magnetic field by 180° to the giant magnetoresistive elements, unlike the known magnetic sensor. That is, the magnetic sensor can be manufactured by applying a magnetic field oriented in a single direction to two types of films formed on the substrate: one being intended to act as the first giant magnetoresistive element and the other being intended to act as the second giant magnetoresistive element. Therefore, in the magnetic sensor, the two types of giant magnetoresistive element (i.e., the first giant magnetoresistive element and the second giant magnetoresistive element), having 180° different magnetic-field-detecting directions can be disposed close. Consequently, the magnetic sensor can be very small.

The plurality of bias magnet films include a first bias magnet film disposed on the substrate so as to be in contact with an end of the first giant magnetoresistive element, a second bias magnet film disposed on the substrate so as to be in contact with an end of the second giant magnetoresistive element, and a third bias magnet film disposed on the substrate so as to be in contact with both the other end of the first giant magnetoresistive element and the other end of the second giant magnetoresistive element. The first bias magnet film applies to the first giant magnetoresistive element a bias magnetic field oriented in a third direction substantially perpendicular to the first direction. The second bias magnet film applies to the second giant magnetoresistive element a bias magnetic field oriented in the third direction. The third bias magnet film applies a bias magnetic field oriented in the third direction to both the first giant magnetoresistive element and the second giant magnetoresistive element.

Each of the bias magnet films generates a bias magnetic field for orienting the magnetization of the free layers in the direction substantially perpendicular to the magnetization direction of the corresponding fixed magnetization layer when no external magnetic field is applied to the first or the second giant magnetoresistive element. The presence of the bias magnet film reduces the hysteresis of the magnetic sensor for an external magnetic field. In general, the bias magnet films are disposed at both ends of the first giant magnetoresistive element and both ends of the second giant magnetoresistive element.

In order to miniaturize the magnetic sensor, it is preferable that the first giant magnetoresistive element be disposed close to the second giant magnetoresistive element as much as possible. Accordingly, in the magnetic sensor according to one aspect of the present invention, a common bias magnet film (third bias magnet film) is provided so as to be in contact with both an end of the first giant magnetoresistive element and an end of the second giant magnetoresistive element. The common bias magnet film is substituted for at least two bias magnet films of the conventional magnetic sensor, and allows the first giant magnetoresistive element and the second giant magnetoresistive element to be disposed very close to each other. Thus, the size of the magnetic sensor can be small. Furthermore, since two elements in contact with the third bias magnet film are electrically coupled with each other by the third (common) bias magnet film, it is unnecessary to connect these two elements via wires. Therefore, the giant magnetoresistive elements in a bridge configuration can be provided more inexpensively.

In the magnetic sensor having such common bias magnet film, the first giant magnetoresistive element may be configured in such a manner that a plurality of the single-layer-pinned spin-valve films (the first giant magnetoresistive element films) are connected in series, and the second giant magnetoresistive element may be configured in such a manner that a plurality of the plural-layer-pinned spin-valve films (the second giant magnetoresistive element films) are connected in series. Also, in the magnetic sensor having such common bias magnet film, the magnetic sensor may include a pair of the first giant magnetoresistive elements (or the first giant magnetoresistive element films) and a pair of the second giant magnetoresistive elements (or the second giant magnetoresistive element films), these being connected to form a full-bridge circuit.

Specifically, the magnetic sensor having such common bias magnet film may be a magnetic sensor having a full-bridge circuit comprising a first sub-circuit and a second sub-circuit. The first sub-circuit is configured in such a manner that a first potential is applied to an end of the first giant magnetoresistive element, the other end of the first giant magnetoresistive element is connected to an end of the second giant magnetoresistive element, and a second potential is applied to the other end of the second giant magnetoresistive element, by, for example, being grounded. The second sub-circuit is configured in such a manner that the first potential is applied to an end of another second giant magnetoresistive element, the other end of the second giant magnetoresistive element is connected to an end of another first giant magnetoresistive element, and a second potential is applied to the other end of the first giant magnetoresistive element. The magnetic sensor thus formed is configured so as to output the potential difference between the junction of the first giant magnetoresistive element with the second giant magnetoresistive element in the first sub-circuit and the junction of the first giant magnetoresistive element with the second giant magnetoresistive element in the second sub-circuit. Alternatively, the magnetic sensor may be a half-bridge circuit sensor having a single first giant magnetoresistive element and a single second giant magnetoresistive element, wherein these elements being connected in a half-bridge configuration, to output a potential at the junction of the first giant magnetoresistive element with the second giant magnetoresistive element.

In those structures, the first giant magnetoresistive element and the second giant magnetoresistive element may each have a narrow strip-shaped portion extending from the third bias magnet film in the same direction substantially perpendicular to the first direction. Alternatively, the first giant magnetoresistive element and the second giant magnetoresistive element may each have a narrow strip-shaped portion, and the narrow strip-shaped portions extend in a line in a direction substantially perpendicular to the first direction, with the third bias magnet film disposed therebetween. In either case, two bias magnet films generally used in the conventional magnetic sensor are replaced with the single bias magnet film (the common bias film or third bias magnet film), and accordingly the magnetic sensor can be smaller.

Preferably, the magnetic sensor further includes an insulating layer, and the first giant magnetoresistive element and the second giant magnetoresistive element partially intersect each other when viewed from above, with the insulating layer therebetween.

In the magnetic sensor thus configured, the first giant magnetoresistive element and the second giant magnetoresistive element intersect each other (when viewed from above), and consequently, the first giant magnetoresistive element and the second giant magnetoresistive element can be closer to each other.

It is also preferable that the magnetic sensor further includes an insulating layer, and each of the first bias magnet film, the second bias magnet film, and the third bias magnet film has a trapezoidal section so that each of the bias magnet films has slants with respect to the surface of the substrate, and an upper surface parallel to the upper surface of the substrate. An end of the first giant magnetoresistive element is in contact with the slant of the first bias magnet film and the other end is in contact with the slant of the third bias magnet film. A portion between the ends of the first giant magnetoresistive element abuts (lies) on the upper surface of the substrate. The first giant magnetoresistive element is covered with the insulating layer. The upper surface of the insulating layer is flush with the upper surfaces of the first to third bias magnet films. An end of the second giant magnetoresistive element is in contact with the upper surface of the second bias magnet film and the other end is in contact with the upper surface of the third bias magnet film. A portion between the ends of the second giant magnetoresistive element abuts (lies) on the upper surface of the insulating layer.

Alternatively, an end of the second giant magnetoresistive element is in contact with the slant of the second bias magnet film and the other end is in contact with the slant of the third bias magnet film. A portion between the ends of the second giant magnetoresistive element abuts (lies) on the upper surface of the substrate. The second giant magnetoresistive element is covered with the insulating layer. The upper surface of the insulating layer is flush with the upper surfaces of the first to third bias magnet films. An end of the first giant magnetoresistive element is in contact with the upper surface of the first bias magnet film and the other end is in contact with the upper surface of the third bias magnet film. A portion between the ends of the first giant magnetoresistive element abuts (lies) on the upper surface of the insulating layer.

In order to apply a bias magnetic field to the giant magnetoresistive elements from the bias magnet films, the giant magnetoresistive elements and their respective bias magnet films should be magnetically coupled with each other. In the above-described structure, the giant magnetoresistive elements are in contact with their respective bias magnet films, so that bias magnetic fields are easily applied to the giant magnetoresistive elements.

According to another aspect of the present invention, another method for manufacturing the magnetic sensor is provided. The method includes the steps of; preparing a single substrate (substrate preparation step); forming films intended to act as the first to third bias magnet films on the substrate (bias magnet films forming step); forming a first film intended to act as one of the first giant magnetoresistive element and the second giant magnetoresistive element on the upper surface of the substrate and the upper surfaces of the first to third bias magnet films (first film forming step); forming an insulating layer so as to cover the upper surfaces of the films intended to act as the bias magnet films and the first film (insulating layer forming step); planarizing the upper surfaces of the insulating layer, the films intended to act as the bias magnet films, and the first film by removing the insulating layer, the films intended to act as the bias magnet films, and the first film so that the upper surfaces of the films intended to act as the bias magnet film are exposed (planarizing step); forming a second film intended to act as the other one of the first giant magnetoresistive element and the second giant magnetoresistive element on the planarized surface (second film forming step); and performing a magnetic field heat treatment by applying a magnetic field oriented in a single direction to the first film and the second film at a high temperature, thereby fixing the magnetization directions of the pinned layers (magnetic field heat treatment step or thermal annealing step).

By this method above, bias magnet films are first formed, subsequently a film intended to act as one of the first giant magnetoresistive element and the second giant magnetoresistive element is formed (including the step of patterning the film into a predetermined shape), and then the insulating layer is deposited over the entire surface.

Subsequently, the insulating layer is partially removed so that the upper surfaces of the bias magnet films are exposed and are flush with the surface of the insulating layer. Then, another film intended to act as the other giant magnetoresistive element is formed (including the step of patterning the film into a predetermined shape). Finally, magnetic field heat treatment is performed to fix the magnetization directions of the pinned layers.

In the method above, by the magnetic field heat treatment, the magnetization direction of the pinned layer in the first giant magnetoresistive element and the magnetization direction of the pinned layer in the second giant magnetoresistive element are easily fixed so that these magnetization directions are antiparallel to each other. Thus, two giant magnetoresistive elements whose magnetic-field-detecting directions are antiparallel can be easily manufactured and disposed close to each other.

In addition, since the first giant magnetoresistive element is electrically isolated from the second giant magnetoresistive element by the insulating layer, the magnetic sensor having these two elements disposed close to each other can be easily manufactured. Furthermore, the first and the second giant magnetoresistive elements can be disposed in such a manner that one of the elements lap over or under the other (lie one over the other), or intersect each other in the vertical direction. Thus, the resulting magnetic sensor can be still smaller.

For the structure above, preferably, the films intended to act as the first to third bias magnet films are each formed so as to have a slant with respect to the surface of the substrate.

Since each bias magnet film has a slant, ends of the first film can be easily brought into contact with the slant of the bias magnet films. In addition, since the second film formation is performed with the upper surface of each bias magnet film being exposed, the second film can be easily brought into contact with the upper surface of the bias magnet film.

Preferably, the magnetic field heat treatment step uses a magnetic field generated from a magnet array including a plurality of substantially rectangular solid permanent magnets having substantially square end surfaces perpendicular to a central axis of one of the permanent magnets. The permanent magnets are arrayed at small intervals in such a manner that the barycenters of the end surfaces correspond to lattice points of a tetragonal lattice, and that a polarity of any one of the permanent magnets is opposite to a polarity of the other adjacent permanent magnets spaced by the shortest route (i.e., each permanent magnet has an opposite polarity to the polarity of its adjacent permanent magnets).

Thus, at least two giant magnetoresistive elements having 180° different magnetic-field-detecting directions can be easily and efficiently formed in a small area on a single substrate.

BRIEF DESCRIPTION OF THE DRAWINGS

FIG. 5C is a graph showing the changes in resistance of a SAF element shown in FIG. 1 in response to an external magnetic field;

FIG. 6A is an equivalent circuit of an X-axis magnetic sensor included in the magnetic sensor shown in FIG. 1;

FIG. 6B is a graph showing the changes in output of the X-axis magnetic sensor in response to the component in the positive X-axis direction of an external magnetic field;

FIG. 7A is an equivalent circuit of a Y-axis magnetic sensor included in the magnetic sensor shown FIG. 1;

FIG. 7B is a graph showing the changes in output of the Y-axis magnetic sensor in response to the component in the positive Y-axis direction of an external magnetic field;

FIG. 16A is a manufacturing process view of a step for forming films intended to act as the conventional GMR elements and the SAF elements on a substrate, according to a first method for manufacturing the magnetic sensor shown in FIG. 1;

FIG. 16B is a manufacturing process view of a step following the step shown in FIG. 16A;

FIG. 16C is a manufacturing process view of a step following the step shown in FIG. 16B;

FIG. 29 is a flow diagram showing steps for forming films intended to act as conventional GMR elements and SAF elements, according to a third method for manufacturing the magnetic sensor shown in FIG. 1;

FIG. 32A is a schematic diagram of an equivalent circuit of a first X-axis magnetic sensor included in the magnetic sensor shown in FIG. 30;

FIG. 32B is a graph showing the changes in output of the first X-axis magnetic sensor in response to the component in the positive X-axis direction of an external magnetic field;

FIG. 33A is a schematic diagram of an equivalent circuit of a second X-axis magnetic sensor included in the magnetic sensor shown in FIG. 30;

FIG. 33B is a graph showing the changes in output of the second X-axis magnetic sensor in response to the component in the positive X-axis direction of an external magnetic field;

FIG. 36A is a schematic diagram of an equivalent circuit of a first Y-axis magnetic sensor included in the magnetic sensor shown in FIG. 30;

FIG. 36B is a graph showing the changes in output of the first Y-axis magnetic sensor in response to the component in the positive Y-axis direction of an external magnetic field;

FIG. 37A is a schematic diagram of an equivalent circuit of a second Y-axis magnetic sensor included in the magnetic sensor shown in FIG. 30;

FIG. 37B is a graph showing the changes in output of the second Y-axis magnetic sensor shown in FIG. 30 in response to the component in the positive Y-axis direction of an external magnetic field;

FIG. 61A is a manufacturing process view of a step for forming films intended to act as the conventional GMR elements and the SAF elements on a substrate, according to a method for manufacturing the magnetic sensor shown in FIG. 49;

FIG. 61B is a manufacturing process view of a step following the step shown in FIG. 61A;

FIG. 61C is a manufacturing process view of a step following the step shown in FIG. 61B;

FIG. 62A is a manufacturing process view of a step following the step shown in FIG. 61C;

FIG. 62B is a manufacturing process view of a step following the step shown in FIG. 62A;

FIG. 62C is a manufacturing process view of a step following the step shown in FIG. 62B;

FIG. 63A is a manufacturing process view of a step following the step shown in FIG. 62C;

FIG. 63B is a manufacturing process view of a step following the step shown in FIG. 63A;

FIG. 63C is a manufacturing process view of a step following the step shown in FIG. 63B;

FIG. 64A is a manufacturing process view of a step following the step shown in FIG. 63C;

FIG. 64B is a manufacturing process view of a step following the step shown in FIG. 64A;

FIG. 64C is a manufacturing process view of a step following the step shown in FIG. 64B;

FIG. 65A is a manufacturing process view of a step following the step shown in FIG. 64C;

FIG. 65B is a manufacturing process view of a step following the step shown in FIG. 65A;

FIG. 65C is a manufacturing process view of a step following the step shown in FIG. 65B;

FIG. 66A is a manufacturing process view of a step following the step shown in FIG. 65C;

FIG. 66B is a manufacturing process view of a step following the step shown in FIG. 66A;

FIG. 66C is a manufacturing process view of a step following the step shown in FIG. 66B;

FIG. 71A is a schematic diagram of an equivalent circuit of a first X-axis magnetic sensor included in the magnetic sensor shown in FIG. 69;

FIG. 71B is a graph showing the changes in output of the first X-axis magnetic sensor in response to the component in the positive X-axis direction of an external magnetic field;

FIG. 72A is a schematic diagram of an equivalent circuit of a second X-axis magnetic sensor included in the magnetic sensor shown in FIG. 69;

FIG. 72B is a graph showing the changes in output of the second X-axis magnetic sensor shown in FIG. 69 in response to the component in the positive X-axis direction of an external magnetic field;

FIG. 73 is a graph showing the changes in output of the X-axis magnetic sensor of the magnetic sensor shown in FIG. 69 in response to the component in the positive X-axis direction of an external magnetic field;

FIG. 74 is a block diagram of a circuit of a Y-axis magnetic sensor included in the magnetic sensor shown in FIG. 69;

FIG. 75A is a schematic diagram of an equivalent circuit of a first Y-axis magnetic sensor included in the magnetic sensor shown in FIG. 69;

FIG. 75B is a graph showing the changes in output of the first Y-axis magnetic sensor in response to the component in the positive Y-axis direction of an external magnetic field;

FIG. 76A is a schematic diagram of an equivalent circuit of a second Y-axis magnetic sensor included in the magnetic sensor shown in FIG. 69;

FIG. 76B is a graph showing the changes in output of the second Y-axis magnetic sensor shown in FIG. 69 in response to the component in the positive Y-axis direction of an external magnetic field;

FIG. 77 is a graph showing the changes in output of the Y-axis magnetic sensor of the magnetic sensor shown in FIG. 69 in response to the component in the positive Y-axis direction of an external magnetic field;

FIG. 78A is a plan view of a magnetic sensor according to an eighth embodiment of the present invention;

Figure 9:
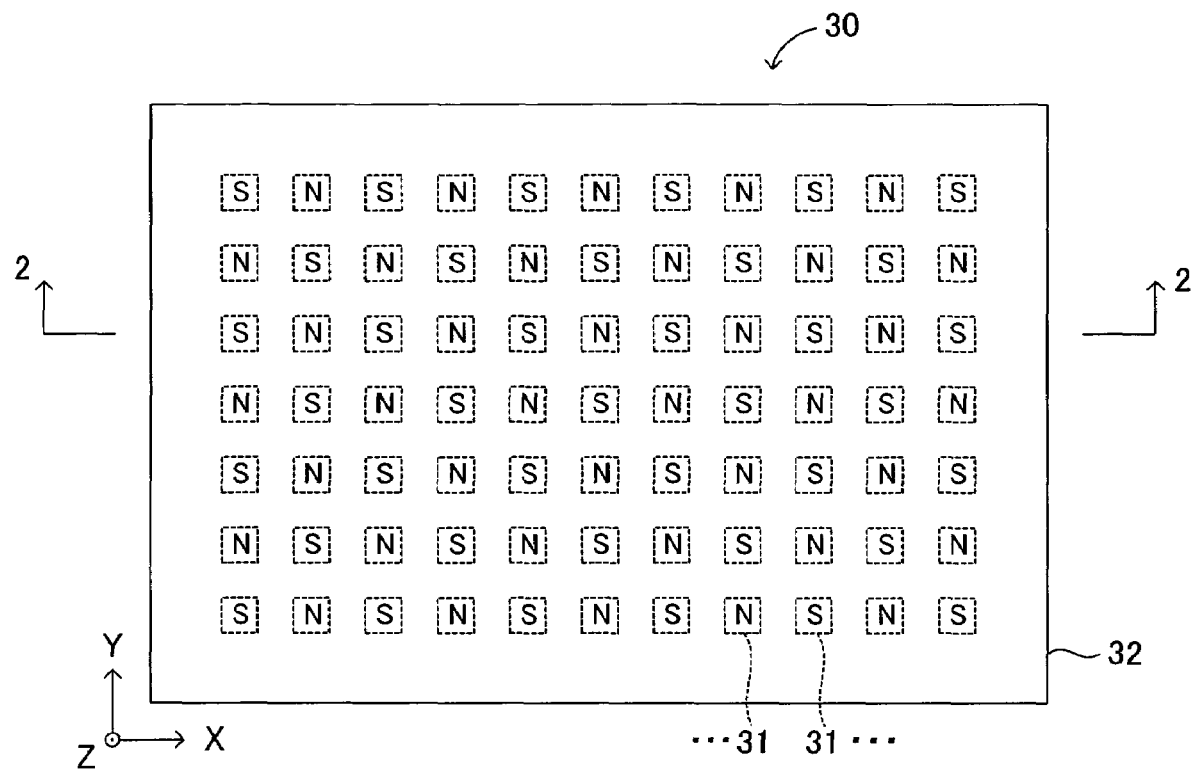
FIG. 9 is a plan view of a magnet array used for fixing the magnetizations of pinned layers of the magnetic sensor shown in FIG. 1.
Figure 78A:
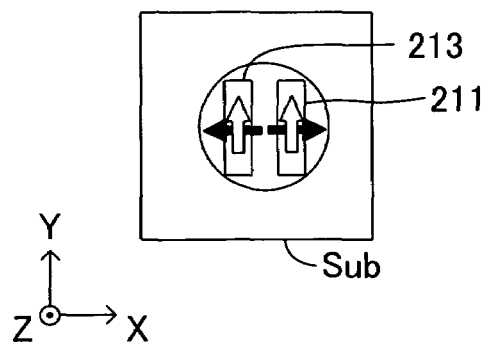
Figure 78B:
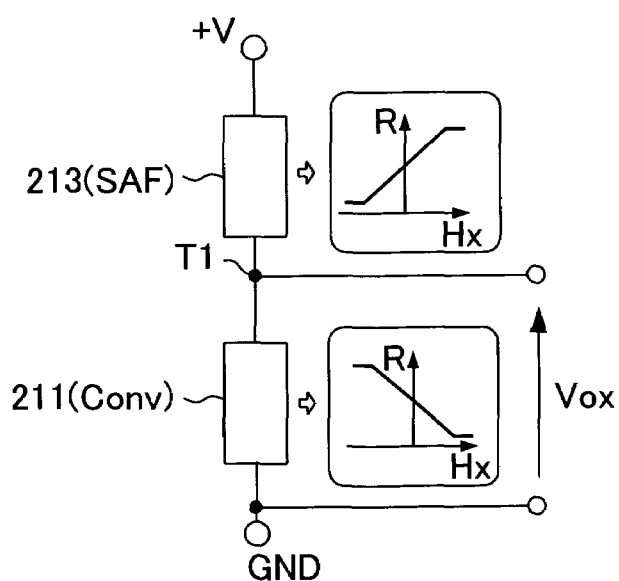
Figure 79:
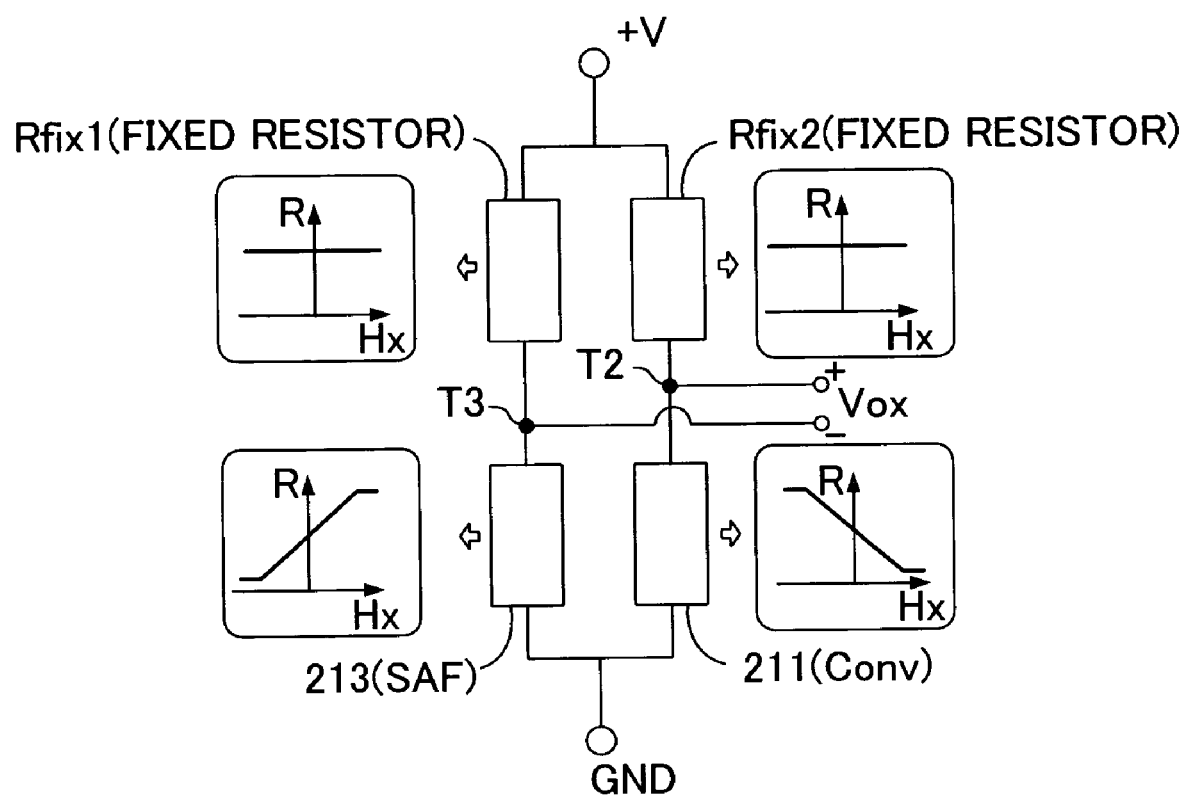
Figure 80:
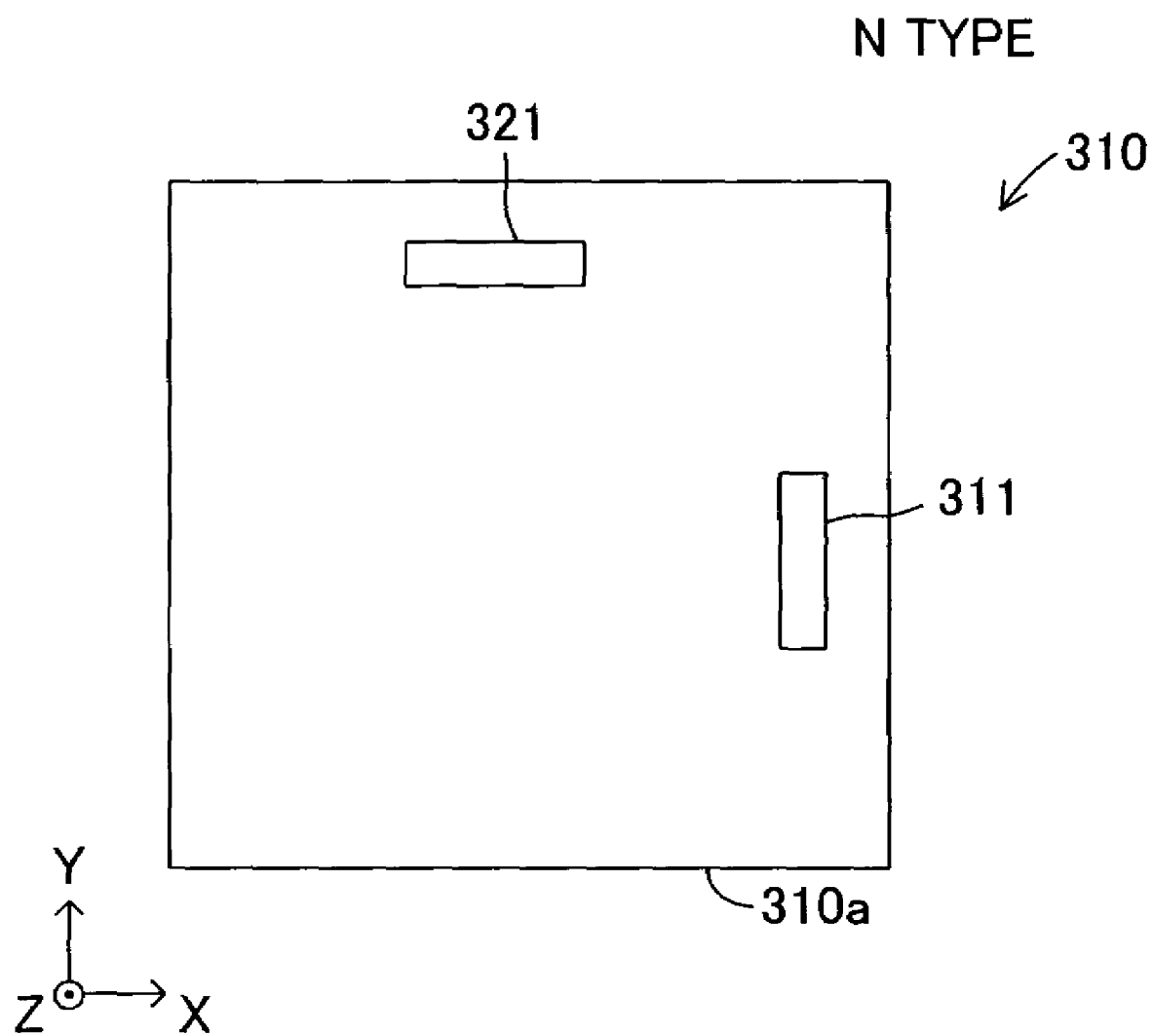
Figure 81:
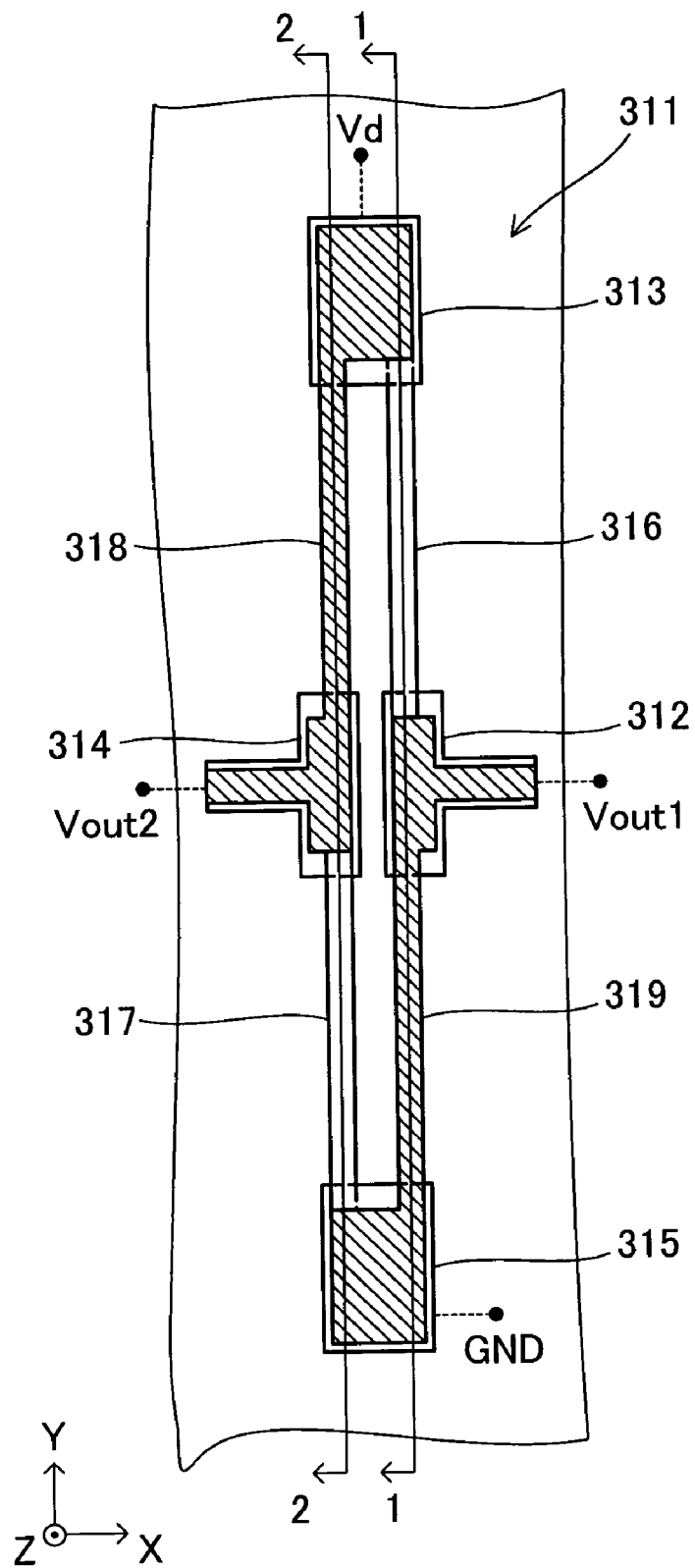
Figure 84A:
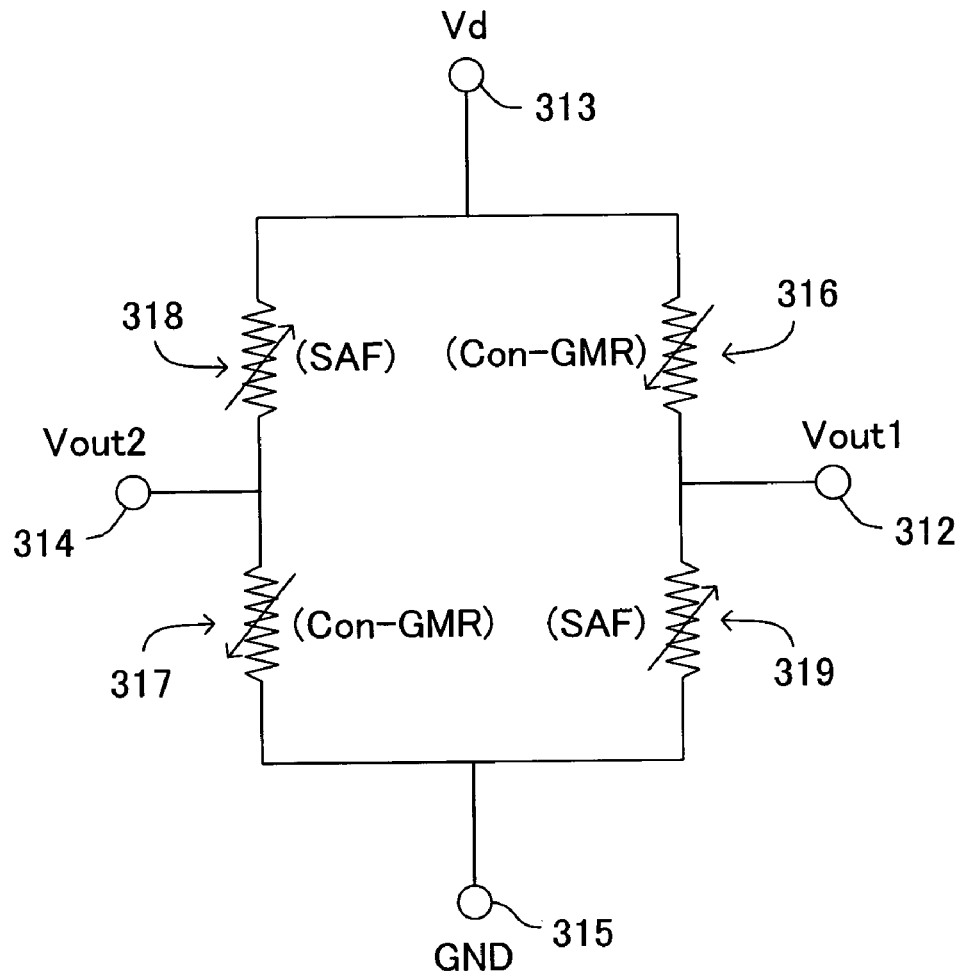
Figure 84B:
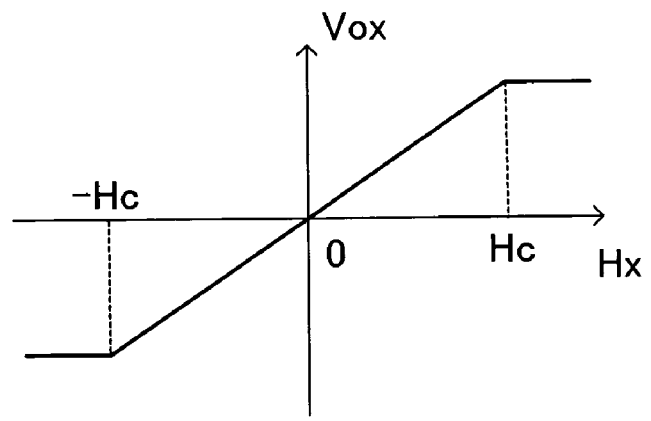
Figure 85:
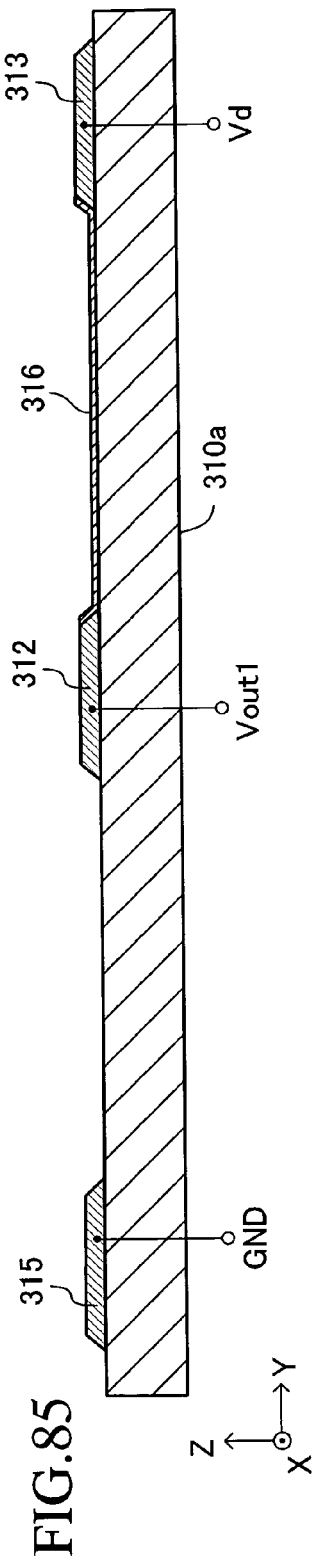
Figure 86:
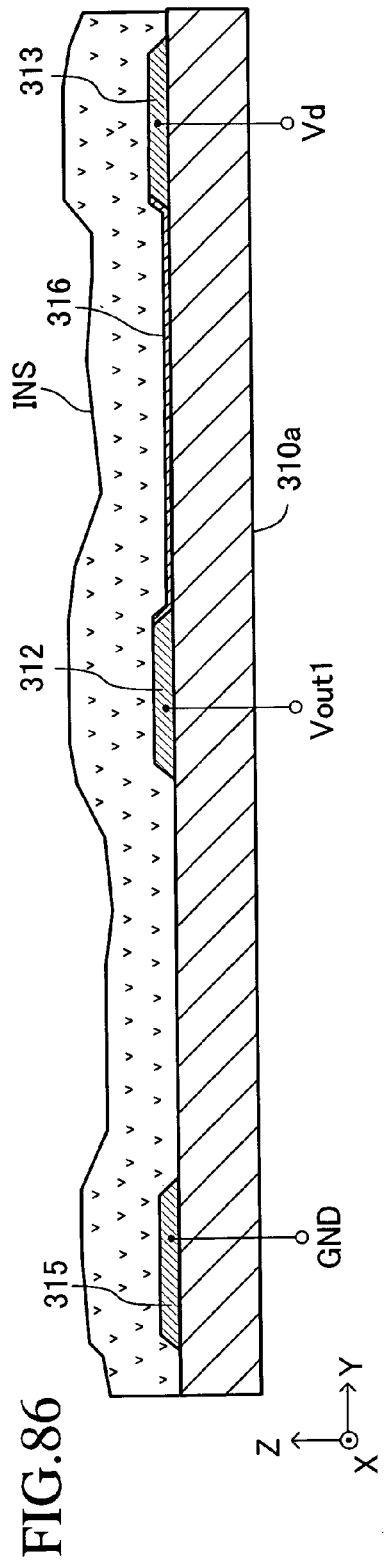
Figure 87:
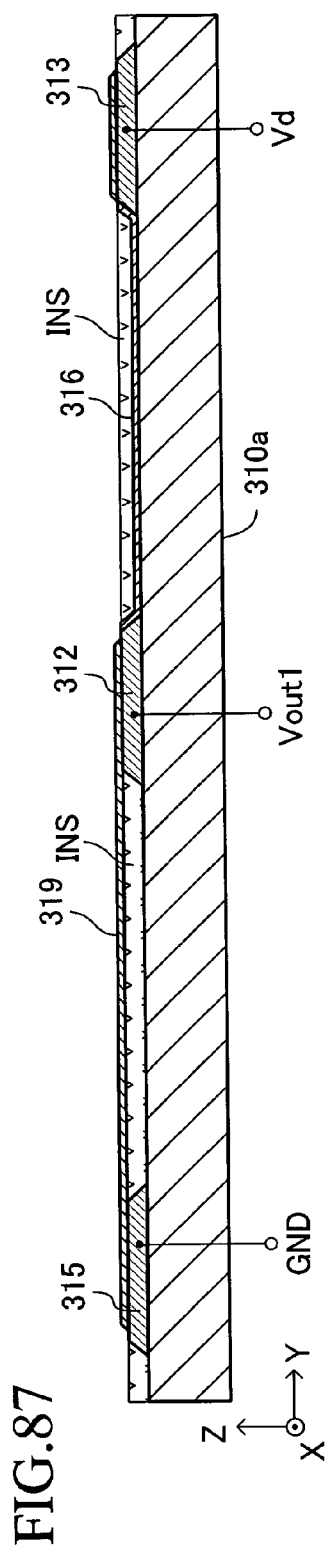
Figure 88:
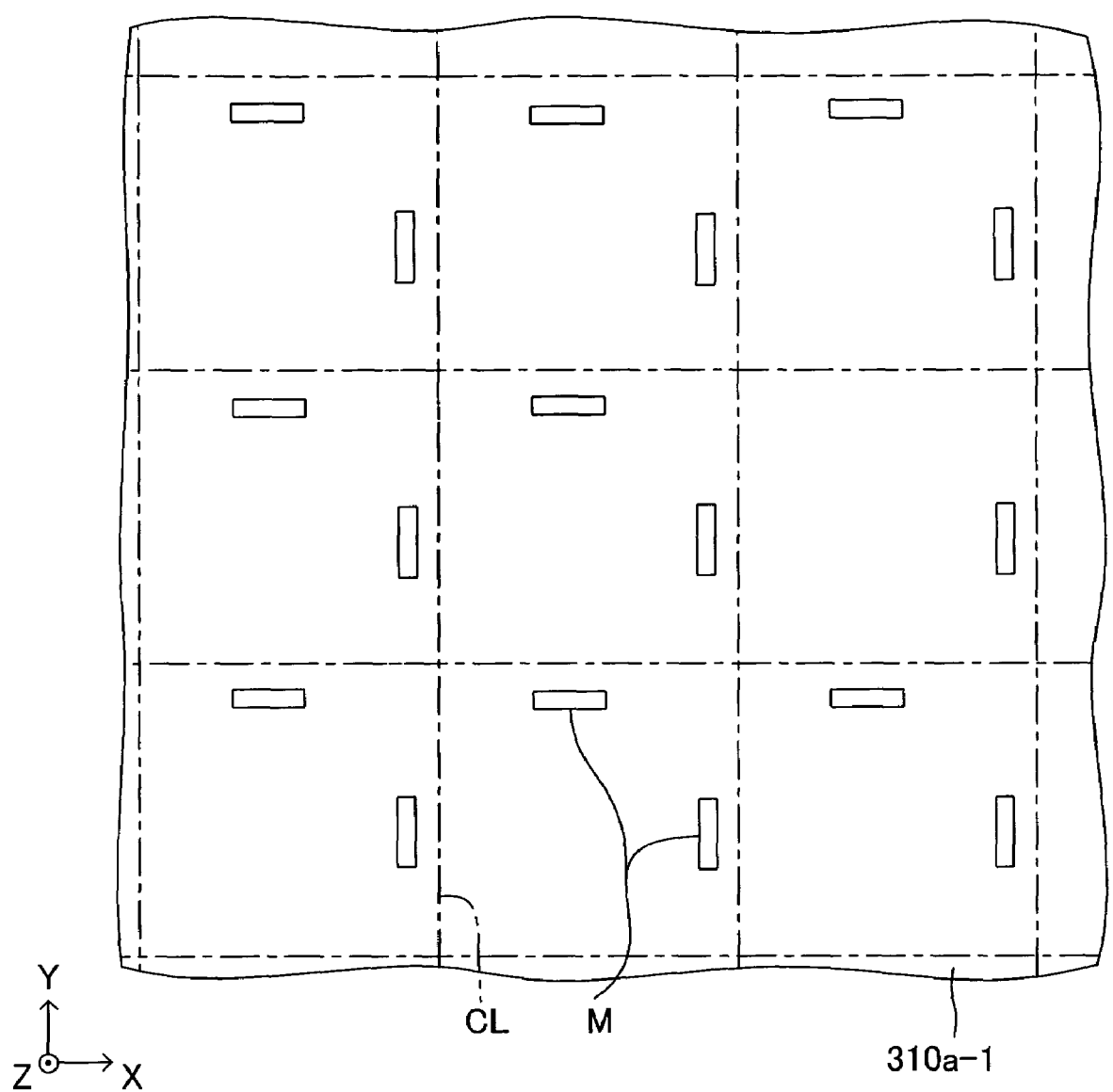
Figure 89:
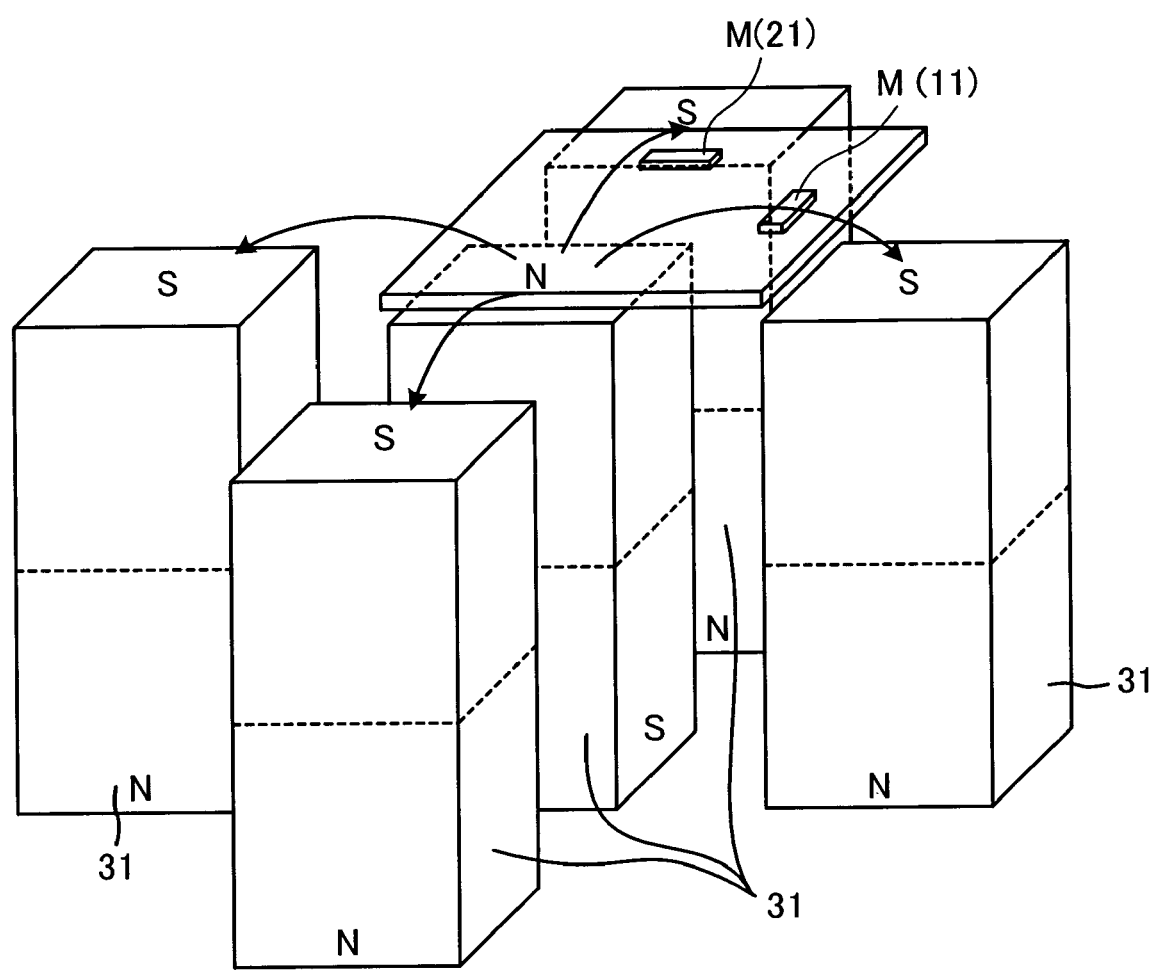
Figure 90:
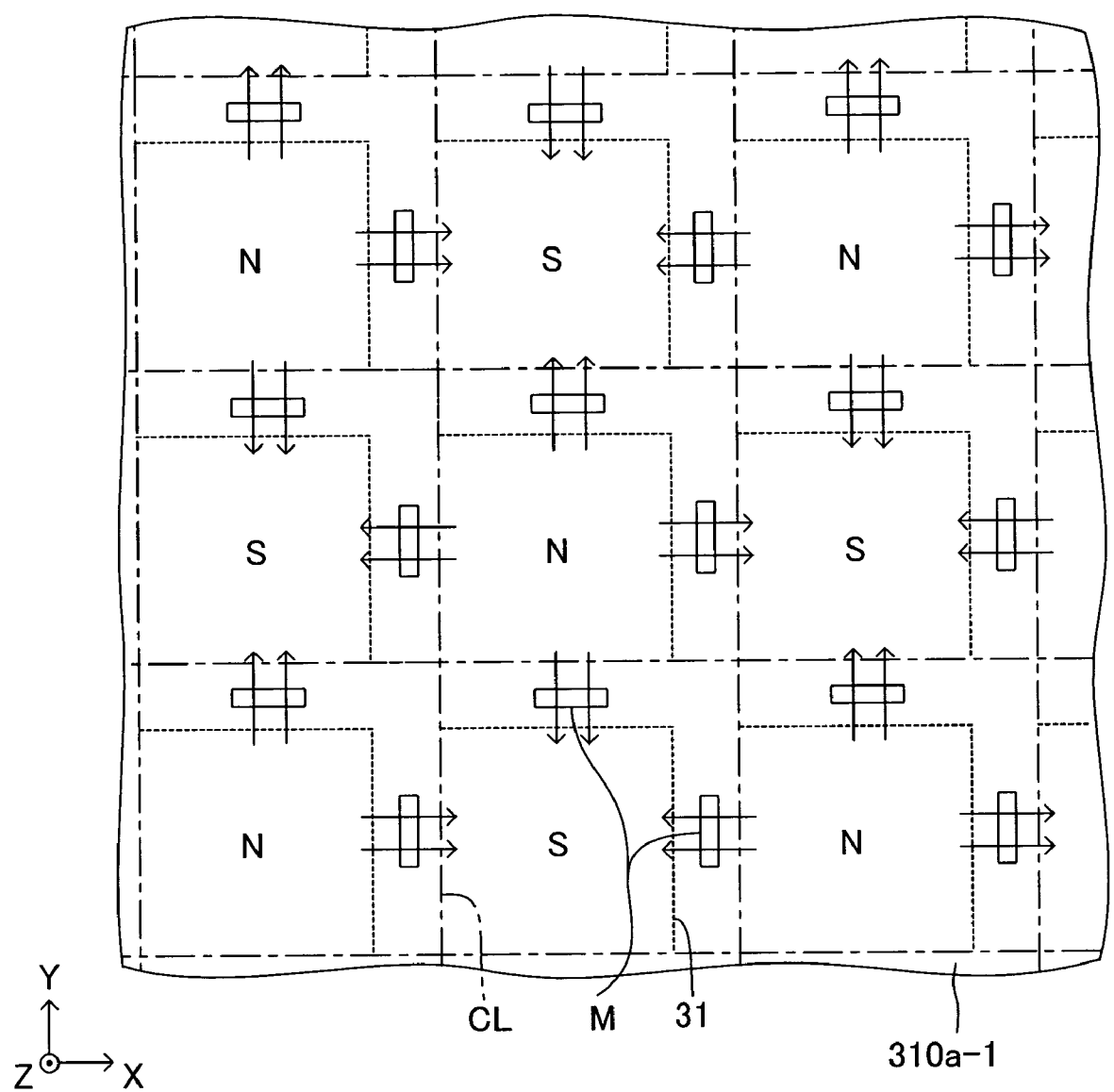
Figure 91:
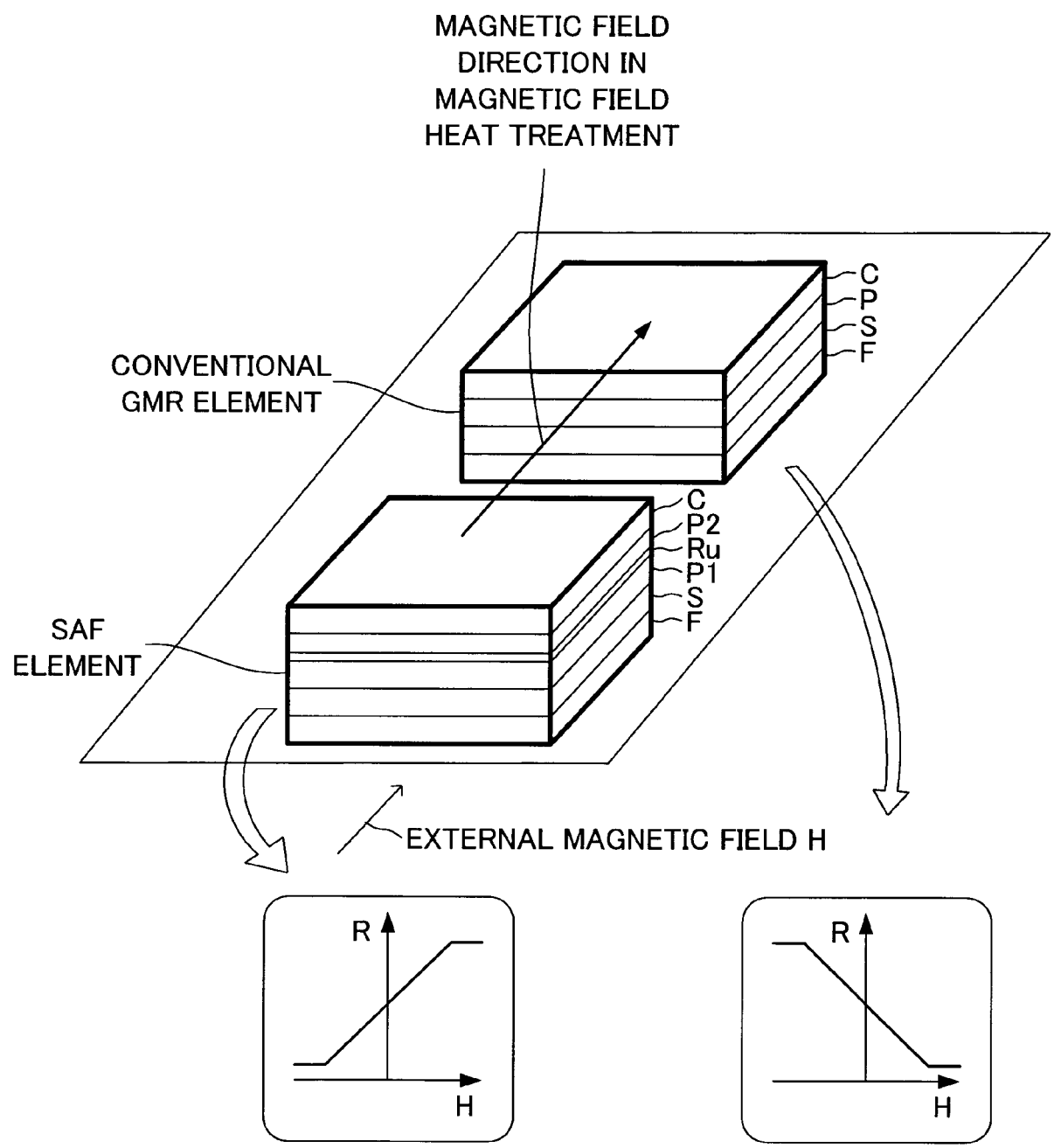
Figure 92:
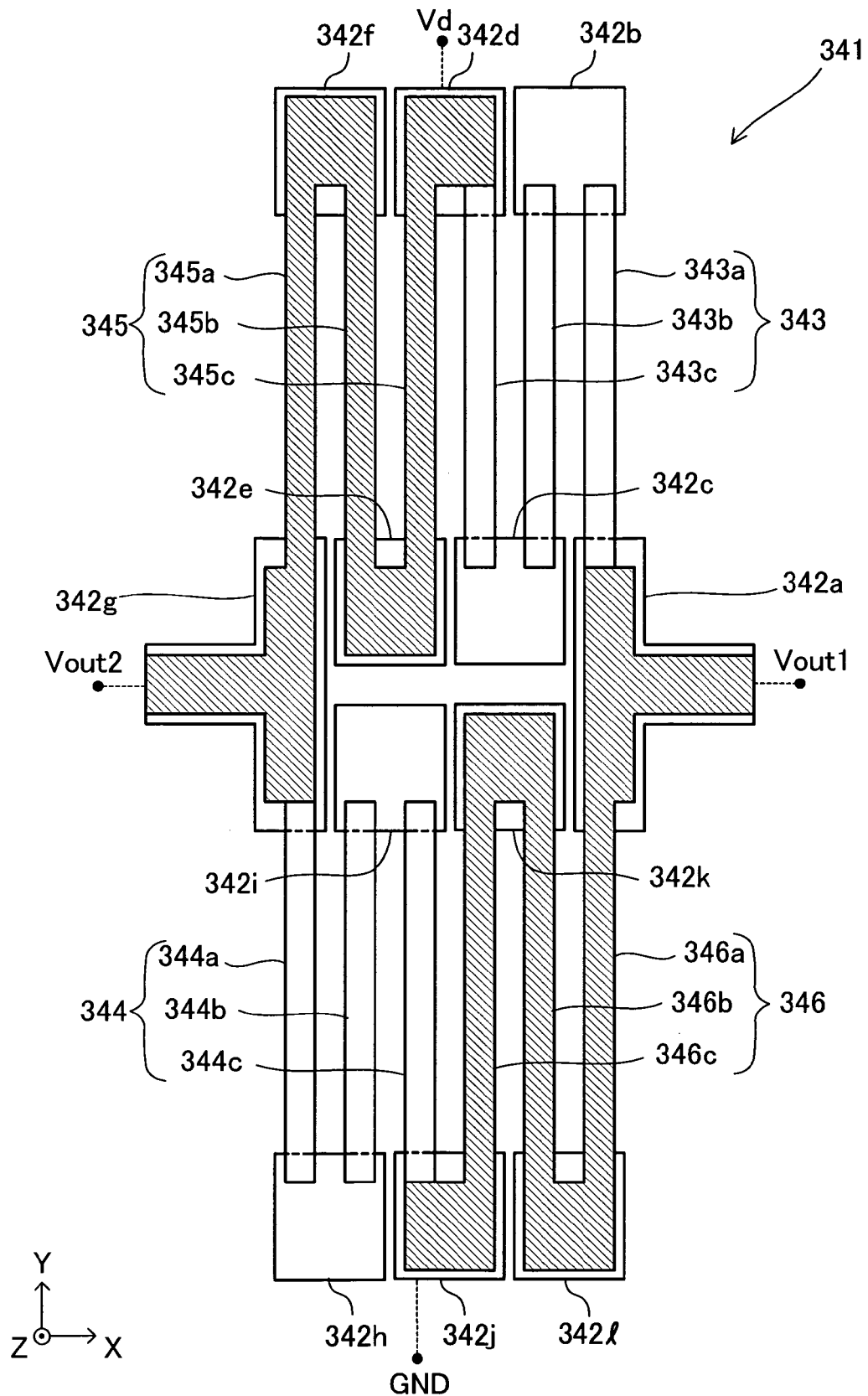
Figure 93:
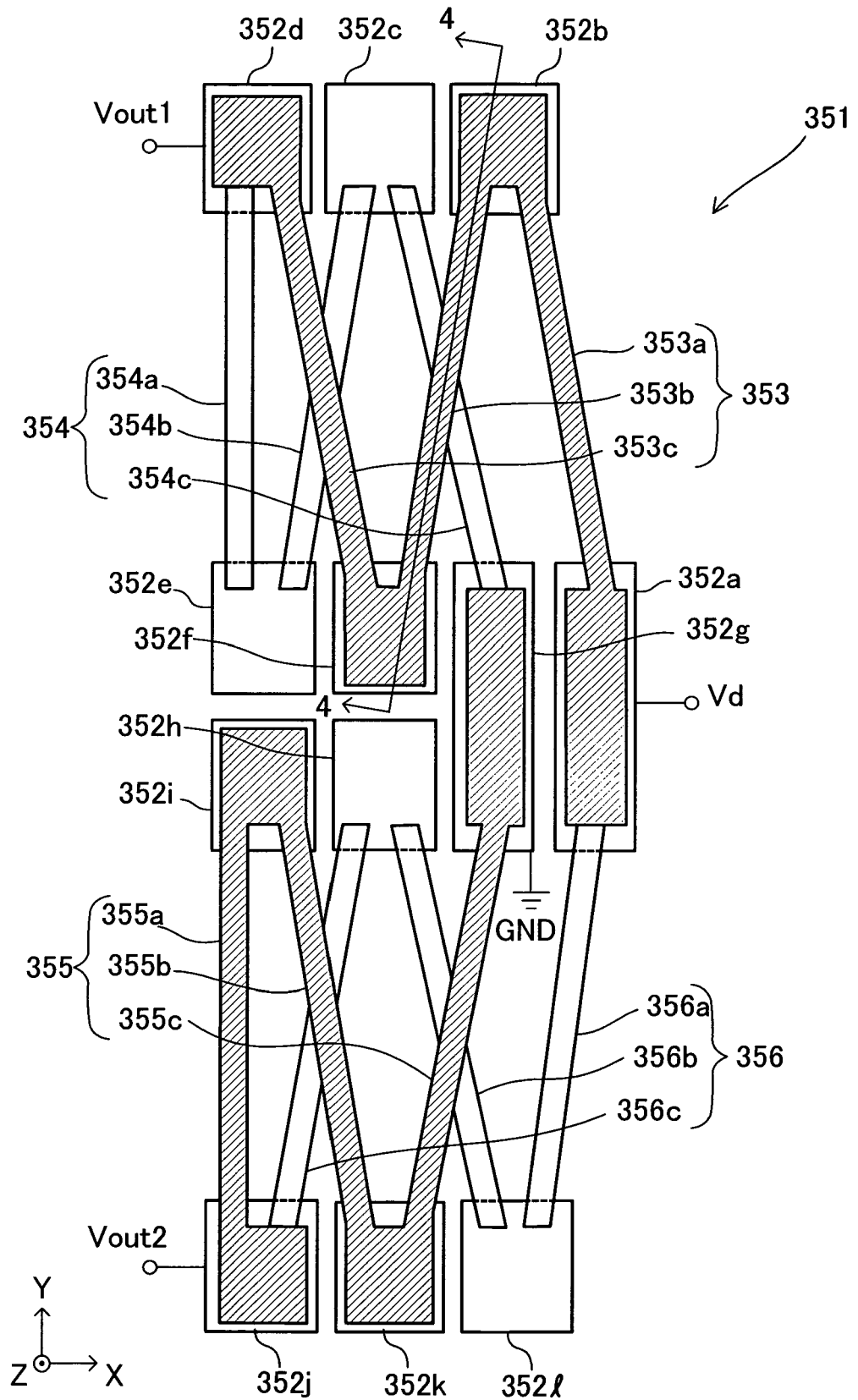
Figure 94:
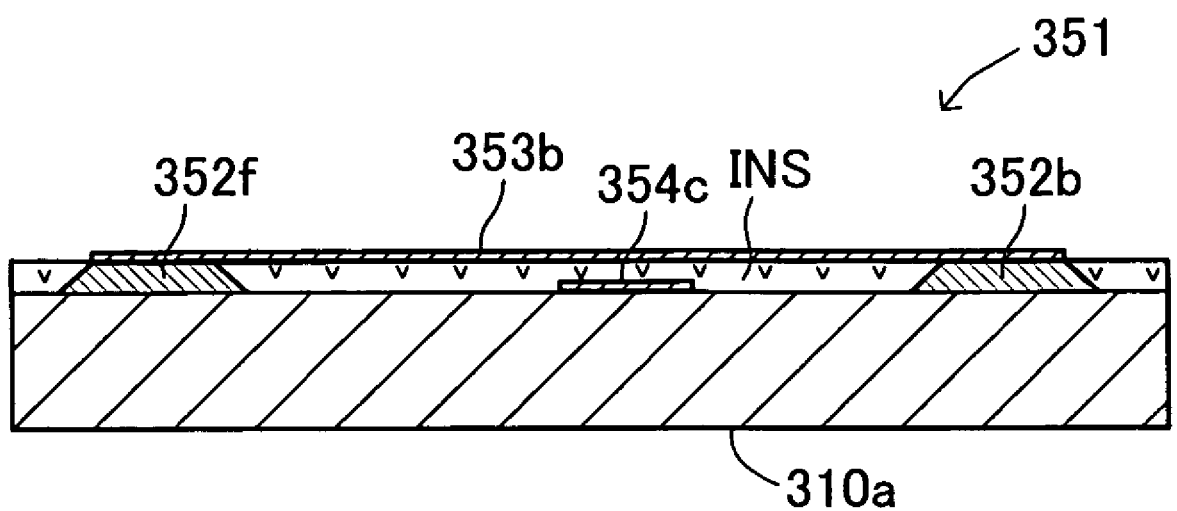
Figure 95:
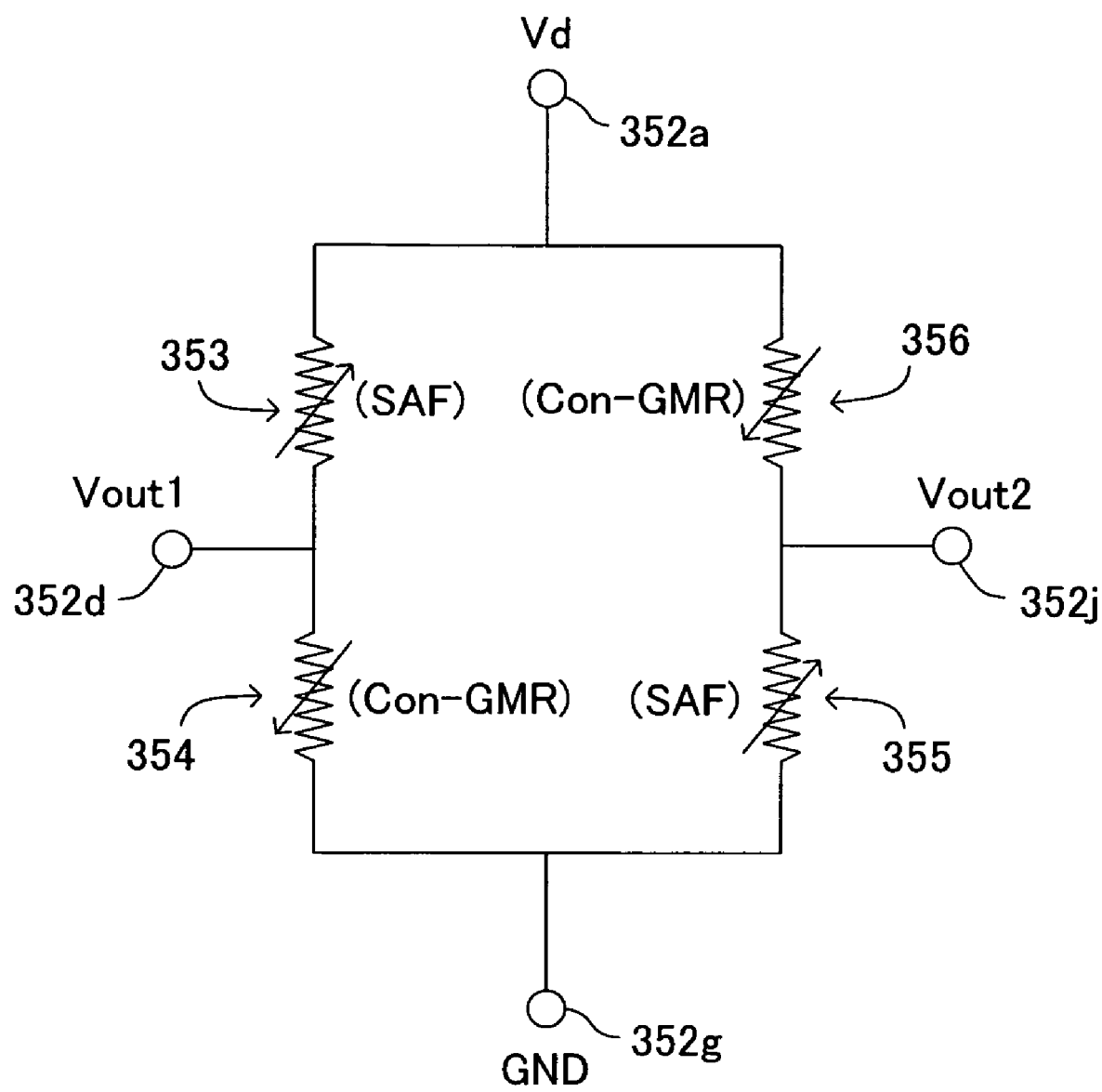

FIG. 78B is a schematic diagram of an equivalent circuit of the magnetic sensor shown in FIG. 78A;

FIG. 79 is a schematic diagram of an equivalent circuit of a magnetic sensor according to another modification of the present invention;

FIG. 80 is a plan view of a magnetic sensor (N type) according to a ninth embodiment of the present invention;

FIG. 81 is an enlarged plan view of an X-axis magnetic sensor of the magnetic sensor shown in FIG. 80;

FIG. 82 is a sectional view of the X-axis magnetic sensor taken along line I-I in FIG. 81;

FIG. 83 is a sectional view of the X-axis magnetic sensor taken along line II-II in FIG. 81;

FIG. 84A is a schematic diagram of an equivalent circuit of the X-axis magnetic sensor shown in FIG. 81;

FIG. 84B is a graph showing the changes in output of the X-axis magnetic sensor shown in FIG. 81 in response to the component in the positive X-axis direction of an external magnetic field;

FIG. 85 is a manufacturing process view of a step of a method for manufacturing the magnetic sensor shown in FIG. 80;

FIG. 86 is a manufacturing process view of a step of a method for manufacturing the magnetic sensor shown in FIG. 80;

FIG. 87 is a manufacturing process view of a step of a method for manufacturing the magnetic sensor shown in FIG. 80;

FIG. 88 is a fragmentary plan view of a wafer (substrate) used for manufacturing the magnetic sensor shown in FIG. 80;

FIG. 89 is a perspective view of five of the permanent magnets in the magnet array shown in FIG. 9;

FIG. 90 is a fragmentary plan view of a magnet array and a wafer used for fixing the magnetization directions of the pinned layers of the conventional GMR elements and SAF elements of the magnetic sensor shown in FIG. 80;

FIG. 91 is a representation of the relationships between the direction of a magnetic field and the characteristics of a conventional GMR element and a SAF element when they are subjected to heat treatment in the magnetic field;

FIG. 92 is a plan view of an X-axis magnetic sensor included in a magnetic sensor according to a tenth embodiment of the present invention;

FIG. 93 is a plan view of an X-axis magnetic sensor included in a magnetic sensor according to an eleventh embodiment;

FIG. 94 is a sectional view of the X-axis magnetic sensor taken along line IV-IV in FIG. 93; and FIG. 95 is a schematic diagram of an equivalent circuit of the X-axis magnetic sensor shown in FIG. 93.

DESCRIPTION OF THE PREFERRED EMBODIMENTS

Embodiments of the magnetic sensor of the present invention will now be described with reference to the drawings.

First Embodiment

Structure of Magnetic Sensor

Figure 1:
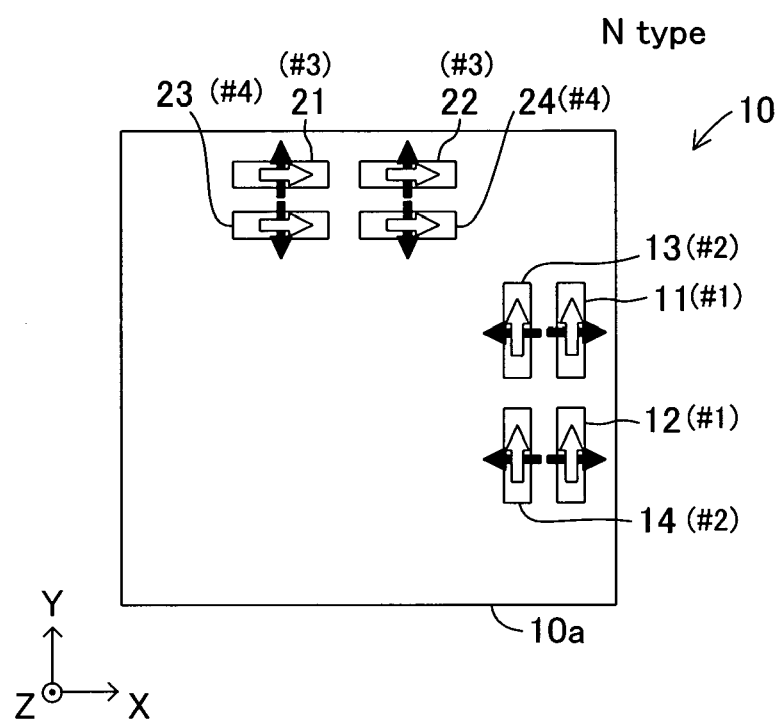
FIG. 1 is a plan view of a magnetic sensor (N type) according to a first embodiment of the present invention.

FIG. 1 is a plan view of a magnetic sensor 10 according to a first embodiment of the present invention. The magnetic sensor 10 includes a single substrate (monolithic chip) 10a and a total of eight giant magnetoresistive elements 11 to 14 and 21 to 24. The magnetic sensor 10 is referred to as an "N-type magnetic sensor 10" for the sake of convenience.

The substrate 10a is a thin silicon plate made of silicon. In plan view, the substrate 10a has a rectangular (substantially square) shape defined by four edges extending along mutually orthogonal X-axis and Y-axis. The substrate 10a has a small thickness along the Z-axis orthogonal to the X- and Y-axes.

Giant magnetoresistive elements 11, 12, 21, and 22 are conventional GMR elements. The other giant magnetoresistive elements 13, 14, 23, and 24 are elements (hereinafter referred to as "SAF elements" for the sake of convenience, described in detail later) having a synthetic spin-valve film including a plural-layer-pinned fixed magnetization layer.

In the present embodiment, the giant magnetoresistive elements 11, 12, 13, and 14 may be referred to as a first, a second, a third, and a fourth X-axis magnetic detecting element, respectively; the giant magnetoresistive elements 21, 22, 23, and 24 may be referred to as a first, a second, a third, and a fourth Y-axis magnetic detecting element, respectively. The conventional GMR elements 11 and 12 may be referred to as first giant magnetoresistive elements; the SAF elements 13 and 14 may be referred to as second giant magnetoresistive elements; the conventional GMR elements 21 and 22 may be referred to as third giant magnetoresistive elements; the SAF elements 23 and 24 may be referred to as fourth giant magnetoresistive elements.

The conventional GMR elements 11, 12, 21, and 22 have substantially the same structure, except for their positions on the substrate 10a. The following description illustrates the structure of the conventional GMR element 11 as a representative example.

Figure 2:
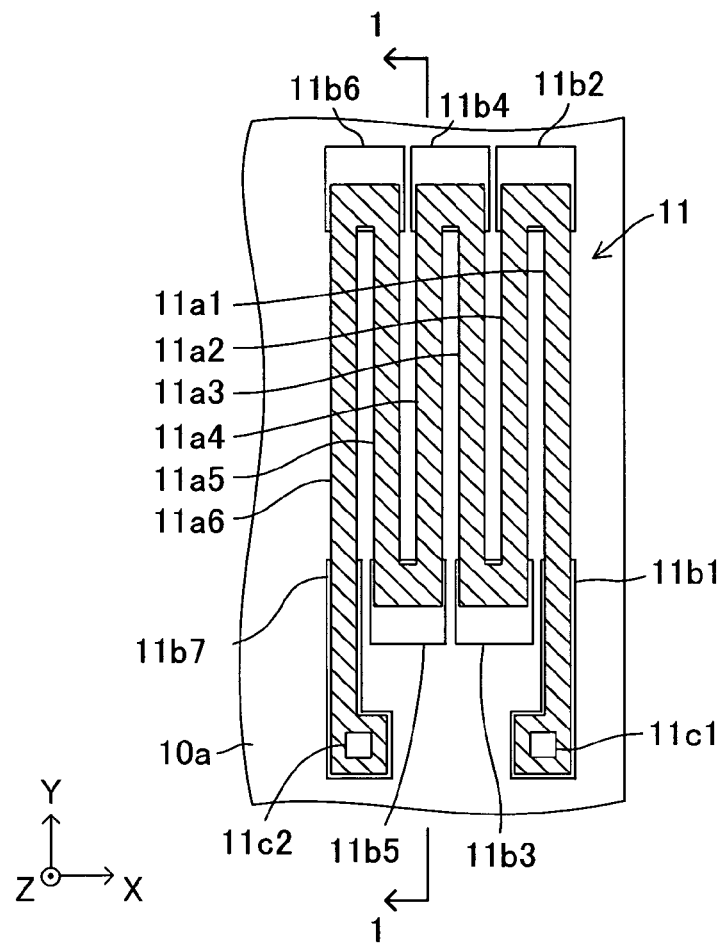
FIG. 2 is an enlarged plan view of a conventional GMR element shown in FIG. 1.
Figure 3:
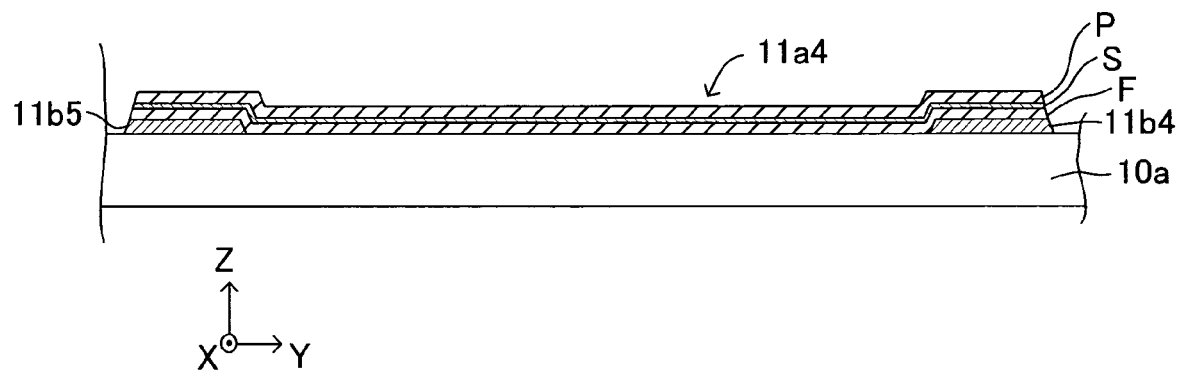
FIG. 3 is a schematic sectional view of the conventional GMR element taken along line I-I in FIG. 2.

FIG. 2 is an enlarged plan view of the conventional GMR element 11 and FIG. 3 is a schematic sectional view of the conventional GMR element 11 taken along line I-I in FIG. 2. As shown in FIGS. 2 and 3, the conventional GMR element 11 includes a plurality (six in this case) of narrow strip-shaped portions 11a1 to 11a6, a plurality (seven in this case) of bias magnet films 11b1 to 11b7, and a pair of terminals (connecting portions) 11c1 and 11c2.

The narrow strip-shaped portions 11a1 to 11a6 each extend in the Y-axis direction. The narrow strip-shaped portion 11a1 is disposed at the most positive side in the X-axis direction. The negative end in the Y-axis direction of the narrow strip-shaped portion 11a1 is formed on the bias magnet film 11b1. The bias magnet film 11b1 is connected to the terminal 11c1. The other end of the narrow strip-shaped portion 11a1, or the positive end in the Y-axis direction, is formed on the bias magnet film 11b2.

One end of the narrow strip-shaped portion 11a2 adjacent to the narrow strip-shaped portion 11a1 at the negative side in the X-axis direction is formed on the bias magnet film 11b2 and is connected to the narrow strip-shaped portion 11a1 on the bias magnet film 11b2. The other end of the narrow strip-shaped portion 11a2 is formed on the bias magnet film 11b3.

One end of the narrow strip-shaped portion 11a3 adjacent to the narrow strip-shaped portion 11a2 at the negative side in the X-axis direction is formed on the bias magnet film 11b3 and is connected to the narrow strip-shaped portion 11a2 on the bias magnet film 11b3. The other end of the narrow strip-shaped portion 11a3 is formed on the bias magnet film 11b4.

One end of the narrow strip-shaped portion 11a4 adjacent to the narrow strip-shaped portion 11a3 at the negative side in the X-axis direction is formed on the bias magnet film 11b4 and is connected to the narrow strip-shaped portion 11a3 on the bias magnet film 11b4. The other end of the narrow strip-shaped portion 11a4 is formed on the bias magnet film 11b5.

One end of the narrow strip-shaped portion 11a5 adjacent to the narrow strip-shaped portion 11a4 at the negative side in the X-axis direction is formed on the bias magnet film 11b5 and is connected to the narrow strip-shaped portion 11a4 on the bias magnet film 11b5. The other end of the narrow strip-shaped portion 11a5 is formed on the bias magnet film 11b6.

One end of the narrow strip-shaped portion 11a6 adjacent to the narrow strip-shaped portion 11a5 at the negative side in the X-axis direction is formed on the bias magnet film 11b6 and is connected to the narrow strip-shaped portion 11a5 on the bias magnet film 11b6. The other end of the narrow strip-shaped portion 11a6 is formed on the bias magnet film 11b7. The bias magnet film 11b7 is connected to the terminal 11c2. As described above, the conventional GMR element 11 has the plurality of narrow strip-shaped portions connected in series in a serpentine (zigzag like) manner.

Figure 4A:
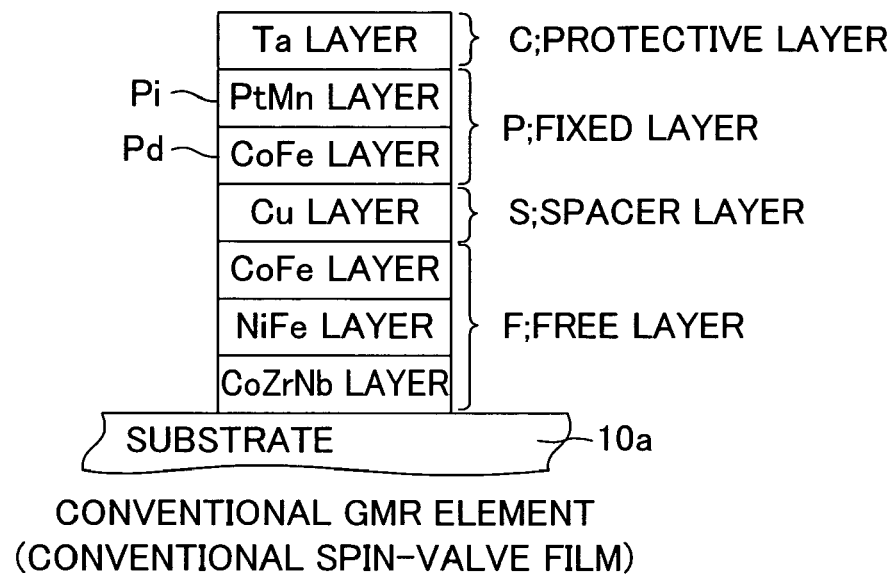
FIG. 4A is a schematic representation of the structure of a conventional GMR element shown in FIG. 1.

Each of the narrow strip-shaped portions 11a1 to 11a6 is made of a conventional spin-valve film shown in FIG. 4A. The spin-valve film includes a free layer F formed (deposited) on the substrate 10a, a spacer layer S formed on the free layer F, a fixed magnetization layer P formed on the spacer layer S, and a protective layer (capping layer) C formed on the fixed magnetization layer P. In practice, an insulating/wiring layer (not shown) made of $SiO_2$ or SiN may be formed between the substrate 10a and the free layer F.

The magnetization direction of the free layer F changes depending on the direction of the external magnetic field. The free layer F includes a CoZrNb amorphous magnetic layer formed on the substrate 10a, a NiFe magnetic layer formed on the CoZrNb amorphous magnetic layer, and a CoFe magnetic layer formed on the NiFe magnetic layer. These layers constitute a soft ferromagnetic film.

Since the narrow strip-shaped portions 11a1 to 11a6 extend in the Y-axis direction, the free layer F also extends in the Y-axis direction to have a longitudinal direction in the Y-axis direction. The magnetization of the free layer F, when an external magnetic field is not applied (hereinafter referred to as the "initial magnetization") to the free layer F, is oriented in the longitudinal direction of the free layer F (positive Y-axis direction for the conventional GMR element 11) due to shape anisotropy (uniaxial anisotropy).

The spacer layer S is made of a nonmagnetic conductive material (Cu in the present embodiment).

The fixed magnetization layer P is a single-layer-pinned fixed magnetization layer which is a lamination of a ferromagnetic magnetic layer Pd made of CoFe and an antiferromagnetic layer Pi made of a PtMn alloy containing 45 to 55 mol % of Pt. The magnetization (magnetization vector) of the CoFe magnetic layer Pd is fixed in the positive X-axis direction by exchange coupling with the antiferromagnetic layer Pi serving as a pinning layer, thereby serving as a pinned layer. The fixed magnetization direction of the pinned layer in each conventional GMR element is the magnetization direction of the magnetic layer Pd made of CoFe.

The protective layer C is made of titanium (Ti) or tantalum (Ta).

Referring again to FIGS. 2 and 3, the bias magnet films 11b1 to 11b7 are made of a hard ferromagnetic material, such as CoCrPt, having a high coercive force and a high remanence ratio, and are magnetized to serve as permanent magnet films (hard magnet films). Each of the bias magnet films 11b1 to 11b7 is magnetically coupled with the free layer F which is formed right on each of the magnet films, and applies a bias magnetic field to the free layer F in the longitudinal direction of the free layer F (positive Y-axis direction for the conventional GMR element 11).

Figure 4B:
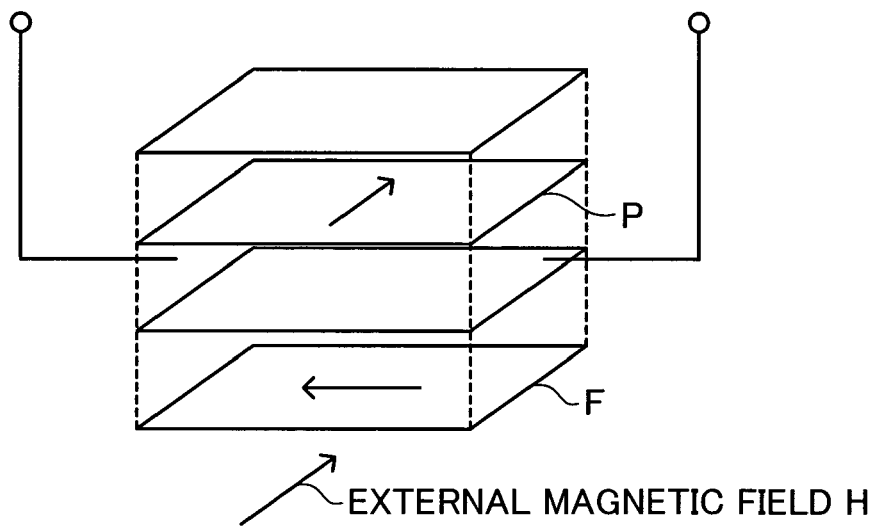
FIG. 4B is a conceptual perspective view of a conventional GMR element shown in FIG. 1.
Figure 4C:
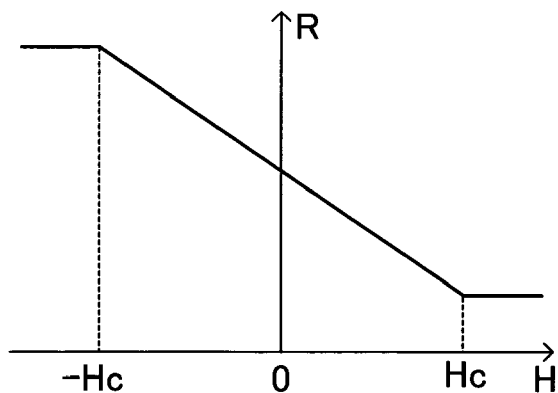
FIG. 4C is a graph showing the changes in resistance of a conventional GMR element shown in FIG. 1 in response to an external magnetic field.

With the above structure, the resistance of the conventional GMR element 11 is equal to a sum of the resistances of the narrow strip-shaped portions 11a1 to 11a6 and is obtained from the terminals 11c1 and 11c2. Accordingly, as shown in FIGS. 4B and 4C, the conventional GMR element 11 has a resistance which varies depending on an external magnetic field H varying in the range of −Hc to +Hc along the fixed magnetization direction (positive X-axis direction in this case) of the CoFe magnetic layer Pd in the fixed magnetization layer P. That is, the resistance decreases as the intensity of the external magnetic field in the positive X-axis direction increases. In other words, the conventional GMR element 11 detects magnetic fields in the direction antiparallel to (180° different from) the fixed magnetization direction of the CoFe magnetic layer Pd adjoining (abutting) the spacer layer S. In this instance, the conventional GMR element 11 exhibits a substantially constant resistance for external magnetic fields changing along the Y axis.

Regarding the SAF elements 13, 14, 23, and 24, those elements have substantially the same structure, except for their positions on the substrate 10a. The following description illustrates the structure of the SAF element 13 as a representative example.

The SAF element 13 has an almost the same film structure as the conventional GMR element 11, except for its spin-valve film structure. The SAF element 13 is a synthetic spin-valve film shown in FIG. 5A. The synthetic spin-valve film includes a free layer F formed on the substrate 10a, a spacer layer S formed on the free layer F, a fixed magnetization layer P' formed on the spacer layer S, and a protective layer (capping layer) C formed on the fixed magnetization layer P'.

In the synthetic spin-valve film, the free layer F, the spacer layer S, and the protective layer C have the same structures as those of the conventional spin-valve film shown in FIG. 4A. In other words, as mentioned above, only the fixed magnetization layer P' has a structure different from the fixed magnetization layer P of the conventional spin-valve film.

The fixed magnetization layer P' is a plural-layer-pinned fixed magnetization layer which is a lamination of a first ferromagnetic layer P1 made of CoFe, an exchange coupling layer Ex made of Ru and formed on the first ferromagnetic layer P1, a second ferromagnetic layer P2 made of CoFe formed on the exchange coupling layer Ex, and an exchange bias layer (antiferromagnetic layer) Eb made of a PtMn alloy containing 45 to 55 mol % of Pt. That is, the first ferromagnetic layer P1, the exchange coupling layer Ex, the second ferromagnetic layer P2, the exchange bias layer Eb are deposited in this order.

The exchange coupling layer Ex lies between the first ferromagnetic layer P1 and the second ferromagnetic layer P2 in a sandwich manner. The first ferromagnetic layer P1 serves as a pinned layer whose magnetization direction is fixed so as not to change in response to the changes of the external magnetic field because of the cooperation of the exchange coupling layer Ex and the second ferromagnetic layer P2. The exchange bias layer Eb serves as a pinning layer for fixing, together with the second ferromagnetic layer P2 and the exchange coupling layer Ex in between, the magnetization direction of the first ferromagnetic layer P1 which is the pinned layer. Note that the first ferromagnetic layer P1, the exchange coupling layer Ex, and the second ferromagnetic layer P2 may together be referred to as a pinned layer, instead.

The exchange bias layer Eb establishes an exchange coupling with the second ferromagnetic layer P2 to fix the magnetization (magnetization vector) of the second ferromagnetic layer P2 in the positive X-axis direction. The first ferromagnetic layer P1 and the second ferromagnetic layer P2 are exchange-coupled through the exchange coupling layer Ex therebetween. Thus, the magnetization direction of the first ferromagnetic layer P1 is antiparallel to the magnetization direction of the second ferromagnetic layer P2, as indicated by the arrows in FIG. 5B. Consequently, the magnetization of the first ferromagnetic layer P1 is fixed in the negative X-axis direction.

The SAF element 13 having the above-described structure has a resistance which varies depending on an external magnetic field H varying in the range of −Hc to +Hc along the fixed magnetization direction of the first ferromagnetic layer (pinned layer) P1 in the fixed magnetization layer P', as shown in FIG. 5C. That is, the resistance increases as the intensity of the external magnetic field H in the positive X-axis direction increases. In other words, the SAF element 13 detects magnetic fields in the direction antiparallel to the fixed magnetization direction of the first magnetic layer P1 adjoining (abutting) the spacer layer S. In this instance, the SAF element 13 exhibits a substantially constant resistance for external magnetic fields changing along the Y axis.

Referring again to FIG. 1, the conventional GMR element 11 is disposed in the vicinity of the end in the X-axis positive direction of the substrate 10a and in an upper-middle position in the Y-axis direction of the substrate 10a. The magnetic-field-detecting direction of the conventional GMR element 11 is in the negative X-axis direction. The conventional GMR element 12 is disposed in the vicinity of the end in the X-axis positive direction of the substrate 10a and in a lower-middle position in the Y-axis direction of the substrate 10a. The magnetic-field-detecting direction of the conventional GMR element 12 is in the negative X-axis direction.

The SAF element 13 is disposed in an upper-middle position in the Y-axis direction of the substrate 10a and at the negative side in the X-axis direction of the conventional GMR element 11 with a short distance therebetween. The magnetic-field-detecting direction of the SAF element 13 is in the positive X-axis direction. The SAF element 14 is disposed in a lower-middle position in the Y-axis direction of the substrate 10a and at the negative side in the X-axis direction of the conventional GMR element 12 with a short distance therebetween. The magnetic-field-detecting direction of the SAF element 14 is in the positive X-axis direction.

As described above, these elements 11 to 14 are provided adjacent each other in a region (first small region) in the vicinity of the end in the X-axis positive direction of the substrate 10a.

The conventional GMR element 21 is disposed in the vicinity of the end in the Y-axis positive direction of the substrate 10a and in a left-middle position in the X-axis direction of the substrate 10a. The magnetic-field-detecting direction of the conventional GMR element 21 is in the negative Y-axis direction. The conventional GMR element 22 is disposed in the vicinity of the end in the Y-axis positive direction of the substrate 10a and in a right-middle position in the X-axis direction of the substrate 10a. The magnetic-field-detecting direction of the conventional GMR element 22 is in the negative Y-axis direction.

The SAF element 23 is disposed in a left-middle position in the X-axis direction of the substrate 10a and at the negative side in the Y-axis direction of the conventional GMR element 21 with a short distance therebetween. The magnetic-field-detecting direction of the SAF element 23 is in the positive Y-axis direction. The SAF element 24 is disposed in a right-middle position in the X-axis direction of the substrate 10a and at the negative side in the Y-axis direction of the conventional GMR element 22 with a short distance therebetween. The magnetic-field-detecting direction of the SAF element 24 is in the positive Y-axis direction.

As described above, these elements 21 to 24 are provided adjacent each other in a region (second small region away from the first small region at a predetermined distance) in the vicinity of the end in the Y-axis positive direction of the substrate 10a.

The magnetic sensor 10 includes an X-axis magnetic sensor (whose magnetic-field-detecting direction is in the X-axis direction) constituted of the elements 11 to 14 and a Y-axis magnetic sensor (whose magnetic-field-detecting direction is in the Y-axis direction) constituted of the elements 21 to 24.

As shown in the equivalent circuit of FIG. 6A, the X-axis magnetic sensor includes the elements 11 to 14 connected in a full-bridge configuration through conducting wires not shown in FIG. 1. The graphs adjacent to the elements 11 to 14 in FIG. 6A each show the characteristics of their adjacent elements, that is, the changes in resistance R in response to the intensity of an external magnetic field varying in the X-axis direction (component Hx along the positive X-axis direction of the external magnetic field H). The conventional GMR elements are each indicated by "Conv" following their respective reference numerals; the SAF elements are each indicated by "SAF" following their respective reference numerals. Such graphs and the letters "Conv" and "SAF" have the similar meaning in similar drawings throughout the specification.

The X-axis magnetic sensor will be further described in detail below. An end of the conventional GMR element 11 is connected to an end of the SAF element 13 to form a first sub-circuit. A first potential +V (a constant voltage supplied from a constant-voltage supply not shown in the figure) is applied to the other end of the conventional GMR element 11. The other end of the SAF element 13 is grounded (connected to GND). In other words, a second potential different from the first potential is applied to this other end of the SAF element 13.

Also, an end of the conventional GMR element 12 is connected to an end of the SAF element 14 to form a second sub-circuit. The first potential +V is applied to the other end of the SAF element 14. The other end of the conventional GMR element 12 is grounded (connected to GND). In other words, the second potential is applied to this other end of the conventional GMR element 12.

The potential difference Vox (=VQ2−VQ1) between the potential VQ1 at the junction Q1 where the conventional GMR element 11 and the SAF element 13 are connected and the potential VQ2 at the junction Q2 where the conventional GMR element 12 and the SAF element 14 are connected is extracted as the output (first output) of the X-axis magnetic sensor. Thus, the X-axis magnetic sensor outputs a voltage Vox that is substantially proportional to the external magnetic field Hx and that decreases as the external magnetic field Hx increases, as shown in FIG. 6B.

As shown in the equivalent circuit of FIG. 7A, the Y-axis magnetic sensor includes the elements 21 to 24 connected in a full-bridge configuration through conducting wires not shown in FIG. 1. The graphs adjacent to the elements 21 to 24 in FIG. 7A each show the characteristics of their adjacent elements, that is, the changes in resistance R in response to the intensity of an external magnetic field varying in the Y-axis direction (component Hy along the positive Y-axis direction of the external magnetic field H).

The Y-axis magnetic sensor will be further described in detail below. An end of the conventional GMR element 21 is connected to an end of the SAF element 23 to form a third sub-circuit. A first potential +V is applied to the other end of the conventional GMR element 21. The other end of the SAF element 23 is grounded (connected to GND). In other words, a second potential different from the first potential is applied to this other end of the SAF element 23.

Also, an end of the conventional GMR element 22 is connected to an end of the SAF element 24 to form a fourth sub-circuit. The first potential +V is applied to the other end of the SAF element 24. The other end of the conventional GMR element 22 is grounded (connected to GND). In other words, the second potential is applied to this other end of the conventional GMR element 22.

The potential difference Voy (=VQ3−VQ4) between the potential VQ3 at the junction Q3 where the conventional GMR element 21 and the SAF element 23 are connected and the potential VQ4 at the junction Q4 where the conventional GMR element 22 and the SAF element 24 are connected is extracted as the output (second output) of the Y-axis magnetic sensor. Thus, the Y-axis magnetic sensor outputs a voltage Voy that is substantially proportional to the external magnetic field Hy varying in the Y-axis direction and that increases as the external magnetic field Hy increases, as shown in FIG. 7B.

Fixing of Magnetization Directions of Pinned Layers

Figure 8:
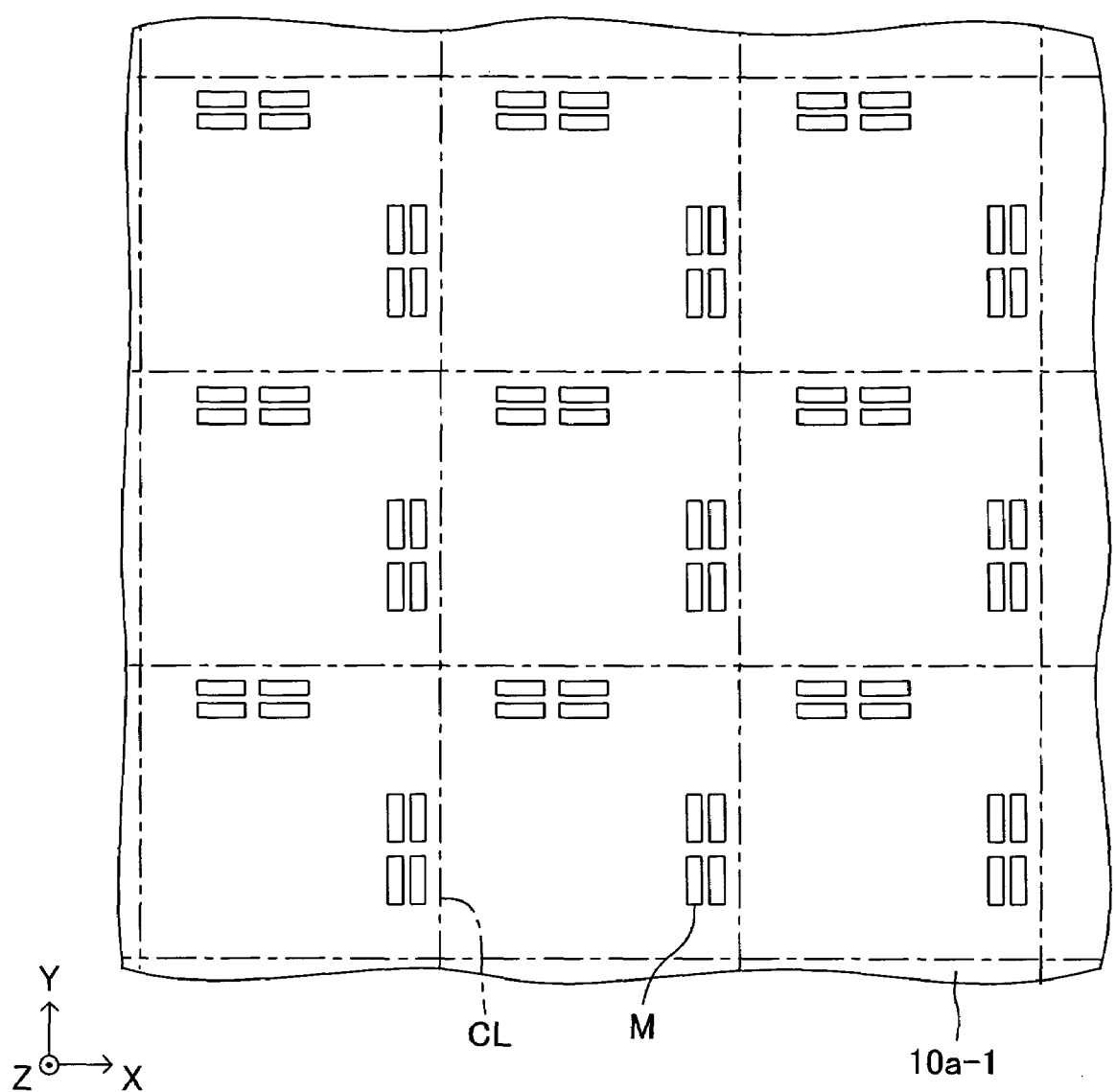
FIG. 8 is a fragmentary plan view of a wafer (substrate) used for manufacturing the magnetic sensor shown in FIG. 1.

A technique will now be described for fixing the magnetization directions of the pinned layers of the elements 11 to 14 and 21 to 24. First, a plurality of films M corresponding to the elements 11 to 14 and 21 to 24 are formed in an island-shaped manner on a substrate 10a-1 that will become the substrate 10a later, as shown in the plan view in FIG. 8. These films M are disposed so that when the substrate 10a-1 is cut along the dotted-chain lines CL in FIG. 8 into a plurality of magnetic sensors 10 shown in FIG. 1 in a cutting step, the elements 11 to 14 and 21 to 24 are arranged on the substrate 10a as shown in FIG. 1. How these films M are formed will be described later.

Figure 10:
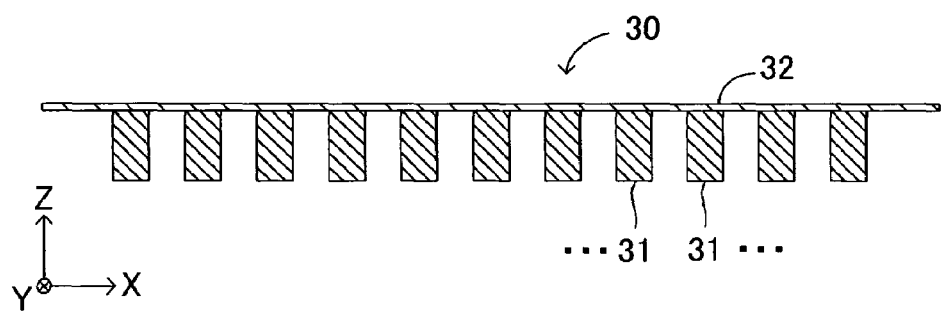
FIG. 10 is a sectional view of the magnet array taken along line II-II in FIG. 9.

A magnet array 30 shown in FIGS. 9 and 10 is prepared. FIG. 9 is a plan view of the magnet array 30. FIG. 10 is a sectional view of the magnet array 30 taken along line II-II in FIG. 9. The magnet array 30 includes a plurality of rectangular solid permanent magnets (permanent bar magnets) 31 and a plate 32 made of a transparent quartz glass. The permanent magnets 31 are arrayed in a tetragonal lattice manner, and their upper surfaces are fixed to the lower surface of the plate 32. The permanent magnets 31 are arranged in such a manner that the end surfaces in the same plane of any two adjacent permanent magnets 31 have polarities opposite to each other.

That is, the magnet array 30 has a plurality of substantially rectangular solid permanent magnets 31, each having a substantially square section perpendicular to the central axis of one of the permanent magnets. The permanent magnets 31 are arranged at small intervals such that each of the barycenters of the end surfaces of the permanent magnets corresponds to the each of lattice points of a tetragonal lattice, and such that their magnetic poles have polarities opposite to those of the magnetic poles of their adjacent permanent magnets 31, the end surfaces having the same shape as the section.

Figure 11:
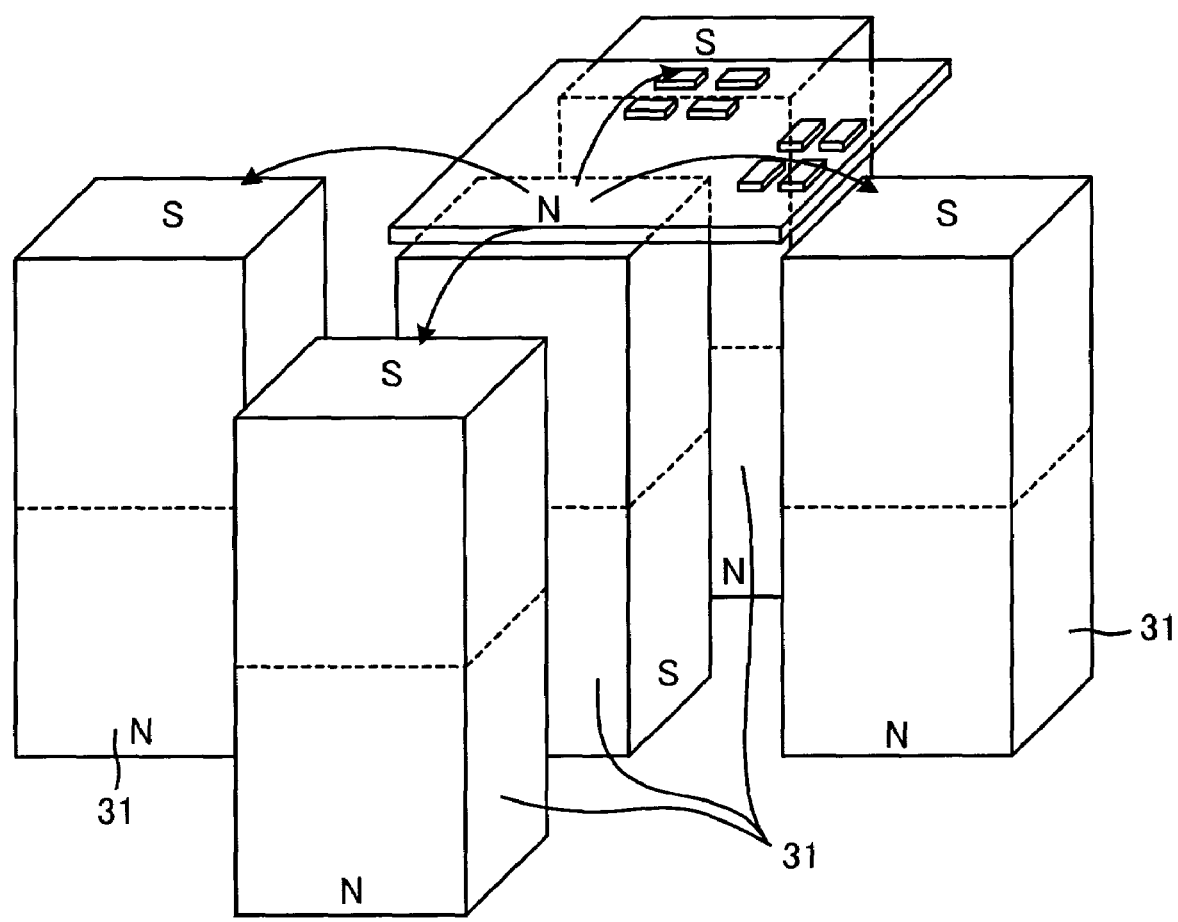
FIG. 11 is a perspective view of five of the permanent magnets in the magnet array shown in FIG. 9.

FIG. 11 is a perspective view of five of the permanent magnets 31. As clearly shown in FIG. 11, the end surfaces (surfaces provided with a magnetic pole) of the permanent magnets 31 generate magnetic fields whose magnetic field lines direct from an N pole to its adjacent S poles. That is, the magnetic fields having directions different by an angle of 90° with each other are generated above the magnet array 30. In the present embodiment, these magnetic fields are used for fixing the magnetization directions of the pinned layers in the elements 11 to 14 and 21 to 24.

Next, the substrate 10*a*-1 having the films M is disposed over the magnet array 30. Specifically, the substrate 10*a*-1 and the magnet array 30 are placed with a relative positional relationship such that two adjacent edges of each square formed by cutting the substrate 10*a*-1 along lines CL, not having the films M adjacent thereto, and their intersection are aligned with two adjacent edges and their intersection of the corresponding permanent magnet, as shown in the plan view in FIG. 12. Thus, each film M is exposed to a magnetic field oriented in the direction perpendicular to the longitudinal direction of the narrow strip-shaped portions of the film M, as indicated by the arrows in FIGS. 11 and 12.

Then, such a set of the substrate 10*a*-1 and the magnet array 30 is heated to 250 to 280° C. in a vacuum and subsequently allowed to stand for about 4 hours for magnetic field heat treatment. Consequently, the magnetization directions of the fixed magnetization layers P (pinned layers Pd) of the conventional GMR elements and the fixed magnetization layers P' (pinned layers P1) of the SAF elements are fixed.

Figure 13:
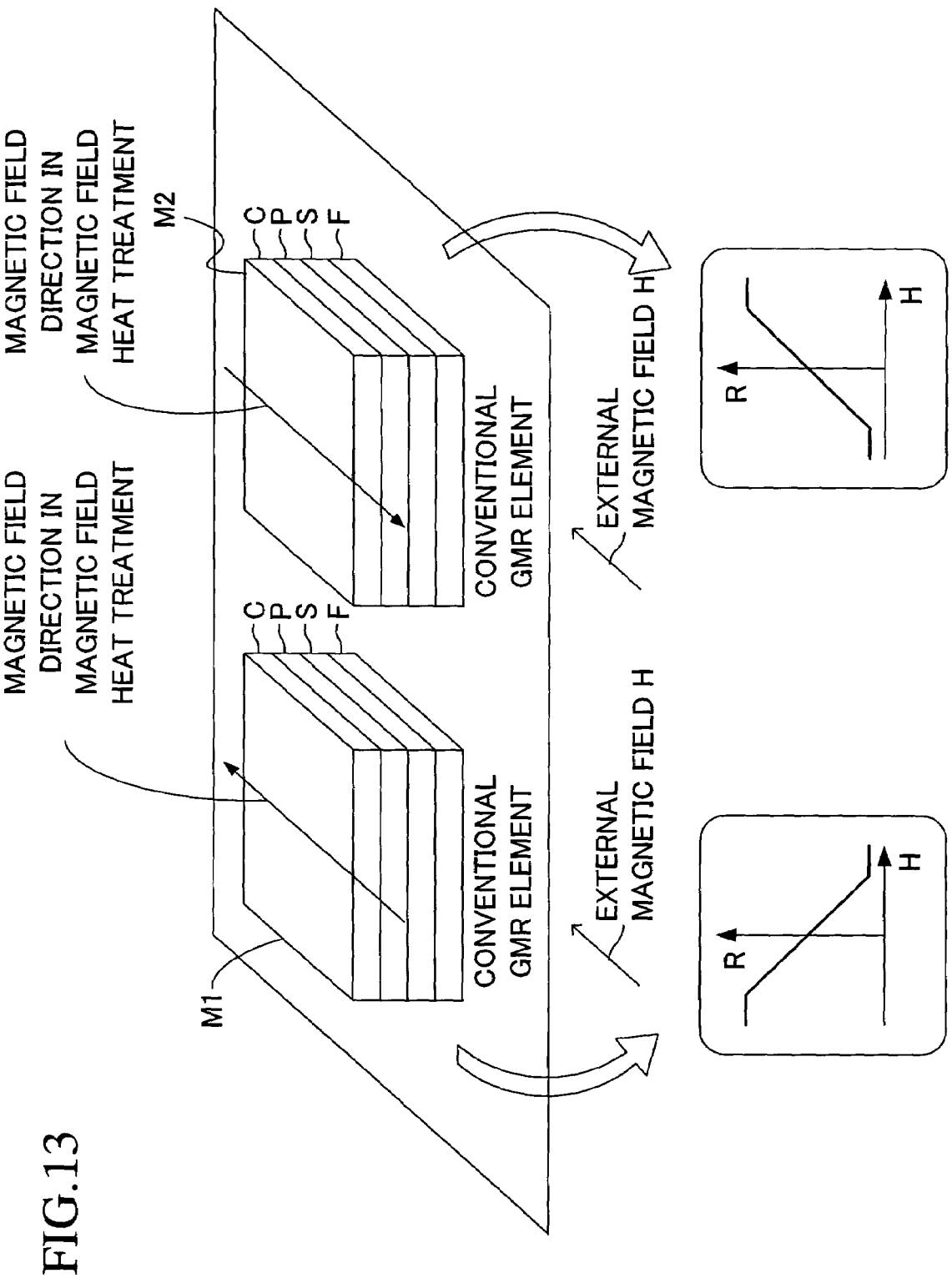
FIG. 13 is a representation of the relationships, each between the magnetic field direction in magnetic field heat treatment and the resulting characteristics of a conventional GMR element.

Referring now to FIG. 13, for example, in order to form two closely lying conventional GMR elements whose magnetic-field-detecting directions are antiparallel to (180° different from) each other, the magnetic field applied during magnetic field heat treatment to one film M1 of the films becoming one of the conventional GMR elements must be oriented in the direction antiparallel to the direction of the magnetic field applied to the other film M2 also becoming the other one of the conventional GMR elements. In general, it is however difficult to generate large antiparallel magnetic fields in a small area. Accordingly, in a known process, the two conventional GMR elements are disposed at a relatively large distance in order allow them to be respectively exposed to two antiparallel magnetic fields from an N pole to its two adjacent S poles of the magnet array 30 (or from an S pole to its two adjacent N poles of the magnetic array 30).

Figure 14:
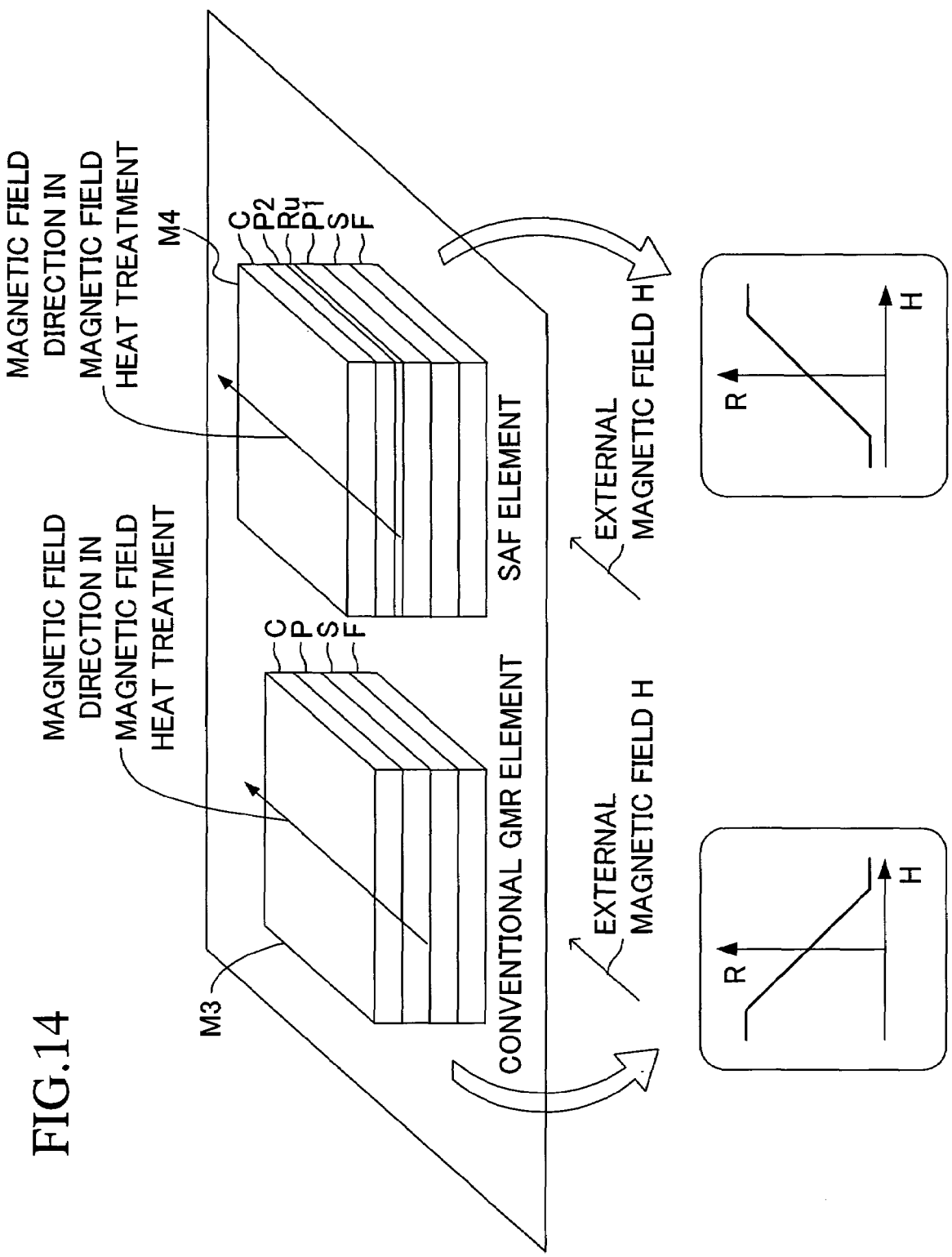
FIG. 14 is a representation of the relationships, each between the magnetic field direction in magnetic field heat treatment and the resulting characteristics of a conventional GMR element or a SAF element.

On the other hand, as shown in FIG. 14, if magnetic fields oriented in the same direction are applied for magnetic field heat treatment to two closely lying films M3 and M4 respectively intended to become a conventional GMR element and a SAF element, giant magnetoresistive elements are produced whose magnetic-field-detecting directions are antiparallel to each other. This is because the magnetization of the pinned layer Pd (CoFe magnetic layer) of the fixed magnetization layer P in the film intended to become a conventional GMR element and the magnetization of the second ferromagnetic layer P2 of the fixed magnetization layer P' in the film intended to become a SAF element are fixed in the same direction each other, while the magnetization direction of the first ferromagnetic layer P1 of the fixed magnetization layer P' is antiparallel to that of the second ferromagnetic layer P2.

Thus, this technique can provide at least two giant magnetoresistive elements arranged in a very small area, having antiparallel magnetic-field-detecting directions each other.

Figure 12:
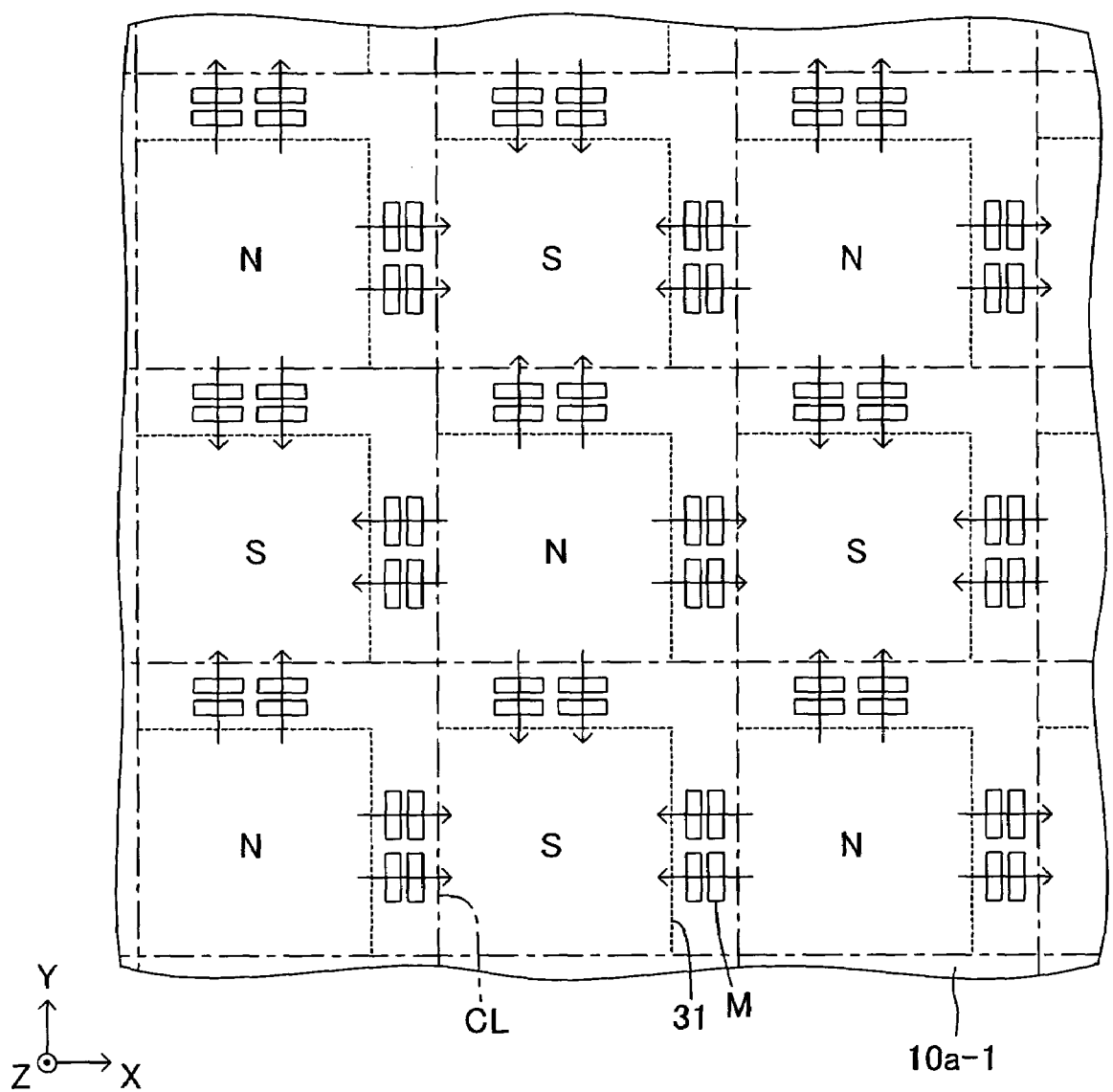
FIG. 12 is a fragmentary plan view of a magnet array and a wafer used for fixing the magnetization directions of the pinned layers of the conventional GMR elements and SAF elements in the magnetic sensor shown in FIG. 1.
Figure 15:
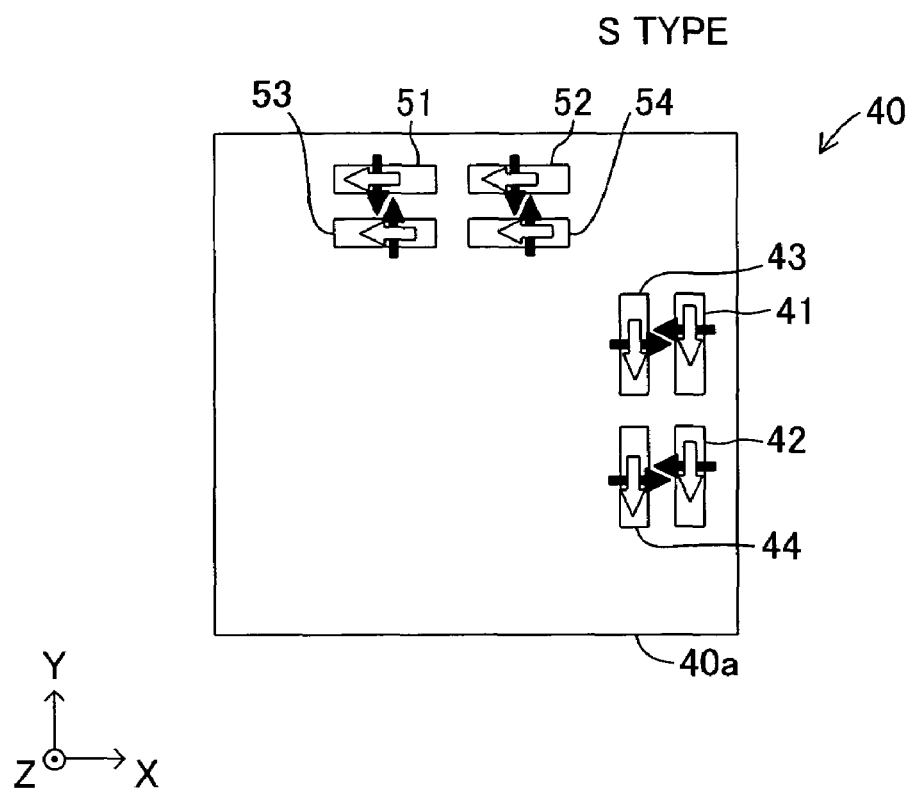
FIG. 15 is a plan view of a magnetic sensor (S type) according to the first embodiment of the present invention.

In practice, after the magnetic field heat treatment, the substrate 10*a*-1 having the films is subjected to necessary treatment, including polarization of the bias magnet films, and thereafter, is cut along lines CL shown in FIG. 12. As a result, a plurality of magnetic sensors 10 shown in FIG. 1 and a plurality of magnetic sensors 40 shown in FIG. 15 are simultaneously manufactured.

The magnetic sensor 40 thus manufactured is referred to as the "S-type magnetic sensor 40" for the sake of convenience. The S-type magnetic sensor 40 includes giant magnetoresistive elements 41 to 44 and 51 to 54. The elements 41, 42, 51, and 52 are conventional GMR elements; and the elements 43, 44, 53, and 54 are SAF elements. The initial magnetizations of the free layers in these elements and the fixed magnetizations of the pinned layers (ferromagnetic layers adjoining the spacer layers), whose directions are antiparallel to the magnetic-field-detecting directions, are oriented as shown in FIG. 15.

The elements 41, 42, 43, and 44 are referred to as a first, a second, a third, and a fourth X-axis magnetic detecting element, respectively. These X-axis magnetic detecting elements are connected in a full bridge configuration to form an X-axis magnetic sensor, as in the elements 11, 12, 13, and 44 of the magnetic sensor 10. Similarly, the elements 51, 52, 53, and 54 are referred to as a first, a second, a third, and a fourth Y-axis magnetic detecting element, respectively. These Y-axis magnetic detecting elements are connected in a full bridge configuration to form a Y-axis magnetic sensor, as in the elements 21, 22, 23, and 24 of the magnetic sensor 10.

First Method for Forming Films M

A first method (film formation step or a film forming step) for forming the films M (intended to act as the conventional GMR element and the SAF element) will now be described.

Step 1: A substrate 10*a* is prepared as shown in FIG. 16A. The substrate 10*a* has an insulating/wiring layer including wires 10*a*1 used for the bridge configuration and an insulating layer 10*a*2 covering the wires 10*a*1. The insulating layer 10*a*2 has via holes VIA used for electrical connection. The wires 10*a*1 are partially exposed at the bottoms of the via holes VIA.

Step 2: Referring to FIG. 16B, a CoCrPt layer 10*b* intended to become the bias magnet films is formed on the upper surface of the substrate 10*a* by sputtering.

Step 3: Referring to FIG. 16C, a resist layer R1 is formed on the upper surface of the CoCrPt layer 10*b*. The resist layer R1 is patterned so as to cover only necessary regions for the bias magnet films. In other words, the resist layer R1 is formed into a resist mask.

Figure 17A:
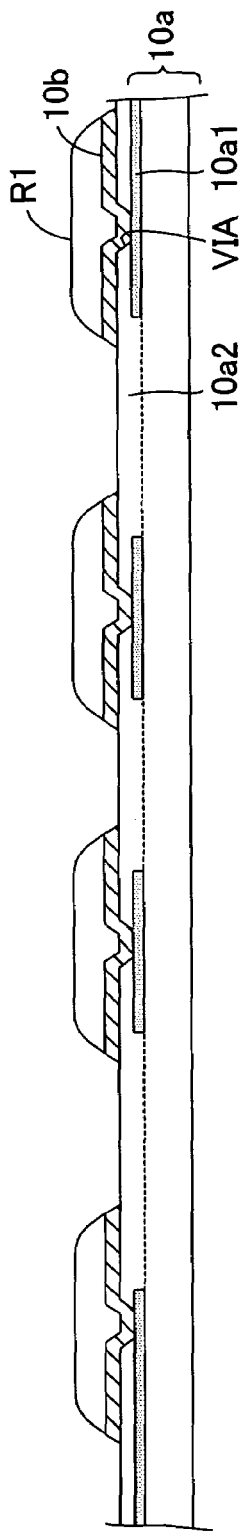
FIG. 17A is a manufacturing process view of a step following the step shown in FIG. 16C.

Step 4: Referring to FIG. 17A, unnecessary regions of the CoCrPt layer 10*b* are removed by ion milling.

Figure 17B:
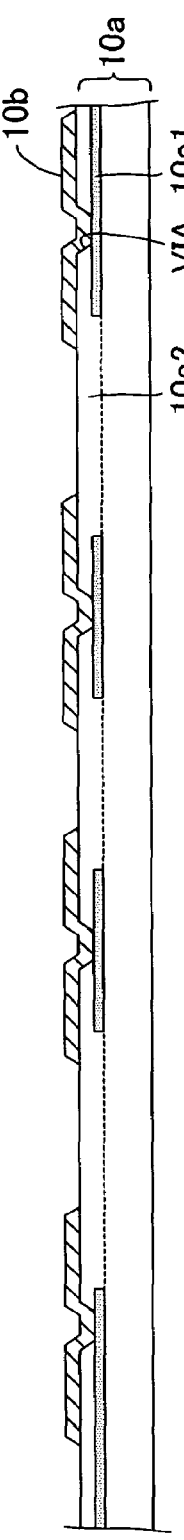
FIG. 17B is a manufacturing process view of a step following the step shown in FIG. 17A.

Step 5: Referring to FIG. 17B, the resist layer R1 is removed.

Figure 17C:
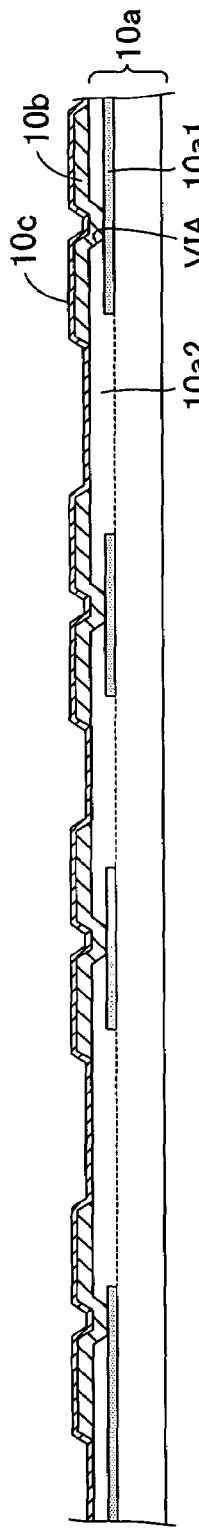
FIG. 17C is a manufacturing process view of a step following the step shown in FIG. 17B.

Step 6: Referring to FIG. 17C, a composite layer 10*c* as shown in FIG. 4A, intended to become the conventional GMR elements is formed over the upper surface of the substrate 10*a*.

Figure 18A:
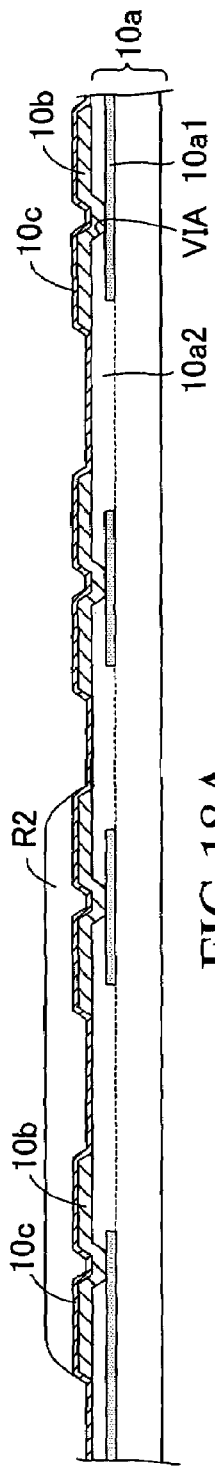
FIG. 18A is a manufacturing process view of a step following the step shown in FIG. 17C.

Step 7: Referring to FIG. 18A, a resist layer R2 is formed on the upper surface of the composite layer 10*c* and subsequently patterned so as to cover only necessary regions of the composite layer 10*c*. In other words, the resist layer R2 is formed into a resist mask.

Figure 18B:
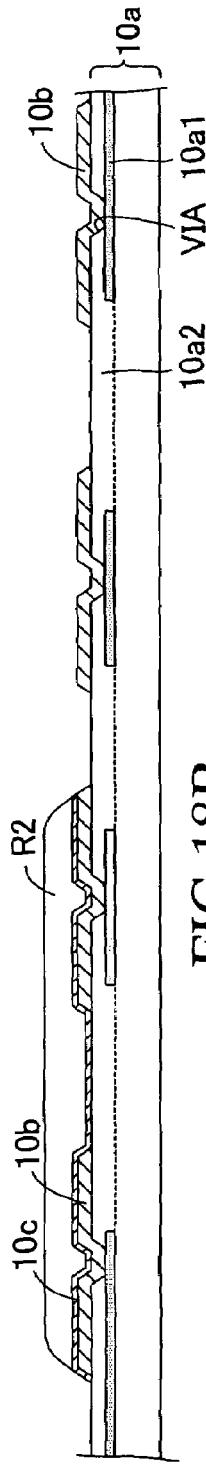
FIG. 18B is a manufacturing process view of a step following the step shown in FIG. 18A.

Step 8: Referring to FIG. 18B, unnecessary regions of the composite layer 10*c* are removed by ion milling.

Figure 18C:
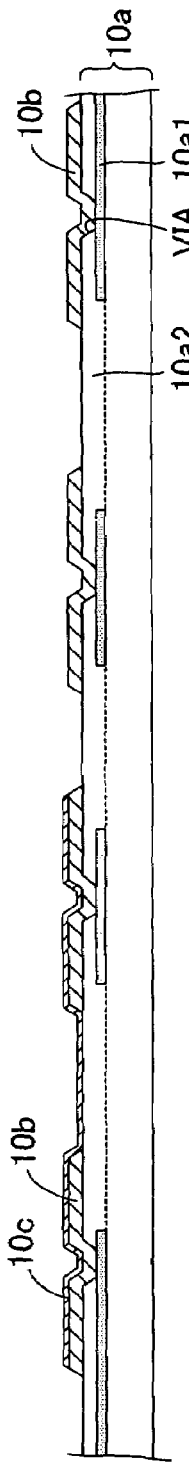
FIG. 18C is a manufacturing process view of a step following the step shown in FIG. 18B.

Step 9: Referring to FIG. 18C, the resist layer R2 is removed.

Figure 19A:
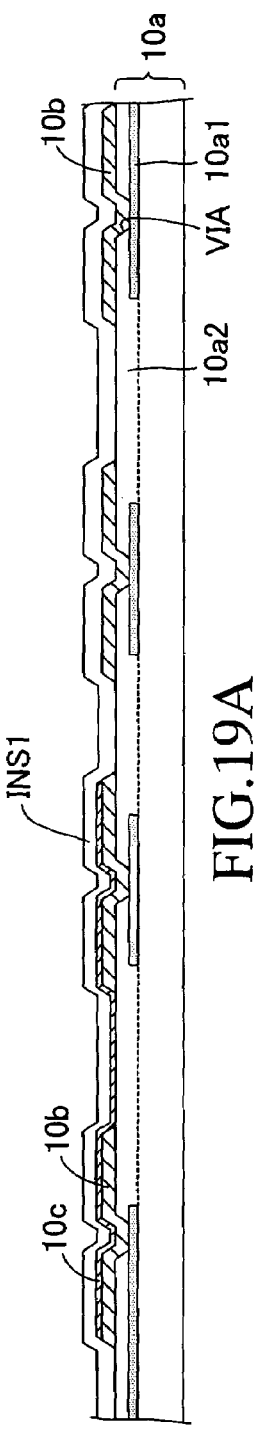
FIG. 19A is a manufacturing process view of a step following the step shown in FIG. 18C.

Step 10: Referring to FIG. 19A, a SiN insulating interlayer INS1 is formed by chemical vapor deposition (CVD). Alternatively, the insulating interlayer INS1 may be formed of $SiO_2$.

Figure 19B:
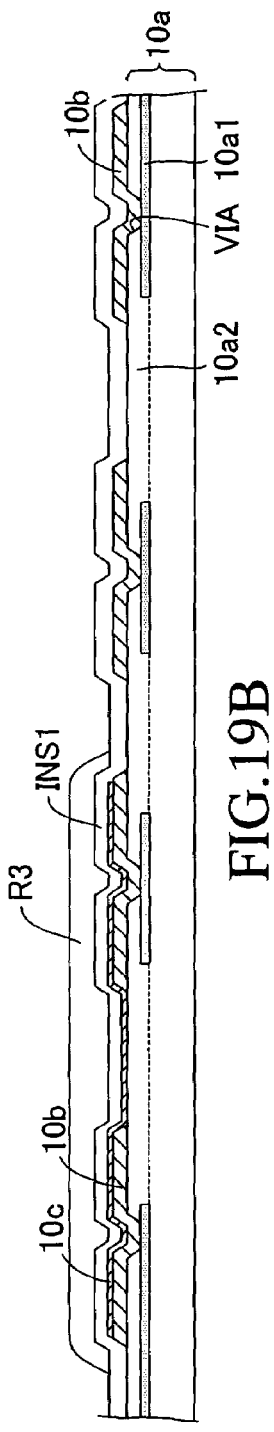
FIG. 19B is a manufacturing process view of a step following the step shown in FIG. 19A.

Step 11: Referring to FIG. 19B, a resist layer R3 is formed on the upper surface of the insulating interlayer INS1 and subsequently patterned so as to cover only regions that are to have the conventional GMR elements. In other words, the resist layer R3 is formed into a resist mask.

Figure 19C:
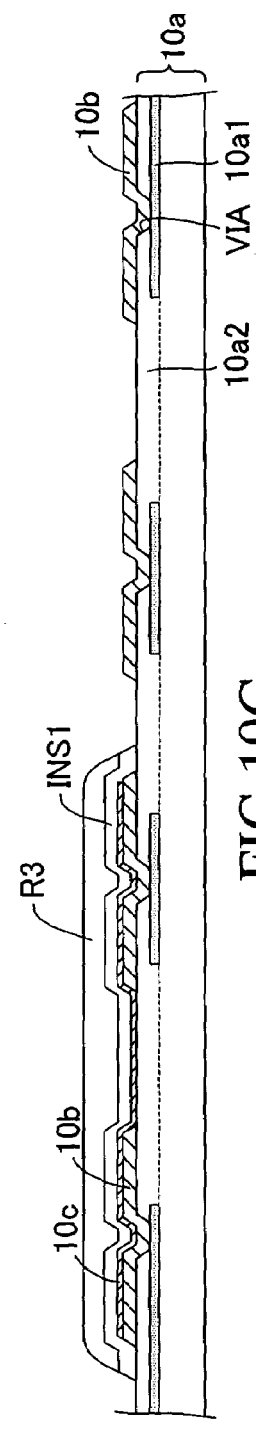
FIG. 19C is a manufacturing process view of a step following the step shown in FIG. 19B.

Step 12: Referring to FIG. 19C, unnecessary regions of the insulating interlayer INS1 are removed by ion milling.

Figure 20A:
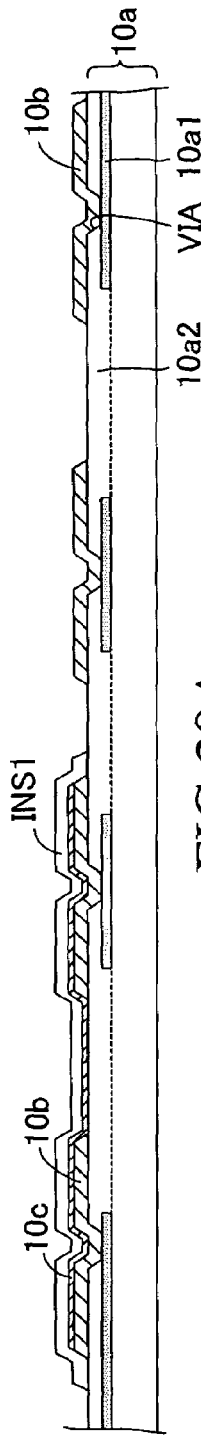
FIG. 20A is a manufacturing process view of a step following the step shown in FIG. 19C.

Step 13: Referring to FIG. 20A, the resist layer R3 is removed.

Figure 5A:
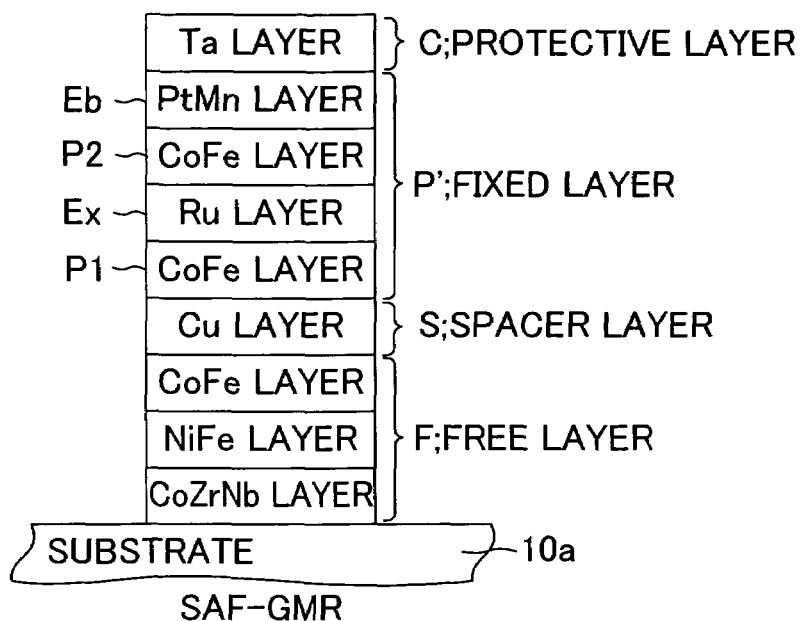
FIG. 5A is a schematic representation of the structure of a SAF element shown in FIG. 1.
Figure 5B:
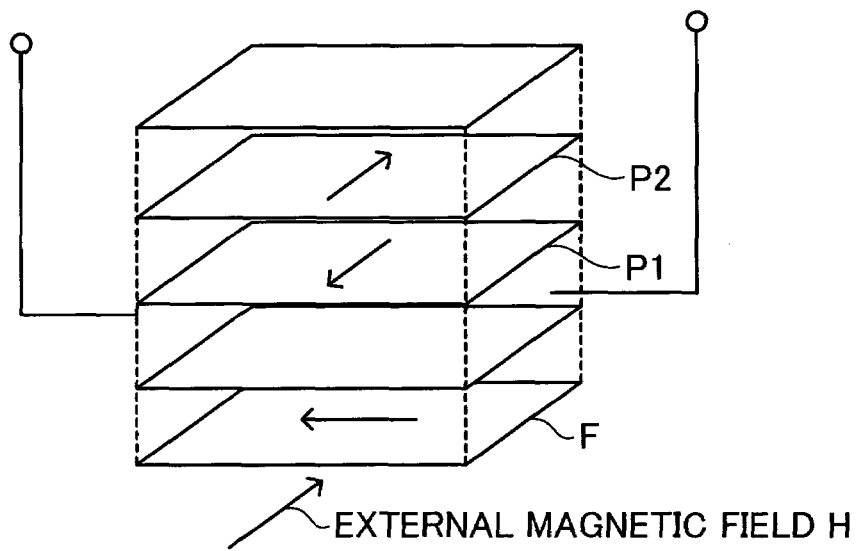
FIG. 5B is a conceptual perspective view of a SAF element shown in FIG. 1.
Figure 20B:
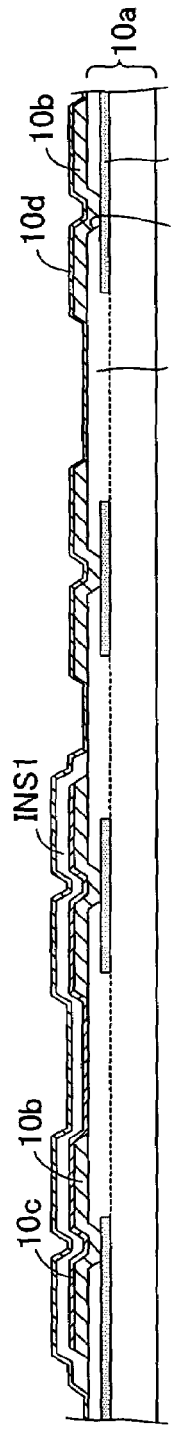
FIG. 20B is a manufacturing process view of a step following the step shown in FIG. 20A.

Step 14: Referring to FIG. 20B, a composite layer 10d as shown in FIG. 5A, intended to become the SAF elements is formed over the upper surface of the substrate 10a.

Figure 20C:
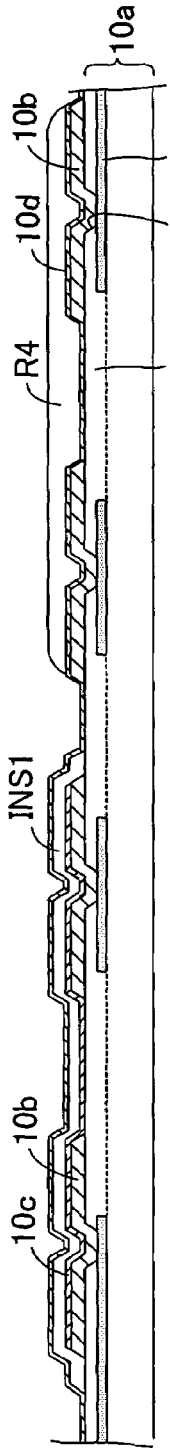
FIG. 20C is a manufacturing process view of a step following the step shown in FIG. 20B.

Step 15: Referring to FIG. 20C, a resist layer R4 is formed on the upper surface of the composite layer 10d and subsequently patterned so as to cover only necessary regions of the composite layer 10d. In other words, the resist layer R4 is formed into a resist mask.

Figure 21A:
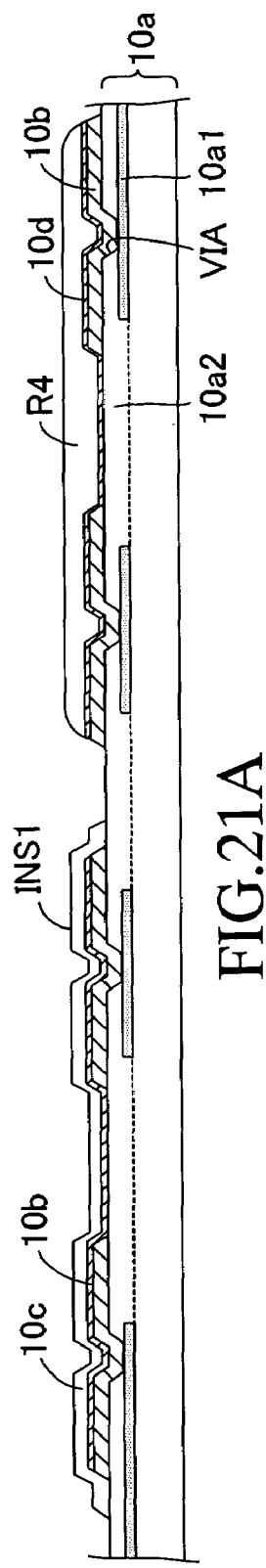
FIG. 21A is a manufacturing process view of a step following the step shown in FIG. 20C.

Step 16: Referring to FIG. 21A, unnecessary regions of the composite layer 10d are removed by ion milling.

Figure 21B:
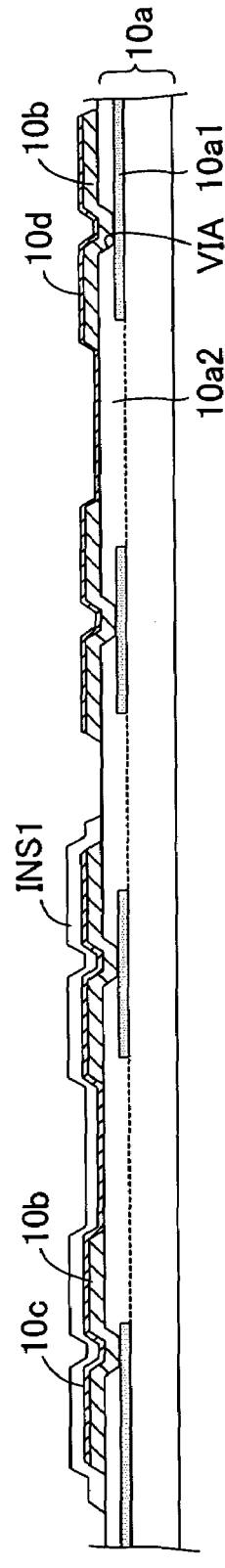
FIG. 21B is a manufacturing process view of a step following the step shown in FIG. 21A.

Step 17: Referring to FIG. 21B, the resist layer R4 is removed.

With steps above, the films intended to act as the conventional GMR elements are provided on the left of FIG. 21B, and the films intended to act as the SAF elements are provided on the right. Following these steps, the above-described magnetic field heat treatment is performed.

Note that, although the films intended to act as the conventional giant magnetoresistive elements are formed before the films intended to act as the SAF elements are formed in the above method, the films intended to act as the SAF elements may be formed before the films intended to act as the conventional giant magnetoresistive elements are formed.

As described above, the first method includes a film forming step including the sub steps of:

forming (depositing) on a single substrate a first composite layer (or films) intended to act as one of the first giant magnetoresistive elements (conventional GMR elements) and the second giant magnetoresistive elements (SAF elements) (Step 6);

removing unnecessary regions of the first composite layer (Steps 7 to 9);

covering (coating) the first composite layer with an insulating layer after the unnecessary regions of the first composite layer are removed (Steps 10 to 13);

forming (depositing) a second composite layer (or films) intended to act as the other giant magnetoresistive elements on the substrate and the insulating layer (Step 14); and removing unnecessary regions of the second composite layer (Steps 15 to 17).

By the method described above, films intended to act as the conventional GMR elements and the SAF elements are formed on a single substrate without a break (in a continuous fashion).

Second Method for Forming Films M

A second method for forming the films M will now be described. The second method provides films in which the fixed magnetization layers P and P' is formed on a substrate and the spacer layer S and the free layer F are formed on the fixed magnetization layers P and P'. This type of film can be called a bottom spin-valve film.

Figure 22A:
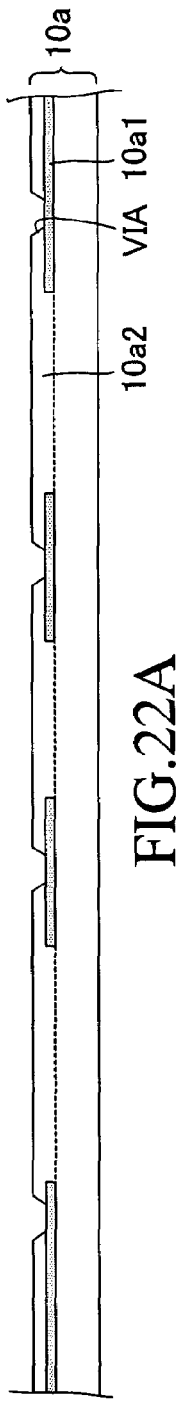
FIG. 22A is a manufacturing process view of a step for forming films intended to act as the conventional GMR elements and the SAF elements on a substrate, according to a second method for manufacturing the magnetic sensor shown in FIG. 1.

Step 1: A substrate 10a is prepared as shown in FIG. 22A. The substrate has the same structure as the substrate 10a shown in FIG. 16A.

Figure 22B:
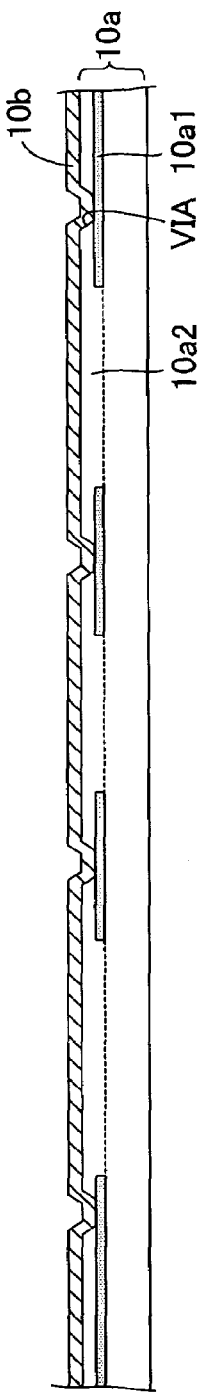
FIG. 22B is a manufacturing process view of a step following the step shown in FIG. 22A.

Step 2: Referring to FIG. 22B, a CoCrPt layer 10b intended to become the bias magnet films is formed on the upper surface of the substrate 10a by sputtering.

Figure 22C:
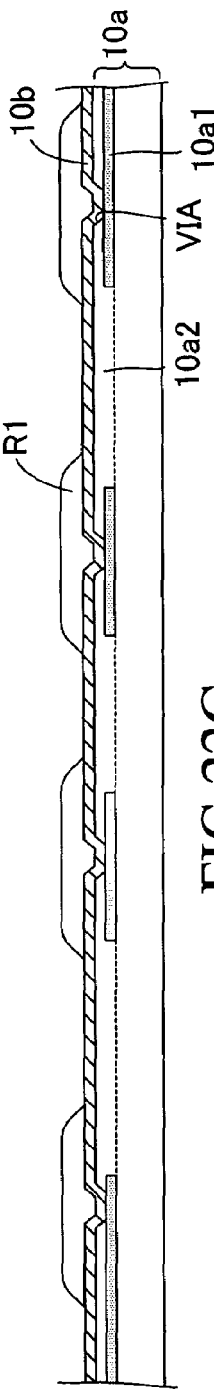
FIG. 22C is a manufacturing process view of a step following the step shown in FIG. 22B.

Step 3: Referring to FIG. 22C, a resist layer R1 is formed on the upper surface of the CoCrPt layer 10b. The resist layer R1 is patterned so as to cover only necessary regions for the bias magnet films. In other words, the resist layer R1 is formed into a resist mask.

Figure 23A:
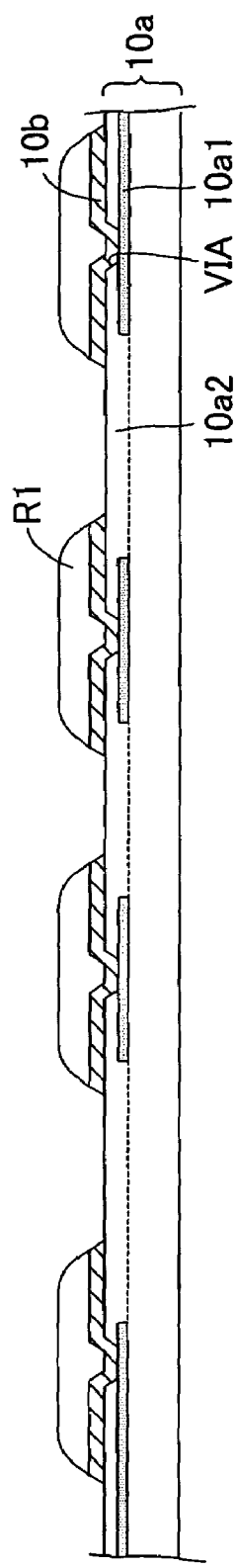
FIG. 23A is a manufacturing process view of a step following the step shown in FIG. 22C.

Step 4: Referring to FIG. 23A, unnecessary regions of the CoCrPt layer 10b are removed by ion milling.

Figure 23B:
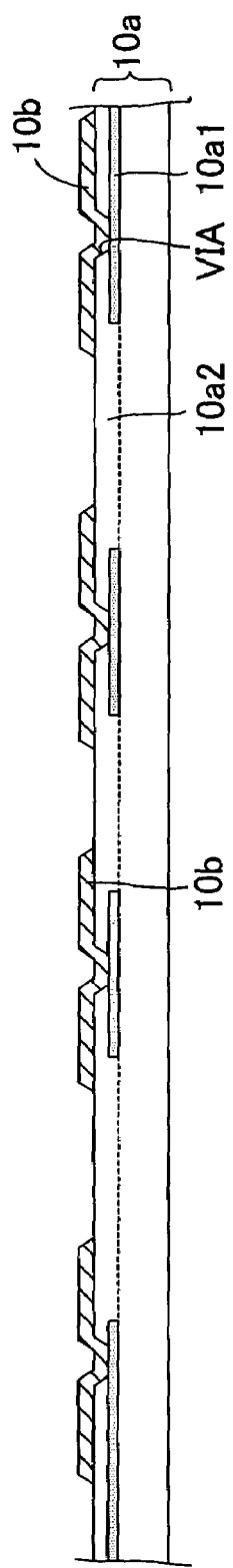
FIG. 23B is a manufacturing process view of a step following the step shown in FIG. 23A.

Step 5: Referring to FIG. 23B, the resist layer R1 is removed. The steps up to Step 5 of this method are the same as the steps up to Step 5 of the first method.

Figure 24A:
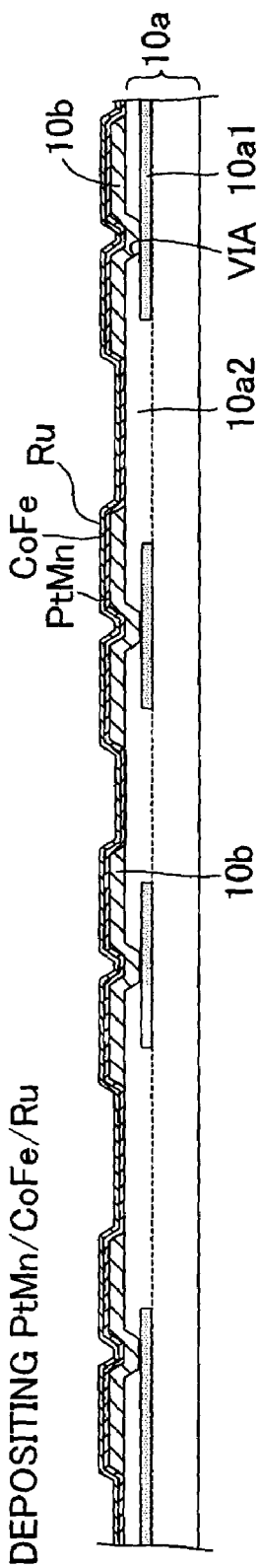
FIG. 24A is a manufacturing process view of a step following the step shown in FIG. 23B.
Figure 24B:
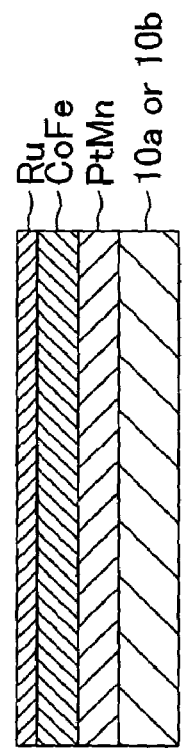
FIG. 24B is an enlarged view of a first SAF composite layer shown in FIG. 24A.

Step 6: Referring to FIG. 24A, a PtMn layer, a CoFe layer, and a Ru layer are formed (deposited or laminated) in this order to form part of a composite layer (films) intended to act as the SAF elements (hereinafter may be referred to as "first SAF composite layer"). FIG. 24B is an enlarged view of the first SAF composite layer.

Figure 25A:
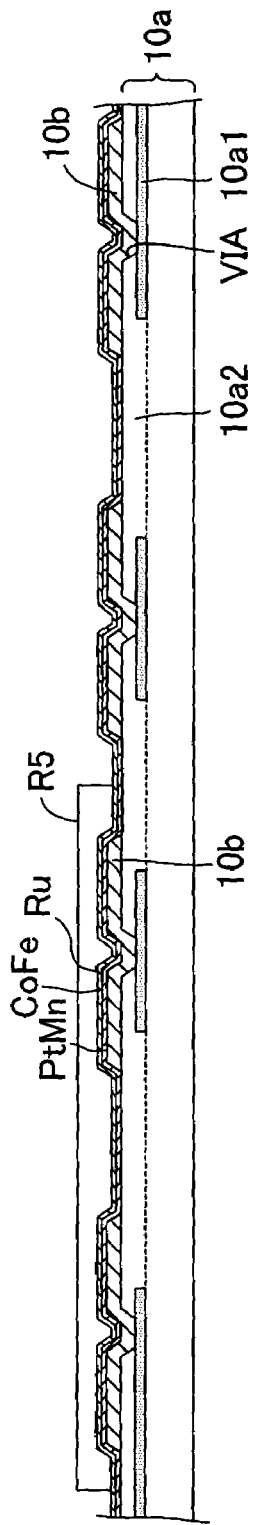
FIG. 25A is a manufacturing process view of a step following the step shown in FIG. 24A.
Figure 25B:
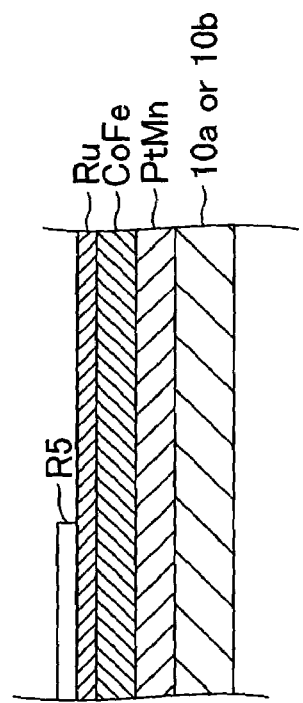
FIG. 25B is an enlarged view of an end of a resist layer R5 and its vicinity shown in FIG. 25A.

Step 7: Referring to FIG. 25A, a resist layer R5 is formed (deposited) on the upper surface of the first SAF composite layer and subsequently patterned so as to cover necessary regions for the first SAF composite layer and their vicinities. In other words, the resist layer R5 is formed into a resist mask. FIG. 25B is an enlarged view of an end of the resist layer R5 and its vicinity.

Figure 26A:
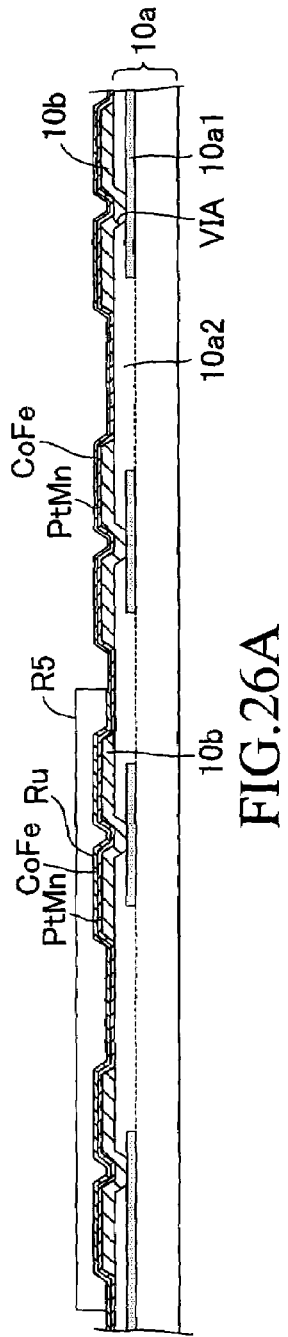
FIG. 26A is a manufacturing process view of a step following the step shown in FIG. 25A.
Figure 26B:
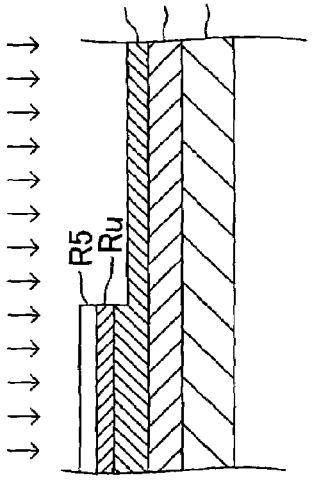
FIG. 26B is an enlarged view of an end of a resist layer R5 formed by the step shown in FIG. 26A.

Step 8: Referring to FIG. 26A, the Ru layer and part of the CoFe layer in the regions necessary for the first SAF composite layer are removed by ion milling. FIG. 26B is an enlarged view of the first SAF composite layer after the ion milling.

Figure 26C:
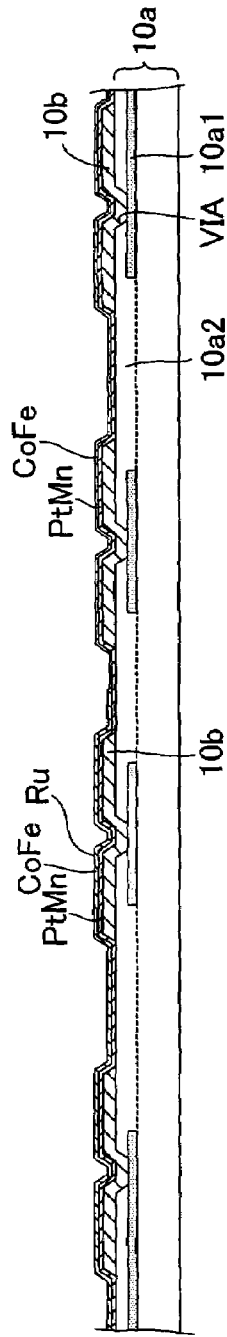
FIG. 26C is a manufacturing process view of a step following the step shown in FIG. 26A.

Step 9: Referring to FIG. 26C, the resist layer R5 is removed.

Figure 27A:
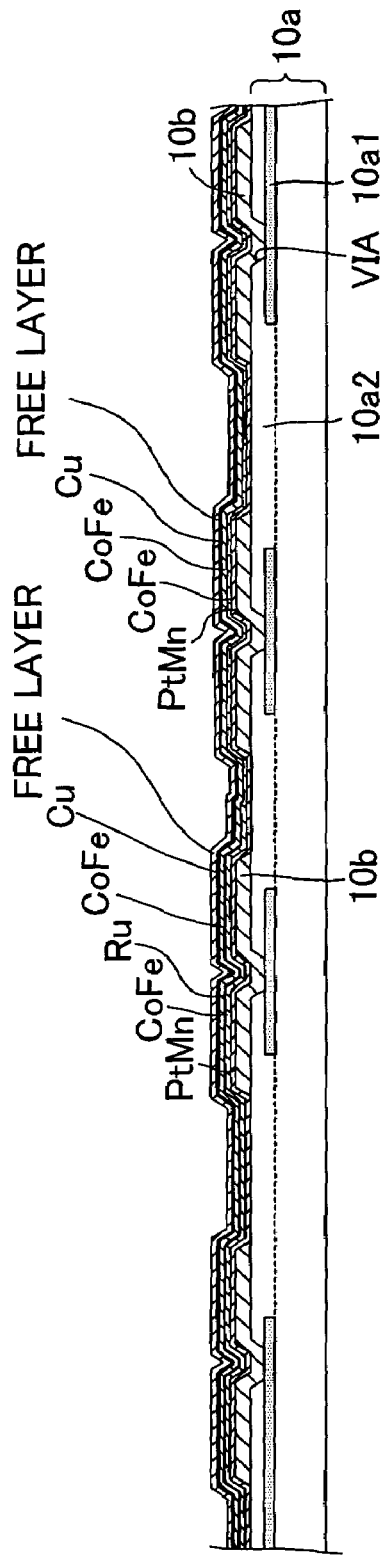
FIG. 27A is a manufacturing process view of a step following the step shown in FIG. 26C.
Figure 27B:
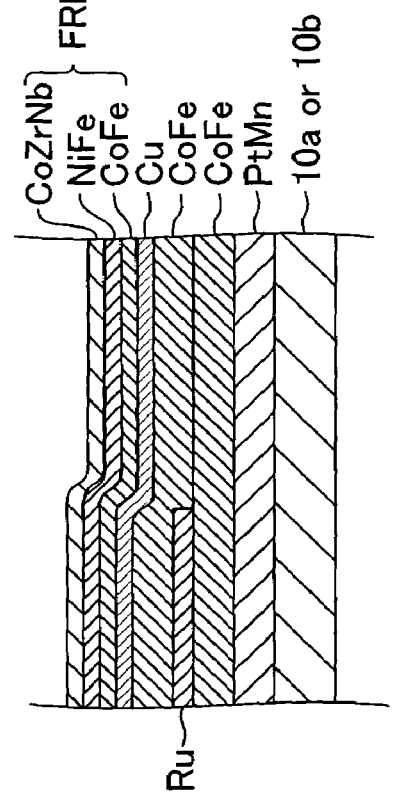
FIG. 27B is an enlarged view of a Ru layer and layers in its vicinity formed by the step shown in FIG. 27A.

Step 10: Referring to FIG. 27A, a CoFe layer, and a Cu layer intended to act as the spacer layer, a CoFe layer, a NiFe and a CoZrNb layer that are intended to act as the free layer are formed (deposited or laminated) in this order over the upper surface of the layers already formed by steps 1 to 9. FIG. 27B is an enlarged view of the resulting composite layer. Then, magnetic field heat treatment is performed on the resulting composite layer.

Figure 28A:
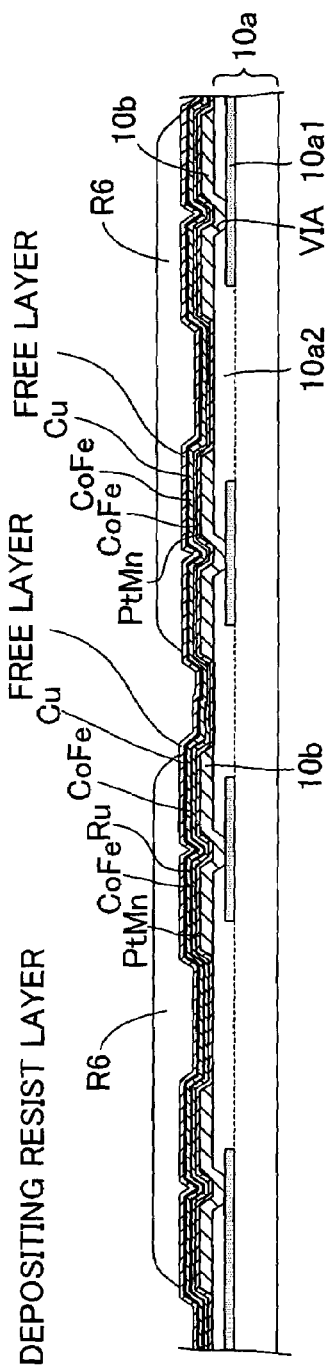
FIG. 28A is a manufacturing process view of a step following the step shown in FIG. 27A.

Step 11: Referring to FIG. 28A, a resist layer R6 is formed on the upper surface of the composite layer and subsequently patterned so as to cover only regions that are to have the conventional GMR elements and SAF elements. In other words, the resist layer R6 is formed into a resist mask.

Figure 28B:
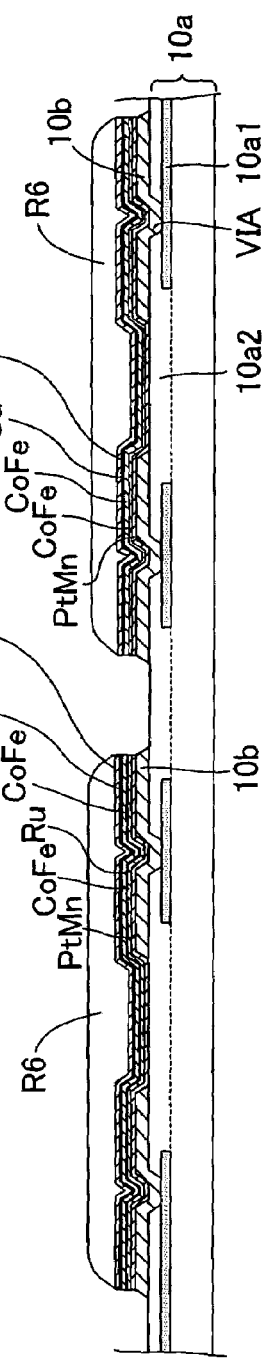
FIG. 28B is a manufacturing process view of a step following the step shown in FIG. 28A.

Step 12: Referring to FIG. 28B, unnecessary regions of the composite layer are removed by ion milling.

Figure 28C:
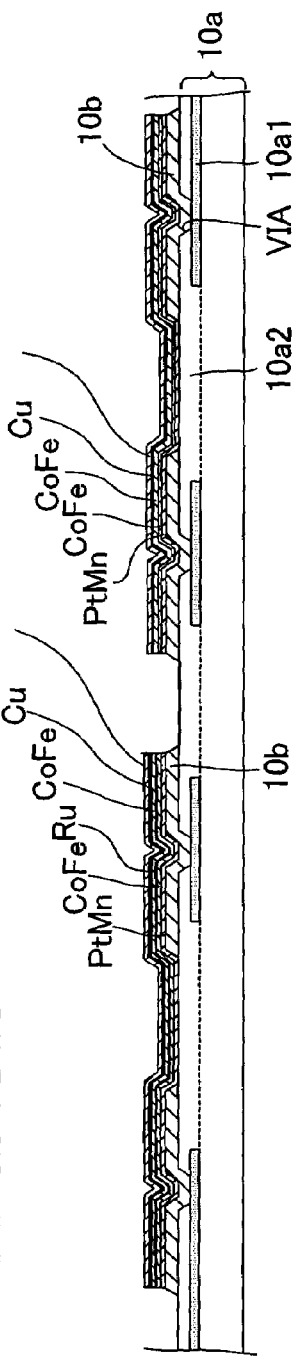
FIG. 28C is a manufacturing process view of a step following the step shown in FIG. 28B.

Step 13: Referring to FIG. 28C, the resist layer R6 is removed.

With steps above, films intended to act as the SAF elements are provided on the left of FIG. 28C, and films intended to act as the conventional GMR elements are provided on the right.

As described above, the second method includes a film forming step including the sub steps of:

forming (depositing) layers intended to act as the pinning layer, second ferromagnetic layer, and exchange coupling layer of the second giant magnetoresistive element (SAF element) in this order on a substrate to form a first pre-composite layer (first SAF composite layer) (Step 6);

completely removing the layer intended to act as the exchange coupling layer of the first pre-composite layer from regions that are to have the first giant magnetoresistive elements (conventional GMR elements) without removing the first pre-composite layer from regions that are to have the second giant magnetoresistive elements (Steps 7 to 9); and further forming (depositing) a layer intended act as a ferromagnetic layer having the same composition as the second ferromagnetic layer and layers intended to act as the spacer layer and the free layer of the first magnetoresistive element and the second giant magnetoresistive element, in this order, over the entire upper surface after removing the layer intended to act as the exchange coupling layer of the first pre-composite layer from regions that are to have the first giant magnetoresistive elements (Step 10).

By the method described above, films intended to act as the conventional GMR elements and the SAF elements are formed on a single substrate without a break (in a continuous fashion).

Third Method for Forming Films M

A third method for forming the films M will now be described with reference to FIG. 29. The third method provides films having the same structures as in the first method, where the free layer F is formed on a substrate, the spacer layer S and the fixed magnetization layer P and P' are formed on the free layer F. This type of film can be called a top spin-valve film.

Step 1: A composite layer (a CoZrNb layer, a NiFe layer, and a CoFe layer) intended to act as the free layer F, a layer intended to act as the spacer layer S, a CoFe layer, and a Ru layer are formed (deposited) in this order on a substrate 10a having a layer 10b intended to act as the bias magnet film by performing the steps 1 to Step 5 of the first method, as shown in Step 1 of FIG. 29.

Step 2: Referring to Step 2 of FIG. 29, a resist layer is formed in regions that are to have the SAF elements. Then, the Ru layer and the upper portion of the CoFe layer underlying the Ru layer are removed from unnecessary regions by ion milling.

Step 3: The resist layer is removed.

Step 4: Referring to Step 4 of FIG. 29, a CoFe layer, a PtMn layer, and a Ta layer are formed (deposited) in this order, thereby providing a layer intended to act as the fixed magnetization layer P' of the SAF elements in the portion where the Ru layer remains, and a layer intended to act as the fixed magnetization layer P of the conventional GMR element over regions which do not have the Ru layer.

Step 5: Then, magnetic field heat treatment is performed to fix the magnetization directions of the pinned layers in the fixed magnetization layers P and P'.

Step 6: Finally, the same patterning as in the steps shown in FIGS. 28A to 28C is performed to form the conventional GMR elements and the SAF elements.

As described above, the third method includes a film forming step including the sub step of:

forming (depositing) a layer intended to act as the free layer of the first giant magnetoresistive element (the conventional GMR element) and the second giant magnetoresistive element (the SAF element), a layer intended to act as the spacer layer of the first and the second giant magnetoresistive element, a CoFe layer intended to act as the first ferromagnetic layer of the second giant magnetoresistive element, and a layer intended to act as the exchange coupling layer of the second giant magnetoresistive element, in this order, on a substrate to form a second pre-composite layer (Step 1);

completely removing the layer intended to act as the exchange coupling layer of the second pre-composite layer from regions that are to have the first giant magnetoresistive elements without removing the second pre-composite layer in regions that are to have the second giant magnetoresistive elements (Steps 2 and 3); and forming a ferromagnetic layer (CoFe layer) having the same composition as the layer intended to act as the first ferromagnetic layer and a layer intended to act as the pinning layer of the first giant magnetoresistive element and the second giant magnetoresistive element, in this order, over the entire upper surface after the layer intended to act as the exchange coupling layer of the second pre-composite layer from regions that are to have the first giant magnetoresistive elements is removed (Step 4).

By the method described above, films intended to act as the conventional GMR elements and the SAF elements are formed on a single substrate without a break (in a continuous fashion).

As described above, the magnetic sensor 10 includes the conventional GMR elements and the SAF elements on a single substrate. By forming films intended to act as these elements close to each other and applying a magnetic field oriented in a single direction to the films, the elements whose magnetic-field-detecting directions are antiparallel to each other can be disposed in a very small area. Hence, the magnetic sensor 10 can be very small.

The giant magnetoresistive elements 11 to 14 and 21 to 24 formed on the substrate 10a of the magnetic sensor 10 are coated with a resin film and the like. Therefore, if the substrate 10a or the resin film is deformed by heat or external stress, the giant magnetoresistive elements 11 to 14 and 21 to 24 are also deformed by the heat or the stress accordingly and their resistances are varied. Consequently, the bridge circuit of a magnetic sensor in which the giant magnetoresistive elements are connected in a bridge configuration, as in the magnetic sensor 10, loses its balance and the output is varied by the stress. Thus, such a magnetic sensor cannot accurately detect the intensity of external magnetic fields.

However, in the magnetic sensor 10, the giant magnetoresistive elements 11 to 14 (or giant magnetoresistive elements 21 to 24) forming a full-bridge circuit are disposed in a very small area on the substrate 10a, and thus, a stress (for example, tensile stress or compressive stress) is almost uniformly placed on these elements. The resistances of the giant magnetoresistive elements therefore evenly increase or decrease. Accordingly, the possibility of losing the balance of the bridge circuit can be reduced. Thus, the magnetic sensor 10 can accurately detect magnetic fields.

Second Embodiment

Figure 30:
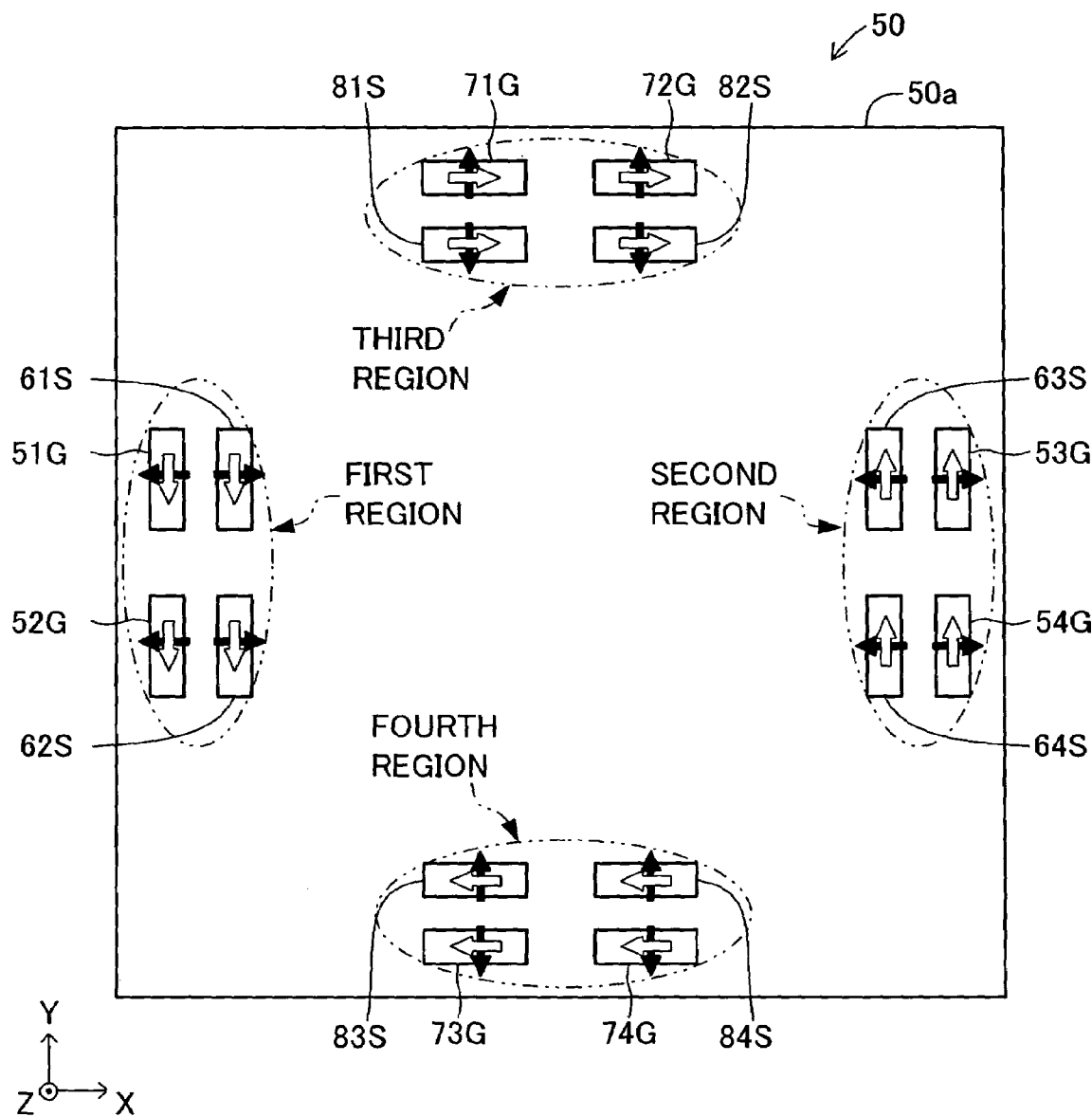
FIG. 30 is a plan view of a magnetic sensor according to a second embodiment of the present invention.

A magnetic sensor according to a second embodiment of the present invention will now be described. As shown in FIG. 30, a magnetic sensor 50 includes a single substrate 50a, conventional GMR elements 51G to 54G, SAF elements 61S to 64S, conventional GMR elements 71G to 74G, and SAF elements 81S to 84S.

The substrate 50a is a thin silicon plate having the same shape as the substrate 10a.

The conventional GMR elements 51G to 54G and 71G to 74G each have the same structure as the foregoing conventional GMR element 11. The SAF elements 61S to 64S and 81S to 84S each have the same structure as the foregoing SAF element 13. The spin-valve film of each element (e.g., the thickness of the layers of the spin-valve film) is designed so that the elements have the same resistance if magnetic fields with an identical intensity are applied to the elements in their respective magnetic-field-detecting directions, and so that the resistances of the elements vary by the same amount (to the same extent) if stresses having an identical magnitude (and an identical direction) are respectively placed on the elements.

In the present embodiment, the conventional GMR elements 51G and 52G may be referred to as first giant magnetoresistive elements; the SAF elements 61S and 62S may be referred to as second giant magnetoresistive elements; the conventional GMR elements 53G and 54G may be referred to as fifth giant magnetoresistive elements; and the SAF elements 63S and 64S may be referred to as sixth giant magnetoresistive elements.

FIG. 30 and the following Tables 1 to 4 show the element positions on the substrate 50a, the fixed magnetization directions of the pinned layer Pd in the fixed magnetization layers P of the conventional GMR elements 51G to 54G and 71G to 74G, the fixed magnetization directions of the first ferromagnetic layers P1 (i.e., the pinned layers) in the fixed magnetization layers P' of the SAF elements 61S to 64S and 81S to 84S, and the magnetic-field-detecting direction of each elements.

TABLE 1

| Element | Position on substrate 50a | Magnetization direction of Pinned layer Pd | Initial magnetization direction of free layer F | Magnetic-field-detecting direction |
|---|---|---|---|---|
| Conventional GMR 51G | Y-axis direction: upper-middle; X-axis direction: vicinity of negative end | Negative X-axis | Negative Y-axis | Positive X-axis |
| Conventional GMR 52G | Y-axis direction: lower-middle; X-axis direction: vicinity of negative end | Negative X-axis | Negative Y-axis | Positive X-axis |
| Conventional GMR 53G | Y-axis direction: upper-middle; X-axis direction: vicinity of positive end | Positive X-axis | Positive Y-axis | Negative X-axis |
| Conventional GMR 54G | Y-axis direction: lower-middle; X-axis direction: vicinity of positive end | Positive X-axis | Positive Y-axis | Negative X-axis |

TABLE 2

| Element | Position on substrate 50a | Magnetization direction of Pinned layer P1 | Initial magnetization direction of free layer F | Magnetic-field-detecting direction |
|---|---|---|---|---|
| SAF 61S | Y-axis direction: upper-middle; X-axis direction: vicinity of negative end | Positive X-axis | Negative Y-axis | Negative X-axis |
| SAF 62S | Y-axis direction: lower-middle; X-axis direction: vicinity of negative end | Positive X-axis | Negative Y-axis | Negative X-axis |
| SAF 63S | Y-axis direction: upper-middle; X-axis direction: vicinity of positive end | Negative X-axis | Positive Y-axis | Positive X-axis |
| SAF 64S | Y-axis direction: lower-middle; X-axis direction: vicinity of positive end | Negative X-axis | Positive Y-axis | Positive X-axis |

The SAF elements 61S and 62S are disposed at the positive side in the X-axis direction of the conventional GMR elements 51G and 52G respectively, with a short distance therebetween; the SAF elements 63S and 64S are disposed at the negative side in the X-axis direction of the conventional GMR elements 53G and 54G respectively, with a short distance therebetween.

TABLE 3

| Element | Position on substrate 50a | Magnetization direction of Pinned layer Pd | Initial magnetization direction of free layer F | Magnetic-field-detecting direction |
|---|---|---|---|---|
| Conventional GMR 71G | X-axis direction: left-middle; Y-axis direction: vicinity of positive end | Positive Y-axis | Positive X-axis | Negative Y-axis |
| Conventional GMR 72G | X-axis direction: right-middle; Y-axis direction: vicinity of positive end | Positive Y-axis | Positive X-axis | Negative Y-axis |
| Conventional GMR 73G | X-axis direction: left-middle; Y-axis direction: vicinity of negative end | Negative Y-axis | Negative X-axis | Positive Y-axis |
| Conventional GMR 74G | X-axis direction: right-middle; Y-axis direction: vicinity of negative end | Negative Y-axis | Negative X-axis | Positive Y-axis |

TABLE 4

| Element | Position on substrate 50a | Magnetization direction of Pinned layer P1 | Initial magnetization direction of free layer F | Magnetic-field-detecting direction |
|---|---|---|---|---|
| SAF 81S | X-axis direction: left-middle; Y-axis direction: vicinity of positive end | Negative Y-axis | Positive X-axis | Positive Y-axis |
| SAF 82S | X-axis direction: right-middle; Y-axis direction: vicinity of positive end | Negative Y-axis | Positive X-axis | Positive Y-axis |
| SAF 83S | X-axis direction: left-middle; Y-axis direction: vicinity of negative end | Positive Y-axis | Negative X-axis | Negative Y-axis |
| SAF 84S | X-axis direction: right-middle; Y-axis direction: vicinity of negative end | Positive Y-axis | Negative X-axis | Negative Y-axis |

The SAF elements 81S and 82S are disposed in the negative side in the Y-axis direction of the conventional GMR elements 71G and 72G respectively, with a short distance therebetween; the SAF elements 83S and 84S are disposed in the positive side in the Y-axis direction of the conventional GMR elements 73G and 74G respectively, with a short distance therebetween.

The conventional GMR elements 51G and 52G (first giant magnetoresistive elements) and the SAF elements 61S and 62S (second giant magnetoresistive element) are disposed close to each other in a first region (on the negative side in the X-axis direction of the substrate 50a) having a small area; hence, these elements lie at positions where the same stress is applied to these elements and therefore they may be deformed similarly each other.

The conventional GMR elements 53G and 54G (fifth giant magnetoresistive elements) and the SAF elements 63S and 64S (sixth giant magnetoresistive elements) are also disposed close to each other in a second region (on the positive side in the X-axis direction of the substrate 50a) having a small area; hence, these elements lie at positions where the same stress is applied to these elements and therefore they may be deformed similarly each other.

The conventional GMR elements 71G and 72G and the SAF elements 81S and 82S are also disposed close to each other in a third region (on the positive side in the Y-axis direction of the substrate 50a) having a small area; hence, these elements lie at positions where the same stress is applied to these elements and therefore they may be deformed similarly each other.

The conventional GMR elements 73G and 74G and the SAF elements 83S and 84S are also disposed close to each other in a fourth region (on the negative side in the Y-axis direction of the substrate 50a) having a small area, apart from the third region; hence, these elements lie at positions where the same stress is applied to these elements and therefore they may be deformed similarly each other.

Figure 31:
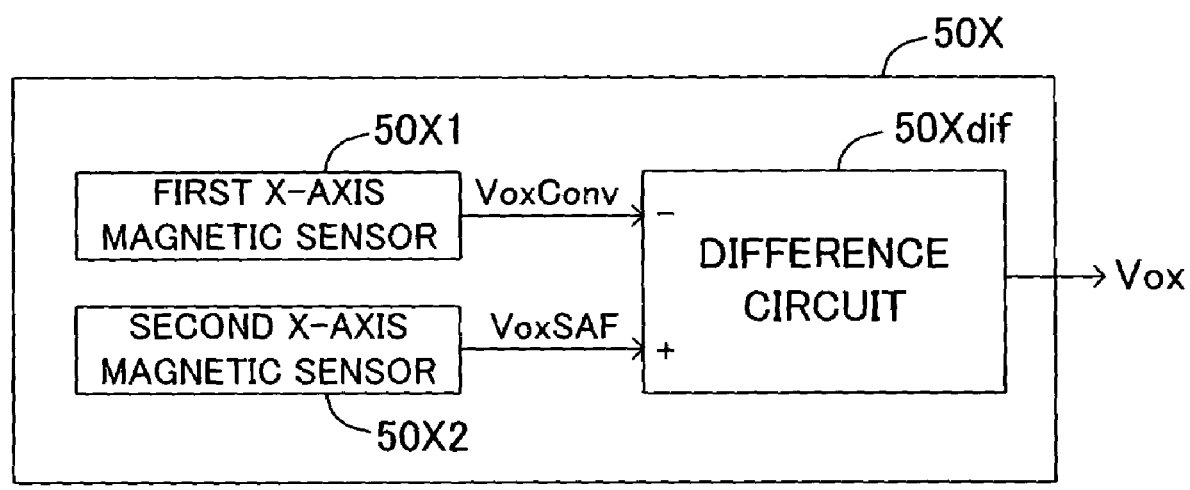
FIG. 31 is a block diagram of a circuit of an X-axis magnetic sensor included in the magnetic sensor shown in FIG. 30.

The magnetic sensor 50 has an X-axis magnetic sensor 50X including a first X-axis magnetic sensor 50X1, a second X-axis magnetic sensor 50X2, and a difference circuit 50Xdif, as shown in FIG. 31.

The first X-axis magnetic sensor 50X1 includes four conventional GMR elements 51G to 54G connected in a full-bridge configuration with conducting wires (not shown in FIG. 30), as shown in the equivalent circuit in FIG. 32A.

The first X-axis magnetic sensor 50X1 will be further described. An end of the conventional GMR element 51G is connected to an end of the conventional GMR element 53G to form a fifth sub-circuit. A first potential +V (a constant voltage supplied from a constant-voltage supply not shown in the figure) is applied to the other end of the conventional GMR element 51G. The other end of the conventional GMR element 53G is grounded (connected to GND). In other words, a second potential different from the first potential is applied to this other end of the conventional GMR element 53G.

Also, an end of the conventional GMR element 54G is connected to an end of the conventional GMR element 52G to form a sixth sub-circuit. The first potential +V is applied to the other end of the conventional GMR element 54G. The other end of the conventional GMR element 52G is grounded (connected to GND). In other words, the second potential different from the first potential is applied to this other end of the conventional GMR element 52G.

The potential difference VoxConv (=VQ10−VQ20) between the potential VQ10 at the junction Q10 where the conventional GMR element 51G is connected to the conventional GMR element 53G and the potential VQ20 at the junction Q20 where the conventional GMR element 54G is connected to the conventional GMR element 52G is extracted as the output of the first X-axis magnetic sensor (conventional GMR element output, X-axis conventional GMR element output).

The graphs adjacent to the conventional GMR elements 51G to 54G in FIG. 32A each show the characteristics of their adjacent elements. In each graph, the solid line, the broken line, and the double-dotted chain line represent the changes in resistance R in response to an external magnetic field Hx when the conventional GMR elements are not stressed, when a tensile stress is applied to the conventional GMR elements, and when a compressive stress is applied to the conventional GMR elements, respectively.

When the conventional GMR elements 51G to 54G are not stressed, the output VoxConv of the first X-axis magnetic sensor 50X1 is substantially proportional to the external magnetic field Hx, and decreases as the intensity of the external magnetic field Hx increases, as shown by the solid line in FIG. 32B.

The second X-axis magnetic sensor 50X2 includes four SAF elements 61S to 64S connected in a full-bridge configuration with conducting wires (not shown in FIG. 30), as shown in the equivalent circuit in FIG. 33A.

The second X-axis magnetic sensor 50X2 will be further described. An end of the SAF element 61S is connected to an end of the SAF element 63S to form a seventh sub-circuit. A first potential +V is applied to the other end of the SAF element 61S. The other end of the SAF element 63S is grounded (connected to GND). In other words, a second potential different from the first potential is applied to this other end of the SAF element 63S.

Also, an end of the SAF element 64S is connected to an end of the SAF element 62S to form an eighth sub-circuit. The first potential +V is applied to the other end of the SAF element 64S. The other end of the SAF element 62S is grounded (connected to GND). In other words, the second potential different from the first potential is applied to this other end of the SAF element 62S.

The potential difference VoxSAF (=VQ30−VQ40) between the potential VQ30 at the junction Q30 where the SAF element 61S is connected to the SAF element 63S and the potential VQ40 at the junction Q40 where the SAF element 64S is connected to the SAF element 62S is extracted as the output of the second X-axis magnetic sensor 50X2 (SAF element output, X-axis SAF element output).

The graphs adjacent to the SAF elements 61S to 64S in FIG. 33A each show the characteristics of their adjacent elements. In each graph, the solid line, the broken line, and the double-dotted chain line represent the changes in resistance R in response to an external magnetic field Hx when the SAF elements are not stressed, when a tensile stress is applied to the SAF elements, and when a compressive stress is applied to the SAF elements, respectively.

Thus, when the SAF elements 61S to 64S are not stressed, the output VoxSAF of the second X-axis magnetic sensor 50X2 is substantially proportional to the external magnetic field Hx, and increases as the intensity of the external magnetic field Hx increases, as shown by the solid line in FIG. 33B.

Figure 34:
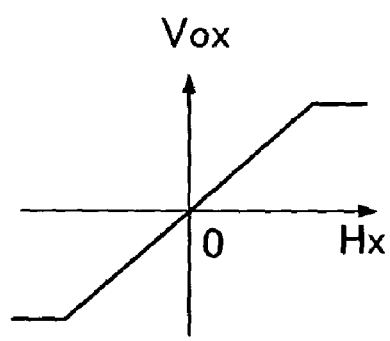
FIG. 34 is a graph showing the changes in output of the X-axis magnetic sensor of the magnetic sensor shown in FIG. 30 in response to the component in the positive X-axis direction of an external magnetic field.

The difference circuit 50Xdif subtracts the output VoxConv of the first X-axis magnetic sensor 50X1 from the output VoxSAF of the second X-axis magnetic sensor 50X2 and outputs the resulting difference, which is defined as the output Vox of the X-axis magnetic sensor 50X, as shown in FIG. 31. The output (X-axis output) Vox of the magnetic sensor 50 is substantially proportional to the external magnetic field Hx, and increases as the intensity of the external magnetic field Hx increases, as shown in FIG. 34.

Figure 35:
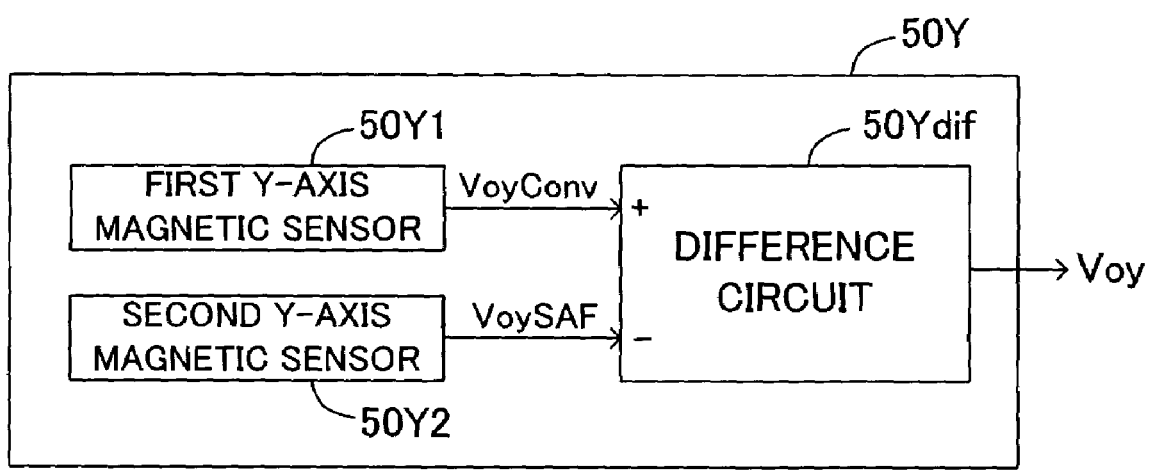
FIG. 35 is a block diagram of a circuit of a Y-axis magnetic sensor included in the magnetic sensor shown in FIG. 30.

The magnetic sensor 50 also has a Y-axis magnetic sensor 50Y, as shown in FIG. 35. The Y-axis magnetic sensor 50Y includes a first Y-axis magnetic sensor 50Y1, a second Y-axis magnetic sensor 50Y2, and a difference circuit 50Ydif.

The first Y-axis magnetic sensor 50Y1 includes four conventional GMR elements 71G to 74G connected in a full-bridge configuration with conducting wires (not shown in FIG. 30), as shown in the equivalent circuit in FIG. 36A.

The first Y-axis magnetic sensor 50Y1 will be further described. An end of the conventional GMR element 71G is connected to an end of the conventional GMR element 73G to form a ninth sub-circuit. A first potential +V is applied to the other end of the conventional GMR element 71G. The other end of the conventional GMR element 73G is grounded (connected to GND). In other words, a second potential different from the first potential is applied to this other end of the conventional GMR element 73G.

Also, an end of the conventional GMR element 74G is connected to an end of the conventional GMR element 72G to form a tenth sub-circuit. The first potential +V is applied to the other end of the conventional GMR element 74G. The other end of the conventional GMR element 72G is grounded (connected to GND). In other words, the second potential different from the first potential is applied to this other end of the conventional GMR element 72G.

The potential difference VoyConv (=VQ50−VQ60) between the potential VQ50 at the junction Q50 where the conventional GMR element 71G is connected to the conventional GMR element 73G and the potential VQ60 at the junction Q60 where conventional GMR element 74G is connected to the conventional GMR element 72G is extracted as the output of the first Y-axis magnetic sensor (conventional GMR element output, Y-axis conventional GMR element output).

The graphs adjacent to the conventional GMR elements 71G to 74G in FIG. 36A each show the characteristics of their adjacent elements. In each graph, the solid line, the broken line, and the double-dotted chain line represent the changes in resistance R in response to an external magnetic field Hy when the conventional GMR elements are not stressed, when a tensile stress is applied to the conventional GMR elements, and when a compressive stress is applied to the conventional GMR elements, respectively.

When the conventional GMR elements 71G to 74G are not stressed, the output VoyConv of the first Y-axis magnetic sensor 50Y1 is substantially proportional to the external magnetic field Hy, and increases as the intensity of the external magnetic field Hy increases, as shown by the solid line in FIG. 36B.

The second Y-axis magnetic sensor 50Y2 includes four SAF elements 81S to 84S connected in a full-bridge configuration with conducting wires (not shown in FIG. 30), as shown in the equivalent circuit in FIG. 37A.

The second Y-axis magnetic sensor 50Y2 will be further described. An end of the SAF element 81S is connected to an end of the SAF element 83S to form an eleventh sub-circuit. A first potential +V is applied to the other end of the SAF element 81S. The other end of the SAF element 83S is grounded (connected to GND). In other words, a second potential different from the first potential is applied to this end of the SAF element 83S.

Also, an end of the SAF element 84S is connected to an end of the SAF element 82S to form a twelfth sub-circuit. The first potential +V is applied to the other end of the SAF element 84S. The other end of the SAF element 82S is grounded (connected to GND). In other words, the second potential different from the first potential is applied to this other end of the SAF element 82S.

The potential difference VoySAF (=VQ70−VQ80) between the potential VQ70 at the junction Q70 where the SAF element 81S is connected to the SAF element 83S and the potential V080 at the junction Q80 where the SAF element 84S is connected to the SAF element 82S is extracted as the output of the second Y-axis magnetic sensor 50Y2 (SAF element output, Y-axis SAF element output).

The graphs adjacent to the SAF elements 81S to 84S in FIG. 37A each show the characteristics of their adjacent elements. In each graph, the solid line, the broken line, and the double-dotted chain line represent the changes in resistance R in response to an external magnetic field Hy when the SAF elements are not stressed, when a tensile stress is applied to the SAF elements, and when a compressive stress is applied to the SAF elements, respectively.

When the SAF elements 81S to 84S are not stressed, the output VoySAF of the second Y-axis magnetic sensor 50Y2 is substantially proportional to the external magnetic field Hy, and decreases as the intensity of the external magnetic field Hy increases, as shown by the solid line in FIG. 37B.

Figure 38:
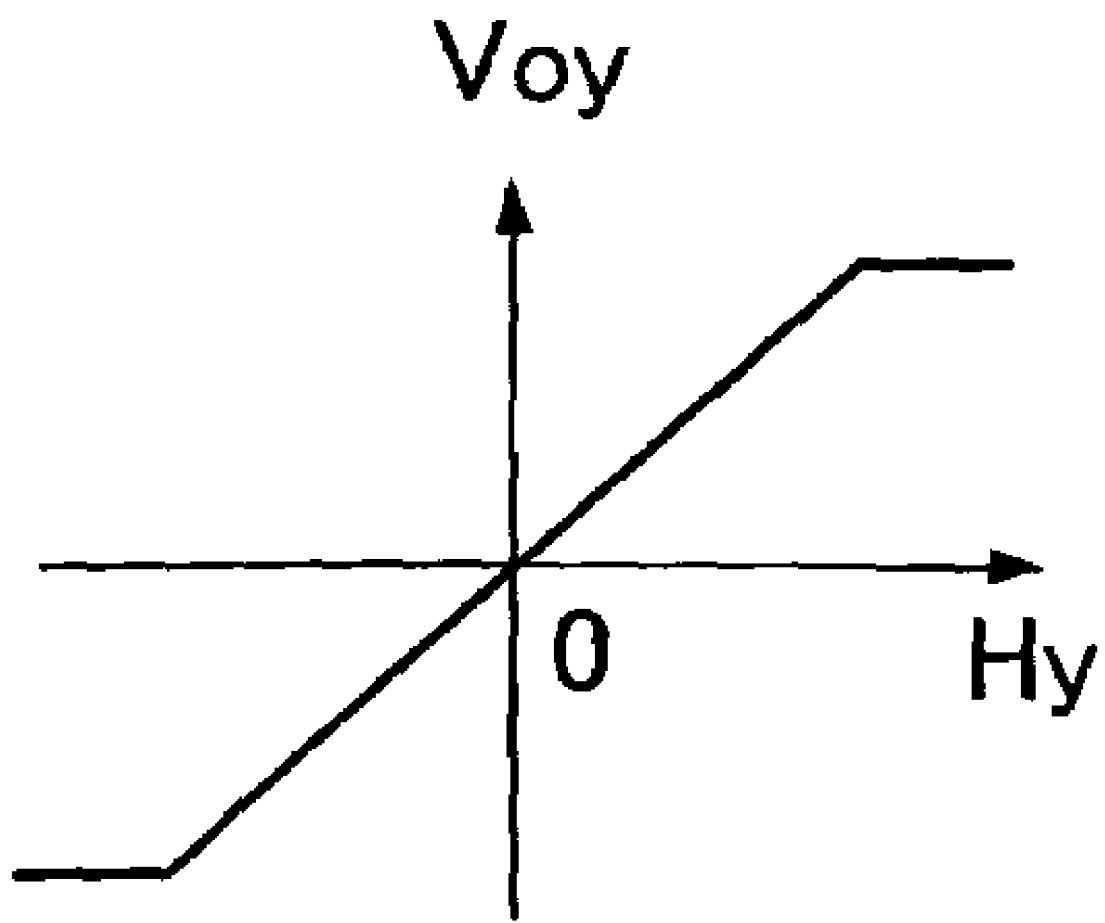
FIG. 38 is a graph showing the changes in output of the Y-axis magnetic sensor of the magnetic sensor shown in FIG. 30 in response to the component in the positive Y-axis direction of an external magnetic field.

The difference circuit 50Ydif subtracts the output VoySAF of the second Y-axis magnetic sensor 50Y2 from the output VoyConv of the first Y-axis magnetic sensor 50Y1 and outputs the resulting difference, which is defined as the output Voy of the Y-axis magnetic sensor 50Y, as shown in FIG. 35. Thus, an output (Y-axis output) Voy of the magnetic sensor 50 is substantially proportional to the external magnetic field Hy, and increases as the intensity of the external magnetic field Hy increases, as shown in FIG. 38.

How the magnetic sensor 50 having the above-described structure operates will now be described case by case. The following description illustrates the operations of the X-axis magnetic sensor 50X because the X-axis magnetic sensor 50X and the Y-axis magnetic sensor 50Y operate in the same manner, except that their magnetic-field-detecting directions are different from each other by 90°.

(1) When no stress is applied to the conventional GMR elements 51G to 54G and the SAF elements 61S to 64S:

The X-axis magnetic sensor 50X outputs a voltage Vox that increases as the external magnetic field Hx increases.

(2) When a tensile stress is placed on the elements (conventional GMR elements 51G and 52G, SAF elements 61S and 62S) in the first region while a compressive stress is placed on the elements (conventional GMR elements 53G and 54G, SAF elements 63S and 64S) in the second region:

The resistances of the conventional GMR elements 51G and 52G increase by a substantially constant value irrespective of the intensity of the external magnetic field Hx (as indicated by the broken line in the graph of the elements 51G and 52G in FIG. 32A). The resistances of the conventional GMR elements 53G and 54G decrease by a substantially constant value irrespective of the intensity of the external magnetic field Hx (as indicated by the double-dotted chain line in the graph of the elements 53G and 54G in FIG. 32A). Consequently, the output VoxConv of the first X-axis magnetic sensor 50X1 decreases by a constant value irrespective of the intensity of the external magnetic field Hx, as indicated by the dotted-chain line in FIG. 32B.

On the other hand, the resistances of the SAF elements 61S and 62S increase by a constant value irrespective of the intensity of the external magnetic field Hx (as indicated by the broken line in the graph of the elements 61S and 62S in FIG. 33A). The resistances of the SAF element 63S and 64S decrease by a constant value irrespective of the intensity of the external magnetic field Hx (as indicated by the double-dotted chain line in the graph of the elements 63S and 64S in FIG. 33A). Consequently, the output VoxSAF of the second X-axis magnetic sensor 50X2 decreases by a constant value irrespective of the intensity of the external magnetic field Hx, as indicated by the dotted-chain line in FIG. 33B. In this instance, both the output VoxConv of the first X-axis magnetic sensor 50X1 and the output VoxSAF of the second X-axis magnetic sensor 50X2 decrease by a constant value. Therefore, the difference between these two outputs (the output Vox of the X-axis magnetic sensor 50X) does not vary.

(3) When a compressive stress is placed on the elements (conventional GMR elements 51G and 52G, SAF elements 61S and 62S) in the first region while a tensile stress is placed on the elements (conventional GMR elements 53G and 54G, SAF elements 63S and 64S) in the second region:

The resistances of the conventional GMR elements 51G and 52G decrease by a substantially constant value irrespective of the intensity of the external magnetic field Hx (as indicated by the double-dotted chain line in the graph of the elements 51G and 52G in the FIG. 32A). The resistances of the conventional GMR element 53G and 54G increase by a substantially constant value irrespective of the intensity of the external magnetic field Hx (as indicated by the broken line in the graph of the elements 53G and 54G in FIG. 32A). Consequently, the output VoxConv of the first X-axis magnetic sensor 50X1 increases by a constant value irrespective of the intensity of the external magnetic field Hx, as indicated by the broken line in FIG. 32B.

On the other hand, the resistances of the SAF elements 61S and 62S decrease by a constant value irrespective of the intensity of the external magnetic field Hx (as indicated by the double-dotted chain line in the graph of the elements 61S and 62S in FIG. 33A). The resistances of the SAF elements 63S and 64S increase by a constant value irrespective of the intensity of the external magnetic field Hx (as indicated by the broken line in the graph of the elements 63S and 64S in FIG. 33A). Consequently, the output VoxSAF of the second X-axis magnetic sensor 50X2 increases by a constant value irrespective of the intensity of the external magnetic field Hx, as indicated by the broken line in FIG. 33B. In this instance, both the output VoxConv of the first X-axis magnetic sensor 50X1 and the output VoxSAF of the second X-axis magnetic sensor 50X2 decrease by a constant value. Therefore the difference between these two outputs (the output Vox of the X-axis magnetic sensor 50X) does not vary.

(4) When a compressive stress is placed on all the elements in the first and second regions:

The resistance of each element decreases by a constant value, and thus, the output VoxConv of the first X-axis magnetic sensor and the output VoxSAF of the second X-axis magnetic sensor do not vary. Consequently, the output Vox of the X-axis magnetic sensor 50X does not vary.

(5) When a tensile stress is placed on all the elements in the first and second regions:

The resistance of each element increases by a constant value, and thus, the output VoxConv of the first X-axis magnetic sensor and the output VoxSAF of the second X-axis magnetic sensor do not vary. Consequently, the output Vox of the X-axis magnetic sensor 50X does not vary.

As described above, the magnetic sensor 50 of the second embodiment can produce a substantially constant output unless the external magnetic field changes, even if stresses placed on the elements vary. Thus, the magnetic sensor 50 can accurately detect magnetic fields.

Third Embodiment

Figure 39:
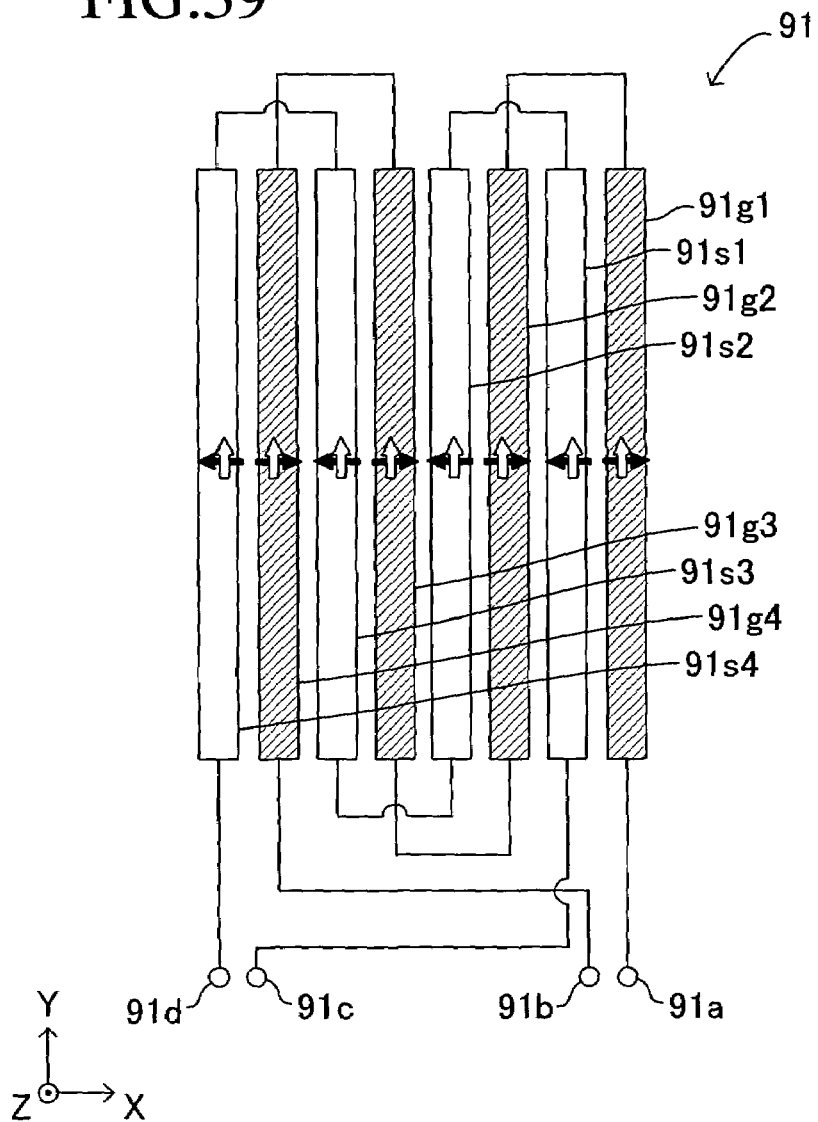
FIG. 39 is a plan view of an element group of a magnetic sensor according to a third embodiment of the present invention.
Figure 40:
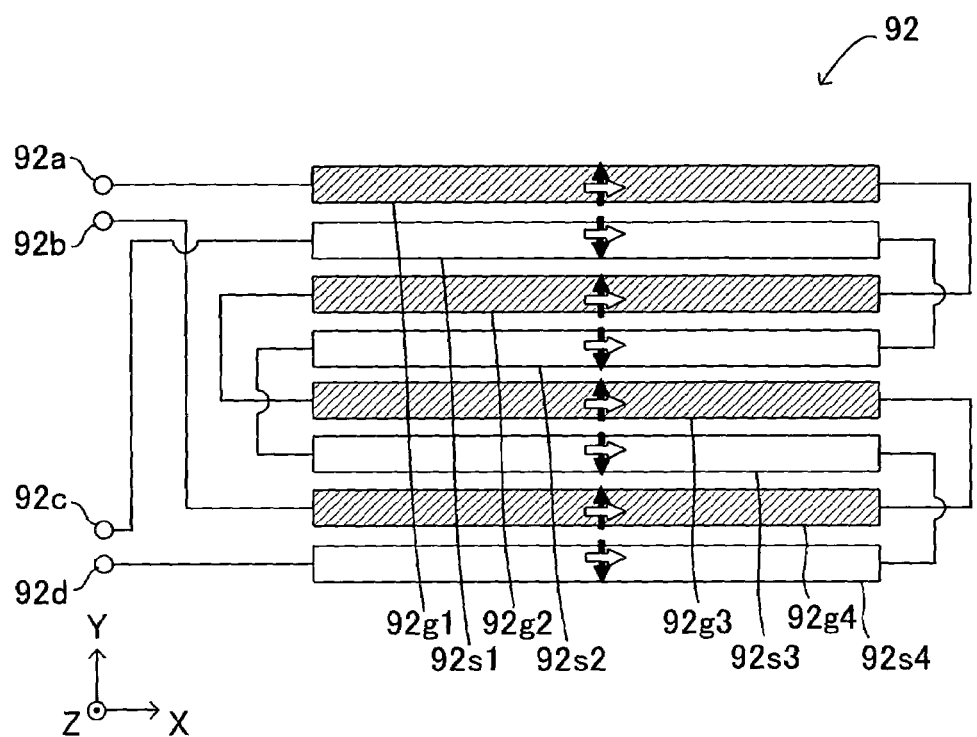
FIG. 40 is a plan view of another element group of the magnetic sensor according to the third embodiment.

A magnetic sensor according to a third embodiment of the present invention is different from the magnetic sensor 10 of the first embodiment shown in FIG. 1 only in that a group comprising one conventional GMR element (for example, the conventional GMR element 11) and one SAF element (for example, the SAF element 13) in which the conventional GMR element and the SAF element is disposed closely to each other is replaced by a group shown in either FIG. 39 or 40. The following description will illustrate the difference.

Specifically, in the magnetic sensor of the third embodiment, a first element group constituted of the conventional GMR element 11 and the SAF element 13 in the magnetic sensor 10 of the first embodiment is replaced by an element group 91 shown in FIG. 39. The element group 91 is disposed in a position corresponding to the position on the substrate 10a shown in FIG. 1 where the first element group is disposed.

The element group 91 includes four conventional GMR elements 91g1 to 91g4 and four SAF elements 91s1 to 91s4. The conventional GMR elements 91g1 to 91g4 and the SAF elements 91s1 to 91s4 each have the identical narrow strip shape in plan view. The longitudinal direction of the each elements is along the Y-axis direction. These elements are arranged in the negative X-axis direction from the positive edge in the X-axis direction of the substrate 10a in this order: the conventional GMR element 91g1, the SAF element 91s1, the conventional GMR element 91g2, the SAF element 91s2, the conventional GMR element 91g3, the SAF element 91s3, the conventional GMR element 91g4, and the SAF element 91s4. Thus, the element group 91 includes an arrangement on the substrate 10a in which the conventional GMR elements (first giant magnetoresistive elements) and the SAF elements (second giant magnetoresistive elements) are alternately disposed in parallel with each other in a predetermined direction (negative X-axis direction).

A film structure of each of the conventional GMR elements 91g1 to 91g4 is the same structure as the conventional spin-valve film show in FIG. 4. The magnetization of the pinned layer Pd of the fixed magnetization layer P in each of the conventional GMR elements 91g1 to 91g4 is fixed in the positive X-axis direction. The initial magnetization of the free layer F in each of the conventional GMR elements 91g1 to 91g4 is oriented in the positive Y-axis direction.

The negative end in Y-axis direction of the conventional GMR element 91g1 is connected to a terminal 91a. The positive end in the Y-axis direction of the conventional GMR element 91g1 is connected to the positive end in the Y-axis direction of the conventional GMR element 91g2. The negative end in the Y-axis direction of the conventional GMR element 91g2 is connected to the negative end in the Y-axis direction of the conventional GMR element 91g3. The positive end in the Y-axis direction of the conventional GMR element 91g3 is connected to the positive end in the Y-axis direction of the conventional GMR element 91g4. The negative end in the Y-axis direction of the conventional GMR element 91g4 is connected to another terminal 91b.

Thus, a sum of the resistances of the conventional GMR elements 91g1 to 91g4 is extracted from the terminals 91a and 91b, in place of the resistance of the conventional GMR element 11 in the magnetic sensor 10. The sum of the resistances of the conventional GMR element 91g1 to 91g4 varies in the same manner as the resistance of the conventional GMR element 11. In other words, the conventional GMR elements 91g1 to 91g4 constitute a modified form of the conventional GMR element 11. That is, a plurality of conventional GMR elements 91g1 to 91g4 are connected in series to form a giant magnetoresistive element (first element).

Figure 5B:
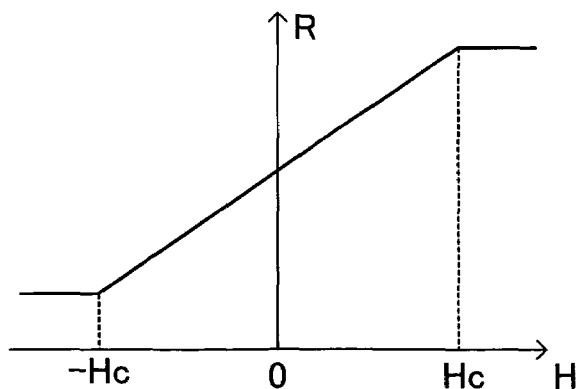

A film structure of each of the four SAF elements 91s1 to 91s4 is the same structure as the synthetic spin-valve film shown in FIG. 5. The magnetization of the pinned layer (first magnetic layer P1) of the fixed magnetization layer P' in each of the SAF elements 91s1 to 91s4 is fixed in the negative X-axis direction. The initial magnetization of the free layer F in each of the SAF elements 91s1 to 91s4 is oriented in the positive Y-axis direction.

The negative end in the Y-axis direction of the SAF element 91s1 is connected to a terminal 91c. The positive end in the Y-axis direction of the SAF element 91s1 is connected to the positive end in the Y-axis direction of the SAF element 91s2. The negative end in the Y-axis direction of the SAF element 91s2 is connected to the negative end in the Y-axis direction of the SAF element 91s3. The positive end in the Y-axis direction of the SAF element 91s3 is connected to the positive end in the Y-axis direction of the SAF element 91s4. The negative end in the Y-axis direction of the SAF element 91s4 is connected to another terminal 91d.

Thus, a sum of the resistances of the SAF elements 91s1 to 91s4 is extracted from the terminals 91c and 91d, in place of the resistance of the SAF element 13 in the magnetic sensor 10. The sum of the resistances of the SAF elements 91s1 to 91s4 varies in the same manner as the resistance of the SAF element 13. In other words, the SAF elements 91s1 to 91s4 constitute a modified SAF element 13. That is, a plurality of the SAF elements 91s1 to 91s4 are connected in series to form another giant magnetoresistive element (second element).

Both ends of each of the conventional GMR elements 91g1 to 91g4 and SAF elements 91s1 to 91s4 are provided with bias magnet films (not shown in FIG. 39) for applying to the corresponding free layer F a bias magnetic field oriented in the same direction as the initial magnetization direction of the free layer F.

In the magnetic sensor of the third embodiment, also, a second element group constituted of the conventional GMR element 12 and the SAF element 14 in the magnetic sensor 10 of the first embodiment is replaced by an element group having the same structure as the element group 91 shown in FIG. 39. This element group is disposed in a position corresponding to the position on the substrate 10a shown in FIG. 1 where the second element group is disposed. As described above, in the magnetic sensor of the third embodiment, a modified conventional GMR element 12 and a modified SAF element 14 are disposed in a position corresponding to the position where the second element group of the magnetic sensor 10 is disposed.

Furthermore, in the magnetic sensor of the third embodiment, a third element group constituted of the conventional GMR element 21 and the SAF element 23 in the magnetic sensor 10 of the first embodiment is replaced by an element group 92 shown in FIG. 40. The element group 92 is disposed in a position corresponding to the position on the substrate 10a shown in FIG. 1 where the third element group is disposed.

As shown in FIG. 40, the element group 92 has the same structure as the element group 91 shown in FIG. 39. More specifically, the element group 92 includes conventional GMR elements 92g1 to 92g4 and SAF elements 92s1 to 92s4. These elements each have a narrow strip shape when viewed from above. The elements in the element group 92 extend in the X-axis direction and are connected as shown in FIG. 40. The initial magnetizations of the free layers F and the fixed magnetizations of the pinned layers of the fixed magnetization layers P and P' are oriented in the directions shown in FIG. 40. Thus, the magnetic sensor of the third embodiment has the element group 92 in a position corresponding to the position where the third element group is disposed in the magnetic sensor 10. In other words, the element group 92 includes a modified conventional GMR element 21 and a modified SAF element 23.

Furthermore, in the magnetic sensor of the third embodiment, a fourth element group constituted of the conventional GMR element 22 and the SAF element 24 in the magnetic sensor 10 of the first embodiment is replaced by an element group having the same structure as the element group 92 shown in FIG. 40. This element group is disposed in a position corresponding to the position on the substrate 10a shown in FIG. 1 where the fourth element group is disposed. As described above, in the magnetic sensor of the third embodiment, a modified conventional GMR element 22 and a modified SAF element 24 are disposed in a position corresponding to the position where the fourth element group of the magnetic sensor 10 is disposed.

In addition, in the magnetic sensor of the third embodiment, the modified conventional GMR elements 11, 12, 21, and 22 and the modified SAF elements 13, 14, 23, and 24 are connected in a full-bridge configuration as in the magnetic sensor 10, thereby forming an X-axis magnetic sensor and a Y-axis magnetic sensor.

In a sensor including a plurality of giant magnetoresistive elements on a single substrate as described above, a stress is placed on the giant magnetoresistive elements by deformation of the substrate or a resin covering the giant magnetoresistive elements. It is inferred that the stress gradually varies along the surface of the substrate.

It is therefore very likely that, in a magnetic sensor having a structure as in the third embodiment, in which conventional GMR elements connected in series to form a first element and SAF elements connected in series to form a second element are alternately arranged in parallel with each other on a substrate 10a in a predetermined direction (in the present embodiment, the X-axis direction or the Y-axis direction), the stress having the same magnitude is applied to both the first element and the second element. Hence, the variations in resistance of the first and the second element due to the stress are close.

Thus, the X-axis and the Y-axis magnetic sensor, which are formed by connecting these elements in bridge configurations, can produce outputs less affected by stress placed on the elements. Accordingly, the magnetic sensor of the third embodiment can produce outputs less affected by stress placed on the elements than the output from the magnetic sensor 10 of the first embodiment, consequently detecting a magnetic field more accurately.

In the magnetic sensor (element groups 91 and 92) of the third embodiment, the arranging order of the elements may be changed. For example, the elements may be arranged in the negative X-axis direction from the positive edge in the X-axis direction of the substrate 10a in the order of: the SAF element 91s1, the conventional GMR element 91g1, the SAF element 91s2, the conventional GMR element 91g2, the SAF element 91s3, the conventional GMR element 91g3, the SAF element 91s4, and the conventional GMR element 91g4, or in the negative Y-axis direction from the positive edge in the Y-axis direction of the substrate 10a in the order of: the SAF element 92s1, the conventional GMR element 92g1, the SAF element 92s2, the conventional GMR element 92g2, the SAF element 92s3, the conventional GMR element 92g3, the SAF element 92s4, and the conventional GMR element 92g4.

Further, the element groups shown in FIGS. 39 and 40 may be applied to the magnetic sensor 50 shown in FIG. 30.

Fourth Embodiment

Figure 41:
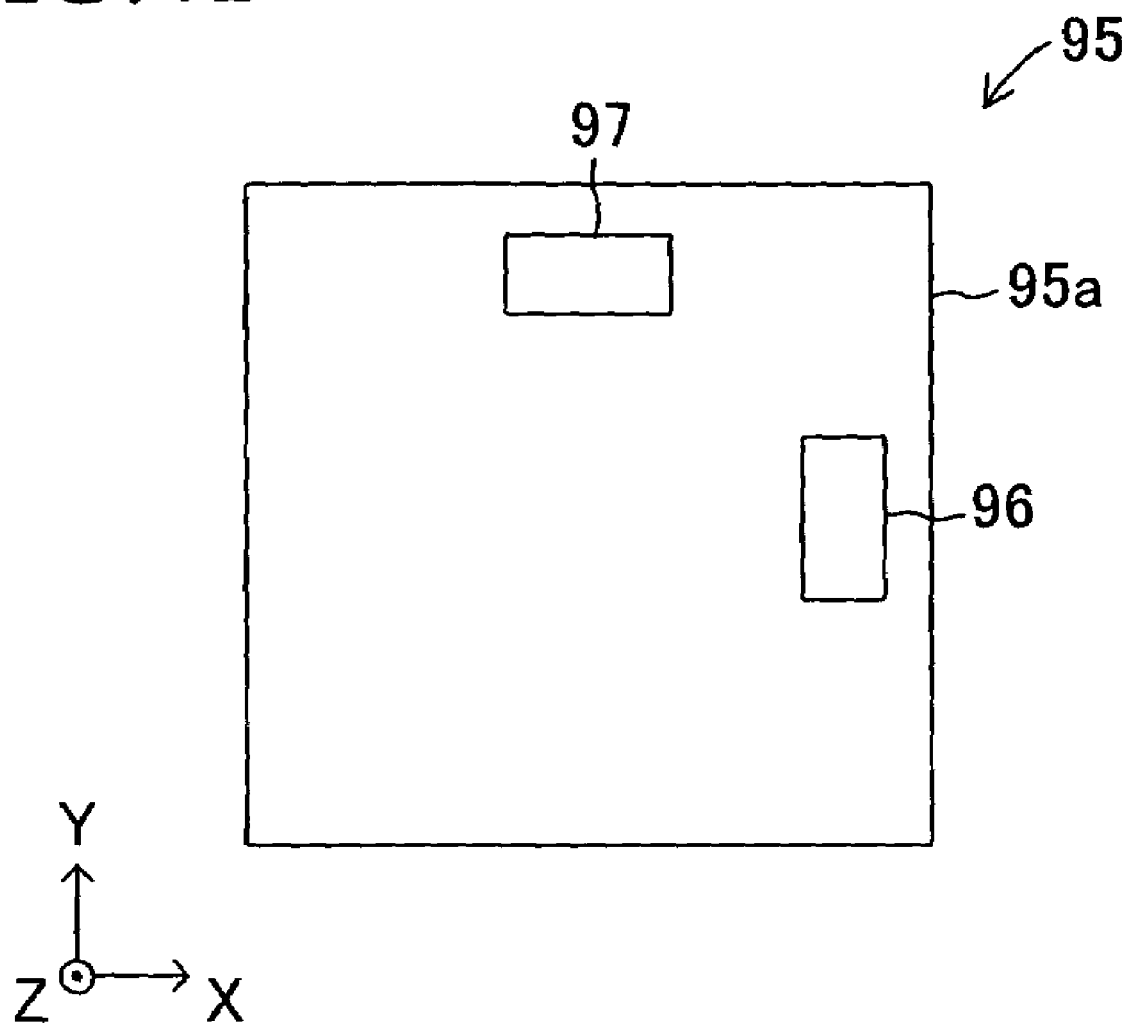
FIG. 41 is a plan view of a magnetic sensor according to a fourth embodiment of the present invention.

FIG. 41 shows a plan view of a magnetic sensor 95 according to a fourth embodiment of the present invention. The magnetic sensor 95 includes a single substrate 95a similar to the substrate 10a, an X-axis magnetic detecting element group 96, and a Y-axis magnetic detecting element group 97. The X-axis magnetic detecting element group 96 is disposed in the vicinity of the positive edge in the X-axis direction of the substrate 95a and in the middle position in the Y-axis direction of the substrate 95a. The Y-axis magnetic detecting element group 97 is disposed in the vicinity of the positive edge in the Y-axis direction of the substrate 95a and in the middle position in the X-axis direction of the substrate 95a.

Figure 42:
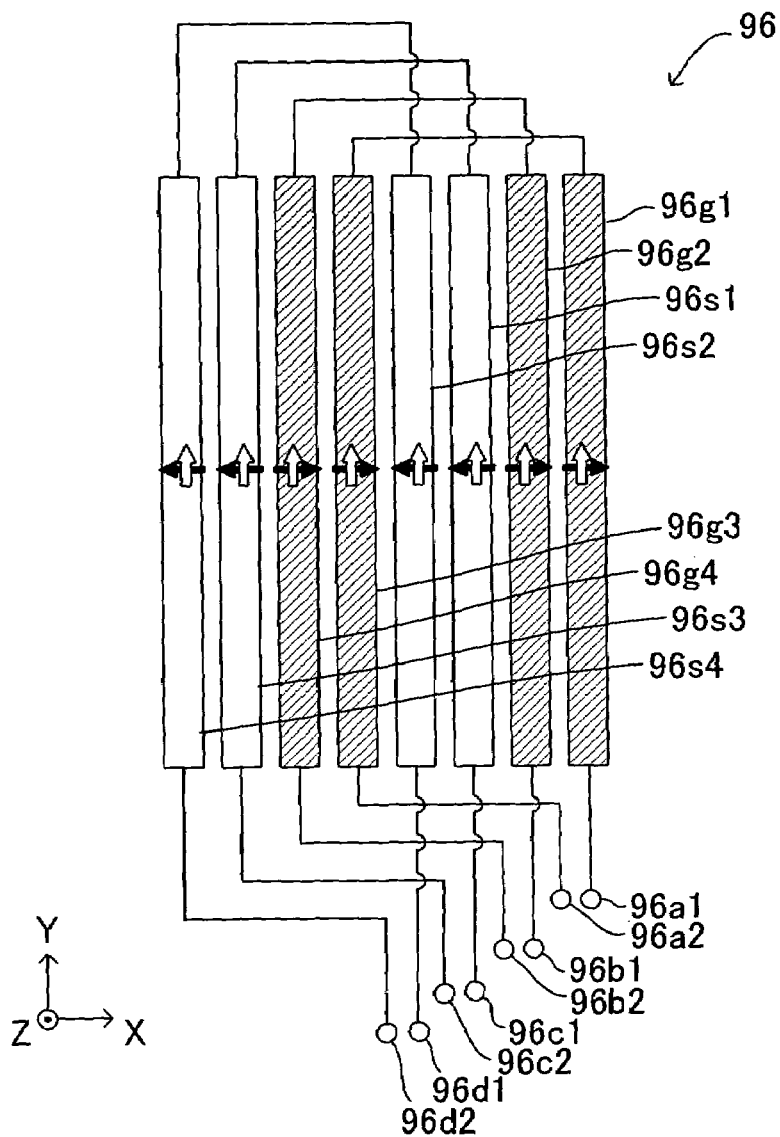
FIG. 42 is a plan view of an X-axis magnetic detecting element group of the magnetic sensor shown in FIG. 41.

The X-axis magnetic detecting element group 96 includes four conventional GMR elements 96g1 to 96g4 and four SAF elements 96s1 to 96s4, as shown in FIG. 42. The conventional GMR elements 96g1 to 96g4 and the SAF elements 96s1 to 96s4 each have the same narrow strip shape when viewed from above, and extend in the Y-axis direction. These elements are arranged in the negative X-axis direction from the positive edge in the X-axis direction of the substrate 95a in the order of: the conventional GMR element 96g1, the conventional GMR element 96g2, the SAF element 96s1, the SAF element 96s2, the conventional GMR element 96g3, the conventional GMR element 96g4, the SAF element 96s3, and the SAF element 96s4.

The conventional GMR elements 96g1 to 96g4 are each formed of the conventional spin-valve film shown in FIG. 4. The magnetization of the pinned layer Pd of the fixed magnetization layer P in each of the conventional GMR elements 96g1 to 96g4 is fixed in the positive X-axis direction. The initial magnetization of the free layer F in each of the conventional GMR elements 96g1 to 96g4 is oriented in the positive Y-axis direction.

The negative end in the Y-axis direction of the conventional GMR element 96g1 is connected to a terminal 96a1. The positive end in the Y-axis direction of the conventional GMR element 96g1 is connected to the positive end in the Y-axis direction of the conventional GMR element 96g3. The negative end in the Y-axis direction of the conventional GMR element 96g3 is connected to a terminal 96a2.

Thus, a sum of the resistances of the conventional GMR elements 96g1 and 96g3 is extracted from the terminals 96a1 and 96a2. The resistance extracted varies in the same manner as the resistance of the conventional GMR element 11 in the magnetic sensor 10. In other words, the conventional GMR elements 96g1 and 96g3 constitute a modified form of the conventional GMR element 11.

Also, the negative end in the Y-axis direction of the conventional GMR element 96g2 is connected to a terminal 96b1. The positive end in the Y-axis direction of the conventional GMR element 96g2 is connected to the positive end in the Y-axis direction of the conventional GMR element 96g4. The negative end in the Y-axis direction of the conventional GMR element 96g4 is connected to a terminal 96b2.

Thus, a sum of the resistances of the conventional GMR elements 96g2 and 96g4 is extracted from the terminals 96b1 and 96b2. The resistance extracted varies in the same manner as the resistance of the conventional GMR element 12 in the magnetic sensor 10. In other words, the conventional GMR elements 96g2 and 96g4 constitute a modified form of the conventional GMR element 12.

The SAF elements 96s1 to 96s4 are each formed of the synthetic spin-valve film shown in FIG. 5. The magnetization of the pinned layer (first magnetic layer P1) of the fixed magnetization layer P' in each of the SAF elements 96s1 to 96s4 is fixed in the negative X-axis direction. The initial magnetization of each free layer F in each of the SAF elements 96s1 to 96s4 is oriented in the positive Y-axis direction.

The negative end in the Y-axis direction of the SAF element 96s1 is connected to a terminal 96c1. The positive end in the Y-axis direction of the SAF element 96s1 is connected to the positive end in the Y-axis direction of the SAF element 96s3. The negative end in the Y-axis direction of the SAF element 96s3 is connected to a terminal 96c2.

Thus, a sum of the resistances of the SAF elements 96s1 and 96s3 is extracted from the terminals 96c1 and 96c2. The resistance extracted varies in the same manner as the resistance of the SAF element 13 of the magnetic sensor 10. In other words, the SAF elements 96s1 and 96s3 constitute a modified form of the SAF element 13.

Also, the negative end in the Y-axis direction of the SAF element 96s2 is connected to a terminal 96d1. The positive end in the Y-axis direction of the SAF element 96s2 is connected to the positive end in the Y-axis direction of the SAF element 96s4. The negative end in the Y-axis direction of the SAF element 96s4 is connected to a terminal 96d2.

Thus, a sum of the resistances of the SAF elements 96s2 to 96s4 is extracted from the terminals 96d1 and 96d2. The resistance extracted varies in the same manner as the resistance of the SAF element 14 in the magnetic sensor 10. In other words, the SAF elements 96s2 and 96s4 constitute a modified form of the SAF element 14.

Note that both ends of each of the conventional GMR elements 96g1 to 96g4 and SAF elements 96s1 to 96s4 are provided with bias magnet films (not shown in FIG. 42) for applying to the corresponding free layer F a bias magnetic field oriented in the same direction as the initial magnetization of the free layer F.

The modified forms of the conventional GMR elements 11 and 12 and SAF elements 13 and 14 are connected in a full-bridge configuration in the same manner as the conventional GMR elements 11 and 12 and SAF elements 13 and 14 in the magnetic sensor 10, thereby forming an X-axis magnetic sensor.

Figure 43:
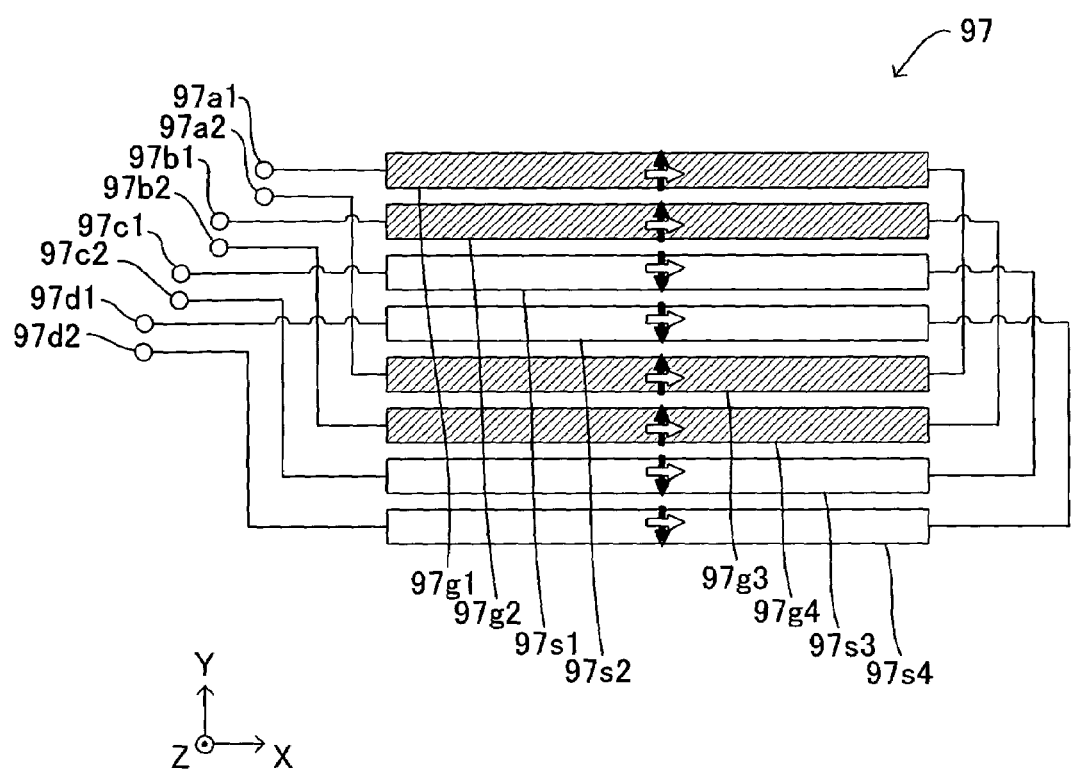
FIG. 43 is a plan view of a Y-axis magnetic detecting element group of the magnetic sensor shown in FIG. 41.

As shown in FIG. 43, the Y-axis magnetic detecting element group 97 has the same structure as the X-axis magnetic detecting element group 96 shown in FIG. 42. Specifically, the Y-axis magnetic detecting element group 97 includes conventional GMR elements 97g1 to 97g4 and SAF elements 97s1 to 97s4. Each of these elements has a narrow strip shape when viewed from above. The elements extend in the X-axis direction and are connected as shown in FIG. 43. The initial magnetization of the free layers F and the fixed magnetizations of the pinned layers of the fixed magnetization layers P and P' are oriented in the directions shown in FIG. 43.

Thus, the conventional GMR elements 97g1 and 97g3 constitute a modified form of the conventional GMR element 21. The conventional GMR elements 97g2 and 97g4 constitute a modified form of the conventional GMR element 22. Also, the SAF elements 97s1 and 97s3 constitute a modified form of the SAF element 23, and the SAF elements 97s2 and 97s4 constitute a modified form of the SAF element 24.

The modified forms of the conventional GMR elements 21 and 22 and SAF elements 23 and 24 are connected in a full-bridge configuration to form a Y-axis magnetic sensor in the same manner as the conventional GMR elements 21 and 22 and the SAF elements 23 and 24 in the magnetic sensor 10.

Focusing attention on, for example, the X-axis magnetic sensor in the magnetic sensor 95 of the fourth embodiment, the X-axis magnetic sensor includes four conventional GMR elements and four SAF elements. Two conventional GMR elements adjacent to each other form a first group (conventional GMR elements 96g1 and 96g2); the other two conventional GMR elements adjacent to each other form a second group (conventional GMR elements 96g3 and 96g4); two SAF elements adjacent to each other form a third group (SAF elements 96s1 and 96s2); the other two SAF elements adjacent to each other form a fourth group (SAF elements 96s3 and 96s4). These four groups are disposed on the substrate 10a in parallel with each other in a predetermined direction (negative X-axis direction, in this instance) in the order of: the first group, the third group, the second group, and the fourth group (or the third group, the first group, the fourth group, and the second group).

In the X-axis magnetic sensor, two conventional GMR elements unadjacent each other (i.e., conventional GMR elements 96g1 and 96g3) are connected in series to form an element (third element) constituted of only the conventional GMR elements, and the other two conventional GMR elements unadjacent each other (i.e., conventional GMR elements 96g2 and 96g4) are connected in series to form another element (fourth element) constituted of only the conventional GMR elements. Further, two SAF elements unadjacent each other (i.e., SAF elements 96s1 and 96s3) are connected in series to form another element (fifth element) constituted of only the SAF elements, and the other two SAF elements unadjacent each other (i.e., elements 96s2 and 96s4) are connected in series to form anther element (sixth element) constituted of only the SAF elements.

With the structure above, it is likely that the third to sixth elements lie under stresses with magnitudes close to each other. Hence, the variations in resistance of the third to sixth elements due to the stresses can be close. Thus, the X-axis magnetic sensor in the magnetic sensor 95, which are formed by connecting the third to sixth elements in a full-bridge configuration, can produce outputs still less affected by stresses placed on the elements.

Modification

Figure 44A:
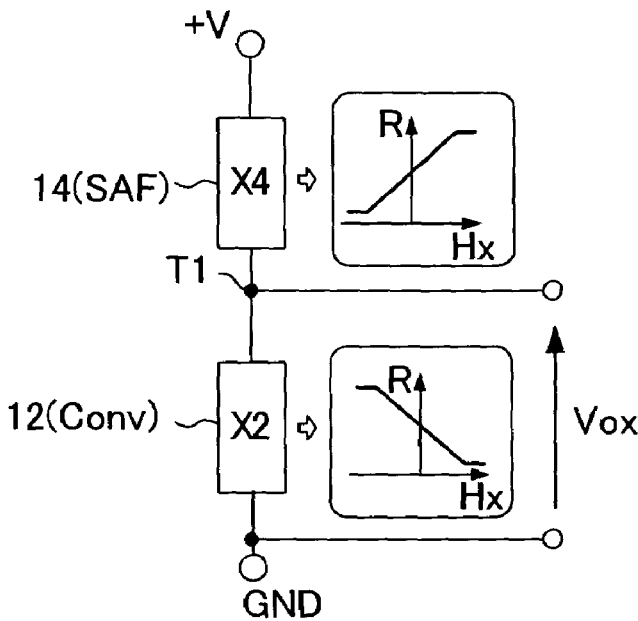
FIG. 44A is a schematic diagram of an equivalent circuit of a magnetic sensor according to a modification of the present invention.
Figure 44B:
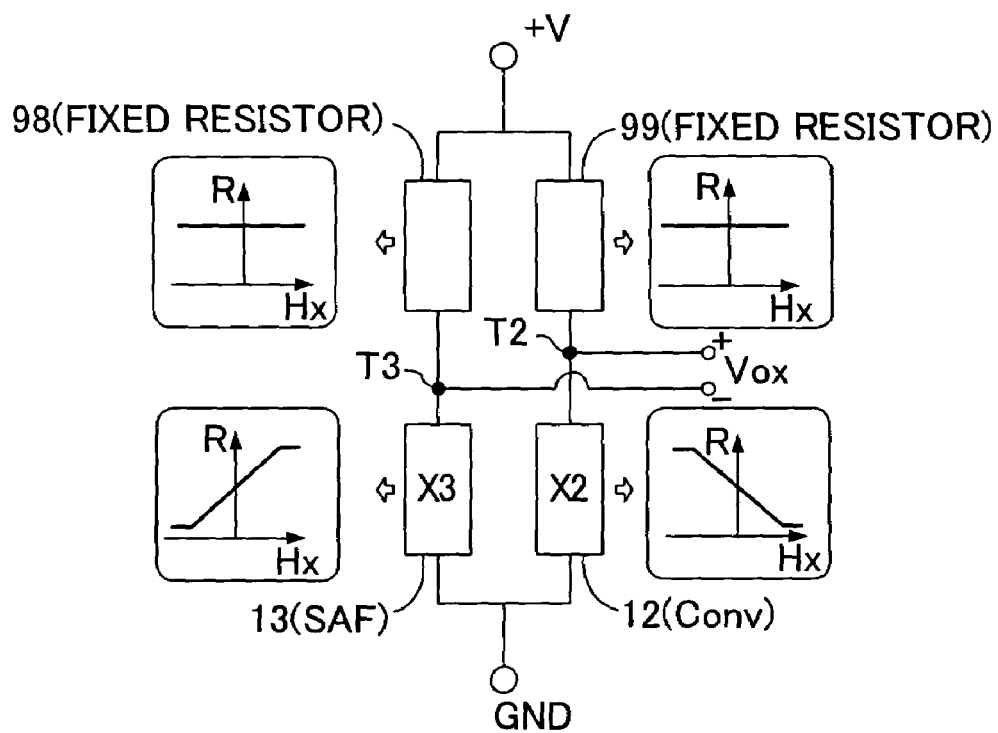
FIG. 44B is a schematic diagram of an equivalent circuit of a magnetic sensor according to another modification of the present invention.
Figure 45A:
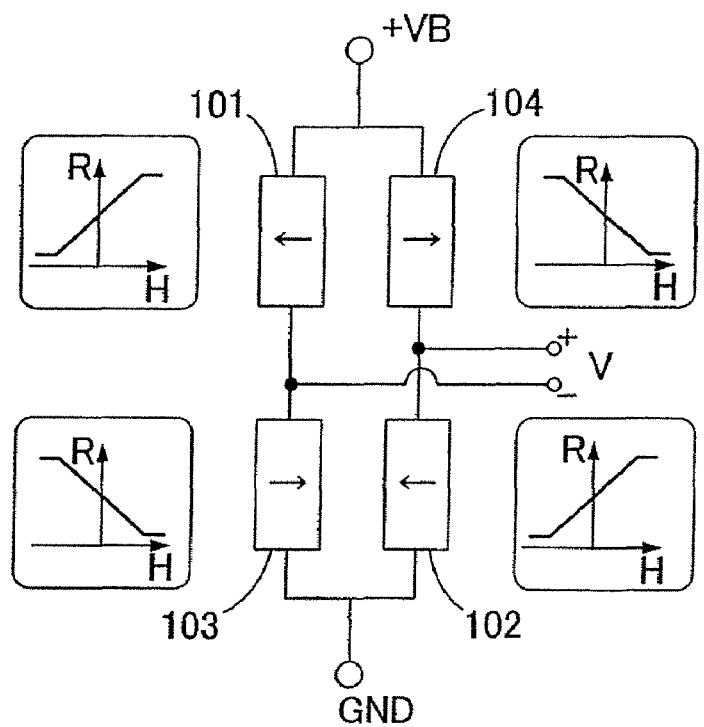
FIG. 45A is a schematic diagram of an equivalent circuit of a known magnetic sensor.
Figure 45B:
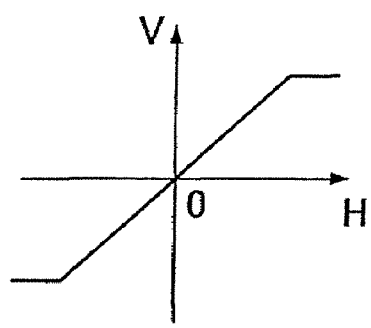
FIG. 45B is a graph showing the changes in output of the known magnetic sensor in response to an external magnetic field.
Figure 46:
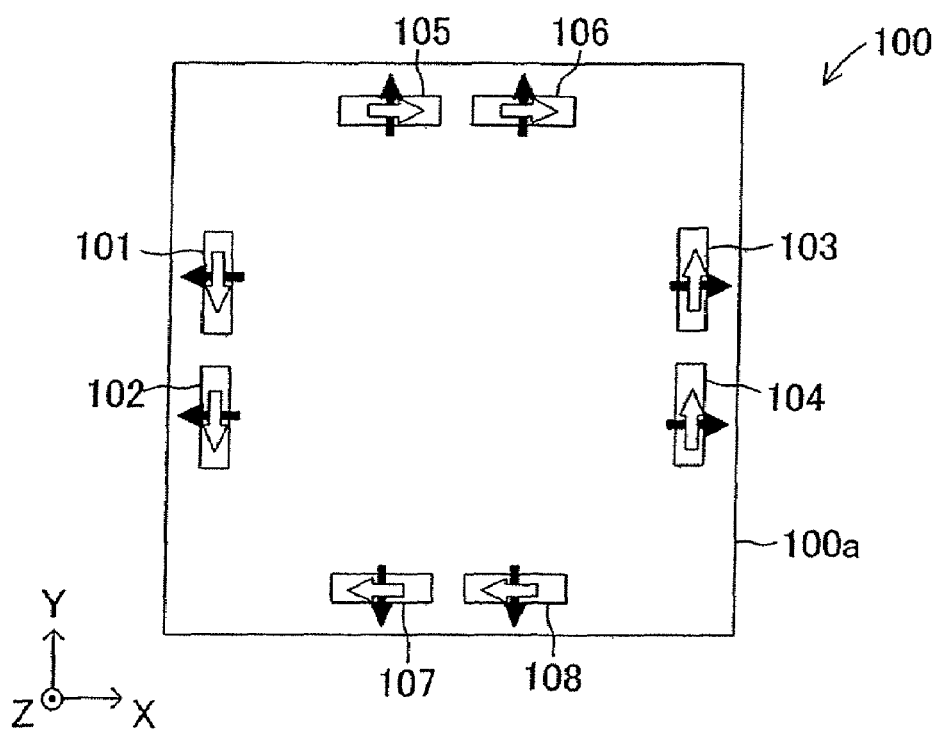
FIG. 46 is a plan view of the known magnetic sensor.
Figure 47:
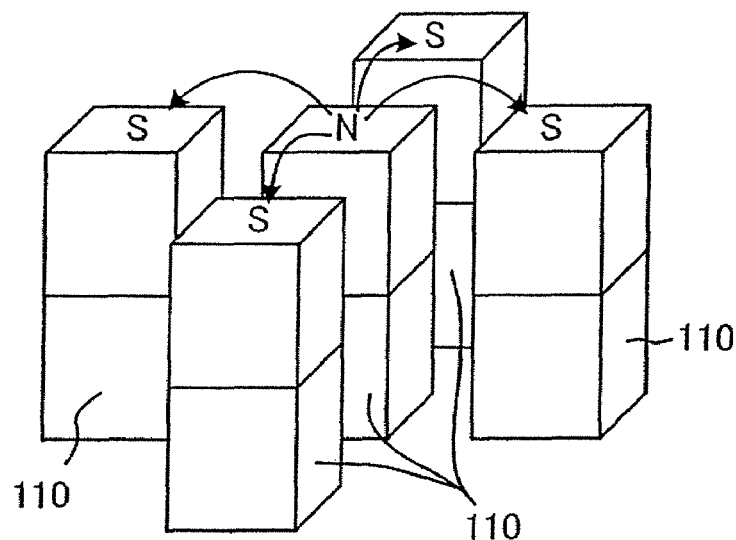
FIG. 47 is a perspective view of five of the permanent magnets in a magnet array used for fixing the magnetization direction of a fixed magnetization layer of the known magnetic sensor.
Figure 48:
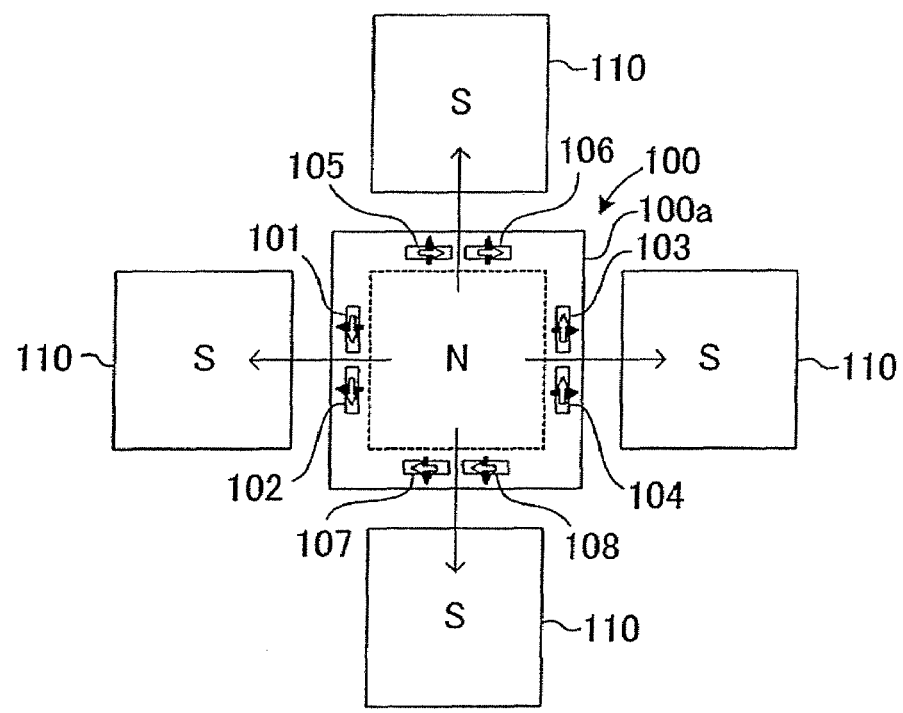
FIG. 48 is a plan view of the positional relationship between the magnet array shown in FIG. 47 and a wafer when the magnetization direction of the fixed magnetization layer is fixed.

In the magnetic sensor of the present invention, for example, the SAF element 14 and the conventional GMR element 12 may be connected in a half-bridge configuration to form an X-axis magnetic sensor, and the potential at the junction T1 of the elements is extracted as the output Vox, as shown in FIG. 44A. Also, a full-bridge circuit may include fixed resistors 98 and 99, as shown in FIG. 44B, and the potential difference between the potential at the junction T2 and the potential at the junction T3 is extracted as the output Vox of the X-axis magnetic sensor.

In another modification, for example, fixed resistors may be respectively disposed in series between the SAF element 13 and the junction Q1 and between the SAF element 14 and the junction Q2, in the circuit shown in FIG. 6.

Fifth Embodiment

Structure of Magnetic Sensor

Figure 49:
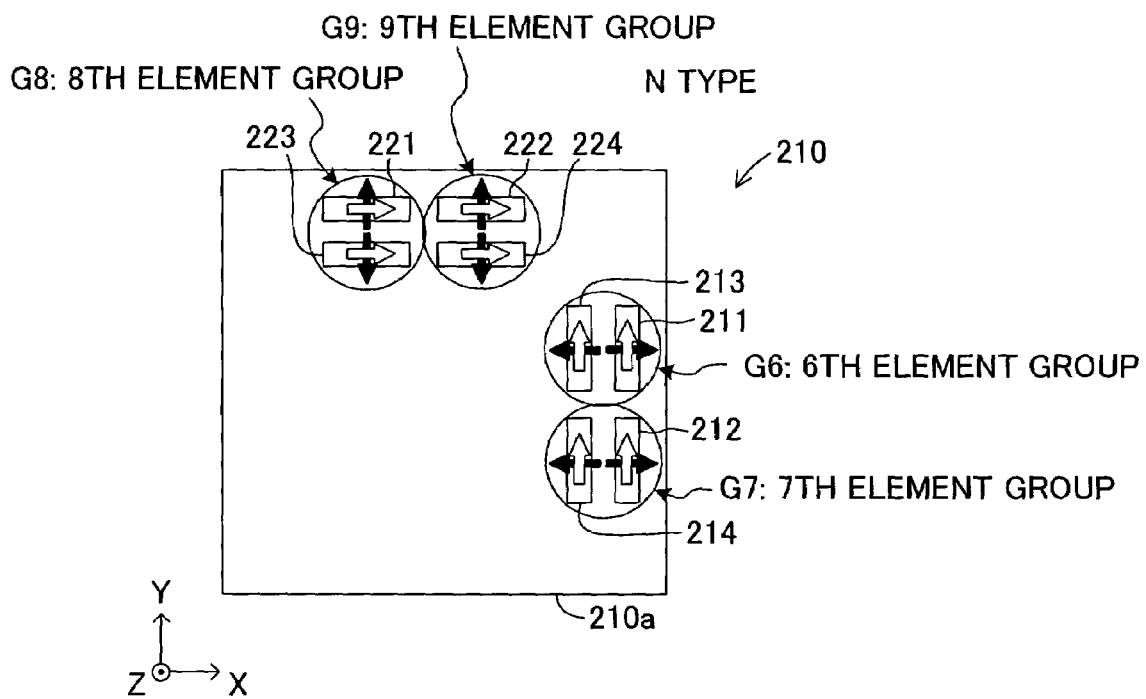
FIG. 49 is a plan view of a magnetic sensor (N type) according to a fifth embodiment of the present invention.

FIG. 49 is a plan view of a magnetic sensor 210 according to a fifth embodiment of the present invention. The magnetic sensor 210 includes the same single substrate (monolithic chip) 210a as the substrate 10a used in the foregoing embodiments and a total of eight giant magnetoresistive elements 211 to 214 and 221 to 224. The magnetic sensor 210 is referred to as an "N-type magnetic sensor 210" for the sake of convenience.

The giant magnetoresistive elements 211, 212, 221, and 222 are the above-described conventional GMR elements. The giant magnetoresistive elements 213, 214, 223, and 224 are the above-described SAF elements. The SAF elements 213, 214, 223, and 224 is formed over (i.e., overlap, overlie, lap over) the conventional GMR elements 211, 212, 221, and 222, respectively, as described in detail later. Note that, two elements in each solid line circle shown in FIG. 49 (for example, the elements 211 and 213) overlap each other in the direction perpendicular to the main surface of the substrate 210a (Z-axis direction).

In the present embodiment as well, the giant magnetoresistive elements 211, 212, 213, and 214 may be referred to as a first, a second, a third, and a fourth X-axis magnetic detecting element, respectively; the giant magnetoresistive elements 221, 222, 223, and 224 may be referred to as a first, a second, a third, and a fourth Y-axis magnetic detecting element, respectively.

The conventional GMR element 211 and the SAF element 213 constitute a sixth element group G6; the conventional GMR element 212 and the SAF element 214 constitute a seventh element group G7; the conventional GMR element 221 and the SAF element 223 constitute a eighth element group G8; and the conventional GMR element 222 and the SAF element 224 constitute a ninth element group G9. The sixth to ninth element groups G6 to G9 have substantially the same structure, except for their positions on the substrate 210a. Therefore, the following description illustrates the structure of the sixth element group G6 as a representative example.

Figure 50:
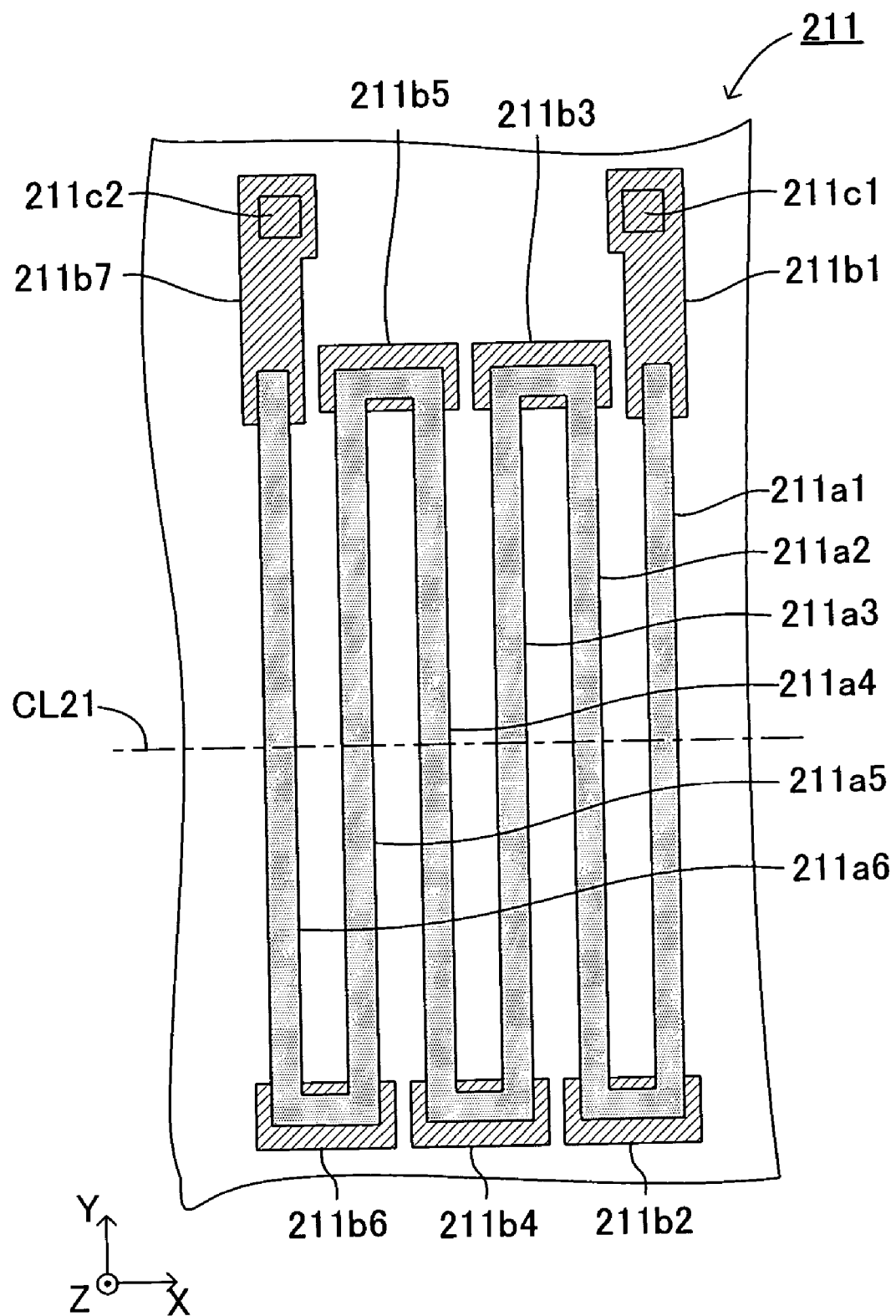
FIG. 50 is an enlarged plan view of a conventional GMR element shown in FIG. 49.

FIG. 50 is an enlarged plan view of the conventional GMR element 211. The conventional GMR element 211 includes a plurality (6 in this case) of narrow strip-shaped portions 211a1 to 211a6, a plurality (7 in this case) of bias magnet films 211b1 to 211b7, and a pair of terminals 211c1 and 211c2.

The narrow strip-shaped portions 211a1 to 211a6 each extend in the Y-axis direction, and they are disposed in parallel in the negative X-axis direction from the narrow strip-shaped portion 211a1 positioned at the most positive position in the X-axis direction. The positive end in the Y-axis direction of this narrow strip-shaped portion 211a1 is formed on a bias magnet film 211b1. The bias magnet film 211b1 is connected to the terminal 211c1. The negative end in the Y-axis direction of the narrow strip-shaped portion 211a1 is formed on a bias magnet film 211b2.

The negative and the positive ends in the Y-axis direction of the narrow strip-shaped portion 211a2 are formed on the bias magnet films 211b2 and 211b3, respectively. The negative end in the Y-axis direction of the narrow strip-shaped portion 211a2 is connected to the negative end in the Y-axis direction of the narrow strip-shaped portion 211a1 on the bias magnet film 211b2. The positive and the negative ends in the Y-axis direction of the narrow strip-shaped portion 211a3 are formed on the bias magnet films 211b3 and 211b4, respectively. The positive end in the Y-axis direction of the narrow strip-shaped portion 211a3 is connected to the positive end in the Y-axis direction of the narrow strip-shaped portion 211a2 on the bias magnet film 211b3.

The negative and the positive ends in the Y-axis direction of the narrow strip-shaped portion 211a4 are formed on the bias magnet films 211b4 and 211b5, respectively. The negative end in the Y-axis direction of the narrow strip-shaped portion 211a4 is connected to the negative end in the Y-axis direction of the narrow strip-shaped portion 211a3 on the bias magnet film 211b4. The positive and the negative ends in the Y-axis direction of the narrow strip-shaped portion 211a5 are formed on the bias magnet films 211b5 and 211b6, respectively. The positive end in the Y-axis direction of the narrow strip-shaped portion 211a5 is connected to the positive end in the Y-axis direction of the narrow strip-shaped portion 211a4 on the bias magnet film 211b5.

The negative and the positive ends in the Y-axis direction of the narrow strip-shaped portion 211a6 are formed on the bias magnet film 211b6 and 211b7, respectively. The negative end in the Y-axis direction of the narrow strip-shaped portion 211a6 is connected to the negative end in the Y-axis direction of the narrow strip-shaped portion 211a5 on the bias magnet film 211b6. The bias magnet film 211b7 is connected to the terminal 211c2. Thus, the conventional GMR element 211 is formed of the plurality of narrow strip-shaped portions connected in series in a serpentine manner. In FIG. 50, the dotted-chain line CL21 indicates the centerline running through the center in the Y-axis direction of each narrow strip-shaped portion.

Each of the narrow strip-shaped portions 211a1 to 211a6 is formed of the conventional spin-valve film shown in FIG. 4A.

Since the narrow strip-shaped portions 211a1 to 211a6 extend in the Y-axis direction, the free layer F of this spin-valve film extends in the Y-axis direction. Consequently, the initial magnetization of the free layer F when no external magnetic field is applied to the free layer F is oriented in the longitudinal direction of the free layer F (positive Y-axis direction for the conventional GMR element 211) by shape anisotropy.

The bias magnet films 211b1 to 211b7 are formed by a permanent magnet film (hard magnet film) made of the same hard ferromagnetic material as the bias magnet films 11b1 to 11b7. The bias magnet films 211b1 to 211b7 are magnetically coupled with free layers F directly overlying the bias magnet films to apply a bias magnetic field to the free layers F in their longitudinal direction (positive Y-axis direction for the conventional GMR element 211).

Thus, a sum of the resistances of the narrow strip-shaped portions 211a1 to 211a6 is extracted as the resistance of the conventional GMR element 211 from the terminals 211c1 and 211c2. Consequently, the resistance of the conventional GMR element 211 varies as shown in FIG. 4B and FIG. 4C, in the same manner as the conventional GMR element 11. More specifically, as the intensity of the external magnetic field in the positive X-axis direction increases, the resistance decreases.

Figure 51:
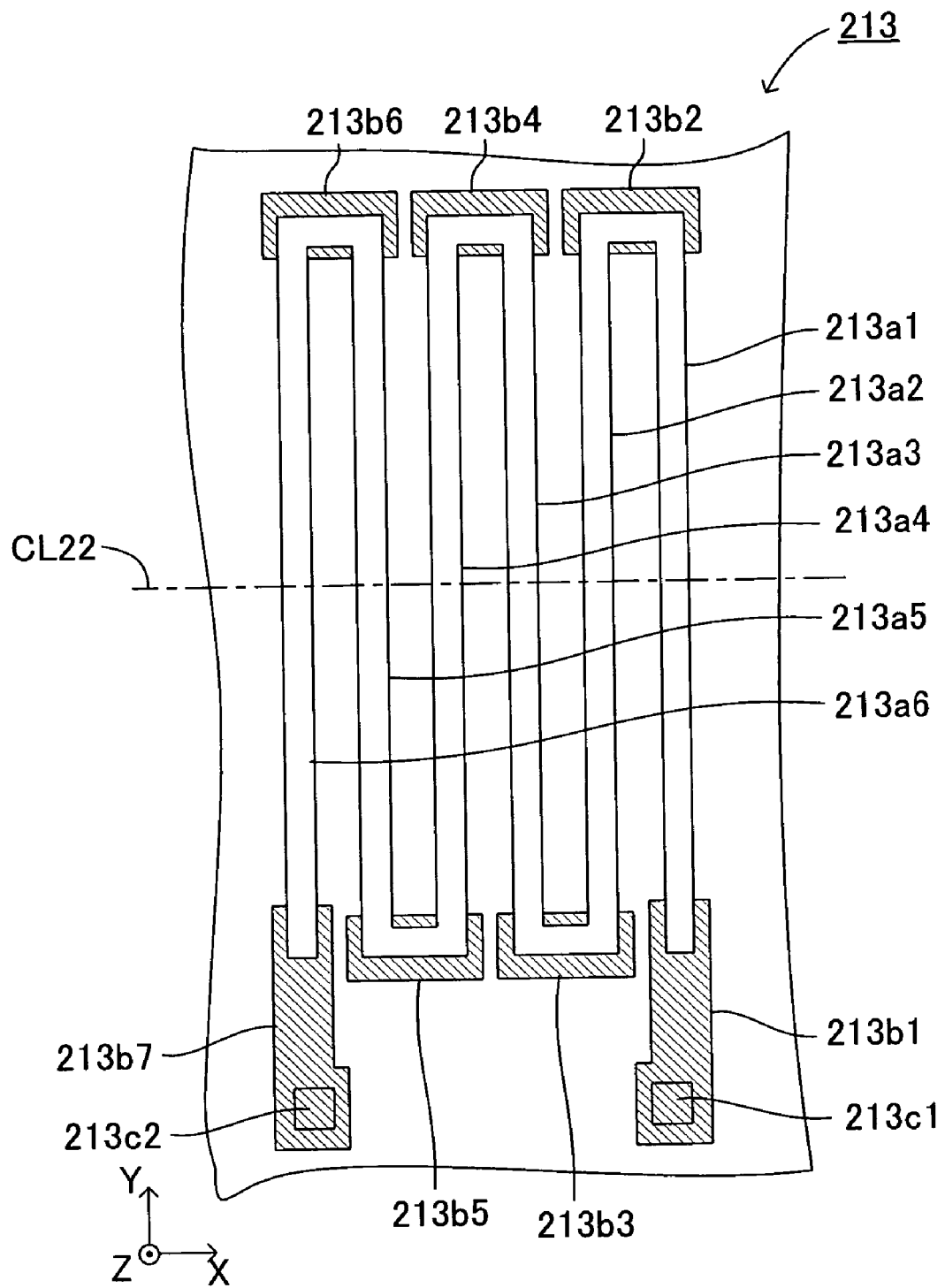
FIG. 51 is an enlarged plan view of a SAF element shown in FIG. 49.

The SAF element 213 has such a form as the conventional GMR element 211 folded back at the centerline CL21 (substantially the same form as the form of the conventional GMR element 211), as shown in FIG. 51. In other words, the SAF element 213 and the conventional GMR element 211 are symmetrical with respect to the centerline CL21.

More specifically, the SAF element 213 includes a plurality (6 in this case) of narrow strip-shaped portions 213a1 to 213a6, a plurality (7 in this case) of bias magnet films 213b1 to 213b7, and a pair of terminals 213c1 and 213c2.

The narrow strip-shaped portions 213a1 to 213a6 each extend in the Y-axis direction, and they are disposed in parallel in the negative X-axis direction from the narrow strip-shaped portion 213a1 lying at the most positive position in the X-axis direction. The negative end in the Y-axis direction of the narrow strip-shaped portion 213a1 is formed on the bias magnet film 213b1. The bias magnet film 213b1 is connected to the terminal 213c1. The positive end in the Y-axis direction of the narrow strip-shaped portion 213a1 is formed on the bias magnet film 213b2.

The positive and the negative ends in the Y-axis direction of the narrow strip-shaped portion 213a2 are formed on the bias magnet films 213b2 and 213b3, respectively. The positive end in the Y-axis direction of the narrow strip-shaped portion 213a2 is connected to the positive end in the Y-axis direction of the narrow strip-shaped portion 213a1 on the bias magnet film 213b2. The negative and the positive end in the Y-axis direction of the narrow strip-shaped portion 213a3 are formed on the bias magnet films 213b3 and 213b4, respectively. The negative end in the Y-axis direction of the narrow strip-shaped portion 213a3 is connected to the negative end in the Y-axis direction of the narrow strip-shaped portion 213a2 on the bias magnet film 213b3.

The positive and the negative ends in the Y-axis direction of the narrow strip-shaped portion 213a4 are formed on the bias magnet films 213b4 and 213b5, respectively. The positive end in the Y-axis direction of the narrow strip-shaped portion 213a4 is connected to the positive end in the Y-axis direction of the narrow strip-shaped portion 213a3 on the bias magnet film 213b4. The negative and the positive end in the Y-axis direction of the narrow strip-shaped portion 213a5 are formed on the bias magnet films 213b5 and 213b6, respectively. The negative end in the Y-axis direction of the narrow strip-shaped portion 213a5 is connected to the negative end in the Y-axis direction of the narrow strip-shaped portion 213a4 on the bias magnet film 213b5.

The positive and the negative ends in the Y-axis direction of the narrow strip-shaped portion 213a6 are formed in the bias magnet films 213b6 and 213b7. The positive end in the Y-axis direction of the narrow strip-shaped portion 213a6 is connected to the positive end in the Y-axis direction of the narrow strip-shaped portion 213a5 on the bias magnet film 213b6. The bias magnet film 213b7 is connected to the terminal 213c2. Thus, the SAF element 213 is formed of the plurality of narrow strip-shaped portions connected in series in a serpentine manner.

Figure 52:
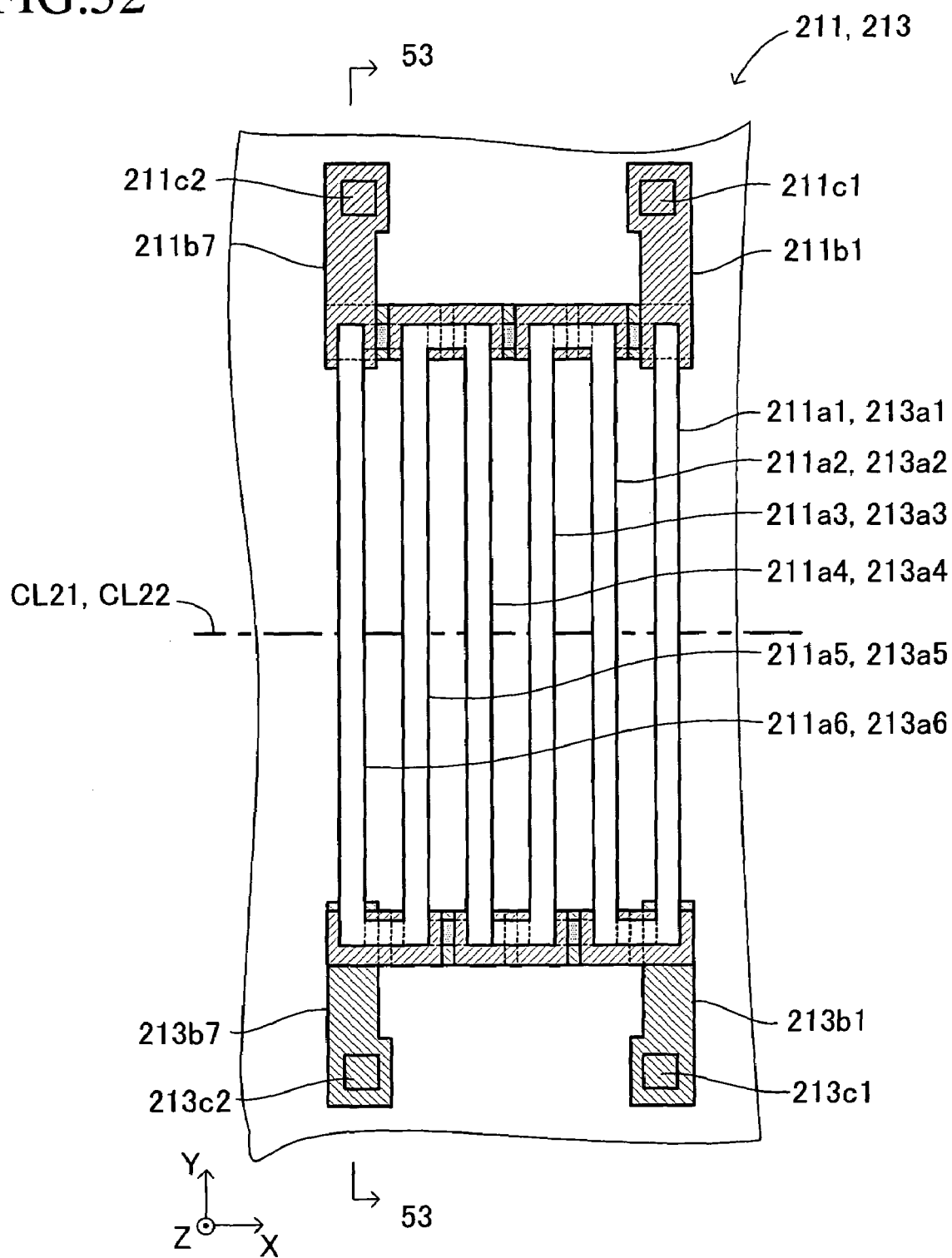
FIG. 52 is an enlarged plan view of a sixth element group (including a conventional GMR element and a SAF element) shown in FIG. 49.
Figure 53:
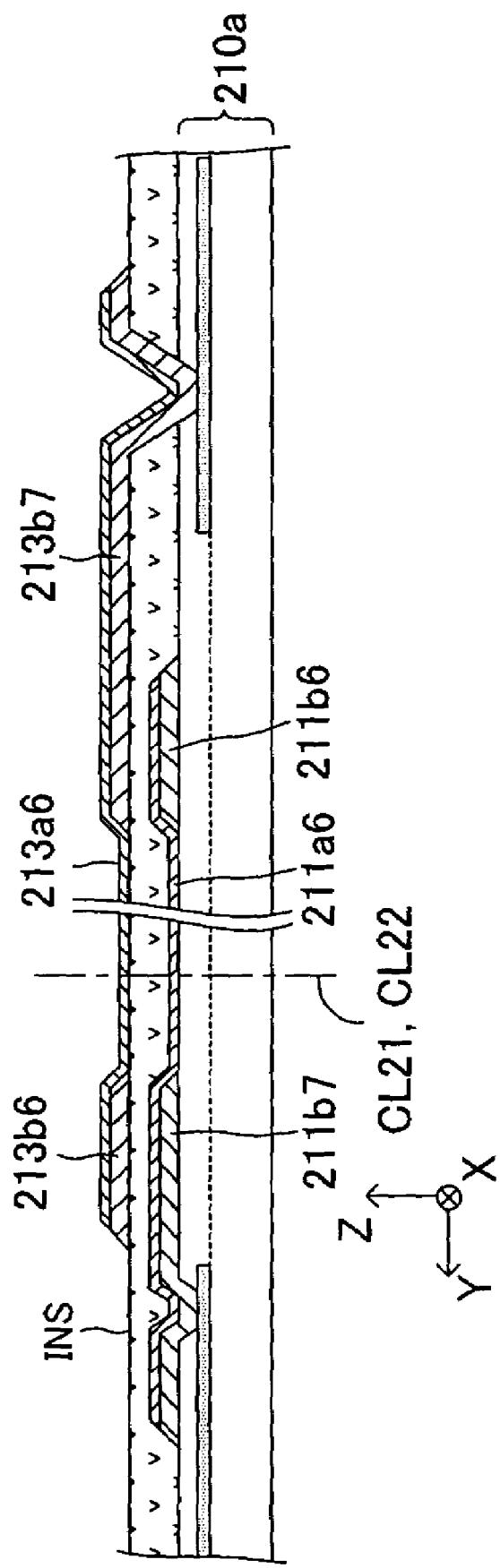
FIG. 53 is a schematic sectional view of the sixth element group taken along line LIII-LIII in FIG. 52.

Dotted-chain line CL22 shown in FIG. 51 indicates the centerline running through the centers in the Y-axis direction of the narrow strip-shaped portions. The SAF element 213 substantially overlies (or underlies) the conventional GMR element 211 so that its centerline CL22 aligns with the centerline CL21 of the conventional GMR element 211, as shown in FIG. 52 and FIG. 53, which is a sectional view of the SAF element 213 taken along line LIII-LIII in FIG. 52. As shown in FIG. 53, an insulating layer is provided between the conventional GMR element 211 and the SAF element 213.

The SAF element 213 is formed of a synthetic spin-valve film having the structure shown in FIG. 5A. The synthetic spin-valve film includes a free layer F, a spacer layer S overlying the free layer F, a fixed magnetization layer P' overlying the spacer layer S, and a protective layer (capping layer) C overlying the fixed magnetization layer P'.

The SAF element 213 having the above-described structure has a resistance varying in response to an external magnetic field H changing in the range of −Hc to +Hc along the fixed magnetization direction of the first ferromagnetic layer (pinned layer) P1 in the fixed magnetization layer P' (resistance increasing as the intensity of the external magnetic field H in the positive X-axis direction increasing), as shown in FIG. 5C.

Referring back to FIG. 49, the sixth element group G6 including the conventional GMR element 211 and the SAF element 213 is disposed in the vicinity of the positive edge in the X-axis direction of the substrate 210a and in an upper-middle position in the Y-axis direction. A magnetic-field-detecting direction of the conventional GMR element 211 is in the negative X-axis direction. A magnetic-field-detecting direction of the SAF element 213 is in the positive X-axis direction. The seventh element group G7 including the conventional GMR element 212 and the SAF element 214 is disposed in the vicinity of the positive edge in the X-axis direction of the substrate 210a and in the lower-middle position in the Y-axis direction. A magnetic-field-detecting direction of the conventional GMR element 212 is in the negative X-axis direction. A magnetic-field-detecting direction of the SAF element 214 is in the positive X-axis direction. As described, the sixth element group G6 and the seventh element group G7 are disposed close to each other in the vicinity of the positive edge in the X-axis direction of the substrate 210a (in a first small region).

The eighth element group G8 including the conventional GMR element 221 and the SAF element 223 is disposed in the positive edge in the Y-axis direction of the substrate 210a and in a left-middle position in the X-axis direction. A magnetic-field-detecting direction of the conventional GMR element 221 is in the negative Y-axis direction. A magnetic-field-detecting direction of the SAF element 223 is in the positive Y-axis direction. The ninth element group G9 including the conventional GMR element 222 and the SAF element 224 is disposed in the vicinity of the positive edge in the Y-axis direction of the substrate 210a and in a right-middle position in the X-axis direction. A magnetic-field-detecting direction of the conventional GMR element 222 is in the negative Y-axis direction. A magnetic-field-detecting direction of the SAF element 224 is in the positive Y-axis direction. As described, the eighth element group G8 and the ninth element group G9 are disposed close to each other in the vicinity of the positive edge in the Y-axis direction of the substrate 210a (second small region at a predetermined distant from the first small region).

The magnetic sensor 210 includes an X-axis magnetic sensor (whose magnetic-field-detecting direction is in the X-axis direction) constituted of the elements 211 to 214 and a Y-axis magnetic sensor (whose magnetic-field-detecting direction is in the Y-axis direction) constituted of the elements 221 to 224.

Figure 54A:
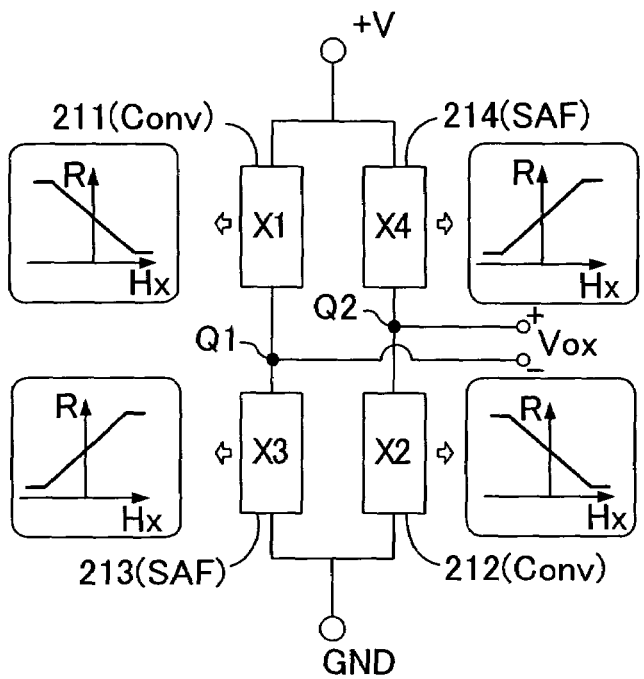
FIG. 54A is a schematic diagram of an equivalent circuit of an X-axis magnetic sensor included in the magnetic sensor shown in FIG. 49.
Figure 54B:
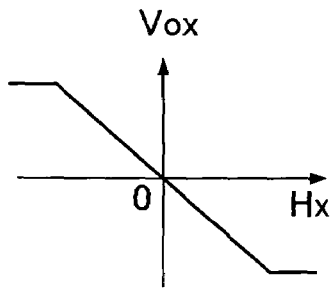
FIG. 54B is a graph showing the changes in output of the X-axis magnetic sensor shown in FIG. 40 in response to the component in the positive X-axis direction of an external magnetic field.

As shown in the equivalent circuit in FIG. 54A, the X-axis magnetic sensor includes the elements 211 to 214 connected in a full-bridge configuration with conducting wires (not shown in FIG. 49). The elements 211 to 214 are connected in the same manner as the elements 11 to 14 shown in FIG. 6. The potential difference Vox (=VQ2−VQ1) between the potential VQ1 at the junction Q1 where the conventional GMR element 211 is connected to the SAF element 213 and the potential VQ2 at the junction Q2 where the conventional GMR element 212 is connected to the SAF element 214 is extracted as the output (first output) from the X-axis magnetic sensor. Consequently, the X-axis magnetic sensor outputs a voltage Vox that is substantially proportional to an external magnetic field Hx changing along the X axis and that decreases as the external magnetic field Hx increases, as shown in FIG. 54B.

Figure 55A:
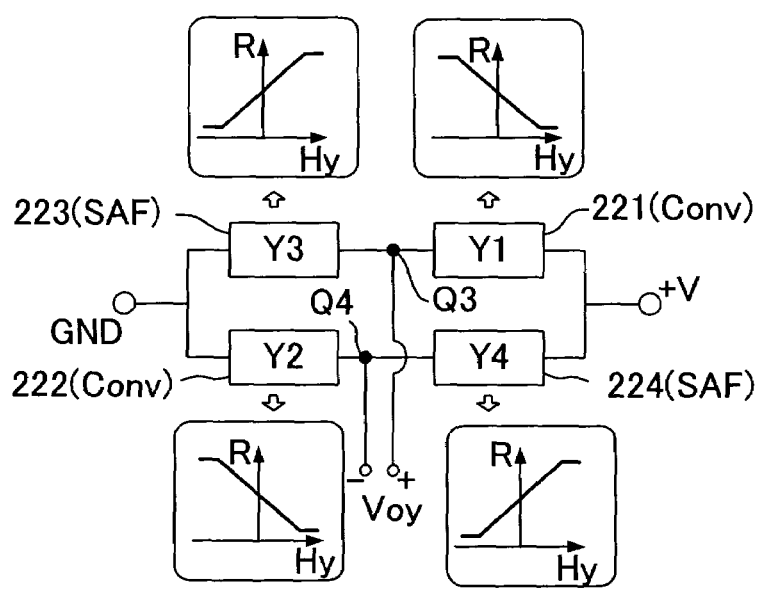
FIG. 55A is a schematic diagram of an equivalent circuit of a Y-axis magnetic sensor included in the magnetic sensor shown in FIG. 49.
Figure 55B:
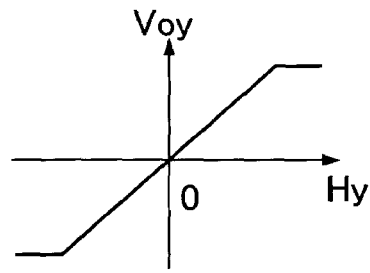
FIG. 55B is a graph showing the changes in output of the Y-axis magnetic sensor shown in FIG. 49 in response to the component in the positive Y-axis direction of an external magnetic field.

As shown in the equivalent circuit in FIG. 55A, the Y-axis magnetic sensor includes the elements 221 to 224 connected in a full-bridge configuration with conducting wires (not shown in FIG. 49). The elements 221 to 224 are connected in the same manner as the elements 21 to 24 shown in FIG. 7. The potential difference Voy (=VQ3−VQ4) between the potential VQ3 at the junction Q3 where the conventional GMR element 221 is connected to the SAF element 223 and the potential VQ4 at the junction Q4 where the conventional GMR element 222 is connected to the SAF element 224 is extracted as the output (second output) of the Y-axis magnetic sensor. Consequently, the Y-axis magnetic sensor outputs a voltage Voy that is substantially proportional to an external magnetic field Hy changing along the Y axis and that increases as the external magnetic field Hy increases, as shown in FIG. 55B.

Figure 56:
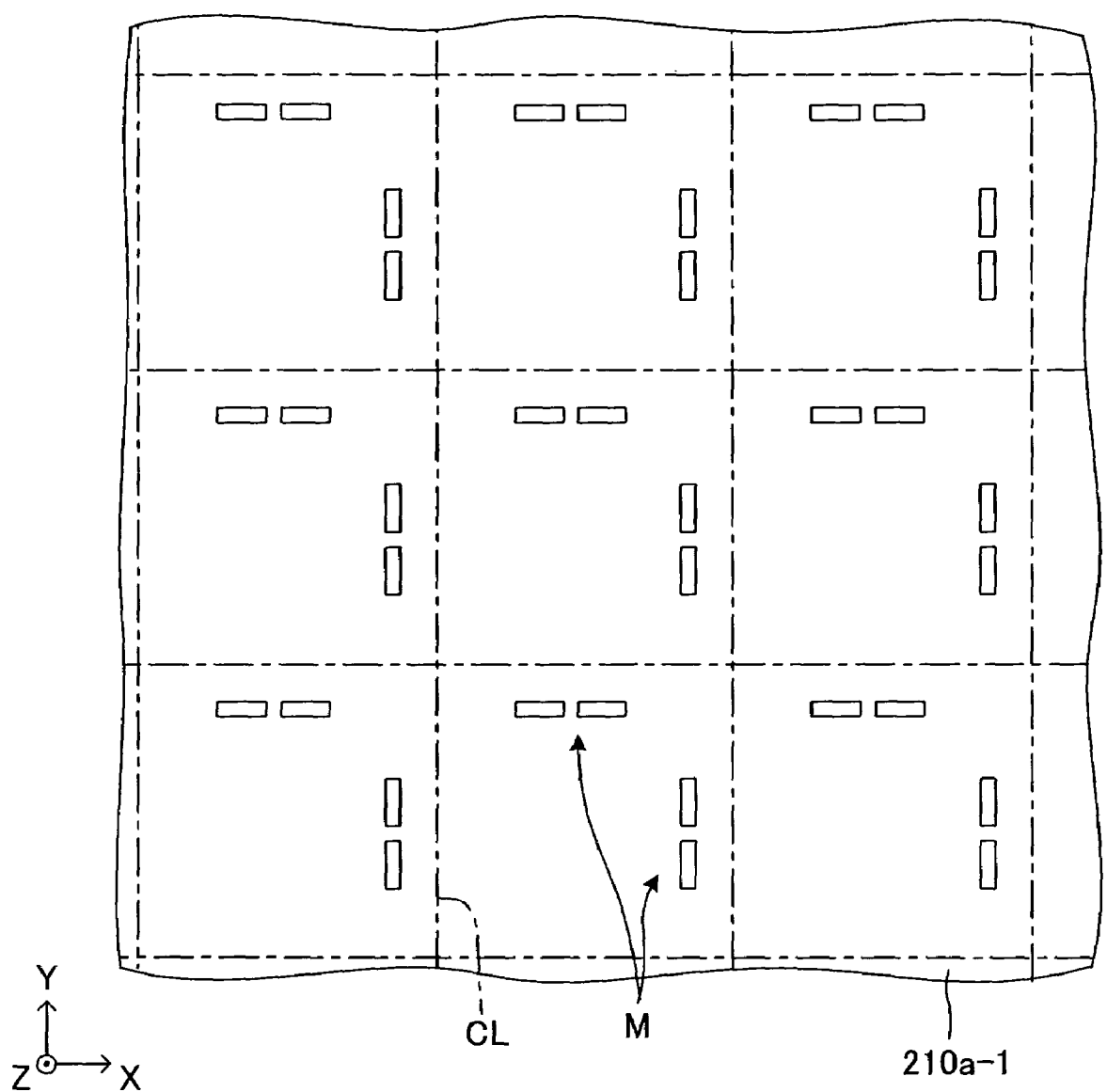
FIG. 56 is a fragmentary plan view of a wafer (substrate) used for manufacturing the magnetic sensor shown in FIG. 49.

Method for Manufacturing Magnetic Sensor 210—Fixing of Magnetization Direction of Pinned Layer A method will now be described for forming the elements 211 to 214 and 221 to 224 (for fixing the magnetization of the pinned layer). First, a plurality of films M intended to act as the elements 211 to 214 and 221 to 224 are formed in an island-shaped manner on a substrate 210a-1 that is to act as the substrate 210a, as shown in plan view in FIG. 56. These films M are disposed so that when the substrate 210a-1 is cut along the dotted-chain lines CL in FIG. 56 into a plurality of magnetic sensors 210 shown in FIG. 49 in a cutting step, the elements 211 to 214 and 221 to 224 are arranged on the substrate 210a as shown in FIG. 49. How these films M are formed will be described later.

Figure 57:
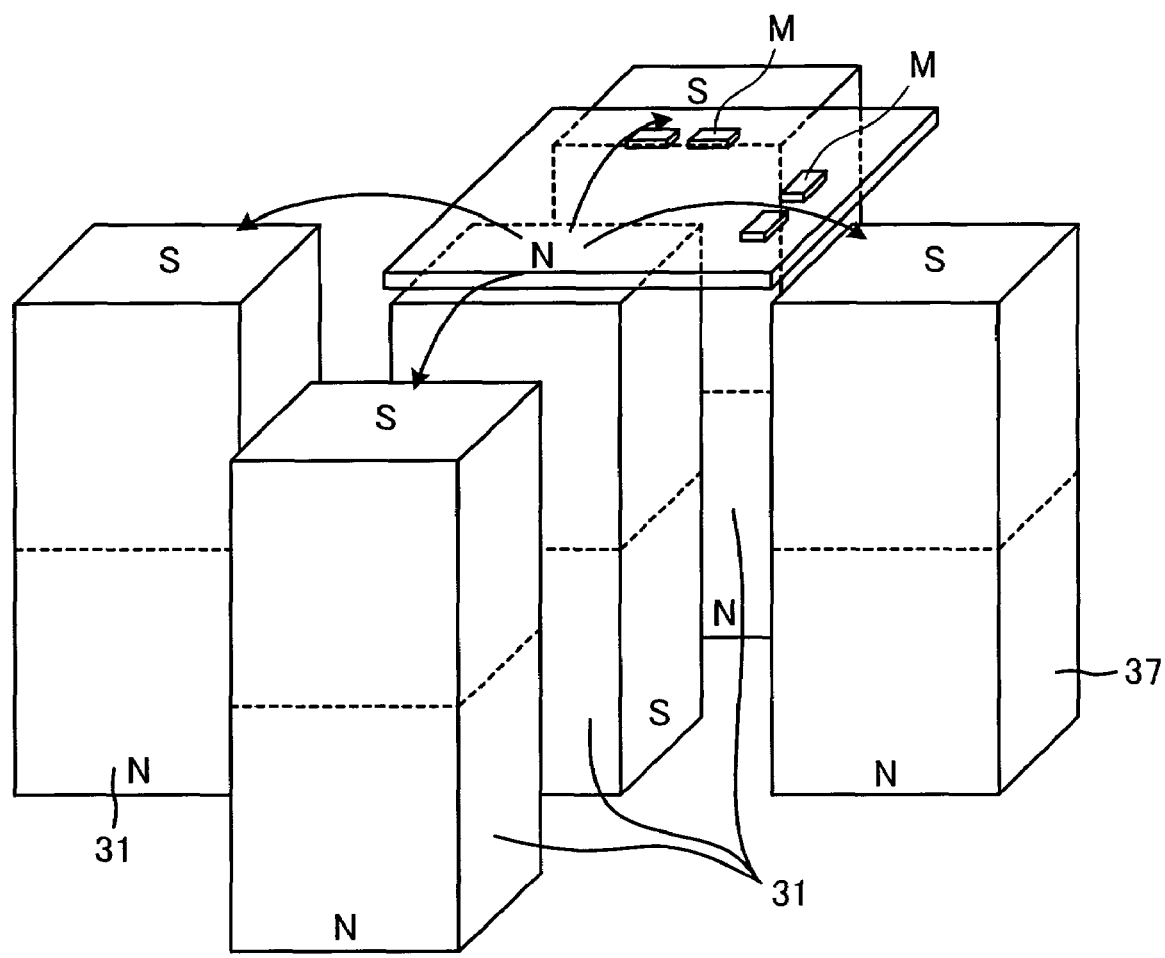
FIG. 57 is a perspective view of five of the permanent magnets in the magnet array shown in FIG. 9.

Then, a magnet array 30 shown in FIGS. 9 and 10 is prepared. In the present embodiment as well, magnetic fields generated over the permanent magnets 31 are used for fixing the magnetization directions of the pinned layers in the elements 211 to 214 and 221 to 224, as shown in FIG. 57.

The substrate 210a-1 having the films M is disposed over the magnet array 30. Specifically, the substrate 210a-1 and the magnet array 30 are disposed with a relative positional relationship such that two adjacent edges of each square formed by cutting the substrate 210a-1 along lines CL, not having the films M adjacent thereto, and their intersection are aligned with two adjacent edges and their intersection of the corresponding permanent magnet, as shown in the plan view in FIG. 58. Thus, each film M is exposed to a magnetic field oriented in the direction perpendicular to the longitudinal direction of the narrow strip-shaped portion of the film M, as indicated by the arrows in FIGS. 57 and 58.

Then, such a set of the substrate 210a-1 and the magnet array 30 is heated to 250 to 280° C. in a vacuum and subsequently allowed to stand for about 4 hours for magnetic field heat treatment. Consequently, the magnetization directions of the fixed magnetization layers P (pinned layers Pd) of the conventional GMR elements and the fixed magnetization layers P' (pinned layers P1) of the SAF elements are fixed.

Figure 59:
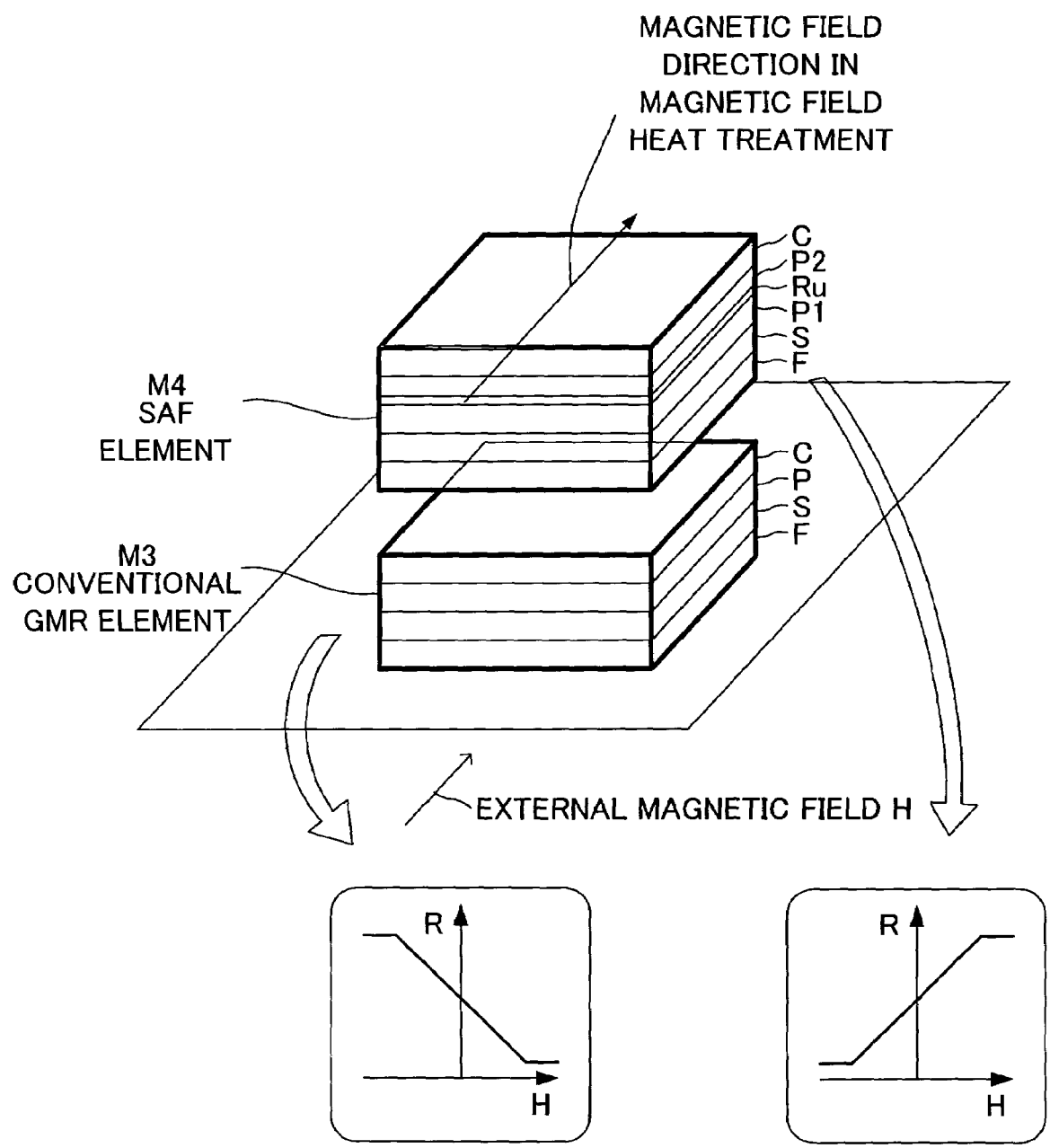
FIG. 59 is a representation of the relationships, each between the magnetic field direction in magnetic field heat treatment and the resulting characteristics of a conventional GMR element.

By the steps described above, as shown in FIG. 59, a magnetic field oriented in a single direction is applied to a pair of the film M3 intended to act as the conventional GMR element and the film M4 intended to act as the SAF element, which are disposed one over the other (i.e., overlap each other), during the magnetic field heat treatment. Consequently, two of giant magnetoresistive elements, whose magnetic-field-detecting directions are antiparallel each other, are obtained. This is because the magnetization of the pinned layer Pd (CoFe magnetic layer) of the fixed magnetization layer P in the film intended to become a conventional GMR element and the magnetization of the second ferromagnetic layer P2 of the fixed magnetization layer P' in the film intended to become a SAF element are fixed in the same direction each other, while the magnetization of the first ferromagnetic layer P1 of the fixed magnetization layer P' is oriented in the antiparallel direction to the magnetization direction of the second ferromagnetic layer P2.

Thus, this technique can also provide at least two giant magnetoresistive elements arranged in a very small area, having antiparallel magnetic-field-detecting directions each other.

Figure 58:
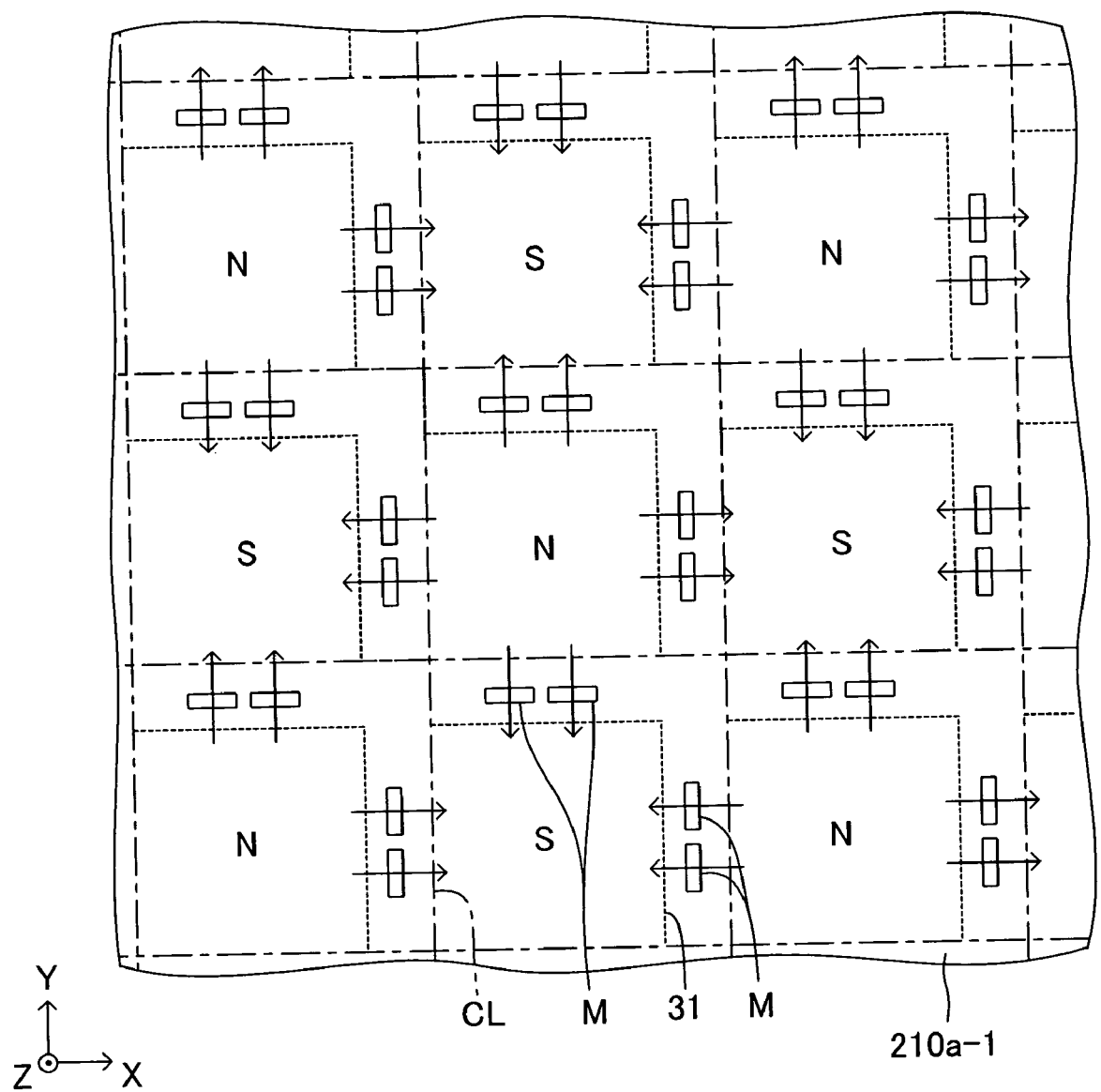
FIG. 58 is a fragmentary plan view of a magnet array and a wafer used for fixing the magnetization directions of the pinned layers of the conventional GMR elements and SAF elements of the magnetic sensor shown in FIG. 49.
Figure 60:
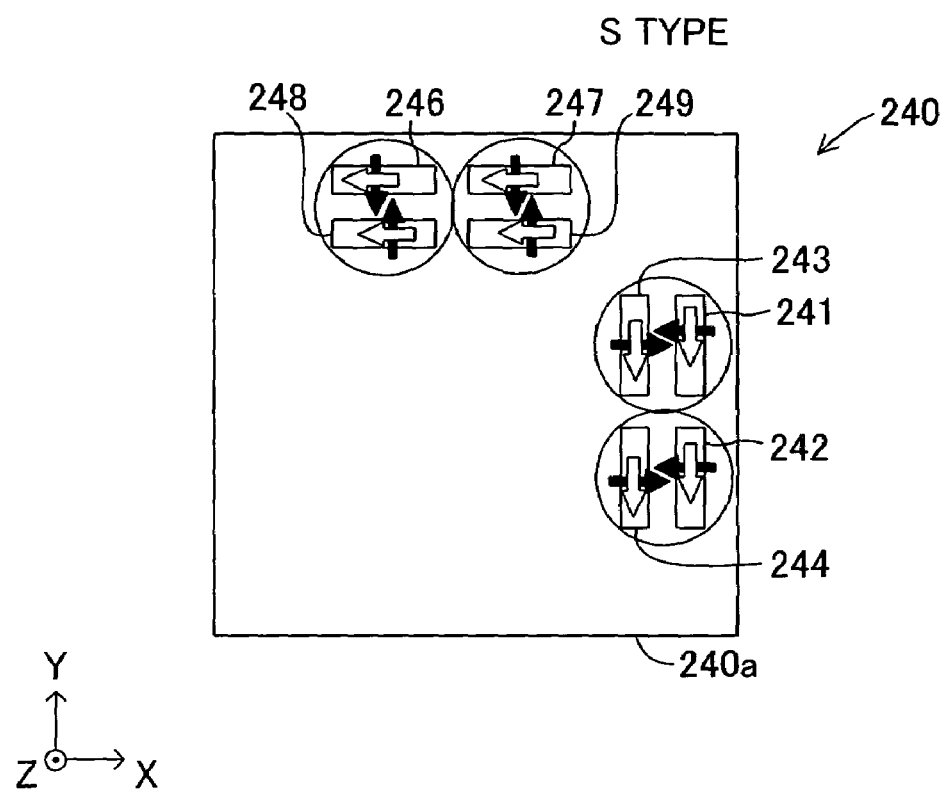
FIG. 60 is a plan view of a magnetic sensor (S type) according to a fifth embodiment of the present invention.

In practice, after the magnetic field heat treatment, the substrate 210a-1 having the films is subjected to necessary treatment, including polarization of the bias magnet films, and is cut along lines CL shown in FIG. 58. As a result, a plurality of magnetic sensors 210 shown in FIG. 49 and a plurality of magnetic sensors 240 shown in FIG. 60 are simultaneously manufactured.

The magnetic sensor 240 is referred to as "S-type magnetic sensor 240" for the sake of convenience. The magnetic sensor 240 includes giant magnetoresistive elements 241 to 244 and 246 to 249. The elements 241, 242, 246, and 247 are conventional GMR elements; and the elements 243, 244, 248, and 249 are SAF elements. The SAF elements 243, 244, 248, and 249 overlie the conventional GMR element 241, 242, 246, and 247, respectively. The initial magnetizations of the free layers in these elements and the fixed magnetizations of the pinned layers (ferromagnetic layers adjoining the spacer layers), whose directions are antiparallel to the magnetic-field-detecting directions, are oriented as shown in FIG. 60. Two elements in each solid line circle shown in FIG. 60 (for example, the elements 241 and 243) overlap each other in the direction perpendicular to the main surface of the substrate 210a (Z-axis direction).

The elements 241, 242, 243, and 244 are referred to as a first, a second, a third, and a fourth X-axis magnetic detecting element, respectively. These X-axis magnetic detecting elements are connected in a full-bridge configuration to form an X-axis magnetic sensor, as in the elements 211, 212, 213, and 214 of the magnetic sensor 210. Similarly, the elements 246, 247, 248, and 249 are referred to as a first, a second, a third, and a fourth Y-axis magnetic detecting element, respectively. These Y-axis magnetic detecting elements are connected in a full-bridge configuration to form a Y-axis magnetic sensor, as in the elements 221, 222, 223, and 224 of the magnetic sensor 210.

Method for Forming Films M

A method (film formation step) for forming the films M (intended to act as the conventional GMR elements and the SAF element) will now be described.

Step 31: A substrate 210*a* is prepared as shown in FIG. 61A. The substrate 210*a* has an insulating/wiring layer including wires 210*a*1 used for the bridge configuration and an insulating layer 210*a*2 covering the wires 210*a*1. The insulating layer 210*a*2 has via holes VIA used for electrical connection. The wire 210*a*1 is partially exposed at the bottoms of the via holes VIA.

Step 32: Referring to FIG. 61B, a layer 211*b* intended to become the bias magnet films (CoCrPt layer for forming the bias magnet films 211*b*1 to 211*b*7) is formed on the substrate 210*a* by sputtering.

Step 33: Referring to FIG. 61C, a resist layer R1 is formed on the upper surface of the CoCrPt layer 211*b*. The resist layer R1 is patterned so as to cover only necessary regions of the CoCrPt layer 211*b* for the bias magnet films. In other words, the resist layer R1 is formed into a resist mask.

Step 34: Referring to FIG. 62A, unnecessary regions of the CoCrPt layer 211*b* for the bias magnet films are removed by ion milling.

Step 35: Referring to FIG. 62B, the resist layer R1 is removed.

Step 36: Referring to FIG. 62C, a composite layer 211*a* as shown in FIG. 4A intended to become the conventional GMR elements (layer for forming the narrow strip-shaped portions 211*a*1 to 211*a*6) is formed over the upper surface of the substrate 210*a*.

Step 37: Referring to FIG. 63A, a resist layer R2 is formed on the upper surface of the composite layer 211*a* and subsequently patterned so as to cover only necessary regions of the composite layer 211*a* for forming the conventional GMR elements. In other words, the resist layer R2 is formed into a resist mask.

Step 38: Referring to FIG. 63B, unnecessary regions of the composite layer 211*a* are removed by ion milling.

Step 39: Referring to FIG. 63C, the resist layer R2 is removed.

Step 40: Referring to FIG. 64A, a SiN insulating interlayer IN is formed on the upper surface over the substrate 210*a* by chemical vapor deposition (CVD). Alternatively, the insulating interlayer IN may be formed of $SiO_2$.

Step 41: Referring to FIG. 64B, a resist layer R3 is formed over the upper surface of the insulating interlayer IN except regions where via holes VIA should be formed. In other words, the resist layer R3 serves as a resist mask.

Step 42: Referring to FIG. 64C, unnecessary regions of the insulating interlayer IN are removed by ion milling, thereby forming via holes VIA.

Step 43: Referring to FIG. 65A, the resist layer R3 is removed.

Step 44: Referring to FIG. 65B, a layer 213*b* intended to become the bias magnet films (CoCrPt layer for forming the bias magnet films 213*b*1 to 213*b*7) is formed on the upper surface over the substrate 210*a* by sputtering.

Step 45: Referring to FIG. 65C, a resist layer R4 is formed on the upper surface of the CoCrPt layer 213*b*. The resist layer R4 is patterned so as to cover only necessary regions of the CoCrPt layer 213*b* for the bias magnet films. In other words, the resist layer R4 is formed into a resist mask.

Step 46: Referring to FIG. 66A, unnecessary regions of the CoCrPt layer 213*b* for the bias magnet films are removed by ion milling.

Step 47: Referring to FIG. 66B, the resist layer R4 is removed.

Step 48: Referring to FIG. 66C, a composite layer 213*a* intended to become the SAF elements shown in FIG. 5A (layer for forming the narrow strip-shaped portions 213*a*1 to 213*a*6) is formed on the upper surface over the substrate 210*a*.

Figure 67A:
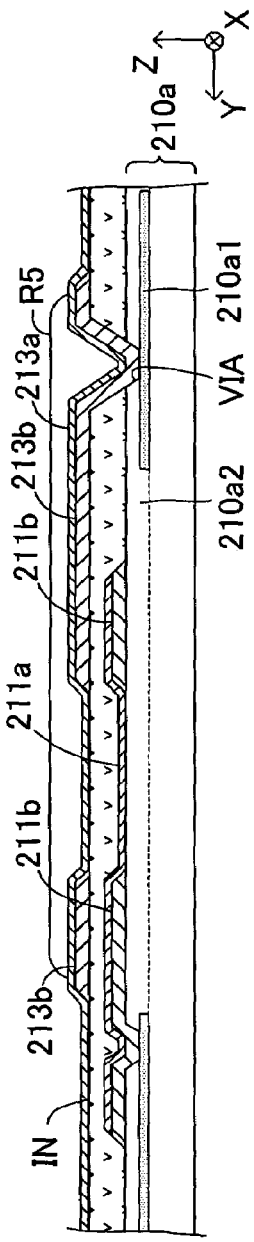
FIG. 67A is a manufacturing process view of a step following the step shown in FIG. 66C.

Step 49: Referring to FIG. 67A, a resist layer R5 is formed on the upper surface of the composite layer 213*a* and subsequently patterned so as to cover necessary regions of the composite layer 213*a* for forming the SAF elements. In other words, the resist layer R5 is formed into a resist mask.

Figure 67B:
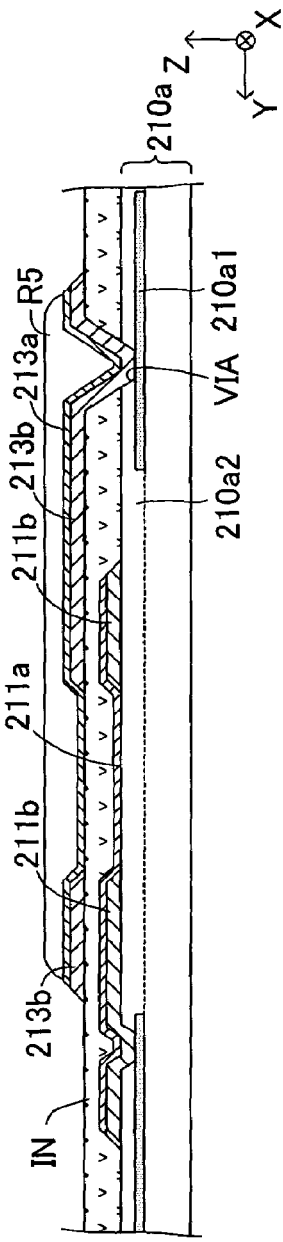
FIG. 67B is a manufacturing process view of a step following the step shown in FIG. 67A.

Step 50: Referring to FIG. 67B, unnecessary regions of the SAF element composite layer 213*a* is removed by ion milling.

Figure 67C:
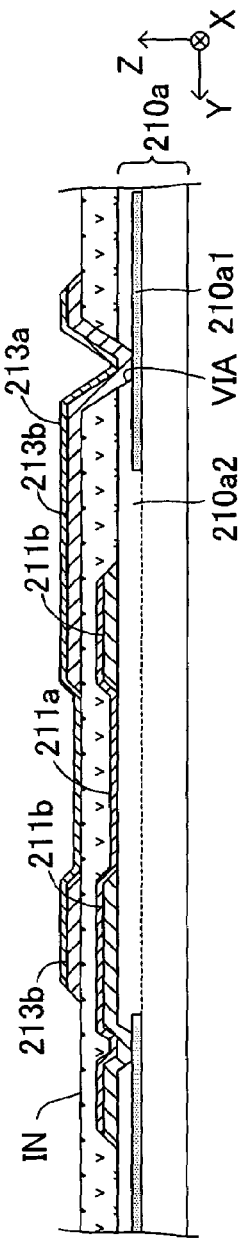
FIG. 67C is a manufacturing process view of a step following the step shown in FIG. 67B.

Step 51: Referring to FIG. 67C, the resist layer R5 is removed.

Thus, composite films 211*a* and 213*a* respectively intended to act as the conventional normal GMR elements and the SAF elements are formed one over the other (are formed to overlap each other). Then, the above-described magnetic field heat treatment is performed.

Although the films intended to act as the conventional GMR elements are formed before the films intended to act as the SAF elements in the above method, the films intended to act as the SAF elements may be formed before the films intended to act as the conventional GMR elements is formed.

As described above, the above method includes: the film forming step (Steps 31 to 51) of forming a composite layer 211*a* (films) intended to act as the conventional GMR elements being the first giant magnetoresistive elements and a composite layer 213*a* intended to act as the SAF elements being the second giant magnetoresistive elements on the substrate 210*a* (more precisely, on the substrate 210*a*-1 to be the substrate 210*a*); and the magnetic field heat treatment for applying a magnetic field oriented in a single direction to the films at a high temperature to fix the magnetization directions of the pinned layers in the films.

This magnetic field heat treatment step easily fixes the magnetization of the pinned layer of the fixed magnetization layer in each conventional GMR element (for example, the conventional GMR element 211) and the magnetization of the pinned layer of the fixed magnetization layer in each SAF element (for example, the SAF element 213) in directions antiparallel to each other. Thus, two of giant magnetoresistive elements having magnetic-field-detecting directions antiparallel to each other can easily be manufactured on a single substrate.

In addition, the magnetic field heat treatment uses magnetic fields generated from a magnet array 30. Accordingly, a large number of magnetic sensors can be efficiently manufactured at one time, and giant magnetoresistive elements and a magnetic sensor detecting two directions perpendicular to each other, such as the X-axis and the Y-axis direction, can be easily achieved.

Furthermore, the film forming step includes the sub steps of:

forming (depositing) a layer (first bias magnet layer) 211*b* intended to become the bias magnet films on a substrate (Step 32);

removing unnecessary regions of the first bias magnet layer 211*b* (Steps 33 to 35);

forming (depositing) a first composite layer intended to become either first giant magnetoresistive elements (conventional GMR elements) or second giant magnetoresistive elements (SAF elements) on the substrate (Step 36);

removing unnecessary regions of the first composite layer (Steps 37 to 39);

covering (coating) the first composite layer with an insulating layer IN after the unnecessary regions of the first composite layer are removed (Step 40);

removing unnecessary regions of the insulating layer IN to form via holes VIA (Step 41 to 43);

forming (depositing) a layer (second bias magnet layer) 213*b* intended to become the bias magnet films on the insulating layer IN (Step 44);

removing unnecessary regions of the second bias magnet layer 213*b* (Steps 45 to 47);

forming (depositing) a second composite layer intended to become the other giant magnetoresistive elements over the insulating layer IN and the via holes VIA (Step 48); and removing unnecessary regions of the second composite layer (Steps 49 to 51).

By the method described above, films intended to act as the conventional GMR elements and the SAF elements are formed on a single substrate without a break (in a continuous fashion).

As described above, the magnetic sensor 210 has on a single substrate 210*a* the conventional GMR element and SAF element that lie one over the other (overlap each other) in the vertical direction (i.e., a direction perpendicular to the main surface of the substrate). Therefore, by simply applying a magnetic field oriented in a single direction to these elements, the resulting magnetic sensor 210 can have elements whose magnetic-field-detecting directions are antiparallel to each other and disposed in a small region. Hence, the magnetic sensor 210 can be very small.

The giant magnetoresistive elements 211 to 214 and 221 to 224 formed on the substrate 210*a* of the magnetic sensor 210 are coated with a resin film and the like. Therefore, if the substrate 210*a* or the resin film is deformed by heat or external stress, the giant magnetoresistive elements 211 to 214 and 221 to 224 are also deformed by the heat or the stress accordingly and their resistances are varied. Consequently, the bridge circuit of a magnetic sensor in which the giant magnetoresistive elements are connected in a bridge configuration, as in the magnetic sensor 210, loses its balance and the output is varied by the stress. Thus, such a magnetic sensor cannot accurately detect the intensity of external magnetic fields.

In the magnetic sensor 210, however, the giant magnetoresistive elements 211 to 214 (or giant magnetoresistive elements 221 to 224) forming a full-bridge circuit are disposed in a small area on the substrate 210*a*, and a stress (for example, tensile stress or compressive stress) is almost uniformly placed on these elements. The resistances of the giant magnetoresistive elements therefore evenly increase or decrease. Accordingly, the possibility of losing the balance of the bridge circuit can be reduced. Thus, the magnetic sensor 210 can accurately detect magnetic fields.

Sixth Embodiment

Figure 68:
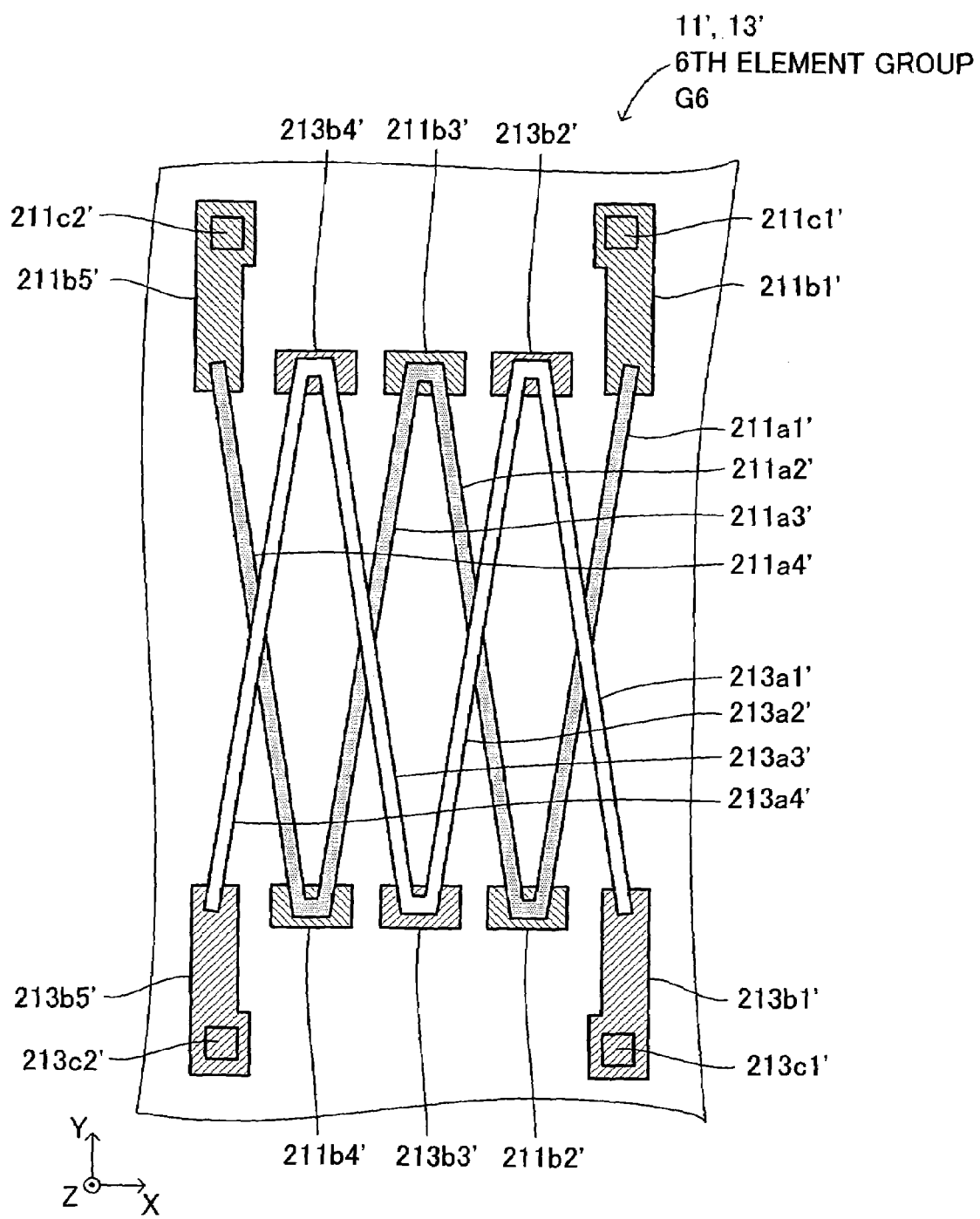
FIG. 68 is an enlarged plan view of a sixth element group of a magnetic sensor according to a sixth embodiment of the present invention.

A magnetic sensor according to a sixth embodiment of the present invention will now be described. FIG. 68 shows an enlarged plan view of the magnetic sensor of the sixth embodiment. In the magnetic sensor, the conventional GMR element and the SAF element overlap each other (lie one over the other) in such a manner that the narrow strip-shaped portions of the conventional GMR element intersect with the narrow strip-shaped portions of the SAF element when viewed from above.

More specifically, the magnetic sensor of the sixth embodiment includes sixth to ninth element groups G6' to G9', which are substituted for the sixth to ninth element groups G6 to G9 of the magnetic sensor 210 of the fifth embodiment. The sixth to ninth element groups G6' to G9' have substantially the same structure, except for their positions on the substrate 210*a*. The following description illustrates the structure of the sixth element group G6' as a representative example.

The conventional GMR element 211' of the sixth element group G6' includes a plurality (4 in this case) of narrow strip-shaped portions 211*a*1' to 211*a*4', a plurality (5 in this case) of bias magnet films 211*b*1' to 211*b*5', and a pair of terminals 211*c*1' and 211*c*2', as shown in FIG. 68.

The narrow strip-shaped portion 211*a*1' lies at the most positive position in the X-axis direction among the narrow strip-shaped portions 211*a*1' to 211*a*4'. The narrow strip-shaped portion 211*a*1' extends in a direction rotated clockwise at an acute angle θ with respect to the positive X-axis direction. The positive end in the Y-axis direction of the narrow strip-shaped portion 211*a*1' is formed on the bias magnet film 211*b*1'. The bias magnet film 211*b*1' is connected to the terminal 211*c*1'. The negative end in the Y-axis direction of the narrow strip-shaped portion 211*a*1' is formed on the bias magnet film 211*b*2'.

Another narrow strip-shaped portion 211*a*2' is adjacent to the narrow strip-shaped portion 211*a*1'. The narrow strip-shaped portion 211*a*2' extends in a direction rotated counterclockwise at the acute angle θ with respect to the positive X-axis direction. The negative and the positive ends in the Y-axis direction of the narrow strip-shaped portion 211*a*2' are formed on the bias magnet films 211*b*2' and 211*b*3', respectively. The negative end in the Y-axis direction of the narrow strip-shaped portion 211*a*2' is connected to the negative end in the Y-axis direction of the narrow strip-shaped portion 211*a*1' on the bias magnet film 211*b*2'.

Another narrow strip-shaped portion 211*a*3' is adjacent to the narrow strip-shaped portion 211*a*2'. The narrow strip-shaped portion 211*a*3' extends in a direction rotated clockwise at the acute angle θ with respect to the positive X-axis direction. The positive and the negative ends in the Y-axis direction of the narrow strip-shaped portion 211*a*3' are formed on the bias magnet films 211*b*3' and 211*b*4', respectively. The positive end in the Y-axis direction of the narrow strip-shaped portion 211*a*3' is connected to the positive end in the Y-axis direction of the narrow strip-shaped portion 211*a*2' on the bias magnet film 211*b*3'.

Another narrow strip-shaped portion 211*a*4' is adjacent to the narrow strip-shaped portion 211*a*3'. The narrow strip-shaped portion 211*a*4' extends in a direction rotated counterclockwise at the acute angle θ with respect to the positive X-axis direction. The negative and the positive ends in the Y-axis direction of the narrow strip-shaped portion 211*a*4' are formed on the bias magnet films 211*b*4' and 211*b*5'. The negative end in the Y-axis direction of the narrow strip-shaped portion 211*a*4' is connected to the negative end in the Y-axis direction of the narrow strip-shaped portion 211*a*3' on the bias magnet film 211b4'. The bias magnet film 211b5' is connected to the terminal 211c2'. As described, the conventional GMR element 211' is formed of the plurality of narrow strip-shaped portions connected in series in a serpentine manner.

The SAF element 213' of the sixth element group G6' includes a plurality (4 in this case) of narrow strip-shaped portions 213a1' to 213a4', a plurality (5 in this case) of bias magnet films 213b1' to 213b5', and a pair of terminals 213c1' and 213c2'.

The narrow strip-shaped portion 213a1' lies at the most positive position in the X-axis direction among the narrow strip-shaped portions 213a1' to 213a4'. The narrow strip-shaped portion 213a1' extends in a direction rotated counter-clockwise at the acute angle θ with respect to the positive X-axis direction. The negative end in the Y-axis direction of the narrow strip-shaped portion 213a1' is formed on the bias magnet film 213b1'. The bias magnet film 213b1' is connected to the terminal 213c1'. The positive end in the Y-axis direction of the narrow strip-shaped portion 213a1' is formed on the bias magnet film 213b2'.

Another narrow strip-shaped portion 213a2' is adjacent to the narrow strip-shaped portion 213a1'. The narrow strip-shaped portion 213a2' extends in a direction rotated clockwise at the acute angle θ with respect to the positive X-axis direction. The positive and the negative ends in the Y-axis direction of the narrow strip-shaped portion 213a2' are formed on the bias magnet films 213b2' and 213b3', respectively. The positive end in the Y-axis direction of the narrow strip-shaped portion 213a2' is connected to the positive end in the Y-axis direction of the narrow strip-shaped portion 213a1' on the bias magnet film 213b2'.

Another narrow strip-shaped portion 213a3' is adjacent to the narrow strip-shaped portion 213a2'. The narrow strip-shaped portion 213a3' extends in a direction rotated counter-clockwise at the acute angle θ with respect to the positive X-axis direction. The negative and the positive end in the Y-axis direction of the narrow strip-shaped portion 213a3' are formed on the bias magnet films 213b3' and 213b4', respectively. The negative end in the Y-axis direction of the narrow strip-shaped portion 213a3' is connected to the negative end in the Y-axis direction of the narrow strip-shaped portion 213a2' on the bias magnet film 213b3'.

Another narrow strip-shaped portion 213a4' is adjacent to the narrow strip-shaped portion 213a3'. The narrow strip-shaped portion 213a4' extends in a direction rotated clockwise at the acute angle θ with respect to the positive X-axis direction. The positive and the negative ends in the Y-axis direction of the narrow strip-shaped portion 213a4' are formed on the bias magnet film 213b4' and 213b5', respectively. The positive end in the Y-axis direction of the narrow strip-shaped portion 213a4' is connected to the positive end in the Y-axis direction of the narrow strip-shaped portion 213a3' on the bias magnet film 213b4'. The bias magnet film 213b5' is connected to the terminal 213c2'. As described, the SAF element 213' is formed of the plurality of narrow strip-shaped portions connected in series in a serpentine manner. The narrow strip-shaped portions of the SAF element 213' are disposed above the narrow strip-shaped portions of the conventional GMR element 211' so as to intersect with them when viewed from above. The narrow strip-shaped portions of the SAF element 213' and the narrow strip-shaped portions of the conventional GMR element 211' are separated by an insulating layer (not shown) at least at their intersections.

The magnetic sensor according to the sixth embodiment has the conventional GMR element and the SAF element lying one over the other in the vertical direction (perpendicular to the main surface of the substrate) on the single substrate 210a, as in the magnetic sensor 210. Therefore, by applying a magnetic field oriented in a single direction to the films intended to act as those elements, at least two giant magnetoresistive elements having 180° different magnetic-field-detecting directions can be easily and efficiently formed in a small area on a single substrate. Hence, the magnetic sensor of the sixth embodiment can be very small. Although, the sixth embodiment has described a magnetic sensor in which the SAF element 213' overlies the conventional GMR element 211' with an insulating layer therebetween, the conventional GMR element 211' may overlie the SAF element 213' with an insulating layer therebetween.

Seventh Embodiment

Figure 69:
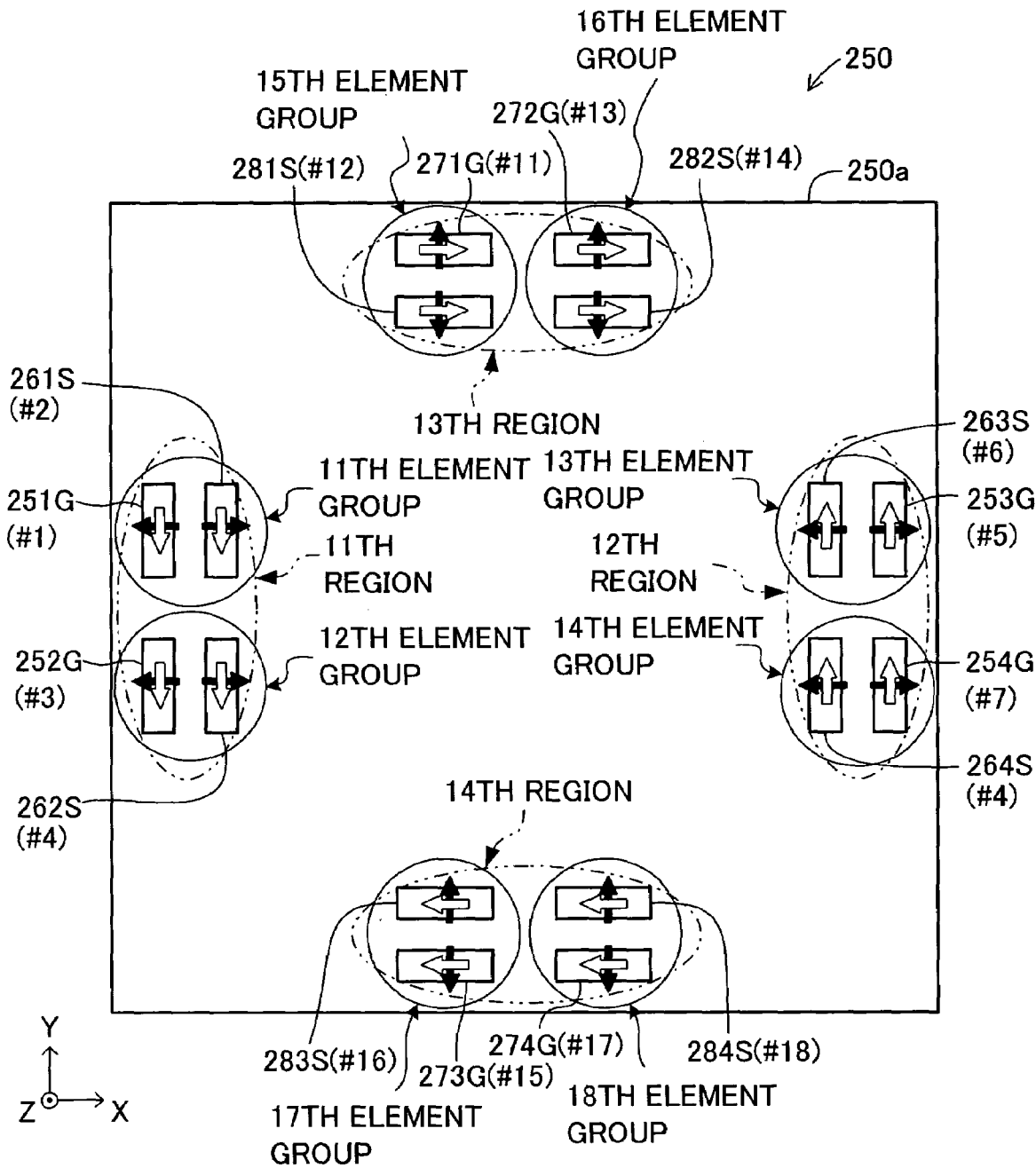
FIG. 69 is a plan view of a magnetic sensor according to a seventh embodiment of the present invention.

A magnetic sensor according to a seventh embodiment of the present invention will now be described. As shown in FIG. 69, the magnetic sensor 250 includes a single substrate 250a, conventional GMR elements 251G to 254G and 271G to 274G, and SAF elements 261S to 264S and 281S to 284S. Two elements in each solid line circle shown in FIG. 69 (for example, the elements 251G and 261S) lie one over the other (overlap each other) in the direction perpendicular to the main surface of the substrate 210a (Z-axis direction) with an insulating layer therebetween.

The substrate 250a is made of a thin silicon plate having the same structure as the substrate 10a.

The conventional GMR elements 251G to 254G and 271G to 274G each have the same structure as the foregoing conventional GMR element 11. The SAF elements 261S to 264S and 281S to 284S each have the same structure as the foregoing SAF element 13. The spin-valve film of each element (e.g., the thickness of the layers of the spin-valve film) is designed so that the elements have the same resistance if magnetic fields with an identical intensity are applied to the elements in their respective magnetic-field-detecting directions, and so that the resistances of the elements vary by the same amount (to the same extent) if stresses having an identical magnitude (and an identical direction) are respectively placed on the elements.

The conventional GMR elements 251G to 254G and 271G to 274G and the SAF elements 261S to 264S and 281S to 284S form eleventh to eighteenth element groups shown in Tables 5 and 6. Tables 5 and 6 show the positions of the element groups, the fixed magnetization directions of the pinned layers Pd if the fixed magnetization layers P of the conventional GMR elements 251G to 254G and 271G to 274G, and the fixed magnetization directions of the first ferromagnetic layers P1 (i.e., the pinned layers) in the fixed magnetization layers P' of the SAF elements 261S to 264S and 281S to 284S, and the magnetic-field-detecting direction of each elements. The elements in each of eleventh to fourteenth regions, shown in FIG. 69 and Table 5, lie under a uniform stress resulting from deformation of, for example, the substrate 250a.

TABLE 5

| Element group | Position on substrate 250a | Elements | Magnetization direction of Pinned layer | Initial magnetization direction of free layer F | Magnetic-field-detecting direction |
|---|---|---|---|---|---|
| 11th group | Y-axis direction: upper-middle; X-axis direction: vicinity of negative edge (in 11th region) | Conventional GMR 251G | Negative X-axis | Negative Y-axis | Positive X-axis |
| | | SAF 261S | Positive X-axis | Negative Y-axis | Negative X-axis |
| 12th group | Y-axis direction: lower-middle; X-axis direction: vicinity of negative edge ((in 11th region) | Conventional GMR 252G | Negative X-axis | Negative Y-axis | Positive X-axis |
| | | SAF 262S | Positive X-axis | Negative Y-axis | Negative X-axis |
| 13th group | Y-axis direction: upper-middle; X-axis direction: vicinity of positive edge (in 12th region) | Conventional GMR 253G | Positive X-axis | Positive Y-axis | Negative X-axis |
| | | SAF 263S | Negative X-axis | Positive Y-axis | Positive X-axis |
| 14th group | Y-axis direction: lower-middle; X-axis direction: vicinity of positive edge (in 12th region) | Conventional GMR 254G | Positive X-axis | Positive Y-axis | Negative X-axis |
| | | SAF 264S | Negative X-axis | Positive Y-axis | Positive X-axis |

TABLE 6

| Element group | Position on substrate 250a | Elements | Magnetization direction of Pinned layer | Initial magnetization direction of free layer F | Magnetic-field-detecting direction |
|---|---|---|---|---|---|
| 15th group | X-axis direction: left-middle; Y-axis direction: vicinity of positive edge (in 13th region) | Conventional GMR 271G | Positive Y-axis | Positive X-axis | Negative Y-axis |
| | | SAF 281S | Negative Y-axis | Positive X-axis | Positive Y-axis |
| 16th group | X-axis direction: right-middle; Y-axis direction: vicinity of positive edge (in 13th region) | Conventional GMR 272G | Positive Y-axis | Positive X-axis | Negative Y-axis |
| | | SAF 282S | Negative Y-axis | Positive X-axis | Positive Y-axis |
| 17th group | X-axis direction: left-middle; Y-axis direction: vicinity of negative edge (in 14th region) | Conventional GMR 273G | Negative Y-axis | Negative X-axis | Positive Y-axis |
| | | SAF 283S | Positive Y-axis | Negative X-axis | Negative Y-axis |
| 18th group | X-axis direction: right-middle; Y-axis direction: vicinity of negative edge (in 14th region) | Conventional GMR 274G | Negative Y-axis | Negative X-axis | Positive Y-axis |
| | | SAF 284S | Positive Y-axis | Negative X-axis | Negative Y-axis |

In the present embodiment, the conventional GMR elements and the SAF elements may be referred to as the designations shown in Table 7.

TABLE 7

| Element | Designation |
|---|---|
| Conventional GMR 251G | First giant magnetoresistive element |
| SAF 261S | Second giant magnetoresistive element |
| Conventional GMR 252G | Third giant magnetoresistive element |
| SAF 262S | Fourth giant magnetoresistive element |
| Conventional GMR 253G | Fifth giant magnetoresistive element |
| SAF 263S | Sixth giant magnetoresistive element |
| Conventional GMR 254G | Seventh giant magnetoresistive element |
| SAF 264S | Eighth giant magnetoresistive element |
| Conventional GMR 271G | Eleventh (first) giant magnetoresistive element |
| SAF 281S | Twelfth (second) giant magnetoresistive element |
| Conventional GMR 272G | Thirteenth (third) giant magnetoresistive element |
| SAF 282S | Fourteenth (fourth) giant magnetoresistive element |
| Conventional GMR 273G | Fifteenth (fifth) giant magnetoresistive element |
| SAF 283S | Sixteenth (sixth) giant magnetoresistive element |
| Conventional GMR 274G | Seventeenth (seventh) giant magnetoresistive element |
| SAF 284S | Eighteenth (eighth) giant magnetoresistive element |

Figure 70:
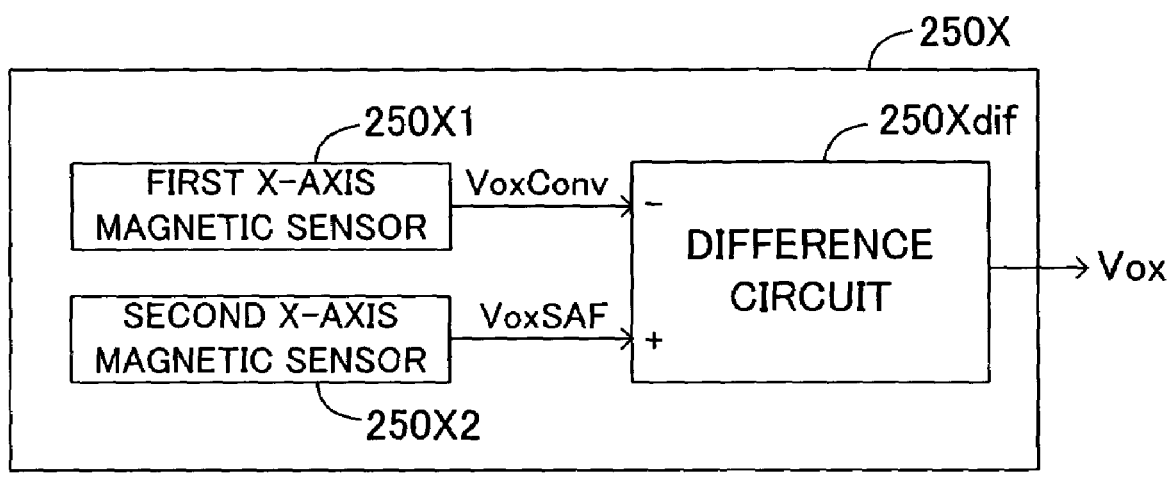
FIG. 70 is a block diagram of a circuit of an X-axis magnetic sensor included in the magnetic sensor shown in FIG. 69.

The magnetic sensor 250 has an X-axis magnetic sensor 250X including a first X-axis magnetic sensor 250X1, a second X-axis magnetic sensor 250X2, and a difference circuit 250Xdif, as shown in FIG. 70.

The first X-axis magnetic sensor 250X1 includes four conventional GMR elements 251G to 254G connected in a full-bridge configuration with conducting wires (not shown in FIG. 69), as shown in the equivalent circuit in FIG. 71A. The first X-axis magnetic sensor 250X1 is a modified form of the first X-axis magnetic sensor 50X1 shown in FIG. 32A, and the conventional GMR elements 251G to 254G correspond to the conventional GMR elements 51G to 54G, respectively.

Accordingly, the first X-axis magnetic sensor 250X1 outputs the difference VoxConv (=VQ210−VQ220) between the potential VQ210 at the junction Q210 where the conventional GMR element 251G is connected to the conventional GMR element 253G and the potential VQ220 at the junction Q220 where the conventional GMR element 254G is connected to the conventional GMR element 252G (conventional GMR element output, X-axis conventional GMR element output).

The graphs adjacent to the conventional GMR elements 251G to 254G in FIG. 71A each show the characteristics of their adjacent elements. In each graph, the solid line, the broken line, and the double-dotted chain line represent the changes in resistance R depending on an external magnetic field Hx when the conventional GMR elements are not stressed, when a tensile stress is applied to the conventional GMR elements, and when a compressive stress is applied to the conventional GMR elements, respectively.

When the conventional GMR elements 251G to 254G are not stressed, the output VoxConv of the first X-axis magnetic sensor 250X1 is substantially proportional to the external magnetic field Hx, and decreases as the intensity of the external magnetic field Hx increases, as shown by the solid line in FIG. 71B.

The second X-axis magnetic sensor 250X2 includes four SAF elements 261S to 264S connected in a full-bridge configuration with conducting wires (not shown in FIG. 69), as shown in the equivalent circuit in FIG. 72A. The second X-axis magnetic sensor 250X2 is a modified form of the second X-axis magnetic sensor 50X2 shown in FIG. 33A, and SAF elements 261S to 264S correspond to the SAF elements 61S to 64S, respectively.

Accordingly, the second X-axis magnetic sensor 250X2 outputs the difference VoxSAF (=VQ230−VQ240) between the potential VQ230 at the junction Q230 where the SAF element 261S is connected to the SAF element 263S and the potential VQ240 at the junction Q240 where the SAF element 264S is connected to the SAF element 262S (SAF elements output, X-axis SAF element output).

The graphs adjacent to the SAF elements 261S to 264S in FIG. 72A each show the characteristics of their adjacent elements. In each graph, the solid line, the broken line, and the double-dotted chain line represent the changes in resistance R in response to an external magnetic field Hx when the SAF elements are not stressed, when a tensile stress is applied to the SAF elements, and when a compressive stress is applied to the SAF elements, respectively.

When the SAF elements 261S to 264S are not stressed, the output VoxSAF of the second X-axis magnetic sensor 250X2 is substantially proportional to the external magnetic field Hx, and increases as the intensity of the external magnetic field Hx increases, as shown by the solid line in FIG. 72B.

Figure 73:
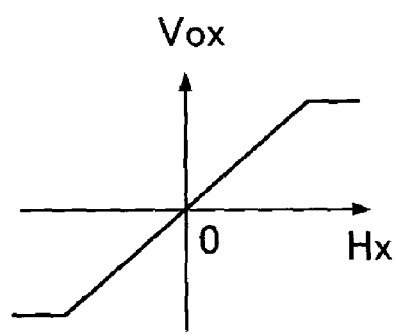

The difference circuit 250Xdif subtracts the output VoxConv of the first X-axis magnetic sensor 250X1 from the output VoxSAF of the second X-axis magnetic sensor 250X2 and outputs the resulting difference, which is defined as the output Vox of the X-axis magnetic sensor 250X, as shown in FIG. 70. Thus, the output Vox (X-axis output) of the magnetic sensor 250 is substantially proportional to the external magnetic field Hx, and increases as the intensity of the external magnetic field Hx increases, as shown in FIG. 73.

Figure 74:
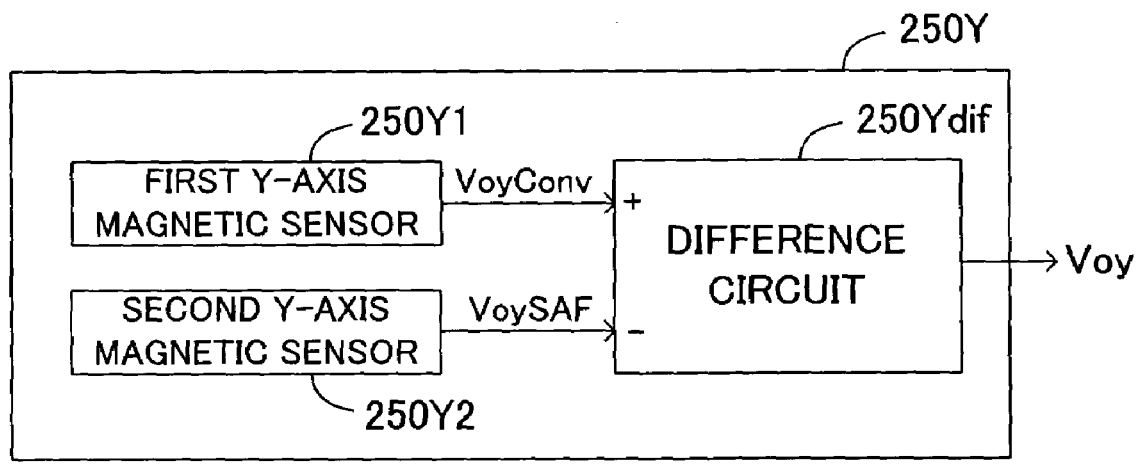

The magnetic sensor 250 also has a Y-axis magnetic sensor 250Y, as shown in FIG. 74. The Y-axis magnetic sensor 250Y includes a first Y-axis magnetic sensor 250Y1, a second Y-axis magnetic sensor 250Y2, and a difference circuit 250Ydif.

Figure 75A:
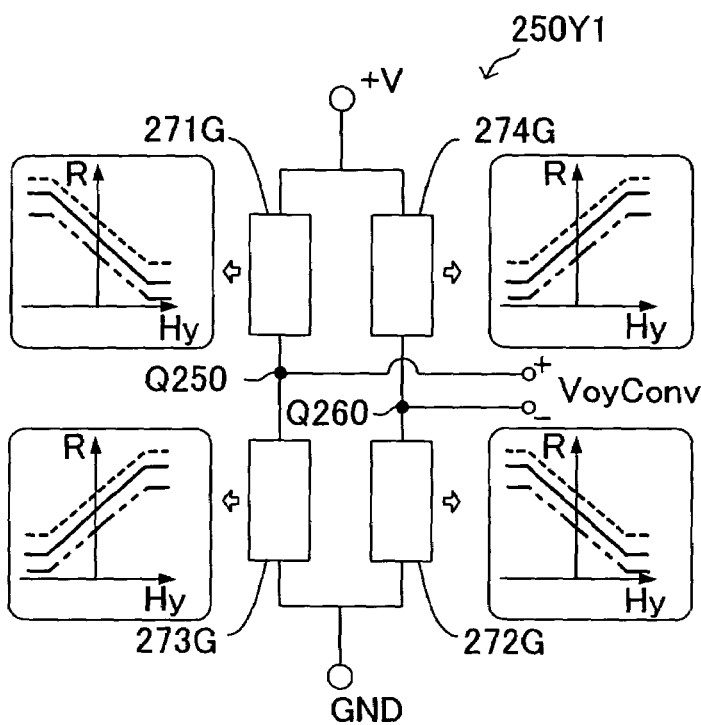

The first Y-axis magnetic sensor 250Y1 includes four conventional GMR elements 271G to 274G connected in a full-bridge configuration with conducting wires (not shown in FIG. 69), as shown in the equivalent circuit in FIG. 75A. The first Y-axis magnetic sensor 250Y1 is a modified form of the first Y-axis magnetic sensor 50Y1 shown in FIG. 36A, and the conventional GMR elements 271G to 274G correspond to the conventional GMR elements 71G to 74G, respectively.

Accordingly, the first Y-axis magnetic sensor 250Y1 outputs the potential difference VoyConv (=VQ250−VQ260) between the potential VQ250 at the junction Q250 where the conventional GMR element 271G is connected to the conventional GMR element 273G and the potential VQ260 at the junction Q260 where the conventional GMR element 274G is connected to the conventional GMR element 272G (output of conventional GMR elements, Y-axis output of conventional GMR elements).

The graphs adjacent to the conventional GMR elements 271G to 274G in FIG. 75A each show the characteristics of their adjacent elements. In each graph, the solid line, the broken line, and the double-dotted chain line represent the changes in resistance R in response to an external magnetic field Hy when the conventional GMR elements are not stressed, when a tensile stress is applied to the conventional GMR elements, and when a compressive stress is applied to the conventional GMR elements, respectively.

Figure 75B:
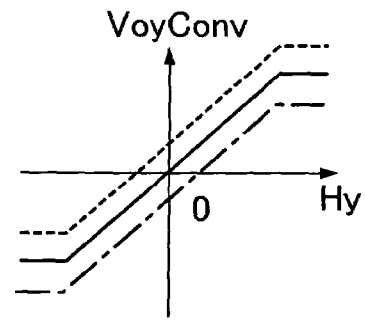

When the conventional GMR elements 271G to 274G are not stressed, the output VoyConv of the first Y-axis magnetic sensor 250Y1 is substantially proportional to the external magnetic field Hy, and increases as the intensity of the external magnetic field Hy increases, as shown by the solid line in FIG. 75B.

Figure 76A:
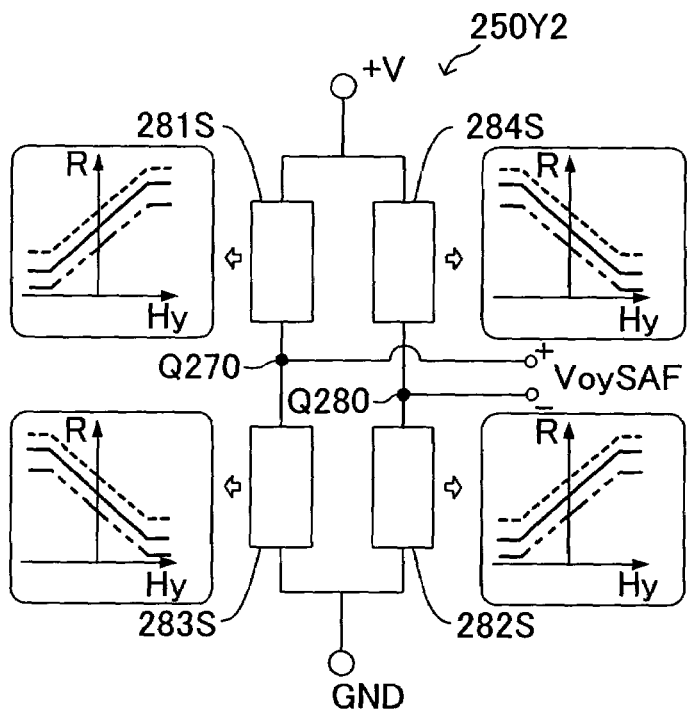

The second Y-axis magnetic sensor 250Y2 includes four SAF elements 281S to 284S connected in a full-bridge configuration with conducting sires (not shown in FIG. 69), as shown in the equivalent circuit in FIG. 76A. The second Y-axis magnetic sensor 250Y2 is a modified form of the second Y-axis magnetic sensor 50Y2 shown in FIG. 37A, and the SAF elements 281S to 284S correspond to the SAF elements 81S to 84S, respectively.

Accordingly, the second Y-axis magnetic sensor 250Y2 outputs the difference VoySAF (=VQ270−VQ280) between the potential VQ270 at the junction Q270 where the SAF element 281S is connected to the SAF element 283S and the potential VQ280 at the junction Q280 where the SAF element 284S is connected to the SAF element 282S (SAF element output, Y-axis SAF element output).

The graphs adjacent to the SAF elements 281S to 284S in FIG. 76A each show the characteristics of their adjacent elements. In each graph, the solid line, the broken line, and the double-dotted chain line represent the changes in resistance R in response to an external magnetic field Hy when the SAF elements are not stressed, when a tensile stress is applied to the SAF elements, and when a compressive stress is applied to the SAF elements, respectively.

Figure 76B:
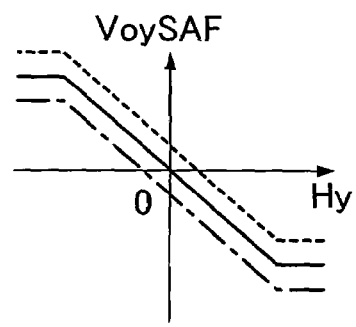

When the SAF elements 281S to 284S are not stressed, the output VoySAF of the second Y-axis magnetic sensor 250Y2 is substantially proportional to the external magnetic field Hy, and decreases as the intensity of the external magnetic field Hy increases, as shown by the solid line in FIG. 76B.

Figure 77:
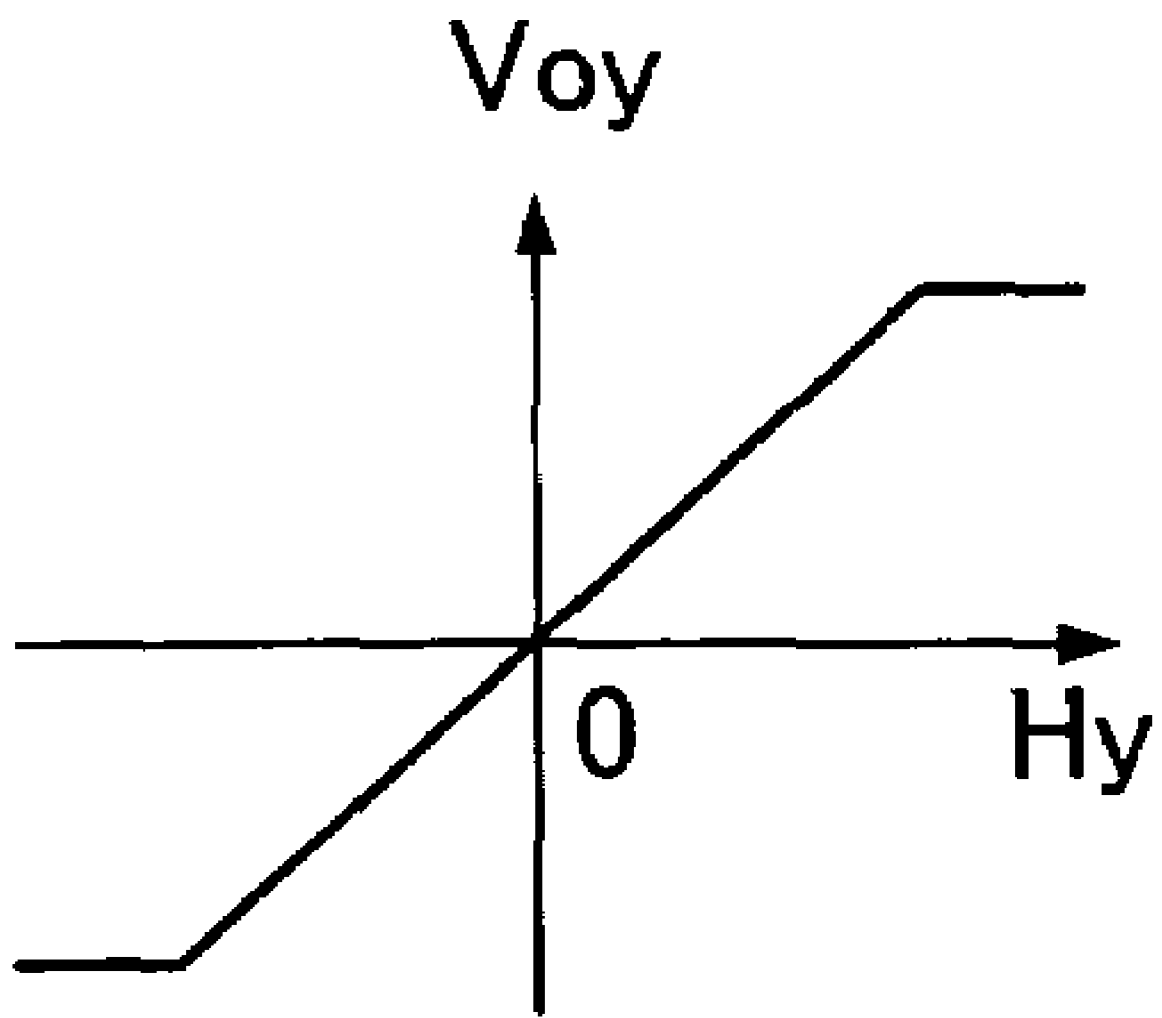

The difference circuit 250Ydif subtracts the output VoySAF of the second Y-axis magnetic sensor 250Y2 from the output VoyConv of the first Y-axis magnetic sensor 250Y1 and outputs the resulting difference, which is defined as the output Voy of the Y-axis magnetic sensor 250Y, as shown in FIG. 74. Thus, an output Voy (Y-axis output) of the magnetic sensor 250 is substantially proportional to the external magnetic field Hy, and increases as the intensity of the external magnetic field Hy increases, as shown in FIG. 77.

The magnetic sensor 250 of the seventh embodiment operates in completely the same manner as the magnetic sensor 50, and how the magnetic sensor 250 operates is not repeatedly described. The magnetic sensor 250, as well as the magnetic sensor 50, can produce a substantially constant output unless the external magnetic field is changed, even if stresses placed on the elements are varied. Thus, the magnetic sensor 250 can accurately detect magnetic fields. Furthermore, in the magnetic sensor 250, the conventional GMR element and the SAF element (for example, the conventional GMR element 251G and the SAF element 261S) lie one over the other like, and therefore, very close stresses are applied to those two elements overlapping each other. As a result, the magnetic sensor 250 is still less affected by stress than the magnetic sensor 50.

Eighth Embodiment

A magnetic sensor according to eighth embodiment of the present invention will now be described. In the magnetic sensor of the eighth embodiment, only the sixth element group G6 (the conventional GMR element 211 and the SAF element 213) in the magnetic sensor 210 of the fifth embodiment, shown in the FIG. 49, is provided on a substrate Sub, as shown in FIG. 78A. The SAF element 213 and the conventional GMR element 211 are connected in a half-bridge configuration, and the potential at the junction T1 of the elements is extracted as the output Vox of an X-axis magnetic sensor, as shown in FIG. 78B. Alternative to the above-described perpendicular bidirectional magnetic sensors, the magnetic sensor of the present invention may be a mono-directional magnetic sensor including only an X-axis magnetic sensor.

Another Modification

The magnetic sensor of the present invention may have a full-bridge circuit including fixed resistors Rfix1 and Rfix2, as shown in FIG. 79. The potential difference between the junction T2 and the junction T3 is extracted as the output Vox of an X-axis magnetic sensor.

Another Modification

The bridge circuit in the magnetic sensor may include fixed resistors. For example, in the circuit shown in FIG. 54A, fixed resistors may be respectively provided in series between the SAF element 213 and the junction Q1 and between the SAF element 214 and the junction Q2, or between the SAF element 211 and the junction Q1 and between the SAF element 212 and the junction Q2.

Another Modification

The SAF elements may be disposed under the conventional GMR element on the substrate with an insulating layer therebetween in such a manner that the centerline CL22 of the narrow strip-shaped portions of each SAF elements aligns with the centerline CL21 of the narrow strip-shaped portions of each conventional GMR element.

Ninth Embodiment

Structure of Magnetic Sensor

FIG. 80 is a plan view of a magnetic sensor 310 according to ninth embodiment of the present invention. The magnetic sensor 310 includes the same single substrate (monolithic chip) 310a as the foregoing substrate 10a, an X-axis magnetic sensor 311, and a Y-axis magnetic sensor 321. The magnetic sensor 310 is referred to as an "N-type magnetic sensor 310" for the sake of convenience.

The X-axis magnetic sensor 311 detects the component in the X-axis direction of an external magnetic field. The X-axis magnetic sensor 311 is disposed on the substrate 310a in the vicinity of the positive edge in the X-axis direction of the substrate 310a and in a substantially middle position in the Y-axis direction of the substrate 310a. The Y-axis magnetic sensor 321 detects the component in the Y-axis direction of the external magnetic field. The Y-axis magnetic sensor 321 is disposed on the substrate 310a in the vicinity of the positive edge in the Y-axis direction of the substrate 310a and in a substantially middle position in the X-axis direction of the substrate 310a. The Y-axis magnetic sensor 321, as shown in FIG. 80, has the same structure as the X-axis magnetic sensor 311, except for lying in a state in which the X-axis magnetic sensor 311 is rotated counterclockwise at 90° in plan view. The following description will illustrate the X-axis magnetic sensor.

X-axis magnetic sensor 311 includes four bias magnet films 312 to 315, a pair of conventional GMR elements (first giant magnetoresistive elements) 316 and 317, and a pair of SAF elements (second giant magnetoresistive elements) 318 and 319, as shown in FIG. 81.

The bias magnet films 312 to 315 are each formed by a permanent magnet film (hard magnet film) made of the same hard ferromagnetic material as the bias magnet films 11b1 to 11b7, and are polarized so that their magnetizations are oriented in the positive Y-axis direction. As shown in FIGS. 82 and 83, which are sectional views of the X-axis magnetic sensor 311 taken long lines I-I and II-II in FIG. 81 respectively, each of the bias magnet films 312 to 315 has slants with respect to the upper surface (main surface) of the substrate 310a and an upper surface parallel to the surface of the substrate 310a; hence the bias magnet film has a trapezoidal cross section (as a vertical cross section). The upper surfaces of the bias magnet films 312 to 315 lie (exist) in the same plane.

As shown in FIG. 81, the bias magnet film 312 is formed in a T shape when viewed from above. The bias magnet film 312 is disposed in the vicinity of the positive edge in the X-axis direction of the substrate 310a and in the middle position in the Y-axis direction. The bias magnet film 313 has a rectangular shape in plan view, and is disposed at a first distance from the bias magnet film 312 in the positive Y-axis direction.

The bias magnet film 314 has the same T shape as the bias magnet film 312 in plan view, and is disposed at a second distance, shorter than the first distance, from the bias magnet film 312 in the negative X-axis direction. The bias magnet film 315 has the same rectangular shape as the bias magnet film 313 in plan view, and is disposed at a first distance from the bias magnet film 312 in the negative Y-axis direction.

The conventional GMR element 316 has a narrow strip shape in plan view and extends in the Y-axis direction, as shown in FIG. 81. As shown in FIG. 82, the conventional GMR element 316 is formed on the upper surface of the substrate 310a. An end of the conventional GMR element 316 is in contact with the slant of the bias magnet film 312, and the other end is in contact with the slant of the bias magnet film 313.

The film structure of the conventional GMR element 316 is the same structure as the conventional spin-valve film shown in FIG. 4A. A SiO$_2$ or SiN insulating/wiring layer (not shown) may be provided between the upper surface of the substrate 310a and the free layer F. The substrate 310a and the insulating/wiring layer may constitute a "substrate".

The initial magnetization of the free layer F before applying an external magnetic field is oriented in its longitudinal direction (positive Y-axis direction for the conventional GMR element 316) by shape anisotropy.

In the conventional GMR element 316, the magnetization of the CoFe magnetic layer Pd, which adjoins the spacer layer S, of the fixed magnetization layer P is fixed in the positive X-axis direction. Therefore, the magnetic-field-detecting direction of the conventional GMR element 316 is in the negative X-axis direction.

The free layer F of the conventional GMR element 316 is magnetically coupled with the bias magnet films 312 and 313 immediately underlying both ends of the conventional GMR element 316. Consequently, the bias magnet films 312 and 313 apply a bias magnetic field to the free layer F of the conventional GMR element 316 in the longitudinal direction of the free layer F (positive Y-axis direction for the conventional GMR element 316).

The conventional GMR element 317 has the same shape, structure, and characteristics as the conventional GMR element 316. Therefore, the magnetic-field-detecting direction of the conventional GMR element 317 is in the negative X-axis direction. As shown in FIG. 83, the conventional GMR element 317 is formed on the upper surface of the substrate 310a. An end of the conventional GMR element 317 is in contact with the slant of the bias magnet film 314, and the other end is in contact with the slant of the bias magnet film 315. Consequently, bias magnet films 314 and 315 apply a bias magnetic field to the conventional GMR element 317 (the free layer F of the conventional GMR element 317) in the positive Y-axis direction.

The SAF element 318 includes a narrow strip-shaped portions extending parallel to the Y-axis direction when viewed from above, as shown in FIG. 81. The positive end in the Y-axis direction of the SAF element 318 has a slightly smaller rectangular shape than the bias magnet film 313, and lies on the upper surface of the bias magnet film 313. The negative end in the Y-axis direction of the SAF element 318 has a slightly smaller T shape than the bias magnet film 314, and lies on the upper surface of the bias magnet film 314. The narrow strip-shaped portion of the SAF element 318 is formed on the upper surface of an insulating layer INS, as shown in FIGS. 81 and 83. The insulating layer INS is formed on the substrate 310a such that its upper surface lies in the same plane as the upper surfaces of the bias magnet films 313 and 314 (and the bias magnet films 312 and 315); hence, the SAF element 318 lies on a plane defined by the upper surface of the bias magnet films 313 and 314 and the upper surface of the insulating layer INS.

The film structure of the SAF element 318 is of the synthetic spin-valve film shown in FIG. 5A. In the SAF element 318, the magnetization of the first magnetic layer P1, which adjoins the spacer layer S, of the fixed magnetization layer P' is fixed in the negative X-axis direction. The magnetic-field-detecting direction of the SAF element 318 therefore is in the positive X-axis direction.

The free layer F of the SAF element 318 is magnetically coupled with the bias magnet films 313 and 314 immediately underlying both ends of the SAF element 318. Consequently, the bias magnet films 313 and 314 apply a bias magnetic field to the free layer F of the SAF element 318 in the longitudinal direction of the free layer F (positive Y-axis direction for the SAF element 318).

The SAF element 319 has the same shape, structure, and characteristics as the SAF element 318. The magnetic-field-detecting direction of the SAF element 319 therefore is in the positive X-axis direction. As shown in FIG. 81, the SAF element 319 has a narrow strip-shaped portion parallel to the Y-axis direction when viewed from above. The positive end in the Y-axis direction of the SAF element 319 has a slightly smaller T shape as the bias magnet film 312, and lies on the upper surface of the bias magnet film 312. The negative end in the Y-axis direction of the SAF element 319 has a slightly smaller rectangular shape as the bias magnet film 315, and lies on the upper surface of the bias magnet film 315. The narrow strip-shaped portion of the SAF element 319 is formed on the upper surface of the insulating layer INS, as shown in FIGS. 81 and 82. The insulating layer INS is formed on the substrate 310a so that its upper surface lies in the same plane as the upper surfaces of the bias magnet films 312 and 315; hence, the SAF element 319 lies on a plane defined by the upper surfaces of the bias magnet films 312 and 315 and the upper surface of the insulating layer INS.

The free layer F of the SAF element 319 is magnetically coupled with the bias magnet films 312 and 315 immediately underlying both ends of the SAF element 319. Consequently, the bias magnet films 312 and 315 apply a bias magnetic field to the free layer F of the SAF element 319 in the longitudinal direction of the free layer F (positive Y-axis direction for the SAF element 319).

As described above, in the X-axis magnetic sensor 311, each of the bias magnet films 312 to 315 applies a bias magnetic field to a single conventional GMR element and a single SAF element. In other words, a pair of the conventional GMR element and the SAF element receive a bias magnetic from a common bias magnet film.

In the X-axis magnetic sensor 311, the elements 316 to 319 are connected in a full-bridge configuration, as shown in the equivalent circuit in FIG. 84A. Then, a first potential +Vd (a constant voltage from a constant-voltage supply not shown) is applied to the bias magnet film 313 through a path not shown, and the bias magnet film 315 is grounded (connected to GND) so that a second potential (0 V) different from the first potential is applied to it. The difference between the potential Vout1 of the bias magnet film 312 and the potential Vout2 of the bias magnet film 314 is extracted as the output Vox of the X-axis magnetic sensor 311. Thus, the X-axis magnetic sensor 311 outputs an voltage Vox that is substantially proportional to the component Hx in the X-axis direction of the external magnetic field Hx and that increases as the external magnetic field Hx increases, as shown in FIG. 84B.

The Y-axis magnetic sensor 321 is the same as an X-axis magnetic sensor rotated counterclockwise at 90° in plan view. Hence, the Y-axis magnetic sensor 321 outputs a voltage Voy that is substantially proportional to the intensity Hy in the Y-axis direction, or the Y-axis component, of the external magnetic field and that increases as the external magnetic field intensity Hy increases.

Method for Manufacturing the Magnetic Sensor 310

A method for manufacturing the magnetic sensor 310 (the X-axis magnetic sensor 311 and the Y-axis magnetic sensor 321) will now be described. The X-axis magnetic sensor 311 and the Y-axis magnetic sensor 321 are simultaneously formed in the same process. The following description will illustrate how the X-axis magnetic sensor 311 is manufactured with reference to FIGS. 85 to 87. FIGS. 85 to 87 are sectional views taken along line I-I in FIG. 81, each showing a state in course of manufacturing the magnetic sensor 310.

First, the substrate 310a is prepared (substrate preparation step). Then, a layer for forming the bias magnet films 312 to 315 is deposited. Specifically, the layer for forming the bias magnet films 312 to 315 is deposited over the entire upper surface of the substrate 310a by sputtering, and subsequently necessary regions of the layer is masked with a resist layer. Then, unnecessary regions are removed by ion milling, and thereafter the resist layer is removed. Thus, the films intended to act as the bias magnet films 312, 313, 315, and 314 (314 is not shown in FIG. 85) are formed at predetermined positions.

Next, the conventional GMR elements 316 and 317 are formed. Specifically, a composite layer for forming the conventional GMR elements 316 and 317 is deposited on the entire upper surfaces of the substrate 310a and of the films intended to act as bias magnet films. Thereafter, a resist layer is formed (deposited) on the upper surface of the composite layer, and patterned so as to cover only necessary regions of the composite layer intended to become the conventional GMR elements 316 and 317. Unnecessary regions of the composite layer are removed by ion milling, and the resist layer is removed. Thus, first films intended to act as the conventional GMR elements 316 and 317 (317 is not shown in FIG. 85) are formed at predetermined positions. These processes are referred to as a first film forming step.

Next, as shown in FIG. 86, a SiN insulating layer INS is formed over the upper surfaces of the substrate 310a, the films intended to act as the bias magnet films 312 to 315, and the first films intended to act as the conventional GMR elements 316 and 317 by CVD. Alternatively, the insulating layer INS may be made of $SiO_2$. This step is referred to as an insulating layer forming step.

Thereafter, the insulating layer INS is removed until the films intended to act as the bias magnet films 312 to 315 are exposed. The surfaces of the films intended to act as the bias magnet films 312 to 315, the insulating layer INS, and the ends of the first films 316 and 317 are ground to be flush with each other. This step is referred to as a planarizing step.

Next, as shown in FIG. 87, a pair of films intended to act as the SAF elements 318 and 319 are formed on the planarized surface. Specifically, a composite layer for forming the films intended to act as the SAF elements 318 and 319 is formed (deposited) over the entire planarized surface. Then, a resist layer is formed (deposited) on the upper surface of the composite layer, and patterned so as to cover only the necessary regions of the composite layer. Thereafter, unnecessary regions of the composite layer are removed by ion milling, and the resist layer is removed. Thus, second films intended to act as the SAF elements 319 and 318 (318 is not shown in FIG. 87) are formed at predetermined positions. These processes are referred to as a second film forming step. Through the above-described steps, the films, having shapes shown in FIG. 81, which will become the X-axis magnetic sensor 311 and the Y-axis magnetic sensor 321 are provided at the positions shown in FIG. 80.

In practice, plural sets of the films M which will be the X-axis magnetic sensor 311 and Y-axis magnetic sensor 321 are formed on the substrate 310a-1 including plural substrates 310a, as shown in FIG. 88. In this instance, the films M are disposed on the substrate 310a-1 so as to be positioned on the substrate 310a as shown in FIG. 80 after the substrate 310a-1 is cut along line CL into magnetic sensors 310 (substrates 310a) in a cutting step described below.

Subsequently, a magnetic field oriented in a single direction is applied to the resulting films intended to act as the conventional GMR elements and the SAF elements at a high temperature, thereby fixing the magnetization directions of the pinned layers of the films. This step is referred to as a magnetic field heat treatment step.

The magnetic field heat treatment step uses the magnet array 30 shown in FIGS. 9 and 10. In the present embodiment as well, magnetic fields generated over the permanent magnets 31 are used for fixing the magnetization directions of the pinned layers in the elements 316 to 319, as shown in FIG. 89.

Specifically, the substrate 310a-1 having the films M is disposed over the magnet array 30 with a relative positional relationship such that two edges of each square formed by cutting the substrate 310a-1 along lines CL, not having the films M adjacent thereto and their intersection are aligned with two edges and their intersection of the corresponding permanent magnet, as shown in the plan view in FIG. 90. Thus, each film M is exposed to a magnetic field oriented in the direction perpendicular to the longitudinal direction of the narrow strip-shaped portions of the film M, as indicated by the arrows in FIGS. 89 and 90.

Then, such a set of the substrate 310a-1 and the magnet array 30 is heated to 250 to 280° C. in a vacuum and subsequently allowed to stand for about 4 hours for magnetic field heat treatment. As a result, the magnetization directions of the fixed magnetization layers P (pinned layers Pd) of the conventional GMR elements and the fixed magnetization layers P' (pinned layers P1) of the SAF elements are fixed.

More specifically, a magnetic field oriented in a single direction is applied to the films intended to act as the conventional GMR element and the SAF element by the magnetic field heat treatment, as shown in FIG. 91. Consequently, pairs of giant magnetoresistive elements whose magnetic-field-detecting directions are antiparallel to each other are obtained. Thus the above-described manufacturing method according to the present embodiment can manufacture in a very small area a set of two conventional GMR elements (for example, the conventional GMR elements 316 and 317) whose magnetic-field-detecting direction are in the negative X-axis direction and two SAF elements (for example, the SAF elements 318 and 319) whose magnetic-field-detecting direction are in the positive X-axis direction.

Note that, in practice, after the magnetic field heat treatment, the substrate 310a-1 having the films is subjected to necessary treatment, including polarization of the bias magnet films, and is cut along lines CL shown in FIG. 90 into a plurality of magnetic sensors 310 shown in FIG. 80 and a plurality of S-type magnetic sensors (not shown).

As described above, the X-axis magnetic sensor 311 and the Y-axis magnetic sensor 321 of the magnetic sensor 310 each have a pair of conventional GMR elements and a pair of SAF elements connected in a full-bridge configuration. By applying a magnetic field oriented in a single direction to a conventional GMR element and a SAF element, the magnetic-field-detecting directions of those two types of giant magnetoresistive elements is antiparallel to each other. Thus, the magnetic sensor 310 according to the present embodiment can have "giant magnetoresistive elements whose magnetic-field-detecting directions are antiparallel to each other" that are required to form a bridge configuration, that are disposed very close to each other. Hence, the magnetic sensor 310 can be very small.

In the present embodiment, the magnetic sensor 310 includes;

a first bias magnet film (for example, bias magnet film 312) formed on the substrate 310a so as to be in contact with an end of a first giant magnetoresistive element (for example, the conventional GMR element 316), the first bias magnet film applying a bias magnetic field oriented in a third direction (for example, the positive Y-axis direction) substantially perpendicular to a first direction (for example, the negative X-axis direction) to the first giant magnetoresistive element;

a second bias magnet film (for example, the bias magnet film 314) formed on the substrate 310a so as to be in contact with an end of a second giant magnetoresistive element (for example, the SAF element 318), the second bias magnet film applying a bias magnetic field oriented in the third direction to the second giant magnetoresistive element; and a single third bias magnet film (common bias magnet film, the bias magnet film 313, for example) formed on the substrate 310a so as to be in contact with both the other end of the first giant magnetoresistive element and the other end of the second giant magnetoresistive element, the third bias magnet film applying a bias magnetic field oriented in the third direction to the first giant magnetoresistive element and the second giant magnetoresistive element.

Further, the magnetic sensor 310 includes;

a first bias magnet film (for example, bias magnet film 313) formed on the substrate 310a so as to be in contact with an end of a first giant magnetoresistive element (for example, the conventional GMR element 316), the first bias magnet film applying a bias magnetic field oriented in a third direction (for example, the positive Y-axis direction) substantially perpendicular to a first direction (for example, the negative X-axis direction) to the first giant magnetoresistive element;

a second bias magnet film (for example, the bias magnet film 315) formed on the substrate 310a so as to be in contact with an end of a second giant magnetoresistive element (for example, the SAF element 319), the second bias magnet film applying a bias magnetic field oriented in the third direction to the second giant magnetoresistive element; and a single third bias magnet film (common bias magnet film, the bias magnet film 312, for example) formed on the substrate 310a so as to be in contact with both the other end of the first giant magnetoresistive element and the other end of the second giant magnetoresistive element, the third bias magnet film applying a bias magnetic field oriented in the third direction to the first giant magnetoresistive element and the second giant magnetoresistive element.

As described above, in the X-axis magnetic sensor 311 or the Y-axis magnetic sensor 321 of the magnetic sensor 310, a single bias magnet film (any of the bias magnet films 312 to 315) is substituted for two bias magnet films, respectively required for an end of a first giant magnetoresistive element and an end of a second giant magnetoresistive element. Accordingly, the first giant magnetoresistive element and the second giant magnetoresistive element can be disposed more closely to each other. Furthermore, since the two elements in contact with the single (common) bias magnet film are electrically connected to each other, no wire is required for connecting the two elements.

Note that, in the magnetic sensor 310 (for example, X-axis magnetic sensor 311), narrow strip-shaped portions of a first giant magnetoresistive element (for example, the conventional GMR element 316) and a second giant magnetoresistive elements (for example, the SAF element 318) extend from a common bias magnet film (third bias magnet film, the bias magnet film 313) toward the same direction substantially perpendicular to the first direction (negative Y-axis direction, in this case).

Also, in the magnetic sensor 310 (for example, the X-axis magnetic sensor 311), narrow strip-shaped portions of two elements of a first giant magnetoresistive element (for example, the conventional GMR element 316) and a second giant magnetoresistive element (for example, the SAF element 319), extend in a line in the direction substantially perpendicular to the first direction (positive Y-axis direction). In addition, the a third bias magnet film (the bias magnetic film 312) is disposed between the first giant magnetoresistive element (for example, the conventional GMR element 316) and the second giant magnetoresistive element (for example, the SAF element 319). In this instance as well, a single bias magnet film (third bias magnet film 312) is substituted for two bias magnet films generally required in a conventional magnetic sensor. Thus, the magnetic sensor 310 can be still smaller.

In the embodiment above, the first giant magnetoresistive elements (conventional GMR elements) of the magnetic sensor 310 is formed on the upper surface of the substrate 310a and the second giant magnetoresistive elements (SAF elements) are formed on the upper surface of the insulating layer INS. However, either of the giant magnetoresistive elements may be disposed on the upper surface of the substrate 310a. For example, in the X-axis magnetic sensor 311 shown in FIGS. 81 to 83, the conventional GMR elements 316 and 317 may be replaced with SAF elements while the SAF elements 318 and 319 is replaced with conventional GMR elements.

In the magnetic sensor 310 according to the present embodiment, since the giant magnetoresistive elements 316 to 319 forming a single full-bridge circuit is provided in a small area on a substrate 310a, a stress (for example, tensile stress or compressive stress) is almost uniformly placed on these elements. Therefore, since the resistances of the giant magnetoresistive elements evenly increase or decrease, the possibility of losing the balance of the bridge circuit can be reduced. Thus, the magnetic sensors 310 can accurately detect external magnetic fields even if a stress is placed on the giant magnetoresistive elements.

Tenth Embodiment

A magnetic sensor according to a tenth embodiment of the present invention will now be described. The magnetic sensor of the tenth embodiment is different from the magnetic sensor 310 of the ninth embodiment in the following two points:

the X-axis magnetic sensor 311 of the magnetic sensor 310 is replaced with an X-axis magnetic sensor 341 shown in FIG. 92; and the Y-axis magnetic sensor 321 of the magnetic sensor 310 is replaced with the same type of magnetic sensor as the X-axis magnetic sensor 341 rotated counterclockwise by 90° in plan view.

Thus, the following description will illustrate the X-axis magnetic sensor 341.

The X-axis magnetic sensor 341 detects the component in the X-axis direction of an external magnetic field. The X-axis magnetic sensor 341 includes 12 bias magnet films 342a to 342l, a pair of conventional GMR elements 343 and 344, and a pair of SAF elements 345 and 346.

The bias magnet films 342a to 342l each have a trapezoidal cross section, as in the bias magnet films 312 to 315 according to the ninth embodiment. The bias magnet films 342a to 342l are made of the same material as the bias magnet films 312 to 315, and act as permanent magnet films polarized in the positive Y-axis direction. Two bias magnet films 342a and 342g each have the same T shape as each other. The other bias magnet films each have the same rectangular shape as each other. The upper surfaces of the bias magnet films 342a to 342l lie in the same plane.

The bias magnet film 342a is provided in the vicinity of the positive edge in the X-axis direction of the substrate 310a and in the middle in the Y-axis direction of the substrate 310a. The bias magnet film 342g is disposed at a third distance from the bias magnet film 342a in the negative X-axis direction. Four bias magnet films 342c, 342e, 342i, and 342k are disposed between those two bias magnet films 342a and 342g.

The bias magnet film 342c lies at a short distance from the bias magnet film 342a in the negative X-axis direction. The bias magnet film 342e lies at a short distance from the bias magnet film 342c in the negative X-axis direction and at a short distance from the bias magnet film 342g in the positive X-axis direction. The positive edges in the Y-axis direction of the bias magnet films 342c and 342e are aligned with the positive edges in the Y-axis direction of the bias magnet films 342a and 342g.

The bias magnet film 342b is disposed at a first distance from the bias magnet film 342a in the positive Y-axis direction so as to oppose the bias magnet films 342a and 342c. The bias magnet film 342d is disposed at a short distance from the bias magnet film 342b in the negative X-axis direction so as to oppose the bias magnet films 342c and 342e. The bias magnet film 342f is disposed at a short distance from the bias magnet film 342d in the negative X-axis direction so as to oppose the bias magnet films 342e and 342g. The negative edges in the Y-axis direction of the bias magnet films 342b, 342d, and 342f are aligned in a line.

The bias magnet film 342k is disposed at a short distance from the bias magnet film 342a in the negative X-axis direction. The bias magnet film 342i is disposed at a short distance from the bias magnet film 342k in the negative X-axis direction and at a short distance from the bias magnet film 342g in the positive X-axis direction. The edges in the negative Y-axis direction of the bias magnet films 342i and 342k are aligned with the edges in the negative Y-axis direction of the bias magnet films 342a and 342g.

The bias magnet film 342h is disposed at the first distance from the bias magnet film 342g in the negative Y-axis direction so as to oppose the bias magnet films 342g and 342i. The bias magnet film 342j is disposed at a short distance from the bias magnet film 342h in the positive X-axis direction so as to oppose the bias magnet films 342i and 342k. The bias magnet film 342l is disposed at a short distance from the bias magnet film 342j in the positive X-axis direction so as to oppose the bias magnet films 342k and 342a. The positive edges in the Y-axis direction of the bias magnet films 342h, 342j, and 342l are aligned in a line.

The conventional GMR element 343 is formed by three conventional GMR element films 343a to 343c. These element films 343a to 343c each have a narrow strip shape in plan view and extend in the Y-axis direction, as shown in FIG. 92. The middle portions of the element films 343a to 343c are each in contact with the upper surface of the substrate 310a, as in the conventional GMR element 316 of the ninth embodiment.

An end of the element film 343a is in contact with the slant of the bias magnet film 342a and the other end is in contact with the slant of the bias magnet film 342b. An end of the element film 343b is in contact with the slant of the bias magnet film 342b and the other end is in contact with the slant of the bias magnet film 342c. An end of the element film 343c is in contact with the slant of the bias magnet film 342c and the other end is in contact with the bias magnet film 342d. Thus, the resistance of the conventional GMR element 343 is equal to a the sum of the resistances of the element films 343a to 343c.

The conventional GMR element 344 is formed by three conventional GMR element films 344a to 344c. These element films 344a to 344c each have a narrow strip shape in plan view and extend in the Y-axis direction, as shown in FIG. 92. The middle portions of the element films 344a to 344c are in contact with the upper surface of the substrate 310a, as in the conventional GMR element 316 of the ninth embodiment.

An end of the element film 344a is in contact with the slant of the bias magnet film 342g and the other end is in contact with the slant of the bias magnet film 342h. An end of the element film 344b is in contact with the slant of the bias magnet film 342h and the other end is in contact with the slant of the bias magnet film 342i. An end of the element film 344c is in contact with the bias magnet film 342i and the other end is in contact with the bias magnet film 342j. Thus, the resistance of the conventional GMR element 344 is equal to a sum of the resistances of the element films 344a to 344c.

The SAF element 345 includes three SAF element films 345a to 345c. These element films 345a to 345c each have a narrow strip-shaped portion extending in the Y-axis direction in plan view, as shown in FIG. 92. The element films 345a to 345c are each disposed on the upper surface of an insulating layer, as in the SAF element 318 of the ninth embodiment. The insulating layer overlies the substrate 310a such that the upper surfaces of the insulating layer and the bias magnet films 342a to 342l lie in the same plane.

An end of the element film 345a has a slightly smaller T shape than the bias magnet film 342g and is formed on the upper surface of the bias magnet film 342g. The other end of the element film 345a has a slightly smaller rectangular shape than the bias magnet film 342f and is formed on the upper surface of the bias magnet film 342f. This other end of the element film 345a is connected to an end of the element film 345b on the upper surface of the bias magnet film 342f. The other end of the element film 345b has a slightly smaller rectangular shape than the bias magnet film 342e and is formed on the upper surface of the bias magnet film 342e. This other end of the element film 345b is connected to an end of the element film 345c on the upper surface of the bias magnet film 342e. The other end of the element film 345c has a slightly smaller rectangular shape than the bias magnet film 342d and is formed on the upper surface of the bias magnet film 342d. Thus, the resistance of the SAF element 345 is equal to a sum of the resistances of the element films 345a to 345c.

The SAF element 346 includes three SAF element films 346a to 346c. The element films 346a to 346c each have a narrow strip-shaped portion extending in the Y-axis direction in plan view, as shown in FIG. 92. The element films 346a to 346c are each disposed on the upper surface of the insulating layer, as in the SAF element 318 of the ninth embodiment.

An end of the element film 346a has a slightly smaller T shape than the bias magnet film 342a and is formed on the upper surface of the bias magnet film 342a. The other end of the element film 346a has a slightly smaller rectangular shape than the bias magnet film 342l and is formed on the upper surface of the bias magnet film 342l. This other end of the element film 346a is connected to an end of the element film 346b on the upper surface of the bias magnet film 342l. The other end of the element film 346b has a slightly smaller rectangular shape than the bias magnet film 342k and is formed on the upper surface of the bias magnet film 342k. This other end of the element film 346b is connected to an end of the element film 346c on the upper surface of the bias magnet film 342k. The other end of the element film 346c has a slightly smaller rectangular shape than the bias magnet film 342j and is formed on the upper surface of the bias magnet film 342j. Thus, the resistance of the SAF element 346 is equal to a sum of the resistances of the element films 346a to 346c.

The X-axis magnetic sensor 341 having the above-described structure has a full-bridge circuit as show in the equivalent circuit (the same as the full-bridge circuit of the magnetic sensor 310) in FIG. 84A.

In the X-axis magnetic sensor 341, the element film 343a of the conventional GMR element 343 and the element film 346a of the SAF element 346 receive a bias magnetic field from the same (a single common) bias magnet film 342a. The element film 343c of the conventional GMR element 343 and the element film 345c of the SAF element 345 receive a bias magnetic field from the same (a single common) bias magnet film 342d. The element film 345a of the SAF element 345 and the element film 344a of the conventional GMR element 344 receive a bias magnetic field from the same (a single common) bias magnet film 342g. The element film 344c of the conventional GMR element 344 and the element film 346c of the SAF element 346 receive a bias magnetic field from the same (a single common) bias magnet film 342j.

Thus, in the X-axis magnetic sensor 341, a single bias magnet film is substituted for two bias magnet films generally required in the conventional magnetic sensor, so that the conventional GMR elements and the SAF elements are more closely disposed, as in the magnetic sensor 310. Consequently, the X-axis magnetic sensor and the Y-axis magnetic sensor can be miniaturized, and accordingly the magnetic sensor 341 of the tenth embodiment can be miniaturized.

Eleventh Embodiment

A magnetic sensor according to an eleventh embodiment of the present invention will now be described. The magnetic sensor of the eleventh embodiment is different from the magnetic sensor 310 of the ninth embodiment in the following two points:

the X-axis magnetic sensor 311 of the magnetic sensor 310 is replaced with an X-axis magnetic sensor 351 shown in FIG. 93; and the Y-axis magnetic sensor 321 of the magnetic sensor 310 is replaced with the same type of magnetic sensor as the X-axis magnetic sensor 351 rotated counterclockwise by 90° in plan view.

Thus, the following description will illustrate the X-axis magnetic sensor 351.

The X-axis magnetic sensor 351 detects the component in the X-axis direction of an external magnetic field. The X-axis magnetic sensor 351 includes 12 bias magnet films 352a to 352l, SAF elements 353 and 355, and conventional GMR elements 354 and 356.

The bias magnet films 352a to 352l each have a trapezoidal cross section, as in the bias magnet films 312 to 315 of the magnetic sensor according to the ninth embodiment. The bias magnet films 352a to 352l are made of the same material as the bias magnet films 312 to 315, and act as permanent magnet films polarized in the positive Y-axis direction. Two bias magnet films 352a and 352g each have the same rectangular shape as each other, and the other bias magnet films have the same rectangular shape as each other. The bias magnet films 352a to 352l are disposed in the positions shown in FIG. 93. Upper surfaces of the bias magnet films 352a to 352l lie in the same plane.

The SAF element 353 includes three SAF element films 353a to 353c. The element films 353a to 353c each have a narrow strip-shaped portion in plan view, as shown in FIG. 93. The narrow strip-shaped portions of two element films 353a and 354c extend in a direction inclined at a small angle $\theta$ ($\theta>0$) with respect to the positive Y-axis direction. The narrow strip-shaped portion of the element film 353b extends in a direction inclined at a small angle $-\theta$ with respect to the positive Y-axis direction. Each magnetization of the first magnetic layers P1 of the element films 353a to 353c, adjoining their respective spacer layers S is fixed in the negative X-axis direction; hence, each of the magnetic-field-detecting directions of the films 353a to 353c is in the positive X-axis direction.

An end of the element film 353a has a rectangular shape and is in contact with substantially the entire upper surface of the bias magnet film 352a. The other end of the element film 353a has a rectangular shape and is in contact with substantially the entire upper surface of the bias magnet film 352b. An end of the element film 353b is connected to the element film 353a on the upper surface of the bias magnet film 352b. The other end of the element film 353b has a rectangular shape and is in contact with substantially the entire upper surface of the bias magnet film 352f. An end of the element film 353c is connected to the element film 353b on the upper surface of the bias magnet film 352f. The other end of the element film 353c has a rectangular shape and is in contact with substantially the entire upper surface of the bias magnet film 352d.

The conventional GMR element 354 is formed by three conventional GMR element films 354a to 354c. The element films 354a to 354c each has a narrow strip shape in plan view, as shown in FIG. 93. The element film 354a extends in the Y-axis direction; the element film 354b extends in a direction inclined at a small angle $-\theta$ with respect to the positive Y-axis direction; the element film 354c extends in a direction inclined at a small angle $\theta$ with respect to the positive Y-axis direction. Each magnetization of the magnetic layers P (fixed magnetization layers P) of the element films 354a to 354c, adjoining their respective spacer layers S is fixed in the positive X-axis direction; hence, each of the magnetic-field-detecting direction of the element films 354a to 354c is in the negative X-axis direction.

The conventional GMR element films 354a to 354c are formed so as to be in contact with the upper surface of the substrate 310a, as in the conventional GMR element 316 of the ninth embodiment. An end of the element film 354a is in contact with the slant of the bias magnet film 352e, and the other end is in contact with the slant of the bias magnet film 352d. An end of the element film 354b is in contact with the slant of the bias magnet film 352e, and the other end is in contact with the slant of the bias magnet film 352c. An end of the element film 354c is in contact with the slant of the bias magnet film 352c, and the other end is in contact with the slant of the bias magnet film 352g.

The element films 353a to 353c of the SAF element 353 are each formed on the upper surface of an insulating layer INS covering the substrate 310a and the conventional GMR element 354, as in the SAF element 18 of the ninth embodiment. Thus, the element film 353b runs above the element film 354c to intersect it with the insulating layer INS therebetween, as shown in FIG. 94, which is a sectional view of the X-axis magnetic sensor 351 taken along line IV-IV in FIG. 93. Also, the element film 353c runs above the element film 354b to intersect it with the insulating layer INS therebetween.

The SAF element 355 includes three SAF element films 355a to 355c. The element films 355a to 355c each have a narrow strip-shaped portion in plan view, as shown in FIG. 93. The narrow strip-shaped portion of the element film 355a extends in the Y-axis direction; the narrow strip-shaped portion of the element film 355b extends in a direction inclined at a small angle $\theta$ with respect to the positive Y-axis direction; the narrow strip-shaped portion of the element film 355c extends in a direction inclined at a small angle $-\theta$ with respect to the positive Y-axis direction. Each magnetization of the first magnetic layers P1 of the element films 355a to 355c, adjoining their respective spacer layers S is fixed in the negative X-axis direction; hence, each of the magnetic-field-detecting direction of the element films 355a to 355c is in the positive X-axis direction.

An end of the element film 355a has a rectangular shape and is in contact with substantially entire upper surface of the bias magnet film 352j. The other end of the element film 355a has a rectangular shape and is in contact with substantially the entire upper surface of the bias magnet film 352i. An end of the element film 355b is connected to the element film 355a on the upper surface of the bias magnet film 352i, and the other end of the element film 355b has a rectangular shape and is in contact with substantially the entire upper surface of the bias magnet film 352k. An end of the element film 355c is connected to the element film 355b on the upper surface of the bias magnet film 352k. The other end of the element film 355c has a rectangular shape and is in contact with substantially the entire upper surface of the bias magnet film 352g.

The conventional GMR element 356 is formed by three conventional GMR element films 356a to 356c. The element films 356a to 356c each has a narrow strip shape in plan view, as shown in FIG. 93. The element film 356a extends in a direction inclined at a small angle $-\theta$ with respect to the positive Y-axis direction; the element film 356b extends in a direction inclined at a small angle $\theta$ with respect to the positive Y-axis direction; the element film 356c extends in a direction inclined at a small angle $-\theta$ with respect to the positive Y-axis direction. Each magnetization of the magnetic layers P (fixed magnetization layers P) of the element films 356a to 356c, adjoining their respective spacer layers S is fixed in the positive X-axis direction; hence, each of the magnetic-field-detecting direction of the element films 356a to 356c is in the negative X-axis direction.

The conventional GMR element films 356a to 356c are formed so as to be in contact with the upper surface of the substrate 310a, as in the conventional GMR element 316 of the ninth embodiment. An end of the element film 356a is in contact with the slant of the bias magnet film 352a, and the other end is in contact with the slant of the bias magnet film 352l. An end of the element film 356b is in contact with the slant of the bias magnet film 352l, and the other end is in contact with the slant of the bias magnet film 352h. An end of the element film 356c is in contact with the slant of the bias magnet film 352h, and the other end is in contact with the slant of the bias magnet film 352j.

The element films 355a to 355c of the SAF element 355 are each formed on the upper surface of the insulating layer INS covering the substrate 310a and the conventional GMR element 356, as in the SAF element 18 of the ninth embodiment. Thus, the element film 355b runs above the element film 356c to intersect it with the insulating layer INS therebetween. Also, the element film 355c runs above the element film 356b to intersect it with the insulating layer INS therebetween.

In the X-axis magnetic sensor 351 having the above-described structure, a pair of the conventional GMR element 354 and 356 whose magnetic-field-detecting direction is negative X-axis direction and a pair of the SAF elements 353 and 355 whose magnetic-field-detecting direction is positive X-axis direction are connected in a full-bridge configuration, as shown in the equivalent circuit in FIG. 95. A first potential +Vd is applied to the bias magnet film 352a. The bias magnet film 352g is grounded so that as a second potential (0 V) is applied to the film 352g. A potential Vout1 is extracted from the bias magnet film 352d, which is the junction where the SAF element 353 is connected to the conventional GMR element 354, and a potential Vout2 is extracted from the bias magnet film 352j, which is the junction where the SAF element 355 is connected to the conventional GMR element 356. The difference between the potential Vout1 and the potential Vout2 is obtained as the output Vox of the X-axis magnetic sensor 351.

As described above, the magnetic sensor according to the eleventh embodiment comprises;

a first bias magnet film (for example, the bias magnet film 352l) formed on the substrate 310a so as to be in contact with an end of a first giant magnetoresistive element (for example, the element film 356a of the conventional GMR element 356) and applying a bias magnetic field oriented in a third direction (for example, positive Y-axis direction) substantially perpendicular to a first direction (for example, negative X-axis direction) to the first giant magnetoresistive element;

a second bias magnet film (for example, the bias magnet film 352b) formed on the substrate 310a so as to be in contact with an end of a second giant magnetoresistive element (for example, the element film 353a of the SAF element 353) and applying a bias magnetic field oriented in the third direction to the second giant magnetoresistive element; and a third bias magnet film (for example, the bias magnet film 352a which is a single common bias magnet film) formed on substrate 310a so as to be in contact with both the other end of the first giant magnetoresistive element and the other end of the second giant magnetoresistive element and applying a bias magnetic field oriented in the third direction to the first giant magnetoresistive element and the second giant magnetoresistive element.

Furthermore, the magnetic sensor according to the eleventh embodiment comprises;

a first bias magnet film (for example, the bias magnet film 352e) formed on the substrate 310a so as to be in contact with an end of a first giant magnetoresistive element (for example, the element film 354a of the conventional GMR element 354) and applying a bias magnetic field oriented in a third direction (for example, positive Y-axis direction) substantially perpendicular to the first direction (for example, negative X-axis direction) to the first giant magnetoresistive element;

a second bias magnet film (for example, the bias magnet film 352f) formed on the substrate 310a so as to be in contact with an end of a second giant magnetoresistive element (for example, the element film 353c of the SAF element 353) and applying a bias magnetic field oriented in the third direction to the second giant magnetoresistive element; and a third bias magnet film (for example, the bias magnet film 352d which is a single common bias magnet film) formed on the substrate 310a so as to be in contact with both the other end of the first giant magnetoresistive element and the other end of the second giant magnetoresistive element, and applying a bias magnetic field oriented in the third direction to the first giant magnetoresistive element and the second giant magnetoresistive element.

In addition, the bias magnet films 352j and 352g also serve as common bias magnet films (i.e., third bias magnet films).

In the magnetic sensor according to the eleventh embodiment, as in the magnetic sensor 310, a single bias magnet film (any of the bias magnet films 352a, 352d, 352j, and 352g) is substituted for two bias magnet films, one of which is required for an end of a first giant magnetoresistive element and the other of which is required for an end of a second giant magnetoresistive element. Accordingly, the first giant magnetoresistive element and the second giant magnetoresistive element can be disposed more closely to each other.

In the magnetic sensor according to the eleventh embodiment, each of the first giant magnetoresistive elements (for example, the element film 354b of the conventional GMR element 354) is formed so as to be in contact with the upper surface of the substrate 10a, and each of the second giant magnetoresistive elements (for example, the element film 353c of the SAF element 353) has an intersection with the first giant magnetoresistive element when viewed from above. The first giant magnetoresistive element and the second giant magnetoresistive element are separated by an insulating layer INS.

This structure allows the first giant magnetoresistive element to intersect the second giant magnetoresistive element above the substrate when viewed from above (in plan view). Thus, the first giant magnetoresistive element and the second giant magnetoresistive element can be disposed more closely.

Although in the magnetic sensor of the eleventh embodiment, the first giant magnetoresistive elements (conventional GMR element) are formed on the upper surface of the substrate 310a and the second giant magnetoresistive element (SAF element) is formed on the upper surface of the insulating layer INS, either of the giant magnetoresistive elements may be formed on the upper surface of the substrate 310a. For example, in the X-axis magnetic sensor 351 shown in FIG. 93, the conventional GMR elements 354 and 356 may be replaced with SAF elements while the SAF elements 353 and 355 are replaced with conventional GMR elements.

Any magnetic sensor according to the embodiments disclosed above is small and its output is affected as little as possible by stress placed on the elements. The present invention is not limited to the disclosed embodiments and various modifications can be made. For example, the magnetic sensor of the present invention may be a perpendicular bidirectional magnetic sensor, as described in some of the embodiments, or a mono-directional magnetic sensor defined by only X-axis or Y-axis magnetic sensors.

What is claimed is:

1. A magnetic sensor comprising:
a single substrate;
a first giant magnetoresistive element disposed on the substrate, the first giant magnetoresistive element being formed of a single-layer-pinned spin-valve film comprising
a single-layer-pinned fixed magnetization layer including a single ferromagnetic layer and a pinning layer,
a free layer whose magnetization direction changes in response to an external magnetic field, and
a spacer layer made of a nonmagnetic conductive material, disposed between the ferromagnetic layer and the free layer,
wherein the magnetization of the ferromagnetic layer is fixed in a first direction by the pinning layer, so that the ferromagnetic layer serves as a pinned layer; and
a second giant magnetoresistive element disposed on the substrate, the second giant magnetoresistive element being formed of a plural-layer-pinned spin-valve film comprising
a plural-layer-pinned fixed magnetization layer including a first ferromagnetic layer, an exchange coupling layer adjoining the first ferromagnetic layer, a second ferromagnetic layer adjoining the exchange coupling layer, and a pinning layer adjoining the second ferromagnetic layer,
a free layer whose magnetization direction changes in response to an external magnetic field, and
a spacer layer made of a nonmagnetic conductive material disposed between the first ferromagnetic layer and the free layer, wherein the magnetization direction of the second ferromagnetic layer is fixed by the pinning layer and the magnetization direction of the first ferromagnetic layer is fixed in a second direction antiparallel to the first direction by exchange coupling of the first ferromagnetic layer and the second ferromagnetic layer with the exchange coupling layer therebetween, so that the first ferromagnetic layer serves as a pinned layer.

2. The magnetic sensor according to claim 1, wherein the first giant magnetoresistive element and the second giant magnetoresistive element are connected in a bridge configuration to form a circuit generating an output in response to a potential at a predetermined point of the circuit, the output increasing or decreasing monotonically as the intensity of a component of a magnetic field in a first direction applied to the magnetic sensor increases.

3. The magnetic sensor according to claim 1, comprising two of the first giant magnetoresistive elements and two of the second giant magnetoresistive elements,
wherein an end of one of the two first giant magnetoresistive elements is connected to an end of one of the two second giant magnetoresistive element to form a first sub-circuit, and an end of the other first giant magnetoresistive element is connected to an end of the other second giant magnetoresistive element to form a second sub-circuit,
wherein a first potential is applied to the other end of the first giant magnetoresistive element in the first sub-circuit and the other end of the second giant magnetoresistive element in the second sub-circuit, and a second potential different from the first potential is applied to the other end of the second giant magnetoresistive element in the first sub-circuit and the other end of the first giant magnetoresistive element in the second sub-circuit, and wherein the magnetic sensor outputs a difference in potential between the junction where the first giant magnetoresistive element is connected to the second giant magnetoresistive element in the first sub-circuit and the junction where the first giant magnetoresistive element is connected to the second giant magnetoresistive element in the second sub-circuit.

4. The magnetic sensor according to claim 1, further comprising a third giant magnetoresistive element formed of the single-layer-pinned spin-valve film on the substrate, and a fourth giant magnetoresistive element formed of the plural-layer-pinned spin-valve film on the substrate, wherein the magnetization of the ferromagnetic layer in the third giant magnetoresistive element is fixed in a third direction perpendicular to the first direction, and the magnetization of the first ferromagnetic layer in the fourth giant magnetoresistive element is fixed in a fourth direction antiparallel to the third direction.

5. The magnetic sensor according to claim 4, wherein the first giant magnetoresistive element and the second giant magnetoresistive element are connected in a bridge configuration to form a circuit generating a first output in response to a potential at a predetermined point in the circuit that monotonically increases or decreases as the intensity of a component in the first direction of a magnetic field applied to the magnetic sensor increases, and wherein the third giant magnetoresistive element and the fourth giant magnetoresistive element are connected in a bridge configuration to form a circuit generating a second output in response to a potential at a predetermined point of the circuit that monotonically increases or decreases as the intensity of a component in the third direction of the magnetic field applied to the magnetic sensor increases.

6. The magnetic sensor according to claim 4, comprising two of the first giant magnetoresistive elements comprises, two of the second giant magnetoresistive elements, two of the third giant magnetoresistive elements, and two of the fourth giant magnetoresistive elements, wherein an end of one of the two first giant magnetoresistive elements is connected to an end of one of the two second giant magnetoresistive elements to form a first sub-circuit; an end of the other first giant magnetoresistive element is connected to an end of the other second giant magnetoresistive element to form a second sub-circuit; a first potential is applied to the other end of the first giant magnetoresistive element in the first sub-circuit and the other end of the second giant magnetoresistive element in the second sub-circuit; and a second potential different from the first potential is applied to the other end of the second giant magnetoresistive element in the first sub-circuit and the other end of the first giant magnetoresistive element in the second sub-circuit, wherein an end of one of the two third giant magnetoresistive elements is connected to an end of one of the two fourth giant magnetoresistive elements to form a third sub-circuit; an end of the other third giant magnetoresistive element is connected to an end of the other fourth giant magnetoresistive element to form a fourth sub-circuit; a third potential is applied to the other end of the third giant magnetoresistive element in the third sub-circuit and the other end of the fourth giant magnetoresistive element in the fourth sub-circuit; and a fourth potential different from the third potential is applied to the other end of the fourth giant magnetoresistive element in the third sub-circuit and the other end of the third giant magnetoresistive element in the fourth sub-circuit, whereby the magnetic sensor is configured so as to generate a first output and a second output, the first output being a difference in potential between the junction where the first giant magnetoresistive element is connected to the second giant magnetoresistive element in the first sub-circuit and the junction where the first giant magnetoresistive element is connected to the second giant magnetoresistive element in the second sub-circuit, the second output being a difference in potential between the junction where the third giant magnetoresistive element is connected to the fourth giant magnetoresistive element in the third sub-circuit and the junction where the third giant magnetoresistive element is connected to the fourth giant magnetoresistive element in the fourth sub-circuit.

7. The magnetic sensor according to claim 1, comprising:
two of the first giant magnetoresistive elements;
two of the second giant magnetoresistive elements;
two of a third giant magnetoresistive elements each formed of the single-layer-pinned spin-valve film on the substrate, the magnetization of the ferromagnetic layer in each third giant magnetoresistive element being fixed in the second direction; and
two of a fourth giant magnetoresistive elements each formed of the plural-layer-pinned spin-valve film on the substrate, the magnetization of the first ferromagnetic layer in each fourth giant magnetoresistive element being fixed in the first direction,
wherein the two of the first giant magnetoresistive elements and the two of the second giant magnetoresistive elements are disposed close to each other in a first region; and the two of the third giant magnetoresistive elements and the two of the fourth giant magnetoresistive elements are disposed close to each other in a second region apart from the first region;
wherein an end of one of the two of the first giant magnetoresistive elements is connected to an end of one of the two of the third giant magnetoresistive elements to form a first sub-circuit; an end of the other first giant magnetoresistive element is connected to an end of the other third giant magnetoresistive element to form a second sub-circuit; a first potential is applied to the other end of the first giant magnetoresistive element of the first sub-circuit and the other end of the third giant magnetoresistive element of the second sub-circuit; a second potential different from the first potential is applied to the other end of the third giant magnetoresistive element of the first sub-circuit and the other end of the first giant magnetoresistive element of the second sub-circuit; and
wherein an end of one of the two of the second giant magnetoresistive elements is connected to an end of one of the two of the fourth giant magnetoresistive element to form a third sub-circuit; an end of the other second giant magnetoresistive element is connected to an end of the other fourth giant magnetoresistive element to form an fourth sub-circuit; a third potential is applied to the other end of the second giant magnetoresistive element of the third sub-circuit and the other end of the fourth giant magnetoresistive element of the fourth sub-circuit; and a fourth potential different from the third potential is applied to the other end of the fourth giant magnetoresistive element of the third sub-circuit and the other end of the second giant magnetoresistive element of the fourth sub-circuit,
whereby the magnetic sensor is configured so as to generate an output in response to a GMR element output and a SAF element output, the GMR element output being a difference in potential between the junction where the first giant magnetoresistive element is connected to the third giant magnetoresistive element in the first sub-circuit and the junction where the first giant magnetoresistive element is connected to the third giant magnetoresistive element in the second sub-circuit, the SAF element output being the difference in potential between the junction where the second giant magnetoresistive element is connected to the fourth giant magnetoresistive element in the third sub-circuit and the junction where the second giant magnetoresistive element is connected to the fourth giant magnetoresistive element in the fourth sub-circuit.

8. The magnetic sensor according to claim 1, comprising a plurality of the first giant magnetoresistive elements and the same number of second giant magnetoresistive elements as the number of the first giant magnetoresistive elements; wherein the first giant magnetoresistive elements and the second giant magnetoresistive elements are disposed in parallel to each other and are alternately arranged with each other in a predetermined direction of the substrate; the first giant magnetoresistive elements are connected in series to form a giant magnetoresistive element; and the second giant magnetoresistive elements are connected in series to form another giant magnetoresistive element.

9. The magnetic sensor according to claim 1, comprising four of the first giant magnetoresistive elements and four of the second giant magnetoresistive elements; wherein two of the first giant magnetoresistive elements lie adjacent to each other to form a first group and the other two of the first giant magnetoresistive elements lie adjacent to each other to form a second group;

two of second giant magnetoresistive elements lie adjacent to each other to form a third group and the other two of the second giant magnetoresistive elements lie adjacent to each other to form a fourth group;

the first to fourth groups are arranged in parallel in a predetermined direction on the substrate in the order of: the first group, the third group, the second group, and the fourth group, or the third group, the first group, the fourth group, and the second group, and wherein one of the first giant magnetoresistive elements of the first group is connected to one of the first giant magnetoresistive elements of the second group in series to form an element composed of first giant magnetoresistive elements, and the other first giant magnetoresistive element of the first group is connected to the other first giant magnetoresistive element of the second group in series to form an element composed of first giant magnetoresistive elements; one of the second giant magnetoresistive elements of the third group is connected to one of the second giant magnetoresistive elements of the fourth group in series to form an element composed of second giant magnetoresistive elements, and the other second giant magnetoresistive element of the third group is connected to the other second giant magnetoresistive element of the fourth group in series to form an element composed of second giant magnetoresistive elements.

* * * * *

UNITED STATES PATENT AND TRADEMARK OFFICE
CERTIFICATE OF CORRECTION

PATENT NO. : 7,589,939 B2  Page 1 of 1
APPLICATION NO. : 11/236645
DATED : September 15, 2009
INVENTOR(S) : Wakul et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 495 days.

Signed and Sealed this

Twenty-first Day of September, 2010

David J. Kappos
*Director of the United States Patent and Trademark Office*